US012666593B2

(12) United States Patent
Lee et al.

(10) Patent No.: US 12,666,593 B2
(45) Date of Patent: Jun. 23, 2026

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Kiseok Lee, Hwaseong-si (KR); Keunnam Kim, Yongin-si (KR); Yongseok Kim, Suwon-si (KR); Hui-Jung Kim, Seongnam-si (KR); Min Hee Cho, Suwon-si (KR); Yoosang Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 935 days.

(21) Appl. No.: 17/828,298

(22) Filed: May 31, 2022

(65) Prior Publication Data

US 2023/0157003 A1 May 18, 2023

(30) Foreign Application Priority Data

Nov. 12, 2021 (KR) ........................ 10-2021-0155945

(51) Int. Cl.
*H10B 12/00* (2023.01)
(52) U.S. Cl.
CPC ............. *H10B 12/30* (2023.02); *H10B 12/05* (2023.02); *H10B 12/50* (2023.02)
(58) Field of Classification Search
CPC ........ H10B 12/30; H10B 12/05; H10B 12/50; H10B 12/03; H10B 12/482; H10B 12/488; H10B 12/312; H10B 12/318; H10B 12/48; H01L 23/5386; H10D 62/235
See application file for complete search history.

(56) References Cited

U.S. PATENT DOCUMENTS

| 7,763,542 | B2 | 7/2010 | Kim et al. |
| 9,871,053 | B2 | 1/2018 | Kwak |
| 10,607,995 | B2 | 3/2020 | Roberts et al. |
| 10,784,272 | B2 | 9/2020 | Lee et al. |
| 11,170,836 | B1 | 11/2021 | Tang |

(Continued)

FOREIGN PATENT DOCUMENTS

| KR | 1020070040590 A | 4/2007 |
| KR | 1020170107195 A | 9/2017 |

(Continued)

*Primary Examiner* — Jacob Y Choi
*Assistant Examiner* — Ashley Nicole Blackwell
(74) *Attorney, Agent, or Firm* — Muir Patent Law, PLLC

(57) ABSTRACT

A semiconductor memory device including a stack structure including layer groups that are vertically stacked on a substrate and including a word line, a channel layer, and a data storage element that is electrically connected to the channel layer; and a vertically extending bit line on one side of the stack structure, wherein the word line of each of the layer groups extends in a first direction parallel to a top surface of the substrate, the layer groups include first and second layer groups that are sequentially stacked, the channel layer is below the word line of the first layer group, the channel layer is above the word line of the second layer group, and the bit line includes a first protrusion portion connected to the channel layer of the first layer group; and a second protrusion portion connected to the channel layer of the second layer group.

20 Claims, 125 Drawing Sheets

(56)        References Cited

U.S. PATENT DOCUMENTS

| | | | |
|---|---|---|---|
| 11,335,687 | B2 | 5/2022 | Lee |
| 2018/0323199 | A1* | 11/2018 | Roberts ................ H10D 64/518 |
| 2019/0074289 | A1 | 3/2019 | Hwang et al. |
| 2020/0111800 | A1 | 4/2020 | Ramaswamy |
| 2020/0279601 | A1 | 9/2020 | Kim et al. |
| 2020/0350315 | A1* | 11/2020 | Son ......................... H10B 12/05 |
| 2020/0365616 | A1* | 11/2020 | Baek ...................... H10B 43/40 |
| 2020/0411523 | A1* | 12/2020 | Shin ....................... H10B 12/02 |
| 2021/0013210 | A1 | 1/2021 | Lee et al. |
| 2021/0057360 | A1* | 2/2021 | Oh .......................... G11C 5/025 |
| 2021/0183861 | A1* | 6/2021 | Lee ......................... H10B 12/03 |
| 2021/0210551 | A1 | 7/2021 | Han |
| 2021/0242208 | A1 | 8/2021 | Manfrini et al. |
| 2023/0006061 | A1* | 1/2023 | Han ..................... H10D 30/025 |
| 2023/0157002 | A1 | 5/2023 | Lee et al. |

FOREIGN PATENT DOCUMENTS

| | | | |
|---|---|---|---|
| KR | 1020210057828 | A | 5/2021 |
| KR | 1020210086726 | A | 7/2021 |
| KR | 1020210105594 | | 8/2021 |
| KR | 10-2023-0069690 | A | 5/2023 |

* cited by examiner

Figure 13A:
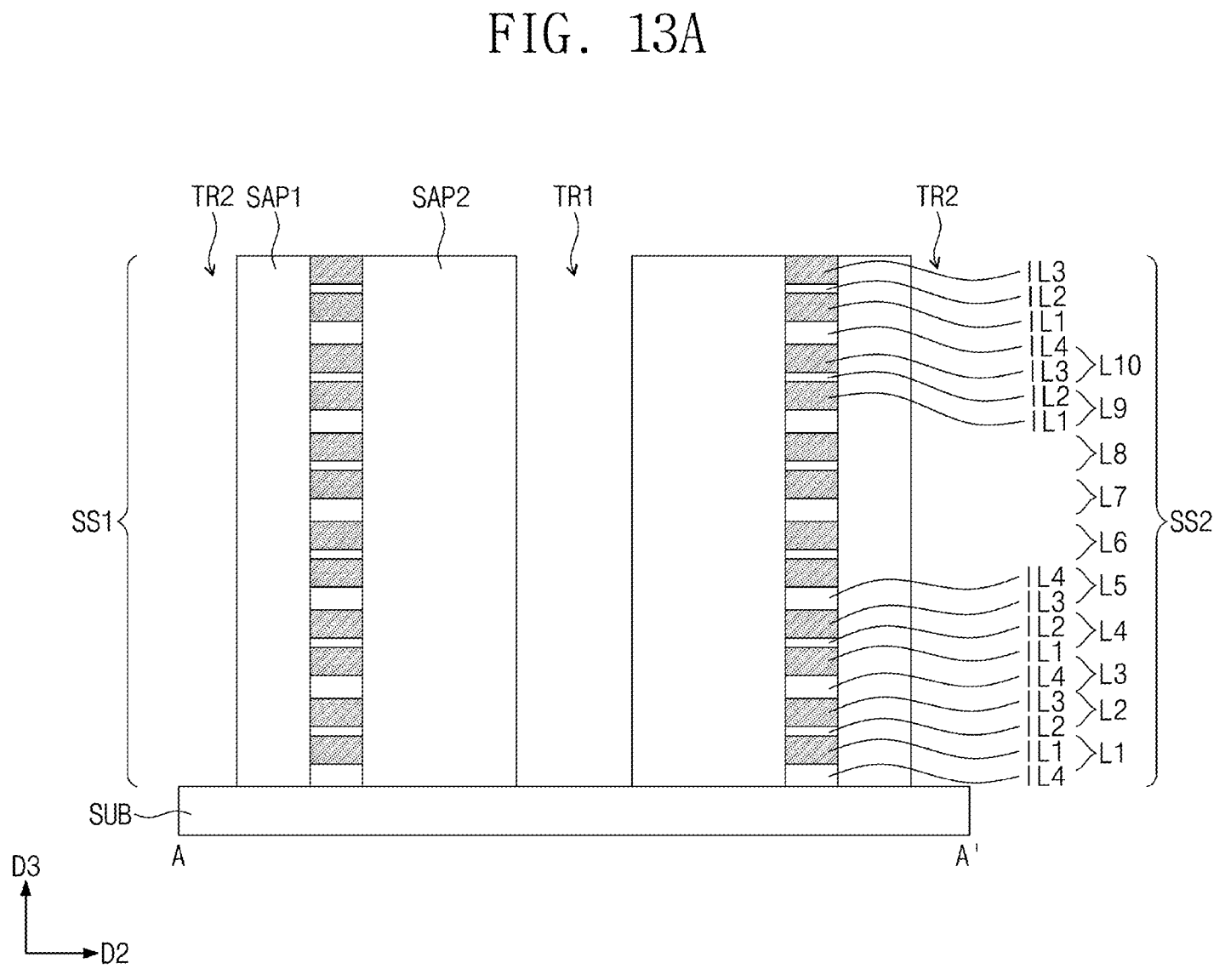

Figure 13B:
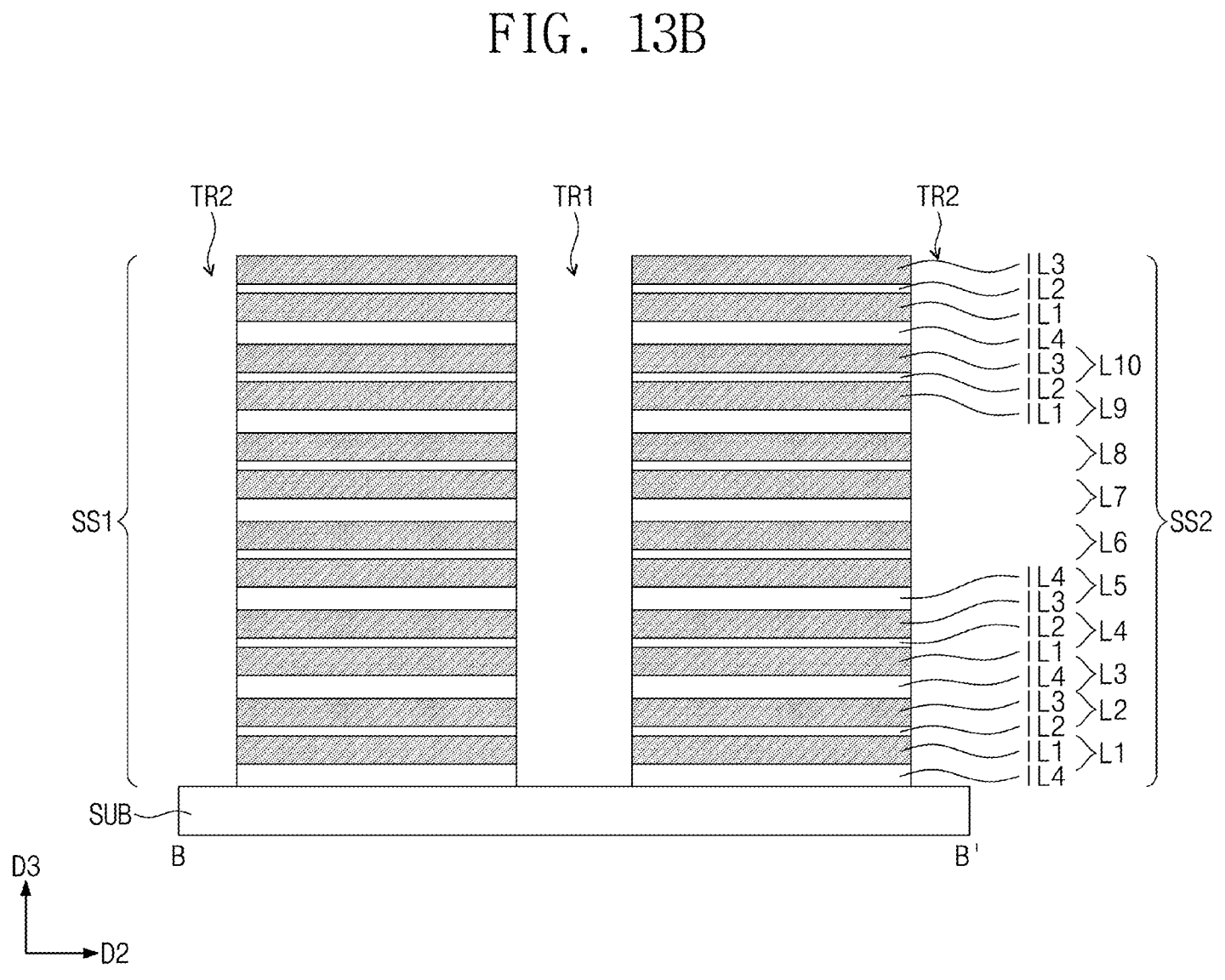

Figure 15A:
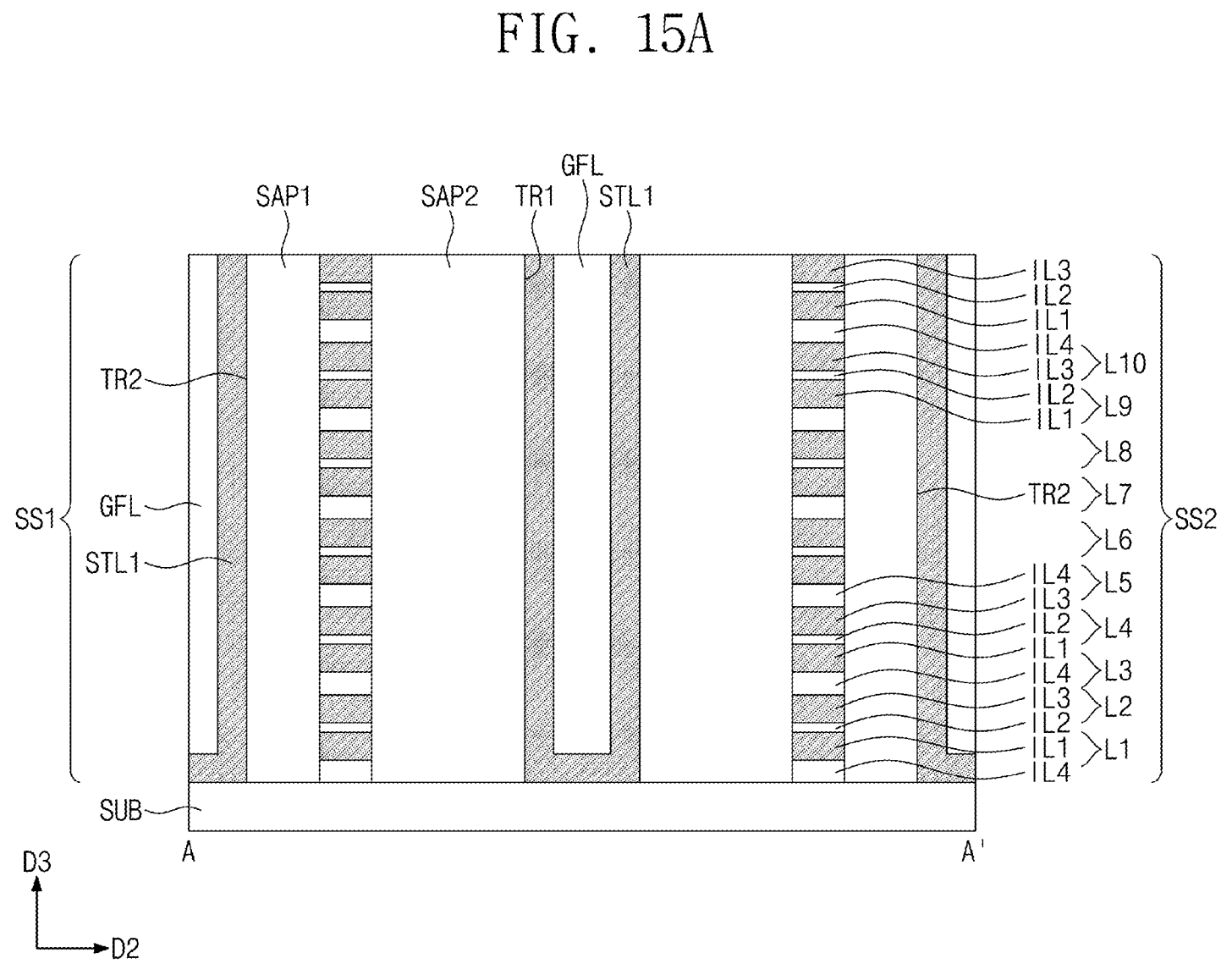

Figure 15B:
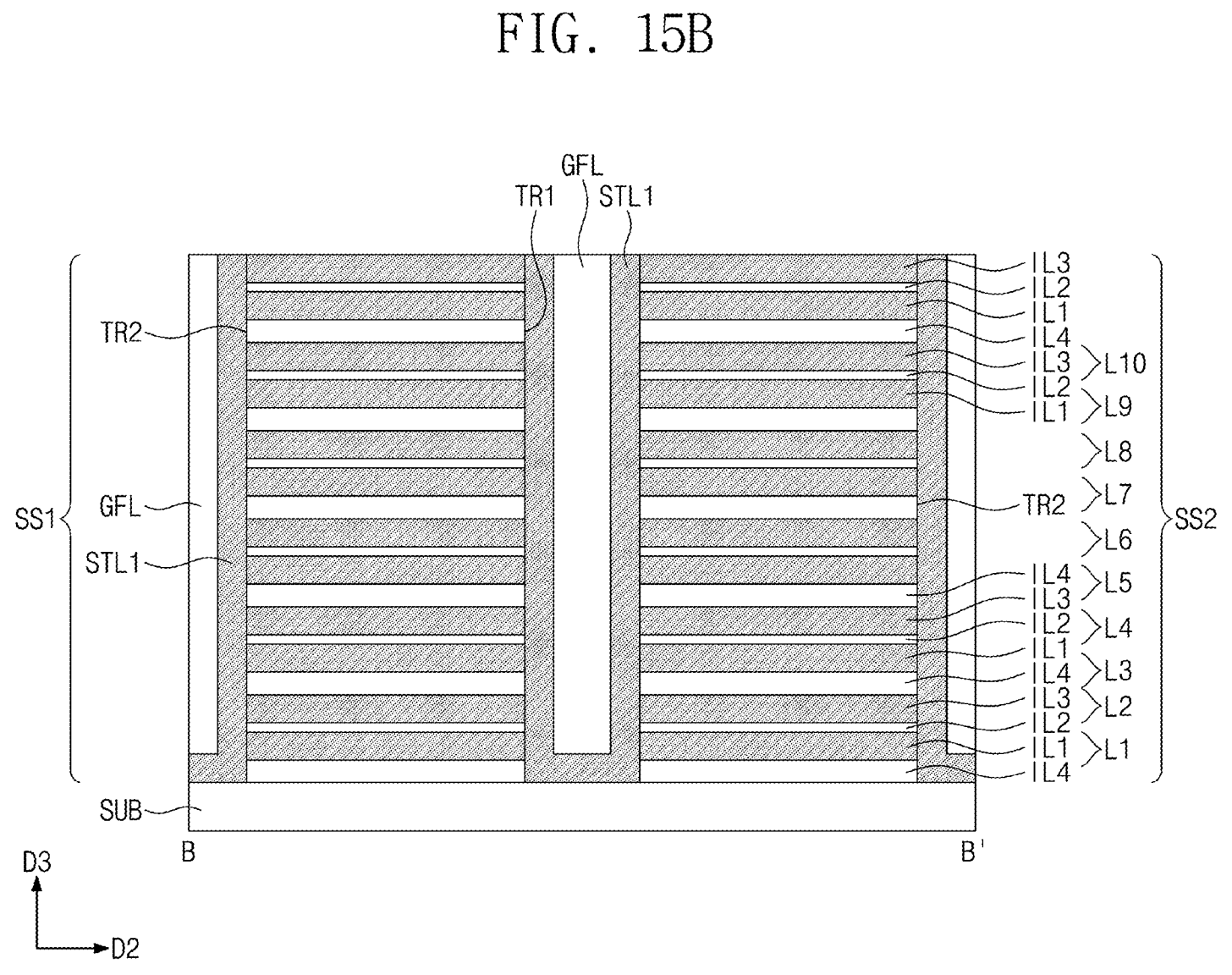

Figure 23A:
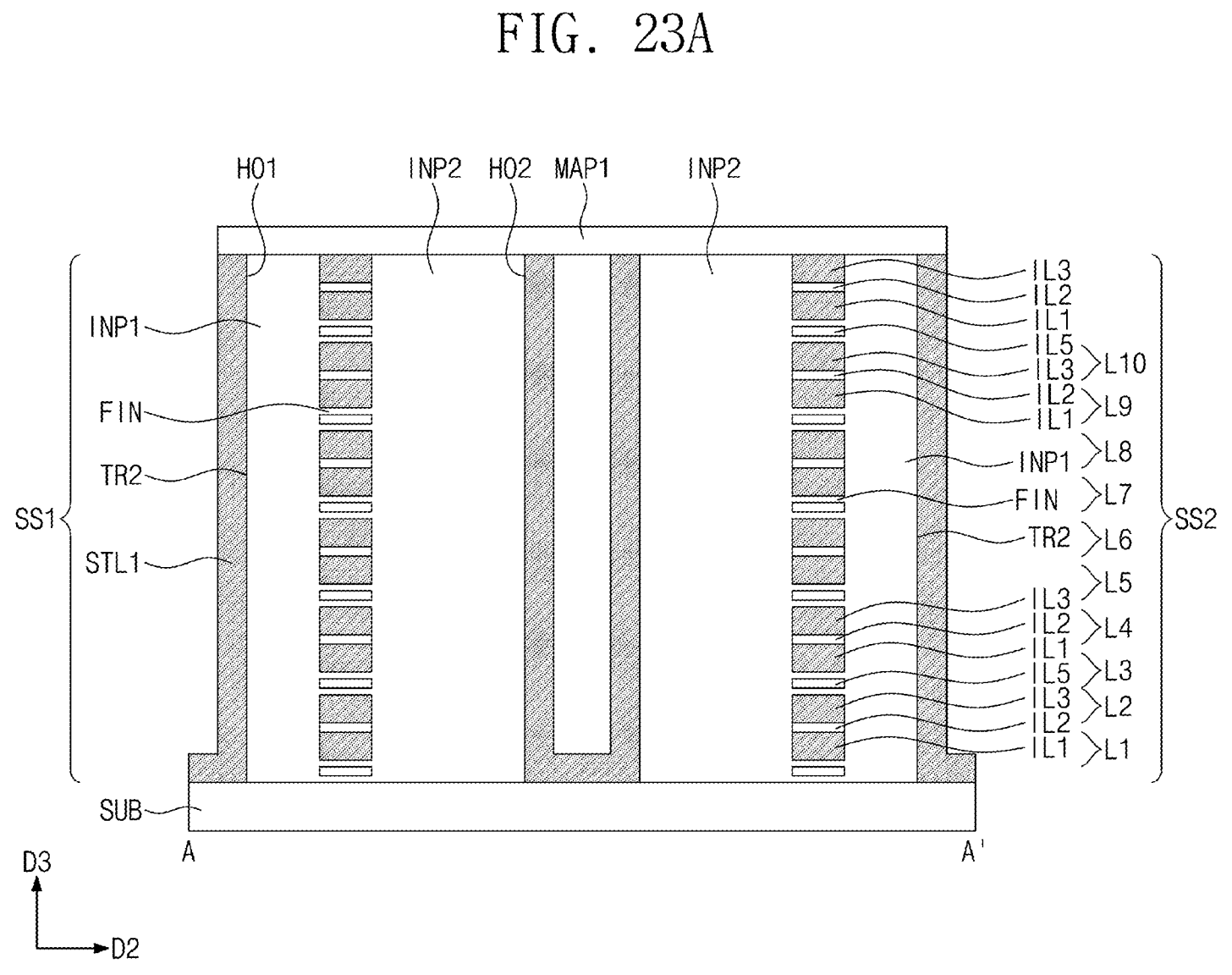

Figure 23B:
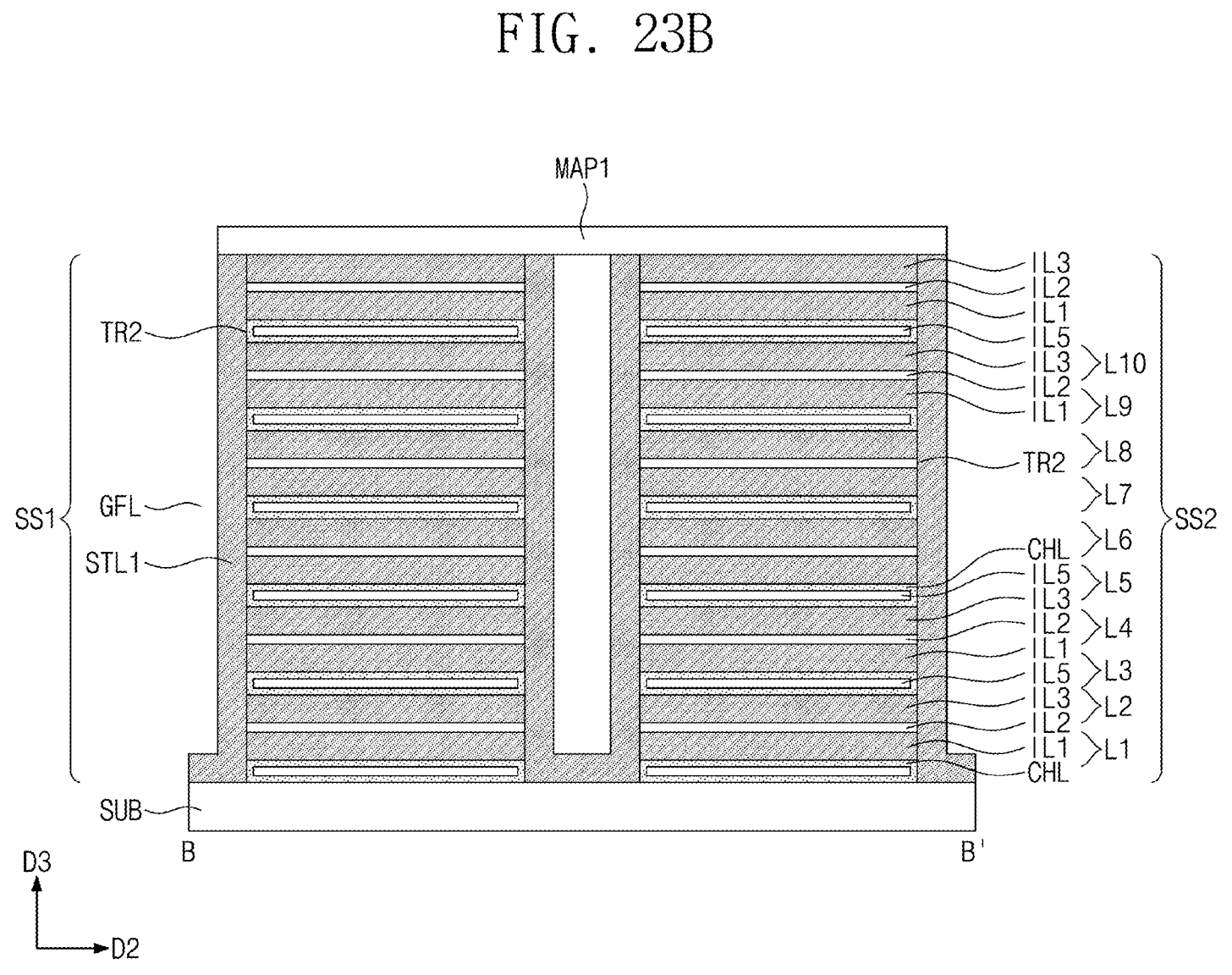

Figure 27A:
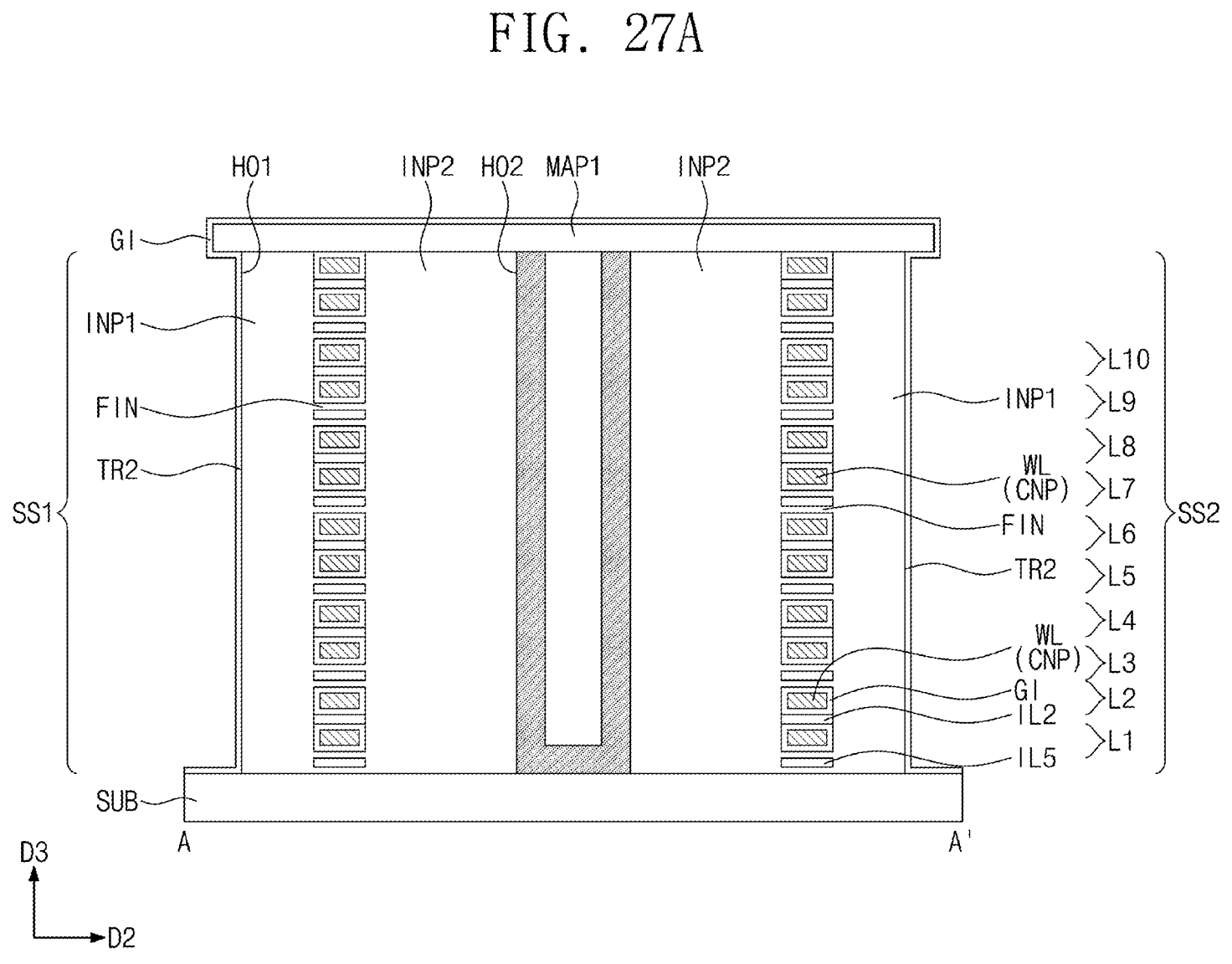

Figure 27B:
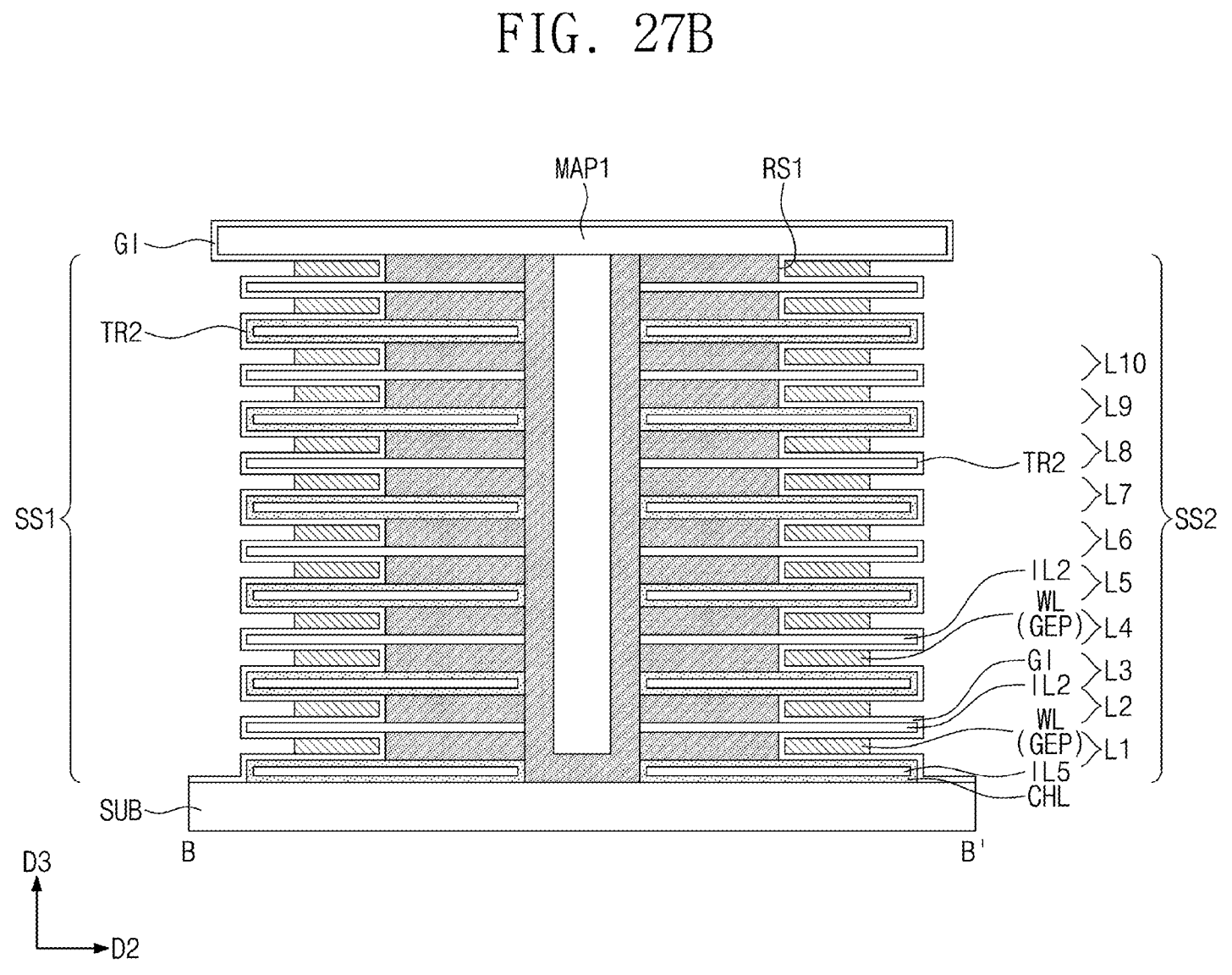

Figure 29A:
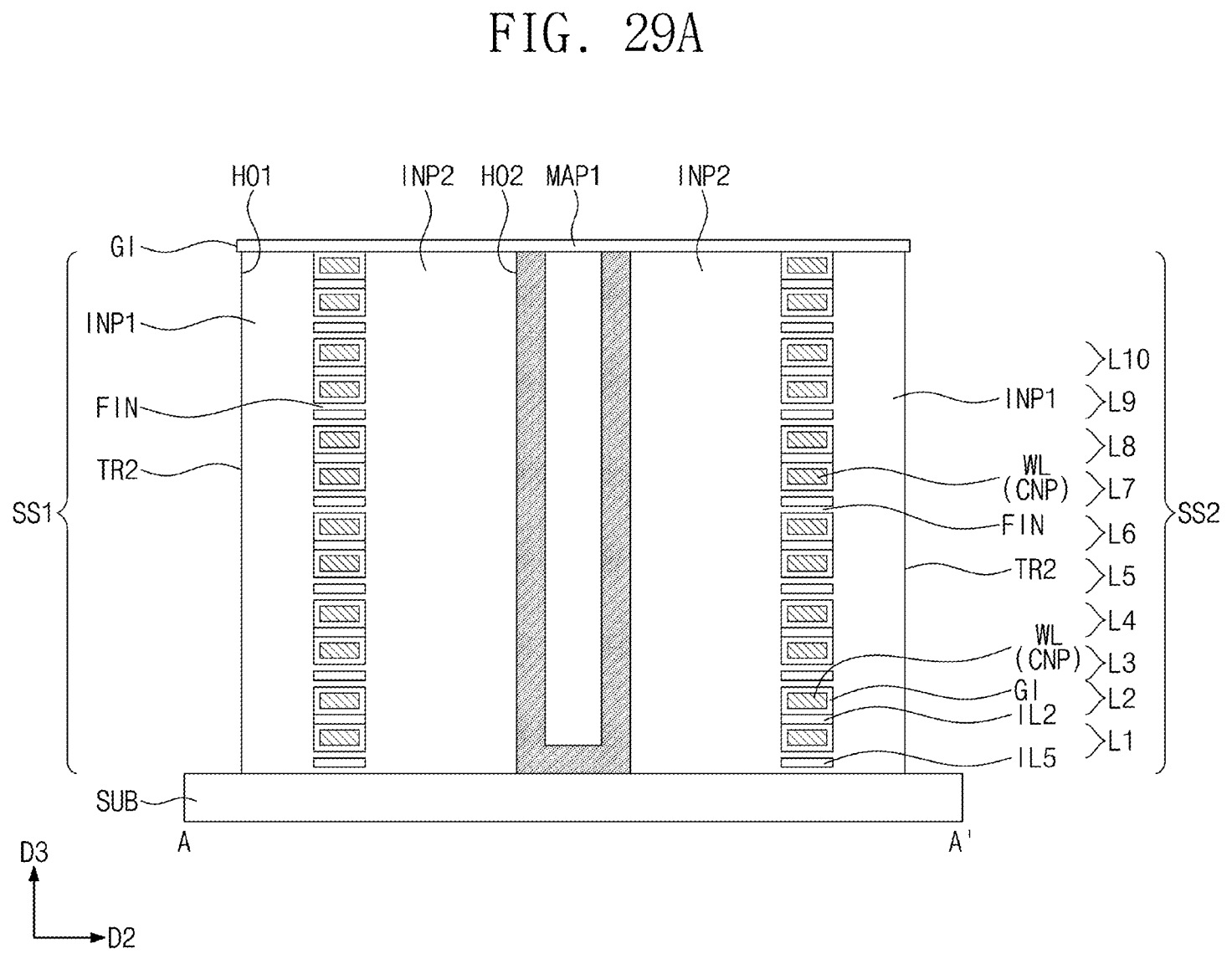

Figure 29B:
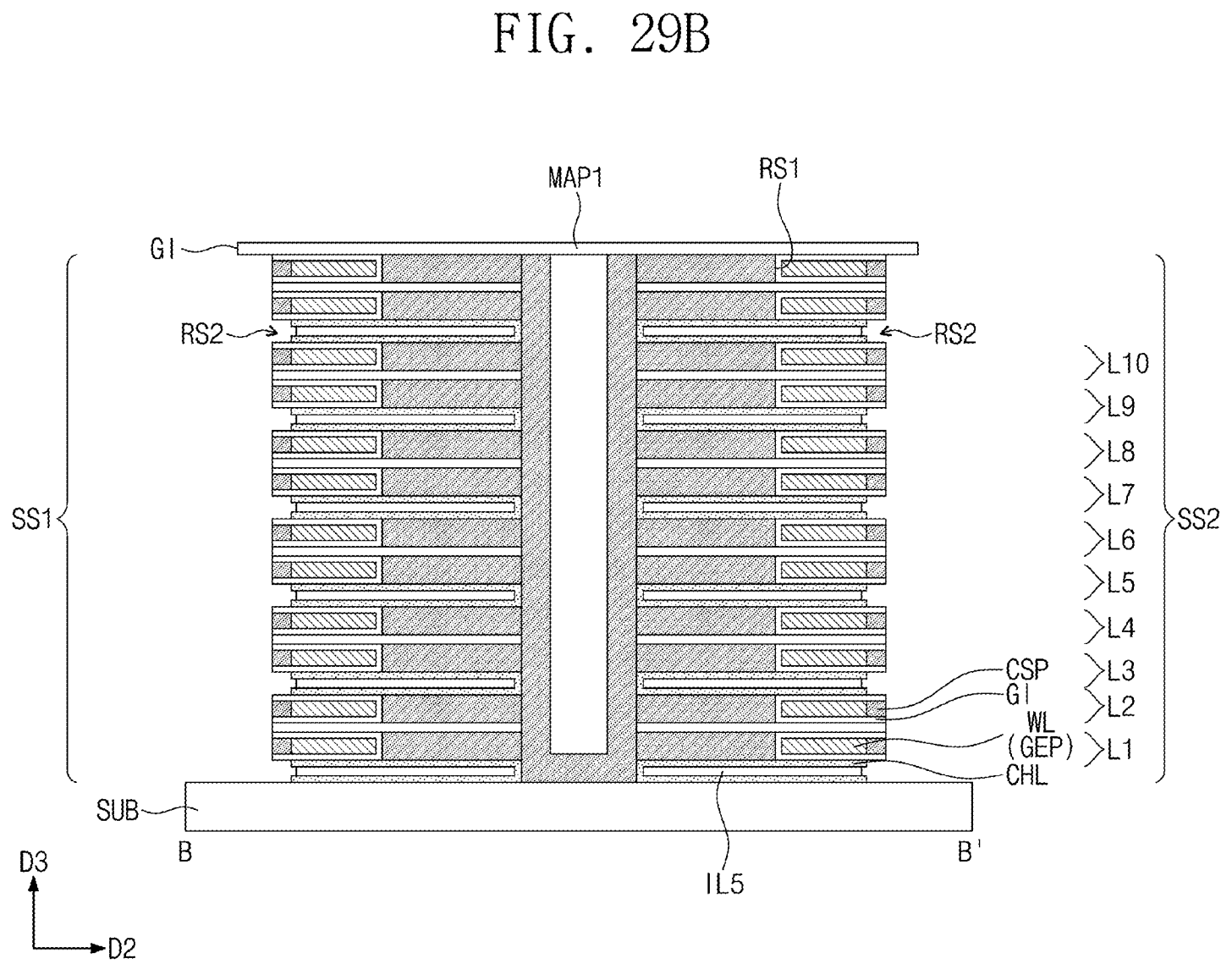

Figure 31A:
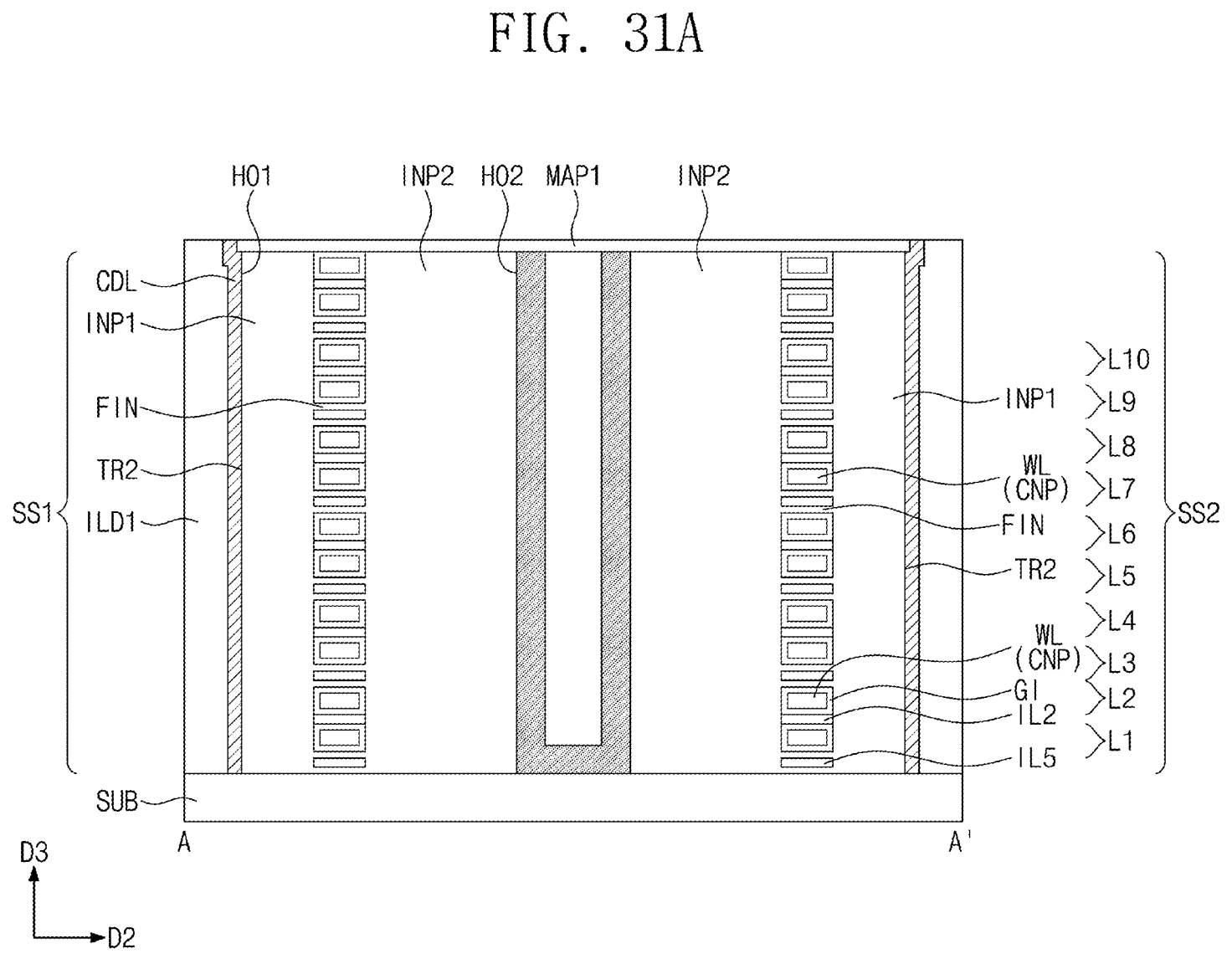

Figure 31B:
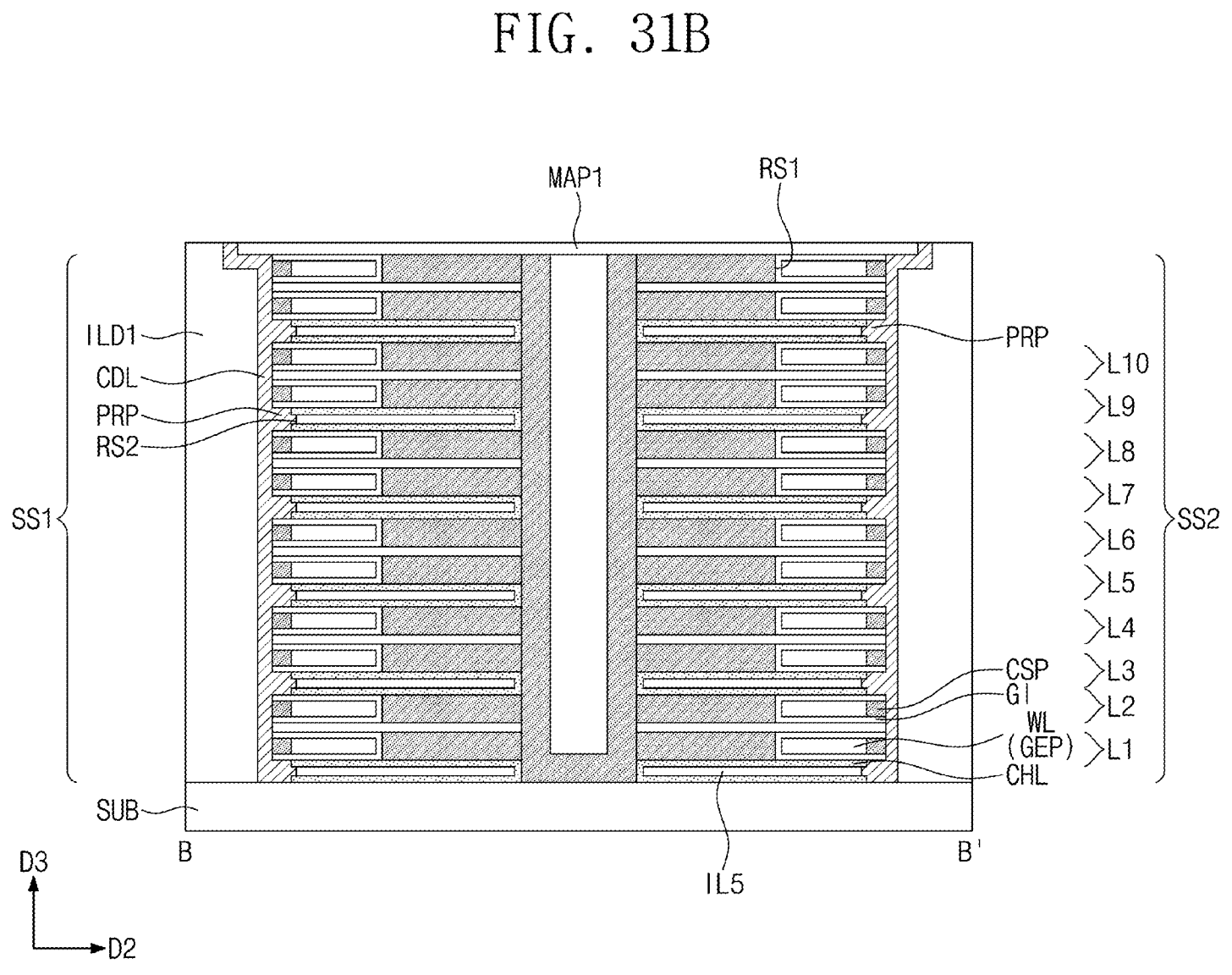

PRP

CSP
GI
WL
(GEP)
CHL

RS1

MAP1

IL5

B'

ILD1
CDL
PRP
RS2

SUB

Figure 33A:
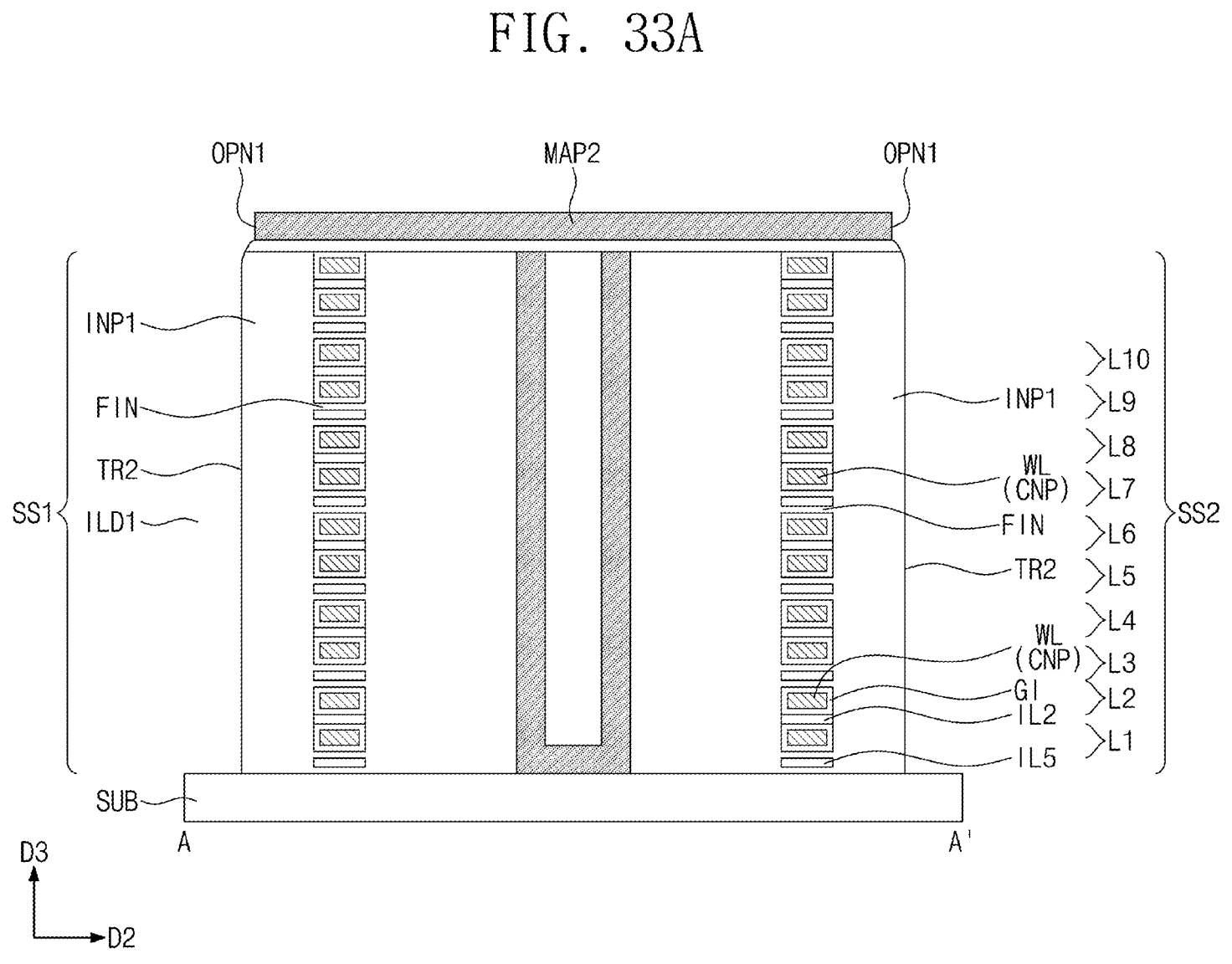

Figure 33B:
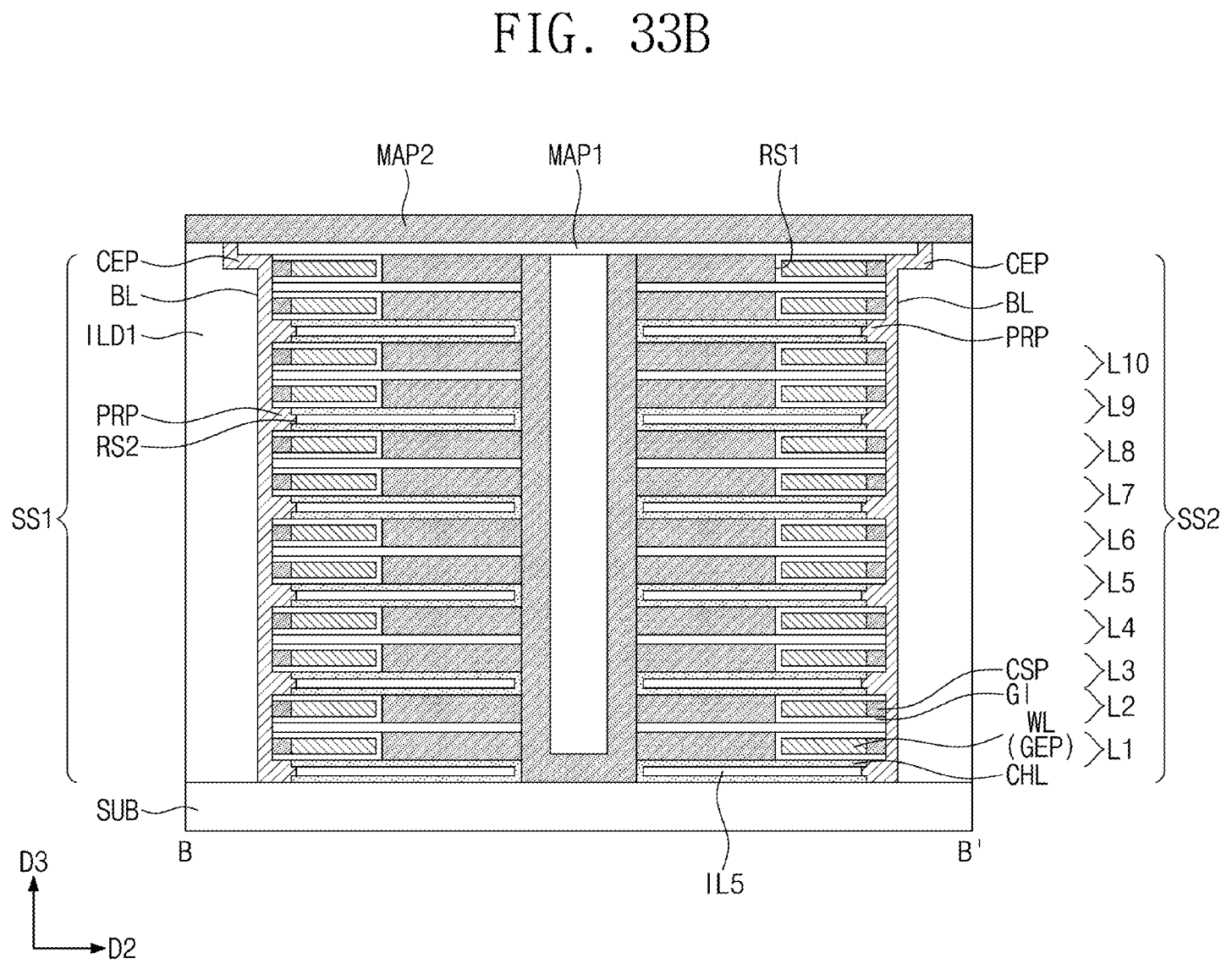

Figure 35A:
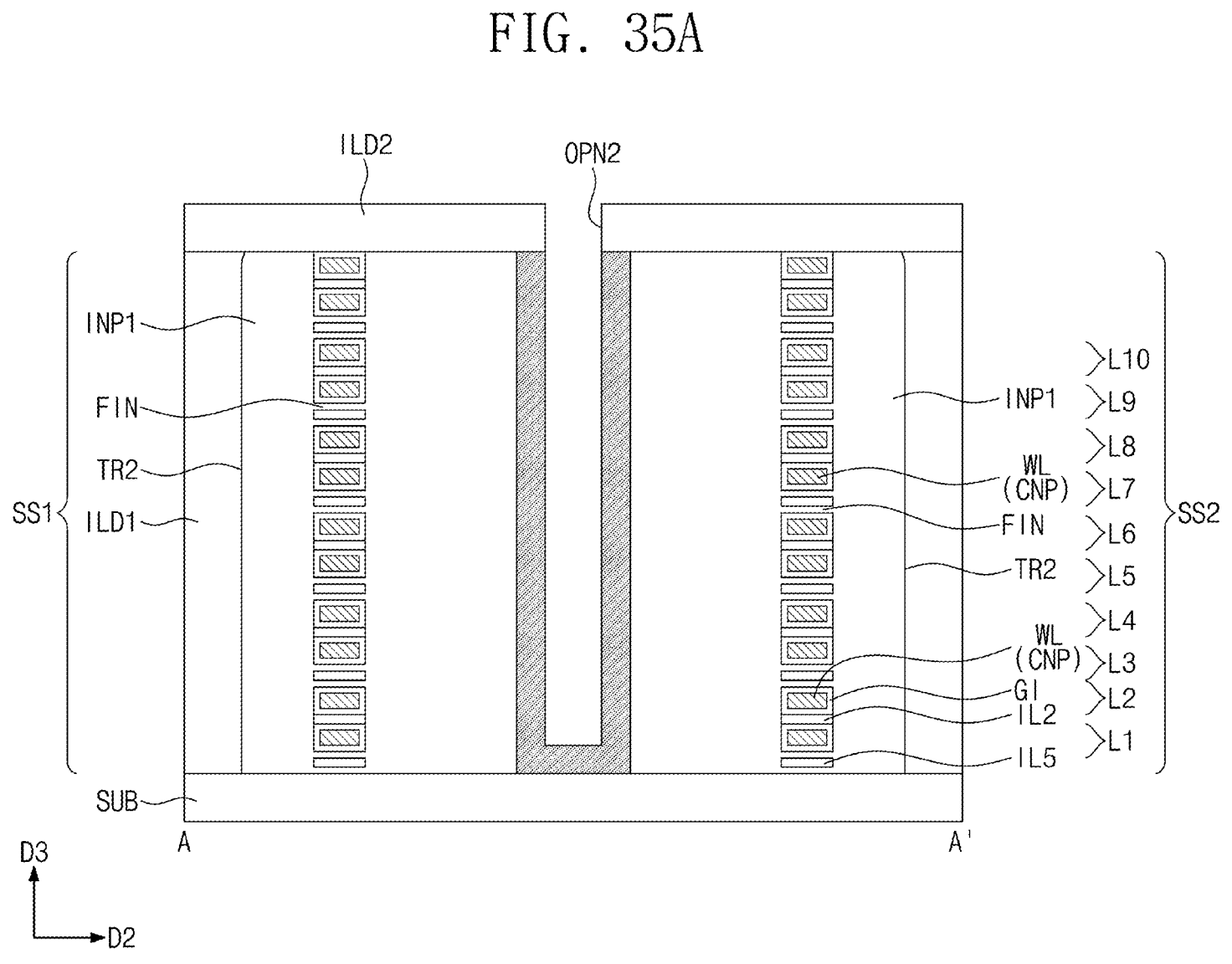

Figure 35B:
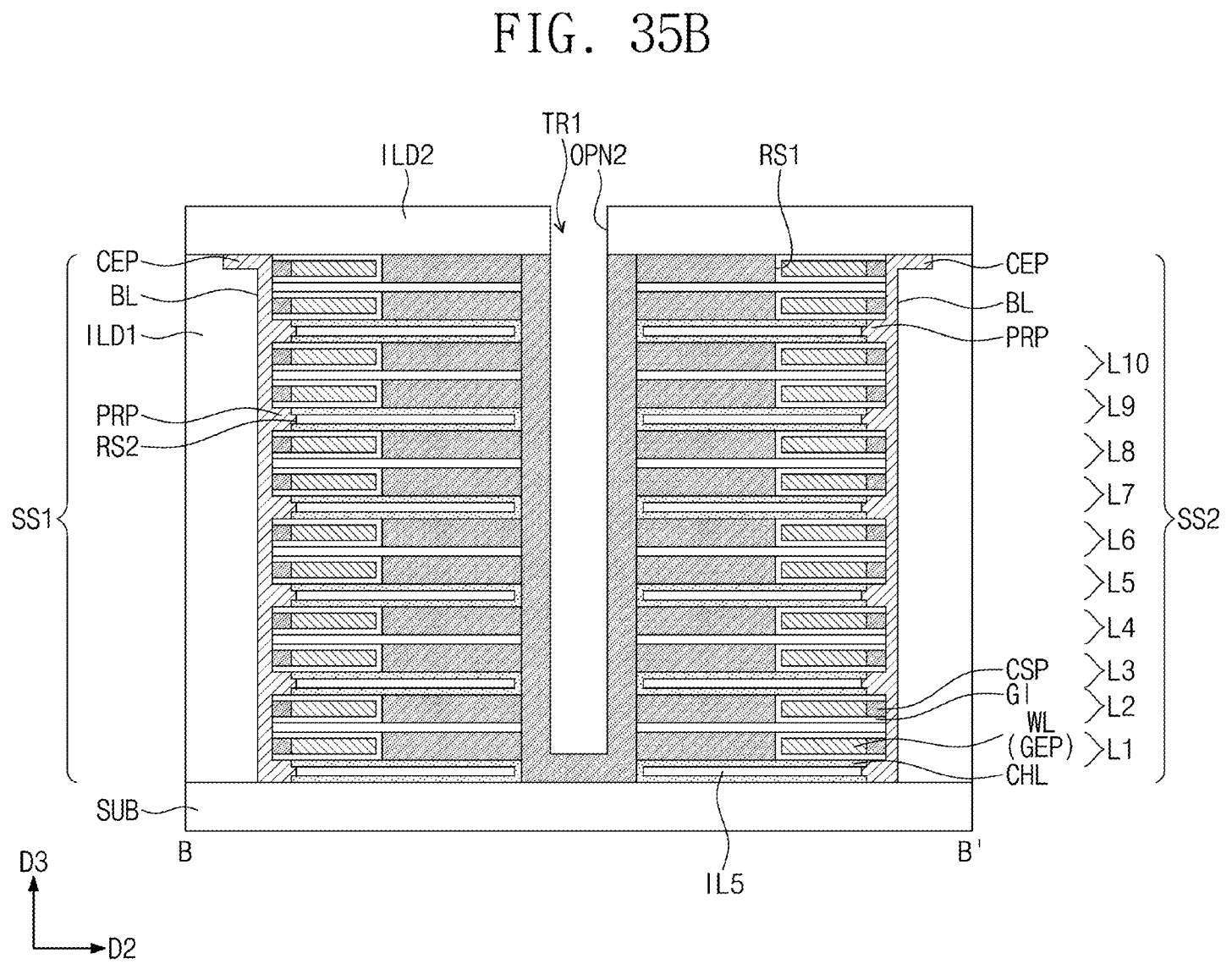

Figure 39A:
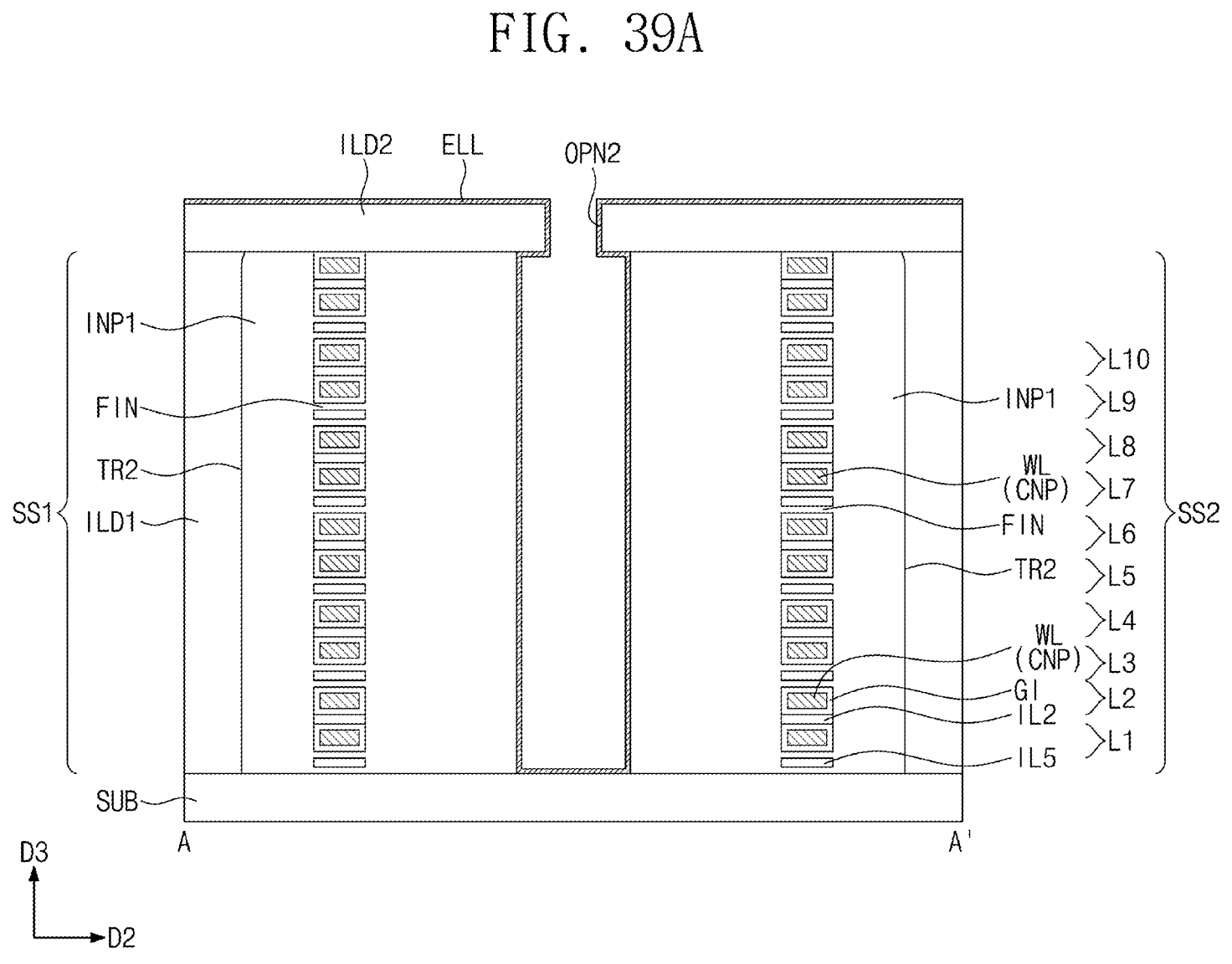

INP1
WL (CNP)
FIN
TR2
WL (CNP)
GI
IL2
IL5

A'

OPN2

ELL
ILD2

INP1
FIN
TR2
ILD1

A

SUB

Figure 39B:
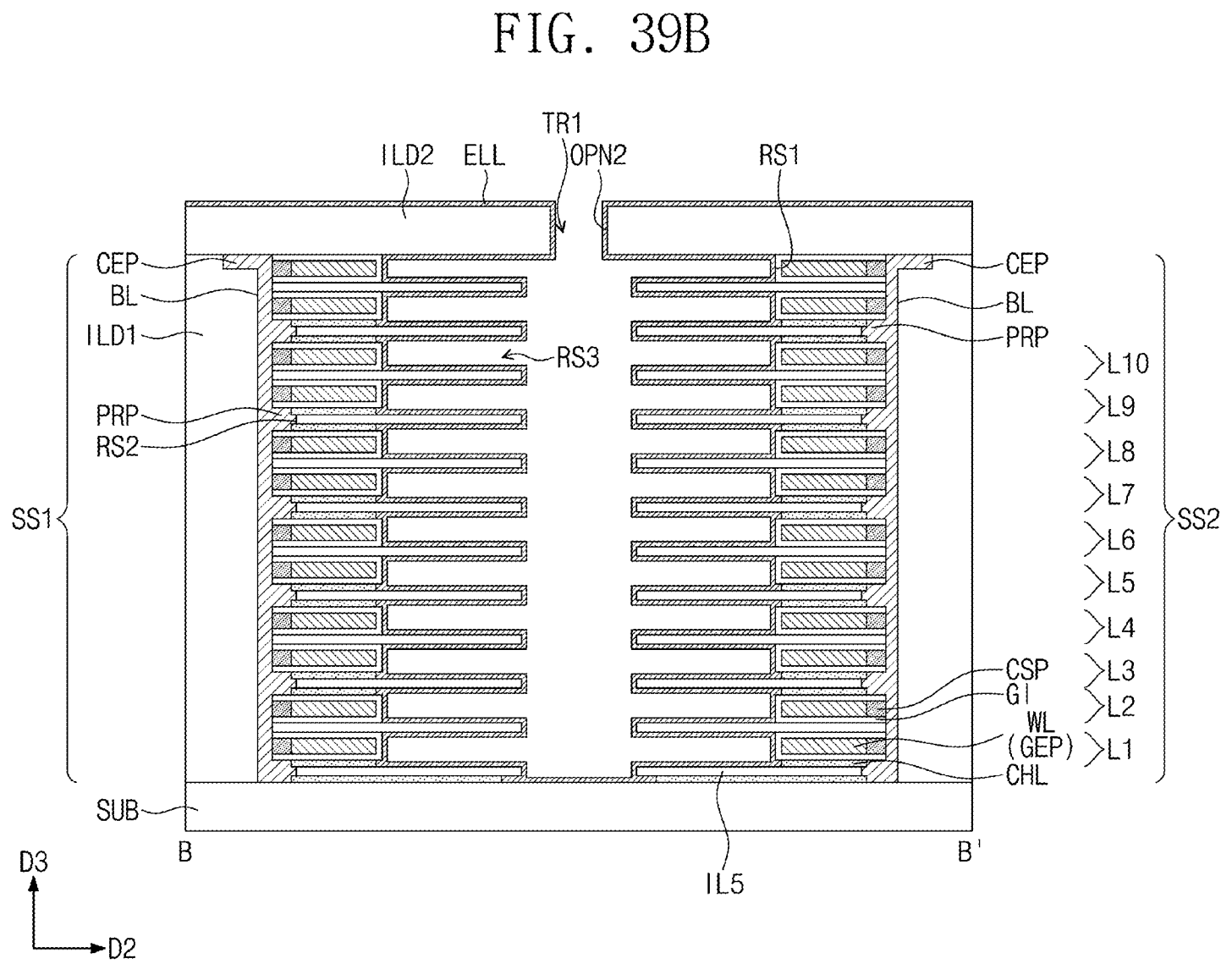

Figure 41A:
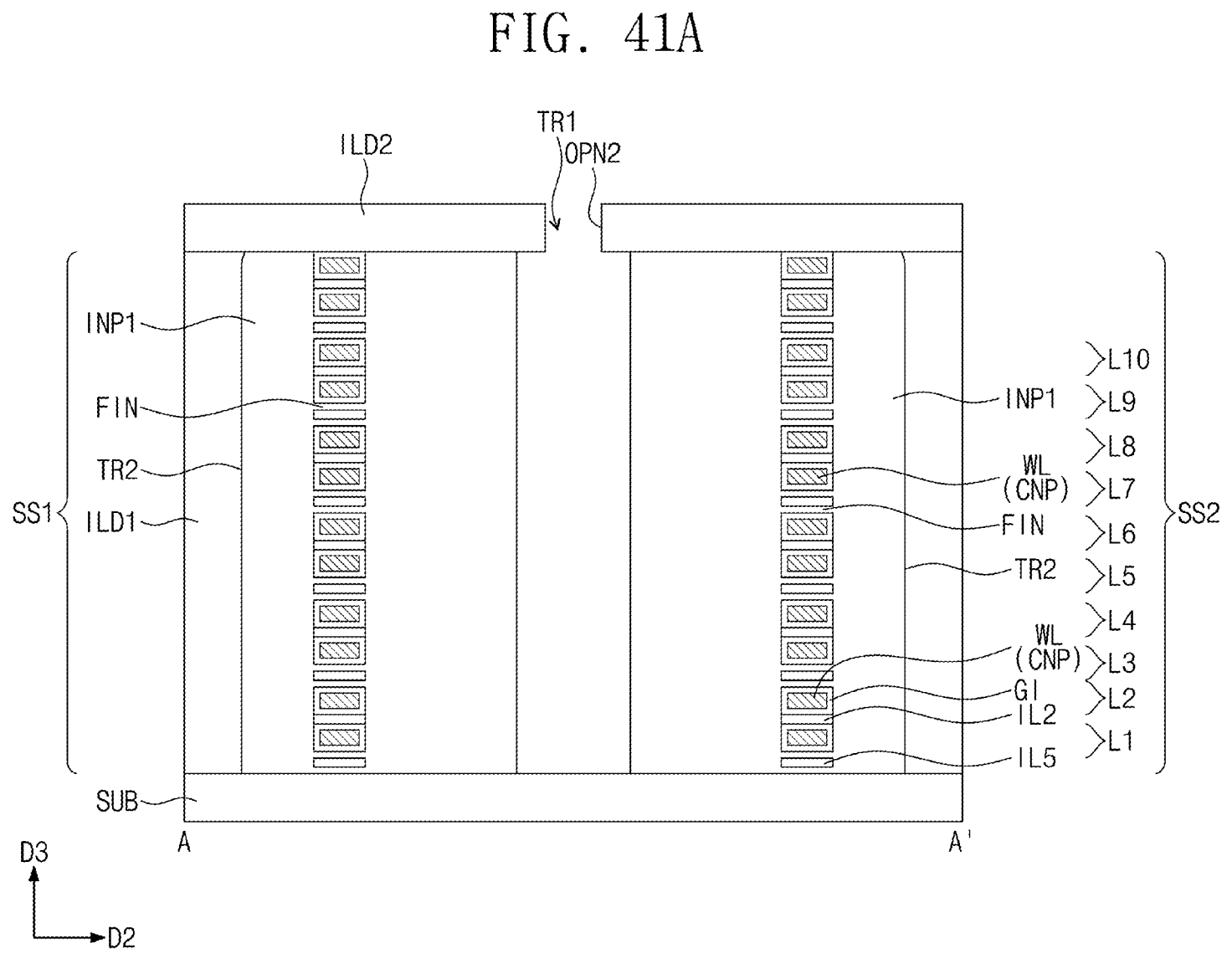

Figure 41B:
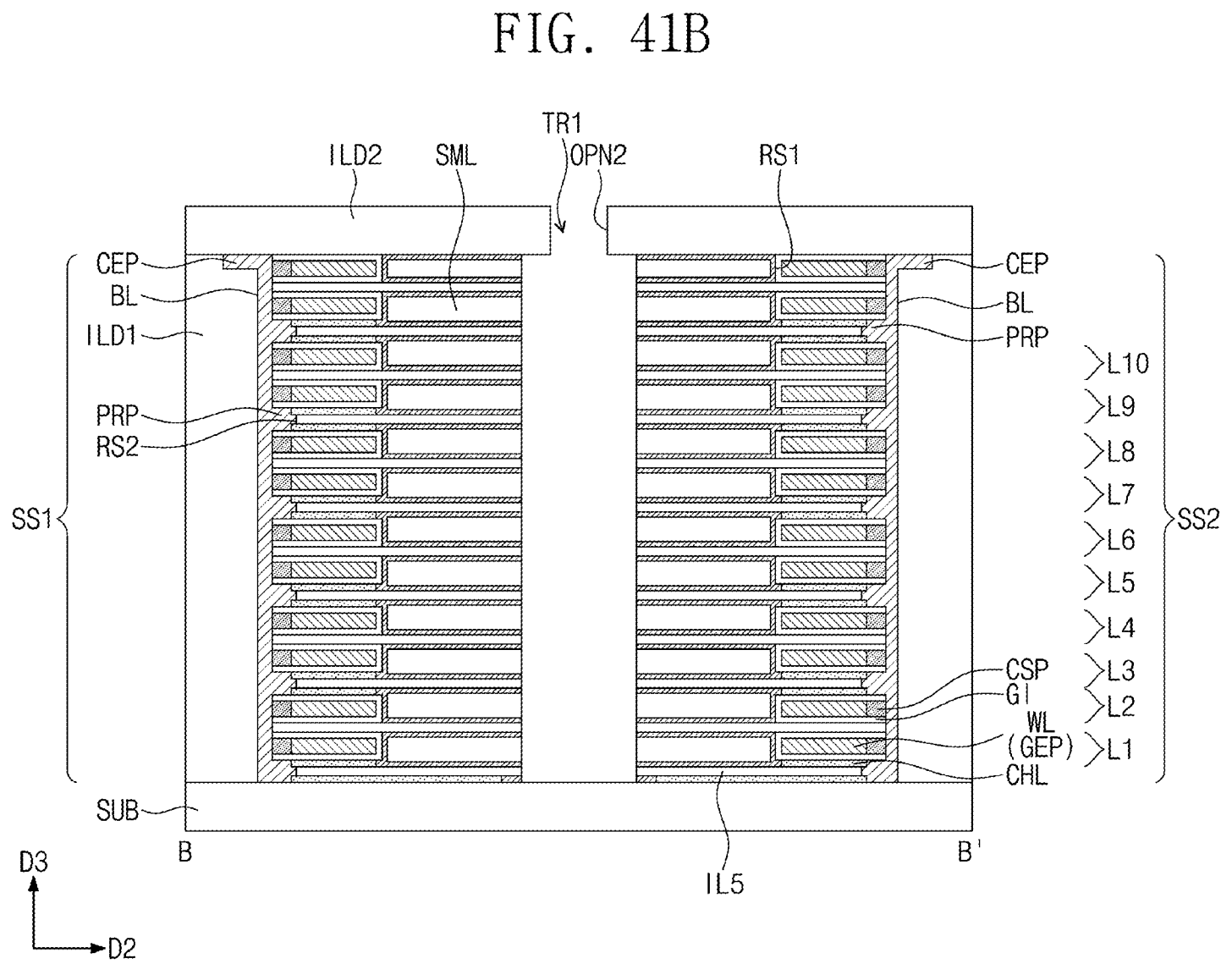

Figure 43A:
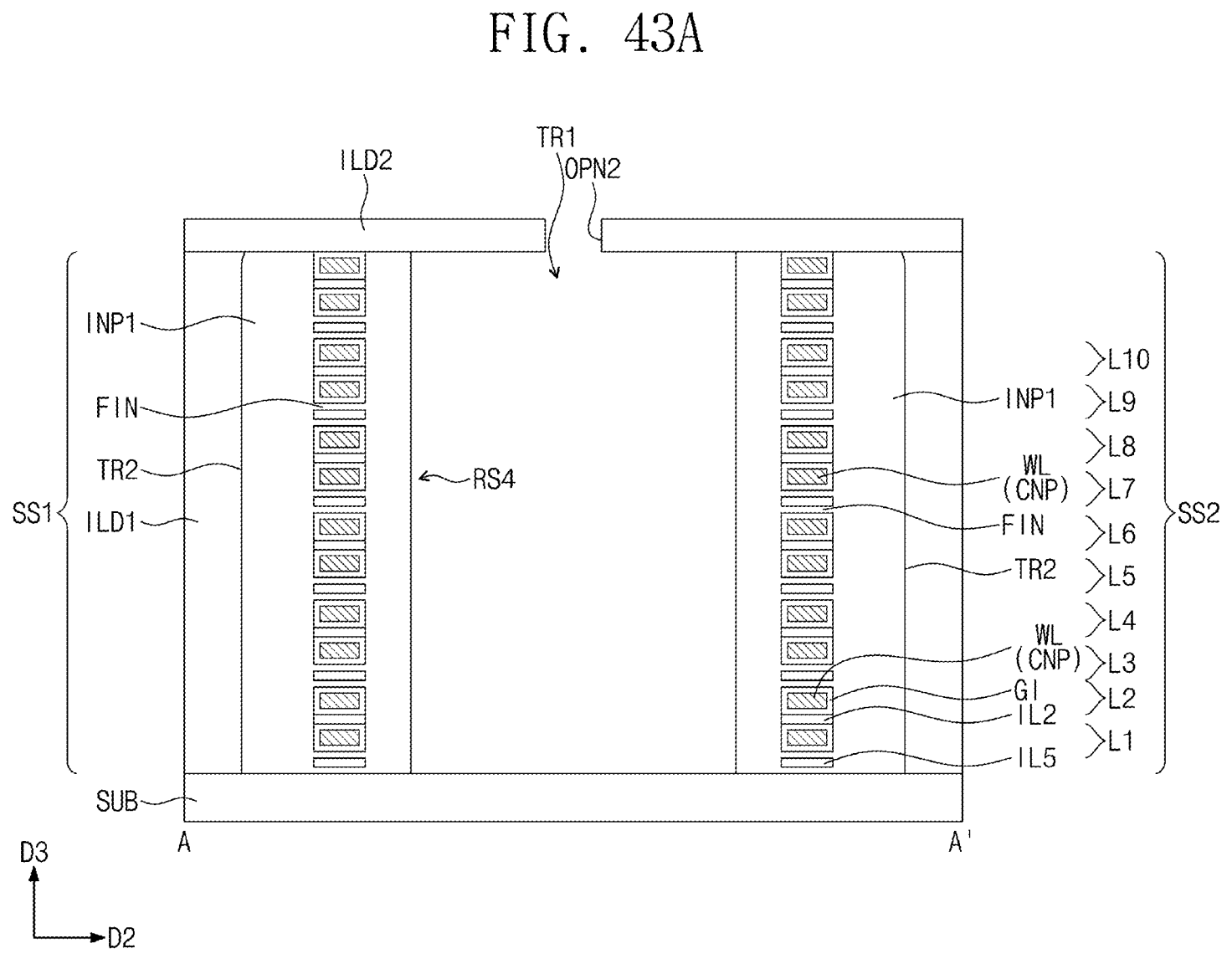

INP1

WL
(CNP)

FIN

TR2

WL
(CNP)
GI
IL2
IL5

A'

TR1
OPN2

RS4

ILD2

INP1
FIN
TR2
ILD1

SUB

Figure 43B:
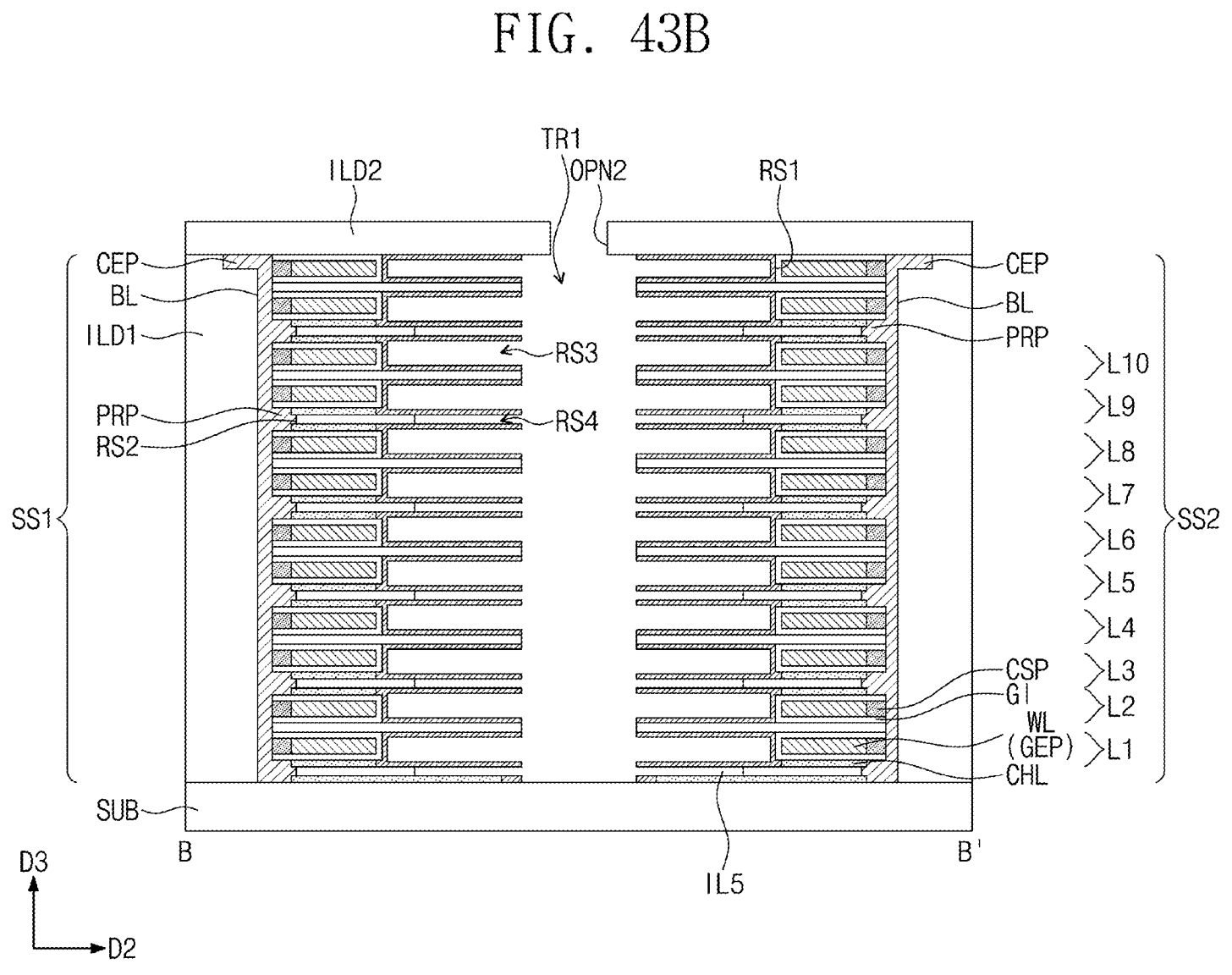

Figure 45A:
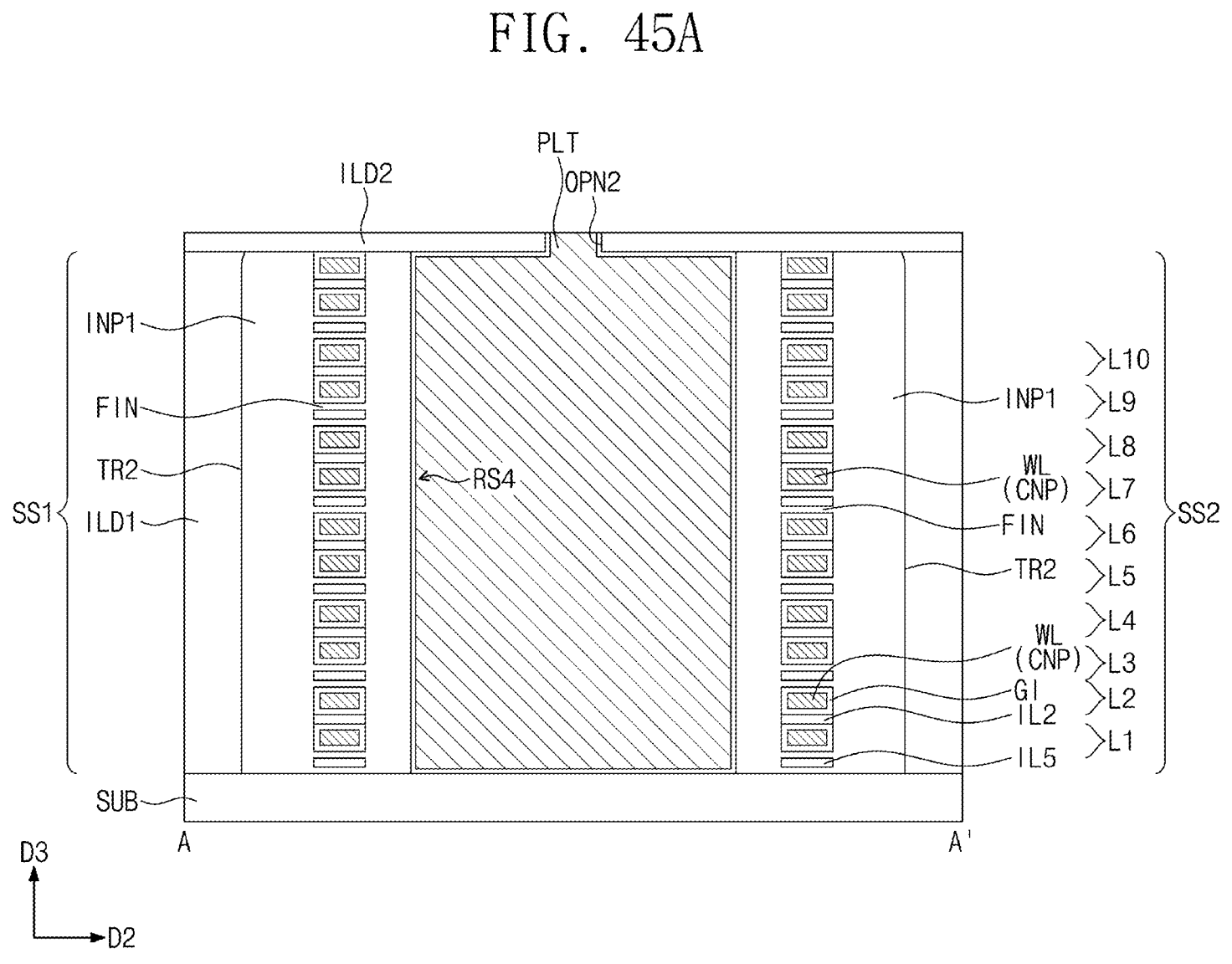

Figure 45B:
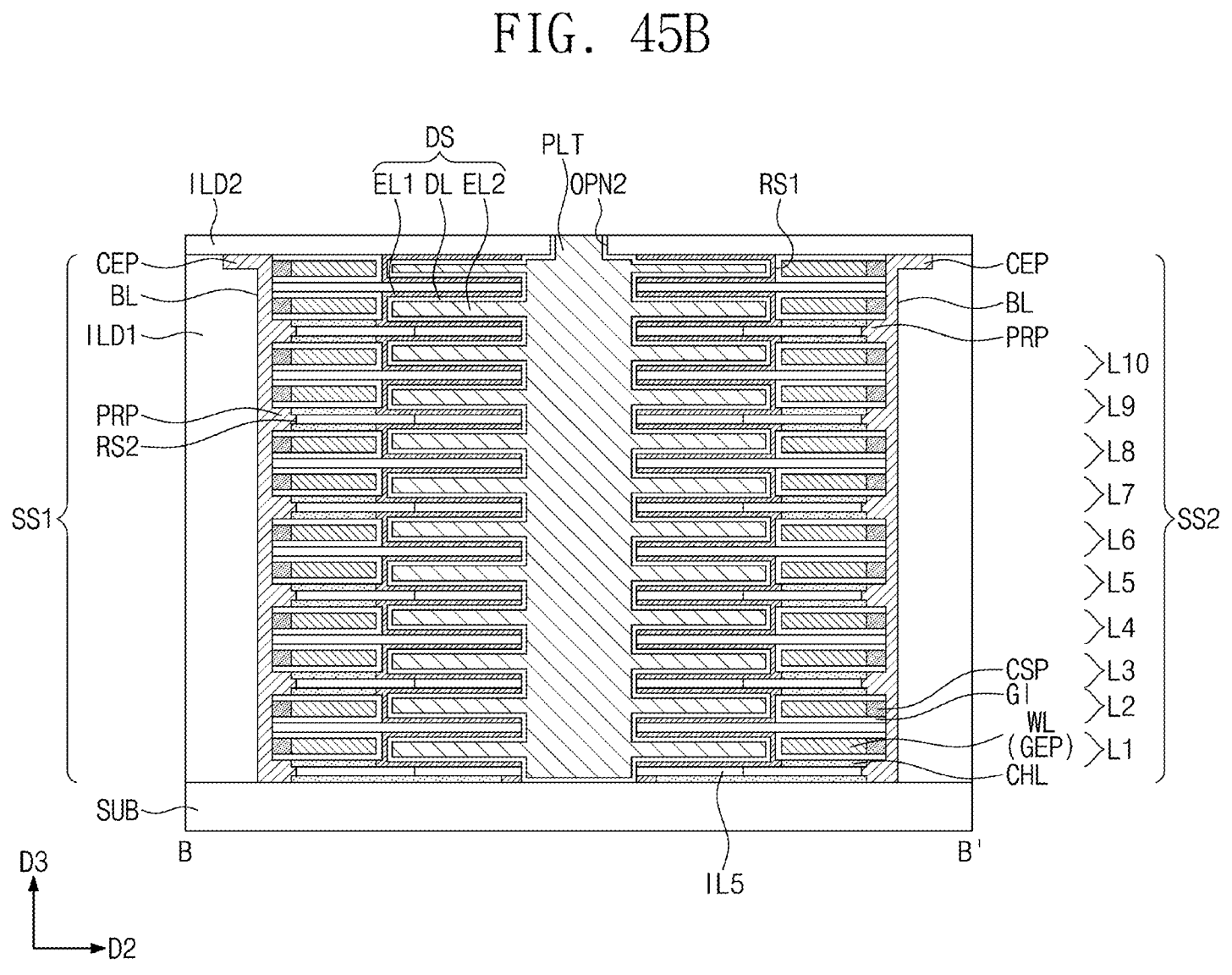

SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0155945 filed on Nov. 12, 2021, in the Korean Intellectual Property Office, the disclosure of which is hereby incorporated by reference in its entirety.

BACKGROUND

1. Field

Embodiments relate to a semiconductor memory device and a method of fabricating the same.

2. Description of the Related Art

Semiconductor devices have been highly integrated for satisfying high performance and low manufacture costs of semiconductor devices for customers. Because integration of semiconductor devices is an important factor in determining product price, high integrated semiconductor devices have been considered. Integration of two-dimensional or planar semiconductor devices may be determined by the area occupied by a unit memory cell, and may be greatly influenced by the level of technology for forming fine patterns.

SUMMARY

The embodiments may be realized by providing a semiconductor memory device including a stack structure including layer groups that are vertically stacked on a substrate, the layer groups each including a word line, a channel layer, and a data storage element that is electrically connected to the channel layer; and a bit line on one side of the stack structure, the bit line extending vertically, wherein the word line of each of the layer groups extends in a first direction parallel to a top surface of the substrate, the layer groups include a first layer group and a second layer group that are sequentially stacked, the channel layer of the first layer group is below the word line of the first layer group, the channel layer of the second layer group is above the word line of the second layer group, and the bit line includes a first protrusion portion connected to the channel layer of the first layer group; and a second protrusion portion connected to the channel layer of the second layer group.

The embodiments may be realized by providing a semiconductor memory device including a stack structure including layer groups that are vertically stacked on a substrate, the layer groups each including a word line, a channel layer, and a data storage element that is electrically connected to the channel layer; and a bit line on one side of the stack structure, the bit line extending vertically, wherein the word line of each of the layer groups extends horizontally, the layer groups include a first layer group, a second layer group, and a third layer group that are sequentially stacked, and a first vertical interval between the channel layer of the first layer group and the channel layer of the second layer group is different from a second vertical interval between the channel layer of the second layer group and the channel layer of the third layer group.

The embodiments may be realized by providing a semiconductor memory device including a stack structure including layer groups that are vertically stacked on a substrate, the layer groups each including a memory cell transistor and a data storage element electrically connected to the memory cell transistor; and a bit line on one side of the stack structure, the bit line extending vertically, wherein the bit line electrically connects the memory cell transistors of the layer groups, the memory cell transistors being stacked, the memory cell transistor of each layer group includes a channel layer between the bit line and the data storage element; and a word line adjacent to the channel layer, the layer groups include a first layer group, a second layer group, and a third layer group that are sequentially stacked, a structure of the memory cell transistor of the first layer group and a structure of the memory cell transistors of the second layer group are mirror-symmetrical to each other about a central line between the first layer group and the second layer group, and a structure of the memory cell transistor of the third layer group is the same as the structure of the memory cell transistor of the first layer group.

The embodiments may be realized by providing a method of fabricating a semiconductor memory device, the method including forming a stack structure by sequentially and repeatedly stacking a first insulating layer, a second insulating layer, a third insulating layer, and a fourth insulating layer on a substrate, the first insulating layer and the third insulating layer including a same material; forming an empty space by removing the fourth insulating layer; depositing a channel layer in the empty space; forming a plurality of first recesses by horizontally and partially etching the first insulating layer and the third insulating layer; forming a gate insulating layer and a word line in each of the first recesses; forming a second recess by recessing an end of the channel layer; forming a bit line on one side of the stack structure, the bit line filling the second recess and extending vertically; forming a plurality of third recesses by removing remaining first and third insulating layers; and forming a data storage element in each of the third recesses.

BRIEF DESCRIPTION OF THE DRAWINGS

Features will be apparent to those of skill in the art by describing in detail exemplary embodiments with reference to the attached drawings in which:

FIGS. 9A, 9B, 9C, 9D, 9E, 9F, 9G, and 9H illustrate cross-sectional views respectively taken along lines A-A', B-B', C-C', D-D', E-E', F-F', G-G', and H-H' of FIG. 8.

FIGS. 11A, 13A, 15A, 17A, 19A, 21A, 23A, 25A, 27A, 29A, 31A, 33A, 35A, 37A, 39A, 41A, 43A, and 45A illustrate cross-sectional views taken along line A-A' of FIGS. 10, 12, 14, 16, 18, 20, 22, 24, 26, 28, 30, 32, 34, 36, 38, 40, 42, and 44, respectively.

FIGS. 11B, 13B, 15B, 17B, 19B, 21B, 23B, 25B, 27B, 29B, 31B, 33B, 35B, 37B, 39B, 41B, 43B, and 45B illustrate cross-sectional views taken along line B-B' of FIGS. 10, 12, 14, 16, 18, 20, 22, 24, 26, 28, 30, 32, 34, 36, 38, 40, 42, and 44, respectively.

DETAILED DESCRIPTION

Figure 1:
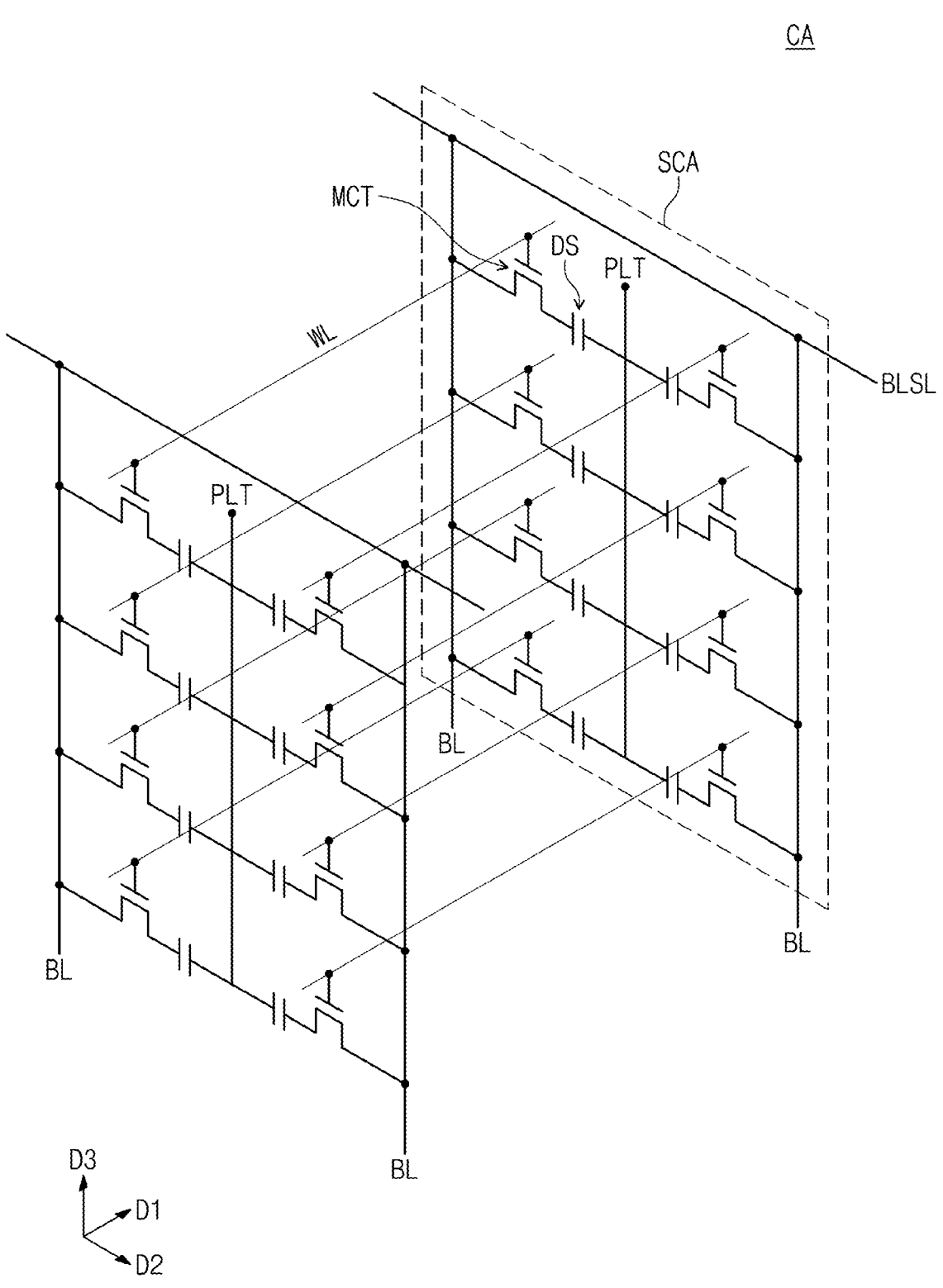
FIG. 1 illustrates a simplified circuit diagram of a cell array of a three-dimensional semiconductor memory device according to some embodiments.

FIG. 1 illustrates a simplified circuit diagram of a cell array of a three-dimensional semiconductor memory device according to some embodiments.

Referring to FIG. 1, a three-dimensional semiconductor memory device according to some embodiments may include a cell array CA including a plurality of sub-cell arrays SCA. The sub-cell arrays SCA may be arranged along a first direction D1.

Each of the sub-cell arrays SCA may include a plurality of bit lines BL, a plurality of word lines WL, and a plurality of memory cell transistors MCT. One memory cell transistor MCT may be between one word line WL and one bit line BL.

Each of the bit lines BL may be a conductive pattern (e.g., a metal line) that extends (e.g., lengthwise) in a direction (e.g., a third direction D3) perpendicular to a substrate. The bit lines BL in one sub-cell array SCA may be arranged in a second direction D2. The bit line BL may be connected in common to the memory cell transistors MCT that are stacked along the third direction D3.

The word lines WL may be conductive patterns (e.g., metal lines) that are stacked in the third direction D3 on the substrate. Each of the word lines WL may extend in the first direction D1. Each of the word lines WL may be connected in common to the memory cell transistors MCT of the sub-cell arrays SCA, while extending in the first direction D1.

A gate of the memory cell transistor MCT may be connected to the word line WL, and a first source/drain of the memory cell transistor MCT may be connected to the bit line BL. A second source/drain of the memory cell transistor MCT may be connected to a data storage element DS. In an implementation, the data storage element DS may be a capacitor. The second source/drain of the memory cell transistor MCT may be connected to a first electrode of the capacitor.

Figure 2:
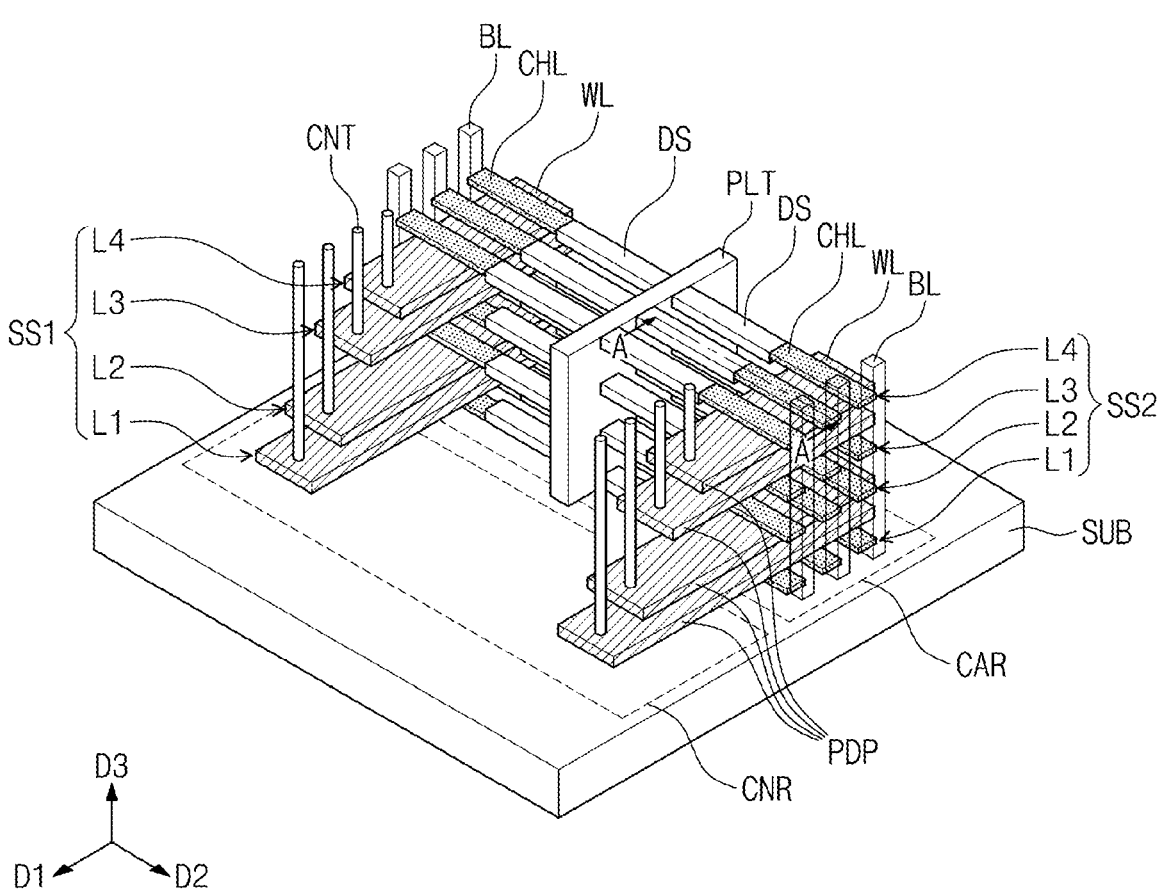
FIG. 2 illustrates a perspective view of a three-dimensional semiconductor memory device according to some embodiments.
Figure 3:
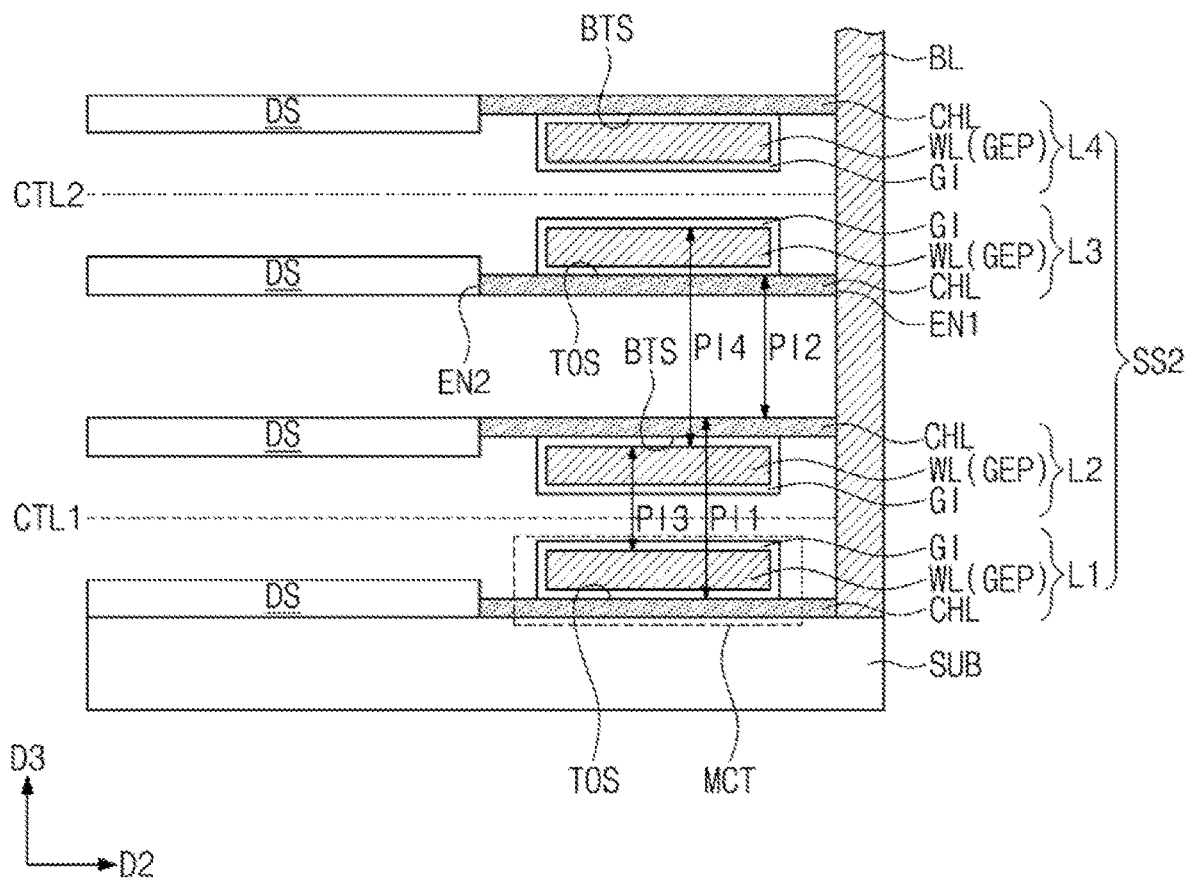
FIG. 3 illustrates a cross-sectional view taken along line A-A' of FIG. 2.
Figure 4A:
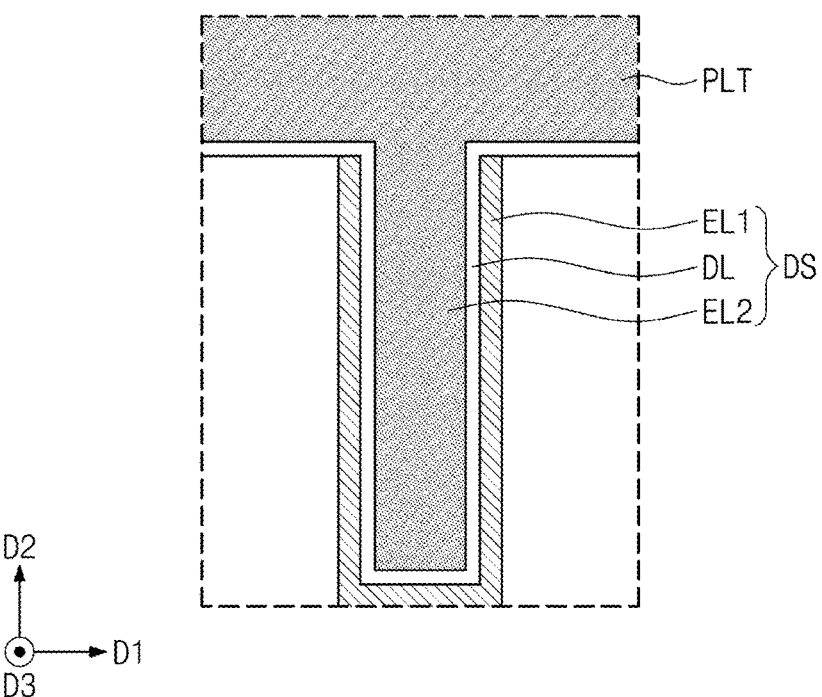
FIGS. 4A to 4C illustrate cross-sectional views of examples of a data storage element depicted in FIG. 2.
Figure 4B:
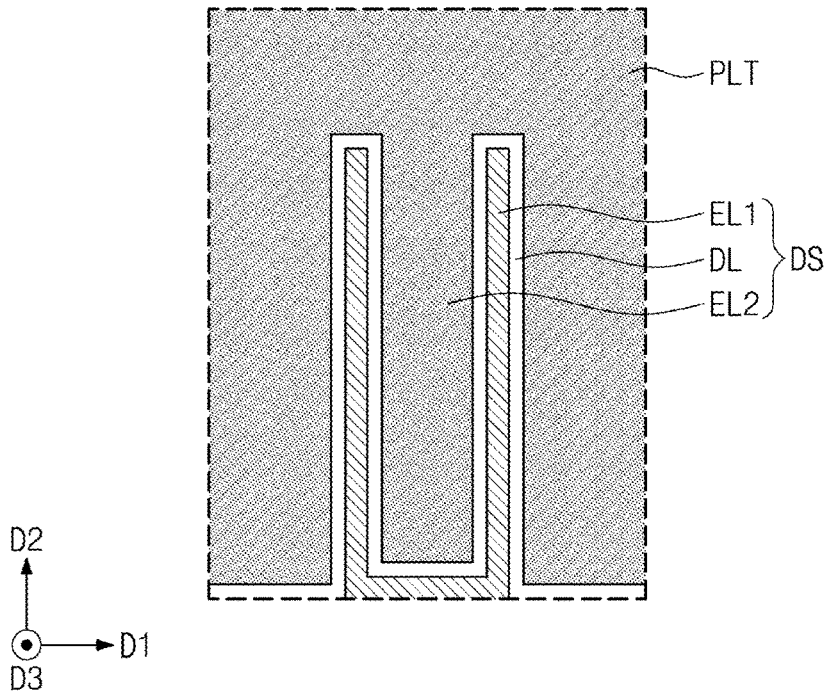
Figure 4C:
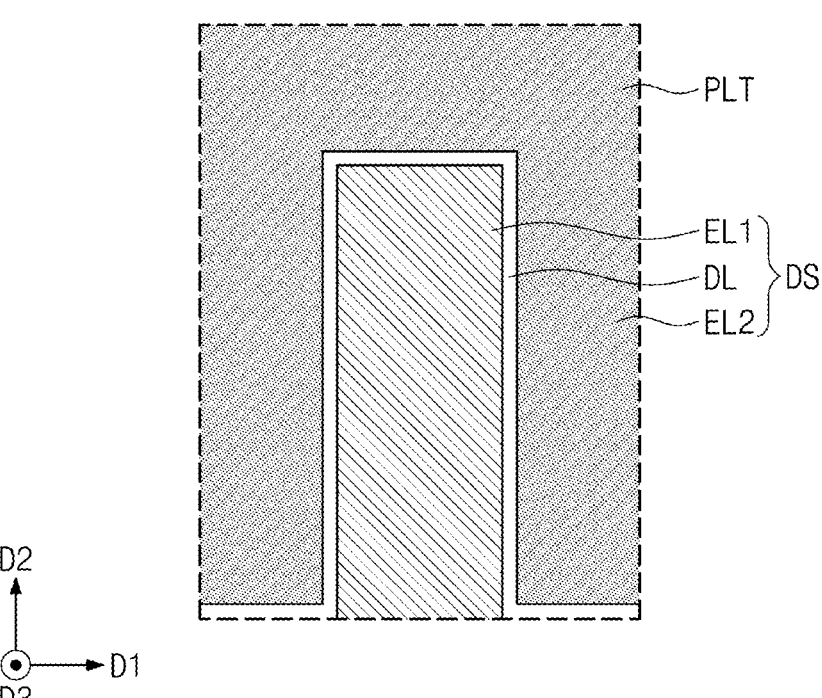

FIG. 2 illustrates a perspective view of a three-dimensional semiconductor memory device according to some embodiments. FIG. 3 illustrates a cross-sectional view taken along line A-A' of FIG. 2. FIGS. 4A to 4C illustrate cross-sectional views of examples of a data storage element depicted in FIG. 2.

Referring to FIGS. 1 and 2, a substrate SUB may be provided thereon with a first stack structure SS1 and a second stack structure SS2. The substrate SUB may be, e.g., a silicon substrate, a germanium substrate, or a silicon-germanium substrate. The substrate SUB may include a cell array region CAR and a connection region CNR. As used herein, the term "or" is not an exclusive term, e.g., "A or B" would include A, B, or A and B.

The first and second stack structures SS1 and SS2 may extend in the first direction D1 from the cell array region CAR to the connection region CNR of the substrate SUB. The first and second stack structures SS1 and SS2 on the cell array region CAR of the substrate SUB may constitute the cell array CA of the three-dimensional semiconductor memory device discussed above with reference to FIG. 1.

In an implementation, each of the first and second stack structures SS1 and SS2 may include a first layer (e.g., layer group) L1, a second layer L2, a third layer L3, and a fourth layer L4 that are sequentially stacked on the substrate SUB. The first to fourth layers L1 to L4 may be stacked and spaced apart from each other in a vertical direction (e.g., the third direction D3). Each of the first to fourth layers (e.g., layer groups) L1 to L4 may include a word line WL that extends in the first direction D1, a plurality of channel layers CHL on the word line WL, and a plurality of data storage elements DS that are correspondingly connected to the plurality of channel layers CHL.

The word line WL on each layer may have a linear shape that extends (e.g., lengthwise) in the first direction D1. The word line WL may include a plurality of gate portions GEP adjacent to corresponding channel layers CHL (see FIG. 3). The word line WL may include a conductive material. In an implementation, the conductive material may include, e.g., doped semiconductor materials (doped silicon, doped germanium, or the like), conductive metal nitrides (titanium nitride, tantalum nitride, or the like), metals (tungsten, titanium, tantalum, or the like.), or metal-semiconductor compounds (tungsten silicide, cobalt silicide, titanium silicide, or the like).

Referring to FIG. 3, a gate insulating layer GI may cover a surface of the word line WL. The gate insulating layer GI may surround or wrap the surface of the word line WL. The gate insulating layer GI may include a high-k dielectric layer, a silicon oxide layer, a silicon nitride layer, a silicon oxynitride layer, or a combination thereof. The high-k dielectric layer may include, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The channel layers CHL on each layer may be arranged (e.g., spaced apart) in the first direction D1. Each of the channel layers CHL may extend (e.g., lengthwise) in the second direction D2 that intersects the first direction D1. Each of the channel layers CHL may be above or below the gate portion GEP of the word line WL. A relation between the channel layer CHL and the gate portion GEP of the word line WL will be discussed in greater detail below with reference to FIG. 3.

The gate insulating layer GI may be between the channel layer CHL and the word line WL. In an implementation, the gate insulating layer GI may separate the channel layer CHL from the word line WL. The channel layer CHL may include a semiconductor material that is formed using a deposition process performed on the word line WL. Even when a deposition process is employed to form an amorphous semiconductor material, the channel layer CHL may include the semiconductor material as long as the semiconductor material can serve as channels of memory cell transistors.

In an implementation, the channel layer CHL may include an amorphous oxide semiconductor. The channel layer CHL may include a compound of oxygen (O) and at least two metals selected from zinc (Zn), indium (In), gallium (Ga), and tin (Sn). In an implementation, the channel layer CHL may include indium-gallium-zinc oxide (IGZO) or indium-tin-zinc oxide (ITZO).

In an implementation, the channel layer CHL may include a two-dimensional semiconductor. In an implementation, the channel layer CHL may include metal chalcogenide, transition metal chalcogenide, graphene, or phosphorene. Either the metal chalcogenide or the transition metal chalcogenide may be metal oxide that is represented by a chemical formula, $MX_y$ (in which subscript y is 1, 2, or 3). In the chemical formula, M may be a metal atom or a transition metal atom, e.g., W, Mo, Ti, Zn, Zs, or Zr. X may be a chalcogen atom, e.g., S, Se, O, or Te. In an implementation, the channel layer CHL may include, e.g., graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $ZsSe_2$, $WO_3$, or $MoO_3$. The channel layer CHL may have a mono-layered structure or a multi-layered structure in which, e.g., two to one hundred, layers are stacked. The multi-layered structure may be achieved when a monolayer and its adjacent monolayer are combined with each other by van der Waals force.

Compared with a semiconductor channel such as a silicon channel, the channel layer CHL according to some embodiments may help eliminate floating body effects. In addition, the channel layer CHL according to an embodiment may be formed by a deposition process that uses an amorphous oxide semiconductor or a two-dimensional semiconductor, and it is possible to easily achieve vertically stacked channels and three-dimensional channels.

Referring back to FIG. 2, the data storage element DS may be connected to one end of the channel layer CHL. The data storage element DS may be parallel to the second direction D2 or an extending direction of the channel layer CHL. A first electrode EL1, which will be discussed below, included in the data storage element DS may extend in a direction parallel to the second direction D2.

The data storage element DS may be a memory element capable of storing data. The data storage element DS may be a memory element using a capacitor, a magnetic tunnel junction pattern, or a variable resistance body that includes a phase change material. In an implementation, the data storage element DS may be a capacitor.

The data storage elements DS of the first and second stack structures SS1 and SS2 may be three-dimensionally arranged. The data storage elements DS may be connected in common to a plate PLT between the first and second stack structures SS1 and SS2.

FIGS. 4A to 4C show various examples of a capacitor, or the data storage element DS. Referring to FIG. 4A, the data storage element DS may include a first electrode EL1, a second electrode EL2, and a dielectric layer DL. The first electrode EL1 may be connected to one end of the channel layer CHL. The one end of the channel layer CHL may be connected to the first electrode EL1 that serves as a drain region (or a source region). The second electrode EL2 may be connected to the plate PLT. The dielectric layer DL may be between the first electrode EL1 and the second electrode EL2. The first electrode EL1 may have a hollow cylindrical shape. The second electrode EL2 may be in a hollow space of the hollow cylindrical first electrode EL1.

The first and second electrodes EL1 and EL2 may each independently include, e.g., metallic materials (e.g., titanium, tantalum, tungsten, copper, or aluminum), conductive metal nitrides (e.g., titanium nitride or tantalum nitride), or doped semiconductor materials (e.g., doped silicon or doped germanium). The dielectric layer DL may include a high-k dielectric material, e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

Referring to FIG. 4B, the first electrode EL1 may have a hollow cylindrical shape the same as that discussed in FIG. 4A. The second electrode EL2 may be not only in an internal space of the first electrode EL1 but also on an outer surface of the first electrode EL1. In an implementation, the second electrode EL2 may surround the first electrode EL1.

Referring to FIG. 4C, the first electrode EL1 may have a solid cylindrical shape, or a pillar shape. The second electrode EL2 may surround an outer surface of the first electrode EL1.

In an implementation, the data storage element DS may have various capacitor structures.

The substrate SUB may be provided thereon with a plurality of bit lines BL that extend in a vertical direction (e.g., the third direction D3). The channel layers CHL, which are vertically stacked along the third direction D3, may be connected to each other through the bit line BL. The bit lines BL may be arranged along the first direction D1. The bit lines BL may be electrically connected to corresponding source regions (or drain regions) of the channel layers CHL that are vertically stacked. The bit lines BL may include, e.g., doped semiconductors, conductive metal nitrides, metals, or metal-semiconductor compounds.

A three-dimensional semiconductor memory device according to some embodiments may include the bit line BL that extends vertically and the word line WL that extend horizontally to intersect the bit line BL. Accordingly, process defects may decrease and device reliability may increase in achieving a three-dimensional memory cell array.

Each of the word lines WL may include a pad portion PDP on the connection region CNR of the substrate SUB. The pad portion PDP may be at an end of the word line WL. The pad portions PDP stacked on the connection region CNR may have a stepwise structure. A plurality of contacts CNT may be coupled to corresponding pad portions PDP that constitute the stepwise structure.

In an implementation, empty spaces in the first and second stack structures SS1 and SS2 may be filled with a dielectric material. In an implementation, the dielectric material may include, e.g., a silicon oxide layer, a silicon nitride layer, or a silicon oxynitride layer. The first and second stack structures SS1 and SS2 may be provided thereon with wiring lines that are electrically connected to the bit lines BL and the word lines WL. In an implementation, the wiring line may be electrically connected through the contact CNT to the word line WL.

Referring back to FIG. 3, one memory cell transistor MCT shown in FIG. 1 may be constituted by the channel layer CHL and the gate portion GEP of the word line WL in each of the first to fourth layers L1 to L4. The channel layer CHL may include a first end EN1 and a second end EN2 that are opposite to each other in the second direction D2. The first end EN1 of the channel layer CHL may be a source region (or a drain region) connected to the bit line BL. The second end EN2 of the channel layer CHL may be a drain region (or a source region) connected to the data storage element DS.

The gate portion GEP of the first layer L1 may be on a top surface TOS of the channel layer CHL. The gate portion GEP of the second layer L2 may be on a bottom surface BTS of the channel layer CHL. A structure of the channel layer CHL and the gate portion GEP of the first layer L1 may be asymmetrical to a structure of the channel layer CHL and the gate portion GEP in the second layer L2. In an implementation, a structure of the memory cell transistor MCT of the first layer L1 and a structure of the memory cell transistor MCT of the second layer L2 may be mirror-symmetrical to each other about a first central line CTL1 between the first layer L1 and the second layer L2.

The third layer L3 and the fourth layer L4 may be substantially the same as the first layer L1 and the second layer L2 discussed above. A structure of the memory cell transistor MCT of the third layer L3 and a structure of the memory cell transistor MCT of the fourth layer L4 may be mirror-symmetrical to each other about a second central line CTL2 between the third layer L3 and the fourth layer L4.

A memory cell structure of the first and second layers L1 and L2 may be the same as a memory cell structure of the third and fourth layers L3 and L4. In an implementation, a semiconductor memory device according to some embodiments may have a structure in which are stacked a plurality of repeat units each of which is constituted by two neighboring layers.

A first (e.g., vertical) interval PI1 may be defined to indicate an interval between the channel layer CHL of the first layer L1 and the channel layer CHL of the second layer L2. In this description, the term "interval" may mean a vertical pitch. In an implementation, the first interval PI1 may mean a vertical distance between the top surface TOS of the channel layer CHL of the first layer L1 and the top surface TOS of the channel layer CHL of the second layer L2.

A second interval PI2 may be defined to indicate an interval between the channel layer CHL of the second layer L2 and the channel layer CHL of the third layer L3. According to some embodiments, the first interval PI1 may be different from the second interval PI2. In an implementation, the first interval PI1 may be greater than the second interval PI2. This, as discussed above, may be caused by the fact that a structure of the memory cell transistor MCT in the first layer L1 is mirror-symmetrical to a structure of the memory cell transistor MCT in the second layer L2.

A third interval PI3 may be defined to indicate an interval between the word line WL of the first layer L1 and the word line WL of the second layer L2. A fourth interval PI4 may be defined to indicate an interval between the word line WL of the second layer L2 and the word line WL of the third layer L3. According to some embodiments, the third interval PI3 may be different from the fourth interval PI4. In an implementation, the third interval PI3 may be less than the fourth interval PI4. This may be caused by the insulating layer being between the word line WL of the first layer L1 and the word line WL of the second layer L2, and that not only an insulating layer but also two channel layers CHL are between the word line WL of the second layer L2 and the word line WL of the third layer L3.

Figure 5:
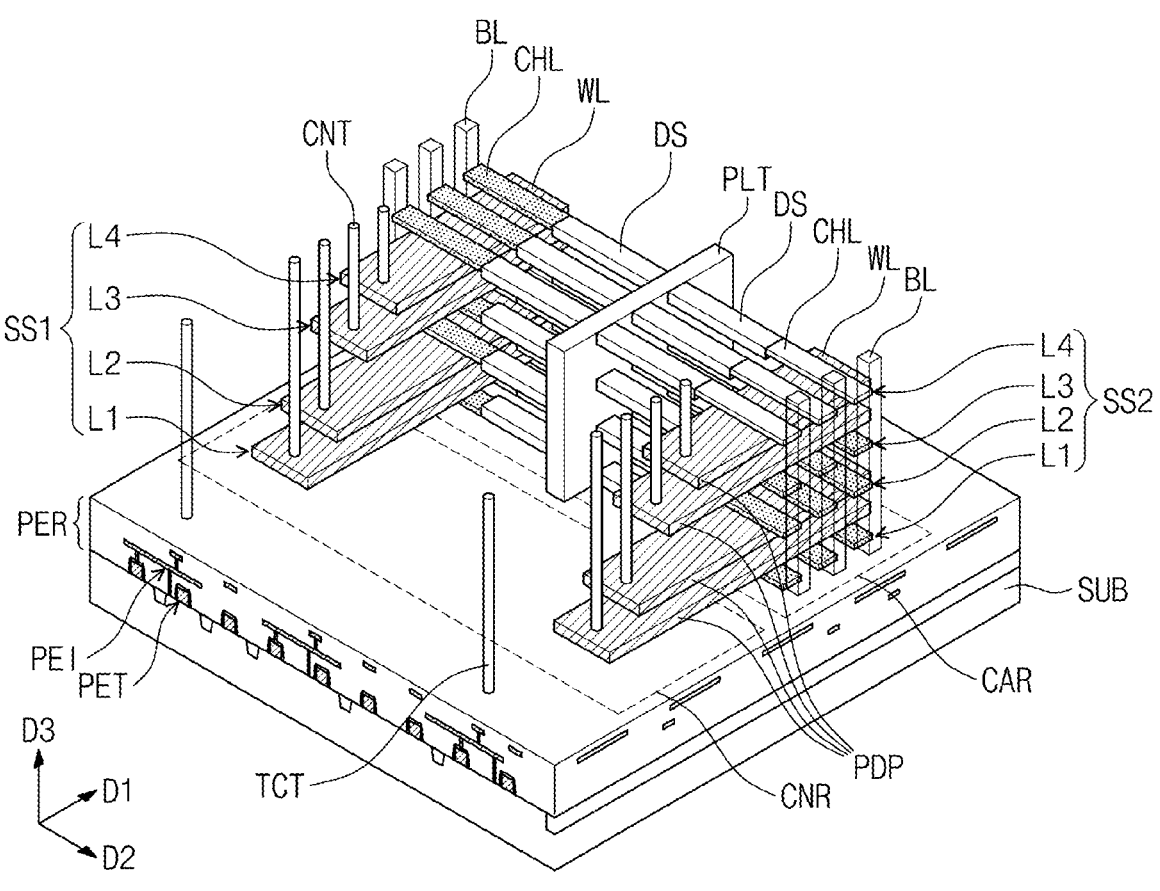
FIGS. 5, 6, and 7 illustrate perspective views of a three-dimensional semiconductor memory device according to some embodiments.
Figure 6:
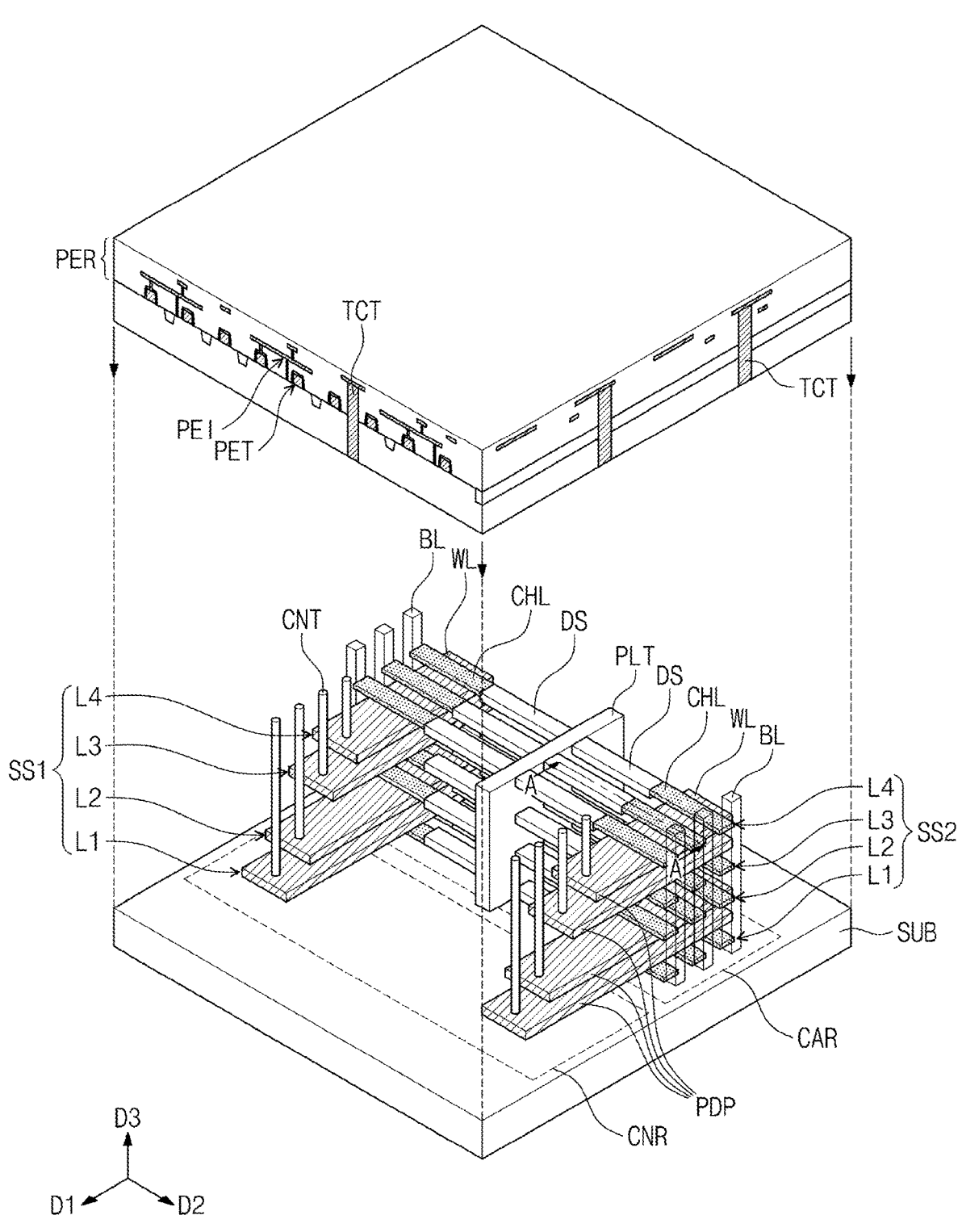
Figure 7:
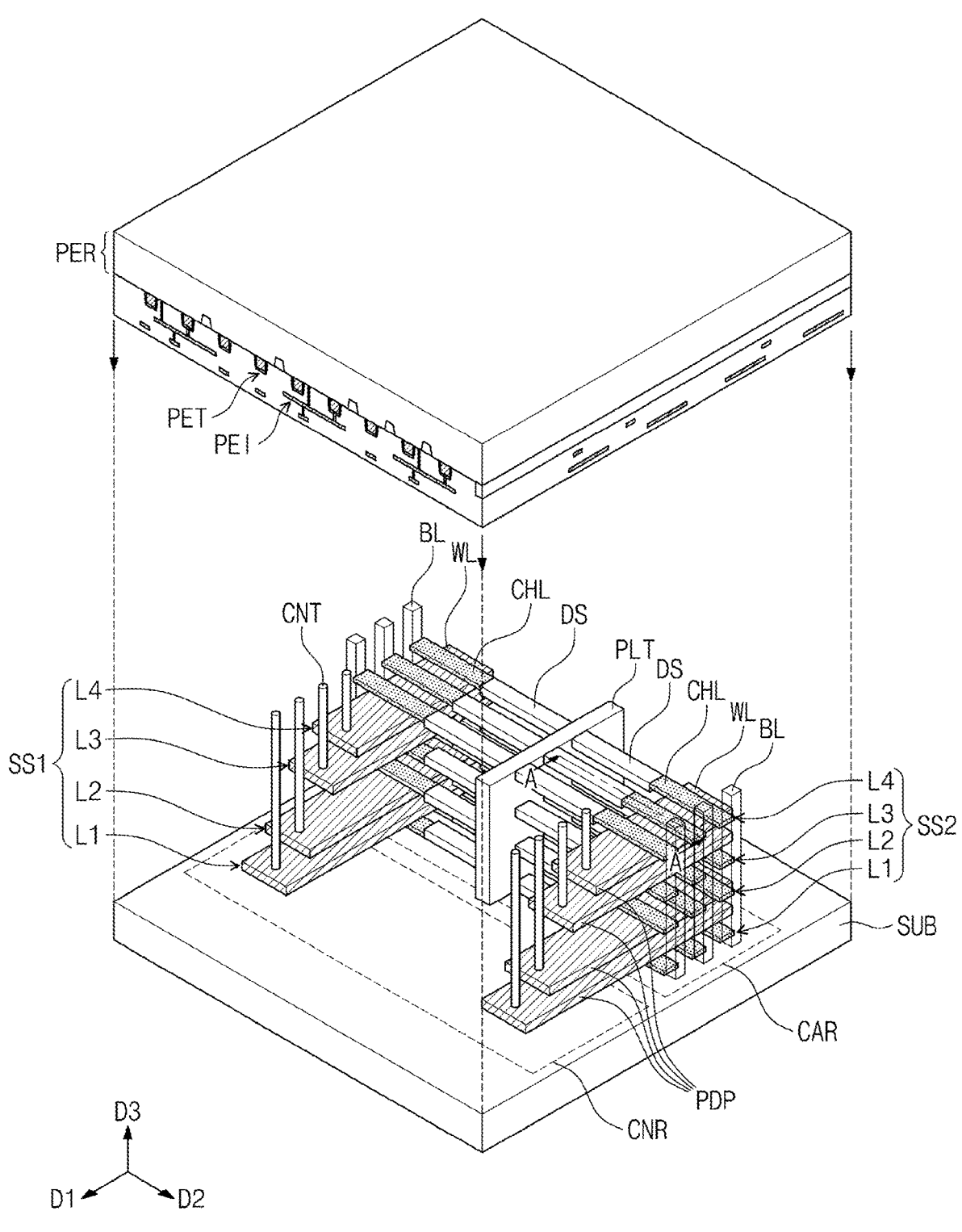

FIGS. 5, 6, and 7 illustrate perspective views of a three-dimensional semiconductor memory device according to some embodiments. In the following embodiments according to FIGS. 5 to 7, a repeated detailed description of technical features similar to those discussed with reference to FIGS. 1 to 4C may be omitted, and a difference thereof will be discussed in detail.

Referring to FIG. 5, a peripheral circuit layer PER may be on the substrate SUB. The peripheral circuit layer PER may be between the substrate SUB and the first and second stack structures SS1 and SS2. In an implementation, the peripheral circuit layer PER may be below a memory cell array layer that is constituted by the first and second stack structures SS1 and SS2.

The peripheral circuit layer PER may include a plurality of peripheral transistors PET and a plurality of peripheral lines PEI on the substrate SUB. The peripheral lines PEI may be on the peripheral transistors PET and may be connected through contacts to the peripheral transistors PET.

The peripheral circuit layer PER may further be provided thereon with through contacts TCT. The through contacts TCT may vertically extend toward the peripheral circuit layer PER from wiring lines on the first and second stack structures SS1 and SS2. The peripheral circuit layer PER may be electrically connected by the through contacts TCT to the wiring lines on the first and second stack structures SS1 and SS2.

In an implementation, the peripheral circuit layer PER may include a sense amplifier electrically connected to the bit lines BL. The peripheral circuit layer PER may include sub-word line drivers or row decoders electrically connected to word lines WL.

Referring to FIG. 6, an upper substrate USUB and a peripheral circuit layer PER may be on a memory cell array layer that is constituted by the first and second stack structures SS1 and SS2. The peripheral circuit layer PER may be on the upper substrate USUB (e.g., a semiconductor wafer). A description of the peripheral circuit layer PER may be similar to that discussed above with reference to FIG. 5. A wafer bonding method may be employed to bond the upper substrate USUB to the substrate SUB on which the first and second stack structures SS1 and SS2 are formed.

One or more through contacts TCT may vertically extend from the peripheral lines PEI of the peripheral circuit layer PER and may penetrate the upper substrate USUB. The through contacts TCT may be connected to the wiring lines on the first and second stack structures SS1 and SS2. For example, the peripheral circuit layer PER may be electrically connected via the through contacts TCT to the wiring lines on the first and second stack structures SS1 and SS2.

Referring to FIG. 7, an upper substrate USUB and a peripheral circuit layer PER may be on a memory cell array layer that is constituted by the first and second stack structures SS1 and SS2. The peripheral circuit layer PER may face the substrate SUB. In an implementation, the upper substrate USUB may be positioned at a top portion, thereby being externally exposed.

In an implementation, one or more metal pads (e.g., copper) may be between and electrically connected to the peripheral circuit layer PER and the memory cell array layer. In an implementation, a first metal pad at top of the memory cell array layer may be bonded to a second metal pad at bottom of the peripheral circuit layer PER, and thus the wiring line of the memory cell array layer may be electrically connected to the peripheral line PEI of the peripheral circuit layer PER.

Figure 8:
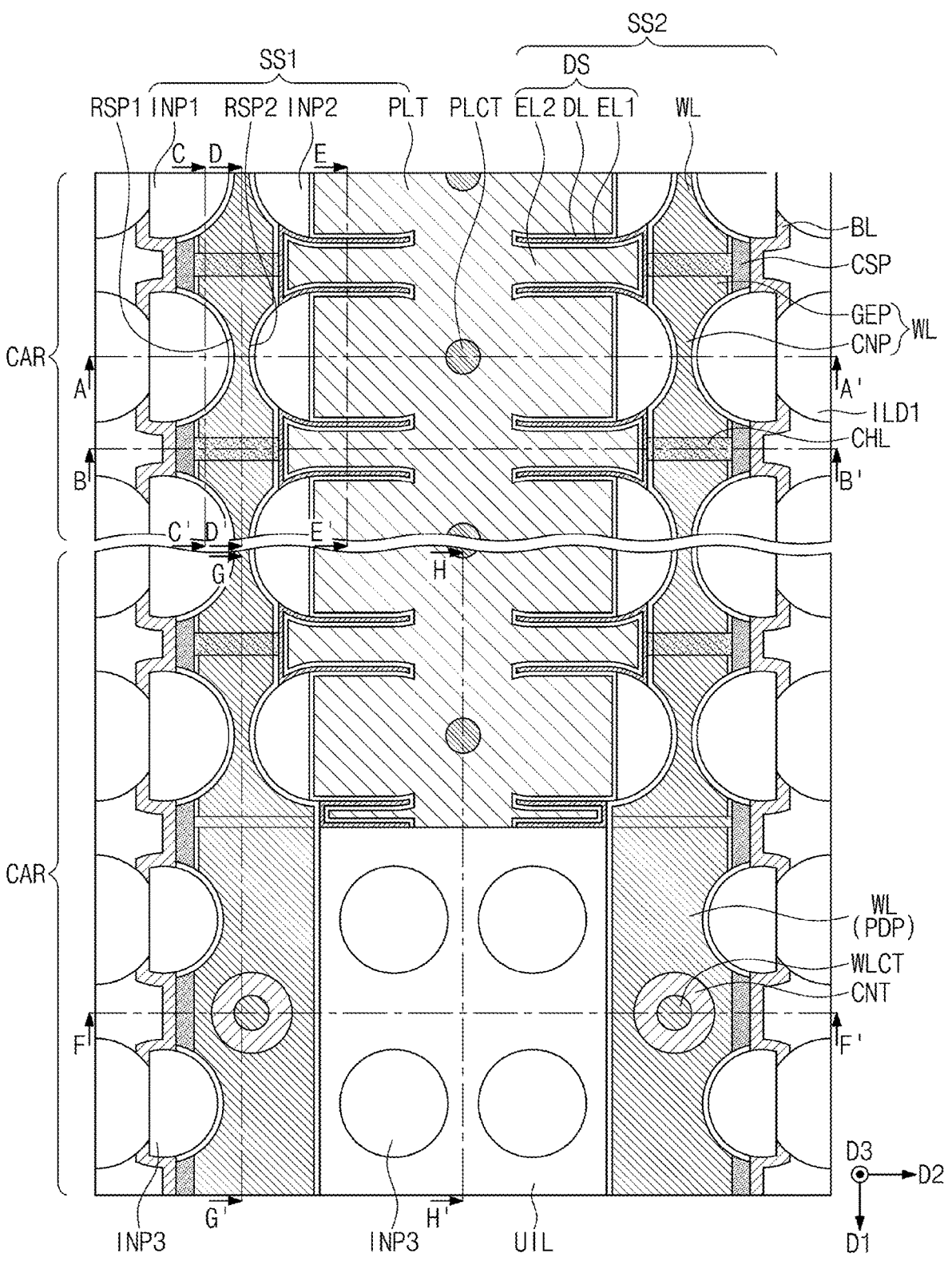
FIG. 8 illustrates a plan view of a three-dimensional semiconductor memory device according to some embodiments.

FIG. 8 illustrates a plan view of a three-dimensional semiconductor memory device according to some embodiments. FIGS. 9A, 9B, 9C, 9D, 9E, 9F, 9G, and 9H illustrate cross-sectional views respectively taken along lines A-A', B-B', C-C', D-D', E-E', F-F', G-G', and H-H' of FIG. 8. In the embodiment that follows, a repeated detailed description of technical features similar to those discussed above with reference to FIGS. 1 to 7 may be omitted, and a difference thereof will be explained in detail.

With reference to FIGS. 8 and 9A to 9E, the following will describe a cell array structure on a cell array region CAR of a substrate SUB. First and second stack structures SS1 and SS2 may be on the cell array region CAR of the substrate SUB. The first and second stack structures SS1 and SS2 may be adjacent in a second direction D2 to each other across a plate PLT. The first and second stack structures SS1 and SS2 may be mirror-symmetrical to each other about the plate PLT.

Figure 9A:
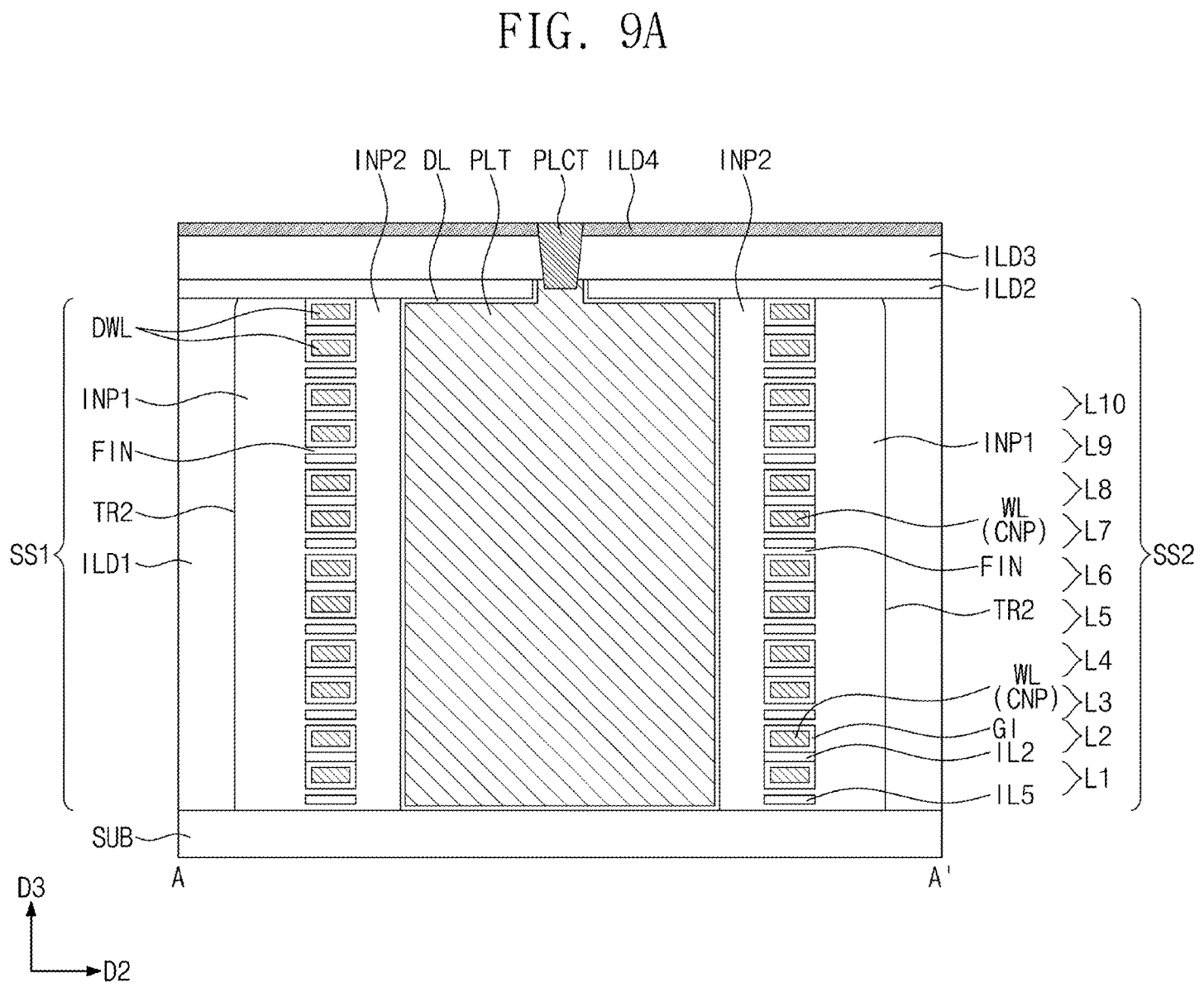
Figure 9B:
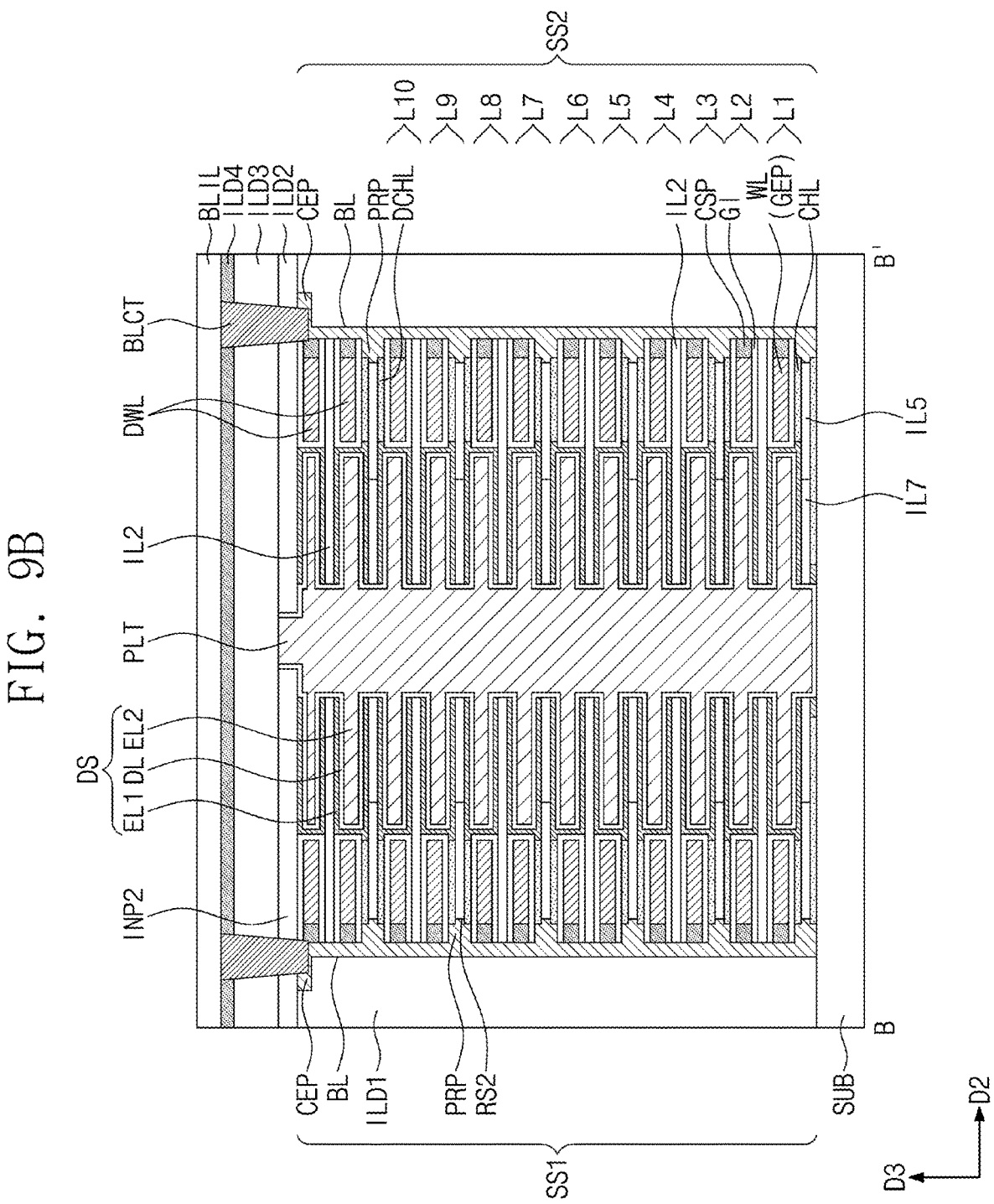
Figure 9C:
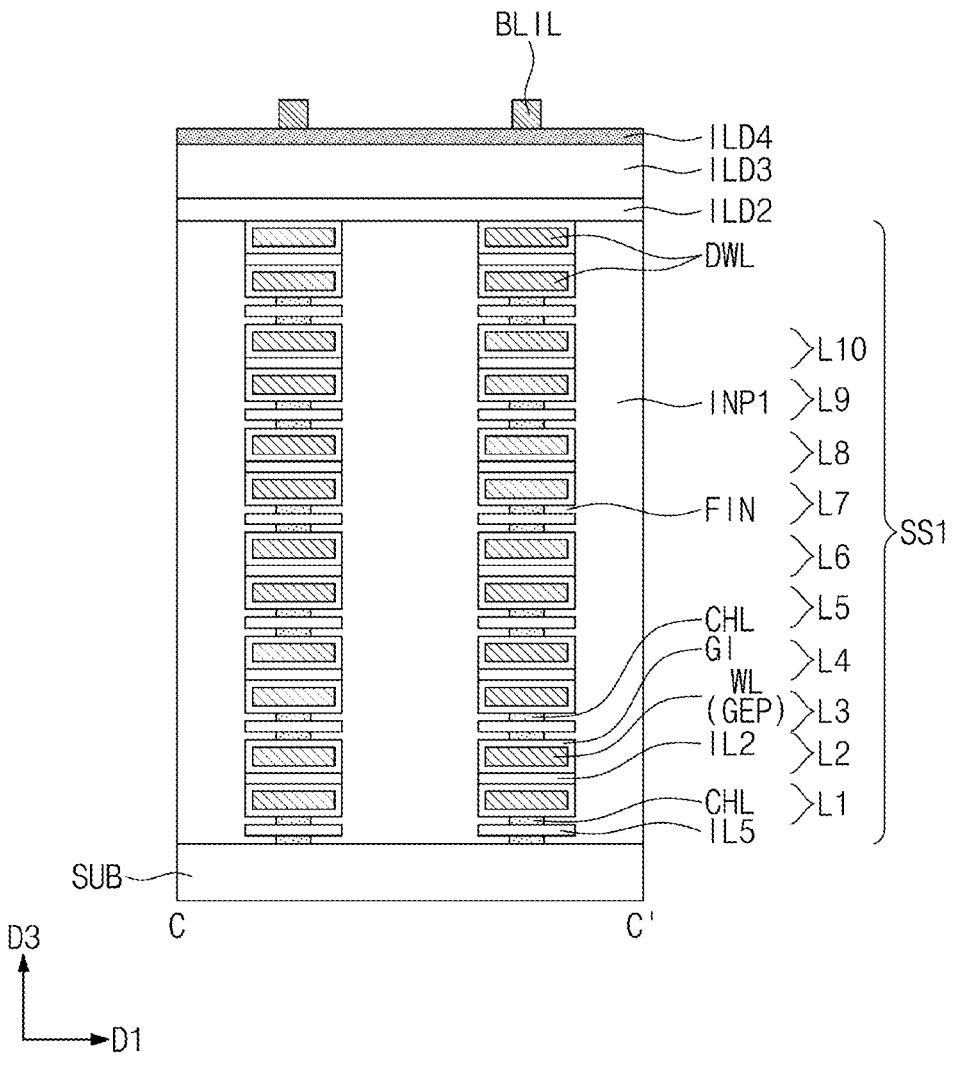

Referring to FIG. 9B, each of the first and second stack structures SS1 and SS2 may include first to tenth layers L1 to L10 that are sequentially stacked on the substrate SUB. Each of the first to tenth layers L1 to L10 may include a word line WL, a channel layer CHL, a gate insulating layer GI, a capping pattern CSP, and a protrusion portion PRP of a bit line BL. Each of the first to tenth layers L1 to L10 may further include a data storage element DS electrically connected to the channel layer CHL. In an implementation, an additional layer may be repeatedly stacked on the tenth layer L10.

Representatively, the first layer L1 may be configured such that the channel layer CHL is provided on its top surface with a gate portion GEP of the word line WL. For the second layer L2, the channel layer CHL may be provided on its bottom surface with a gate portion GEP of the word line WL. In an implementation, as discussed above with reference to FIG. 3, the gate portion GEP and the channel layer CHL in the first layer L1 may be mirror-symmetrical to the gate portion GEP and the channel layer CHL in the second layer L2.

A second insulating layer IL2 may be between the first layer L1 and the second layer L2. A fifth insulating layer IL5 may be between the second layer L2 and the third layer L3. In an implementation, the second insulating layer IL2 may be between a $(2N-1)^{th}$ layer and a $2N^{th}$ layer, and the fifth insulating layer IL5 may be between the $2N^{th}$ layer and a $(2(N+1)-1)^{th}$ layer. Herein, N is an integer equal to or greater than 1. The fifth insulating layer IL5 may allow the channel layer CHL in the $2N^{th}$ layer to separate vertically (e.g., in a third direction D3) from the channel layer CHL in the $((2(N+1)-1)^{th}$ layer. In an implementation, the second insulating layer IL2 may include SiCO or SiCON, and the fifth insulating layer IL5 may include silicon oxide.

The bit line BL may extend in a vertical direction (e.g., the third direction D3) along a sidewall of a corresponding one of the first and second stack structures SS1 and SS2. The bit line BL may include a plurality of protrusion portions PRP that horizontally protrude toward the channel layer CHL. The protrusion portion PRP of the bit line BL may be connected across the fifth insulating layer IL5 to the channel layers CHL that are vertically adjacent to each other. In an implementation, the protrusion portion PRP of the bit line BL may be coupled in common to the channel layer CHL in the $2N^{th}$ layer and the channel layer CHL on the $(2(N+1)-1)^{th}$ layer. The channel layers CHL in the first to tenth layers L1 to L10 aligned in the third direction D3 may be connected in common to the bit line BL through the protrusion portions PRP.

The word lines WL in the first to tenth layers L1 to L10 may be stacked and aligned in the third direction D3. Each of the word lines WL may have a linear shape that extends in a first direction D1.

The word line WL may include gate portions GEP and connection portions CNP that connect the gate portions GEP to each other. The gate portions GEP may be on corresponding channel layers CHL that are arranged in the first direction D1. The connection portion CNP may connect to each other the gate portions GEP that are adjacent to each other.

Referring to FIG. 8, when viewed in plan, the word line WL may include a first recessed sidewall RSP1 and a second recessed sidewall RSP2 that are on opposite sides thereof. The first and second recessed sidewalls RSP1 and RSP2 may define the connection portion CNP. The first and second recessed sidewalls RSP1 and RSP2 may cause the connection portion CNP to have a width less than that of the gate portion GEP. The connection portion CNP may have a bottleneck shape. The connection portion CNP having the first and second recessed sidewalls RSP1 and RSP2 may allow the word line WL to have a profile that is not straight but wavy.

Referring to FIG. 9B, the capping pattern CSP may be between the bit line BL and the gate portion GEP of the word line WL. The capping pattern CSP may electrically insulate the bit line BL from the gate portion GEP of the word line WL.

The channel layer CHL in the $(2N-1)^{th}$ layer may be on a bottom surface of the gate portion GEP that corresponds thereto. The channel layer CHL in the $2N^{th}$ layer may be on a top surface of the gate portion GEP that corresponds to thereto. A memory cell transistor according to some embodiments may have a three-dimensional structure in which the channel layer CHL is above or below the gate portion GEP. As regards the memory cell transistor according to some embodiments, channel controllability of the gate portion GEP may be increased due to the channel layer CHL that is deposited to have a small thickness.

In an implementation, as discussed above with reference to FIG. 3, a first interval between the channel layer CHL in the $(2N-1)^{th}$ layer and the channel layer CHL in the $2N^{th}$ layer may be greater than a second interval between the channel layer CHL in the $2N^{th}$ layer and the channel layer CHL in the $((2(N+1)-1)^{th}$ layer. A third interval between the word line WL in the $(2N-1)^{th}$ layer and the word line WL in the $2N^{th}$ layer may be less than a fourth interval between the word line WL in the $2N^{th}$ layer and the word line WL in the $(2(N+1)-1)^{th}$ layer.

The channel layer CHL in the $(2N-1)^{th}$ layer may be below the word line WL in the $(2N-1)^{th}$ layer. The channel layer CHL in the $2N^{th}$ layer may be above the word line WL in the $2N^{th}$ layer. Identically to the $(2N-1)^{th}$ layer, the channel layer CHL in the $(2(N+1)-1)^{th}$ layer may be below the word line WL in the $(2(N+1)-1)^{th}$ layer. The second insulating layer IL2 may be between the word line WL in the $(2N-1)^{th}$ layer and the word line WL in the $2N^{th}$ layer. Two channel layers CHL and the fifth insulating layer IL5 may be between the word line WL in the $2N^{th}$ layer and the word line WL in the $(2(N+1)-1)^{th}$ layer.

In an implementation, a shield pattern may be included in the second insulating layer IL2 or the fifth insulating layer IL5 between the word lines WL that are vertically adjacent to each other. The shield pattern may help reduce coupling capacitance caused by mutual interference between neighboring word lines WL. In an implementation, the shield pattern may extend in the first direction D1 together with the word line WL, and may be connected to a node that applies a ground voltage.

In an implementation, an air gap may be included in the second insulating layer IL2 or the fifth insulating layer IL5 between the word lines WL that are vertically adjacent to each other. The air gap may have a relatively low dielectric constant, and it may be possible to reduce coupling capacitance caused by mutual interference (e.g., crosstalk) between neighboring word lines WL. When the air gap is absent, either the second insulating layer IL2 or the fifth insulating layer IL5 may have an increased thickness to reduce capacitance between the word lines WL.

In contrast, according to some embodiments, the word lines WL may be provided therebetween the air gap whose dielectric constant is low, and thus at least one selected from the second and fifth insulating layers IL2 and IL5 may have a relatively small thickness. In conclusion, the first and second stack structures SS1 and SS2 may have their relatively small heights.

Each of the channel layers CHL may include a channel region, a source region, and a drain region. The source region (or the drain region) of the channel layer CHL may be connected to the protrusion portion PRP of the bit line BL. The drain region (or the source region) of the channel layer CHL may be connected to a first electrode EL1 of a data storage element DS which will be discussed below. The channel region of the channel layer CHL may be between the source region and the drain region. The channel region of the channel layer CHL may vertically overlap the gate portion GEP.

The gate insulating layer GI may be between the channel layer CHL and the gate portion GEP. The gate insulating layer GI may cover a surface of the word line WL. The gate insulating layer GI may cover a surface of the capping pattern CSP.

The protrusion portion PRP of the bit line BL may extend onto an end of the channel layer CHL and may directly contact the channel layer CHL. As a result, the bit line BL may be electrically connected to the source region (or the drain region) of the channel layer CHL.

Referring to FIGS. 8 and 9A, a plurality of first dielectric pillars INP1 may penetrate the first and second stack structures SS1 and SS2. The first dielectric pillars INP1 may be arranged along the first direction D1. Each of the first dielectric pillars INP1 may form or be complementary to a first recessed sidewall RSP1 of the word line WL.

A plurality of second dielectric pillars INP2 may penetrate the first and second stack structures SS1 and SS2. The second dielectric pillars INP2 may be arranged along the first direction D1. The second dielectric pillars INP2 and the first dielectric pillars INP1 may be correspondingly adjacent to each other across the connection portions CNP of the word line WL. Each of the second dielectric pillars INP2 may form or be complementary to a second recessed sidewall RSP2 of the word line WL.

Figure 9D:
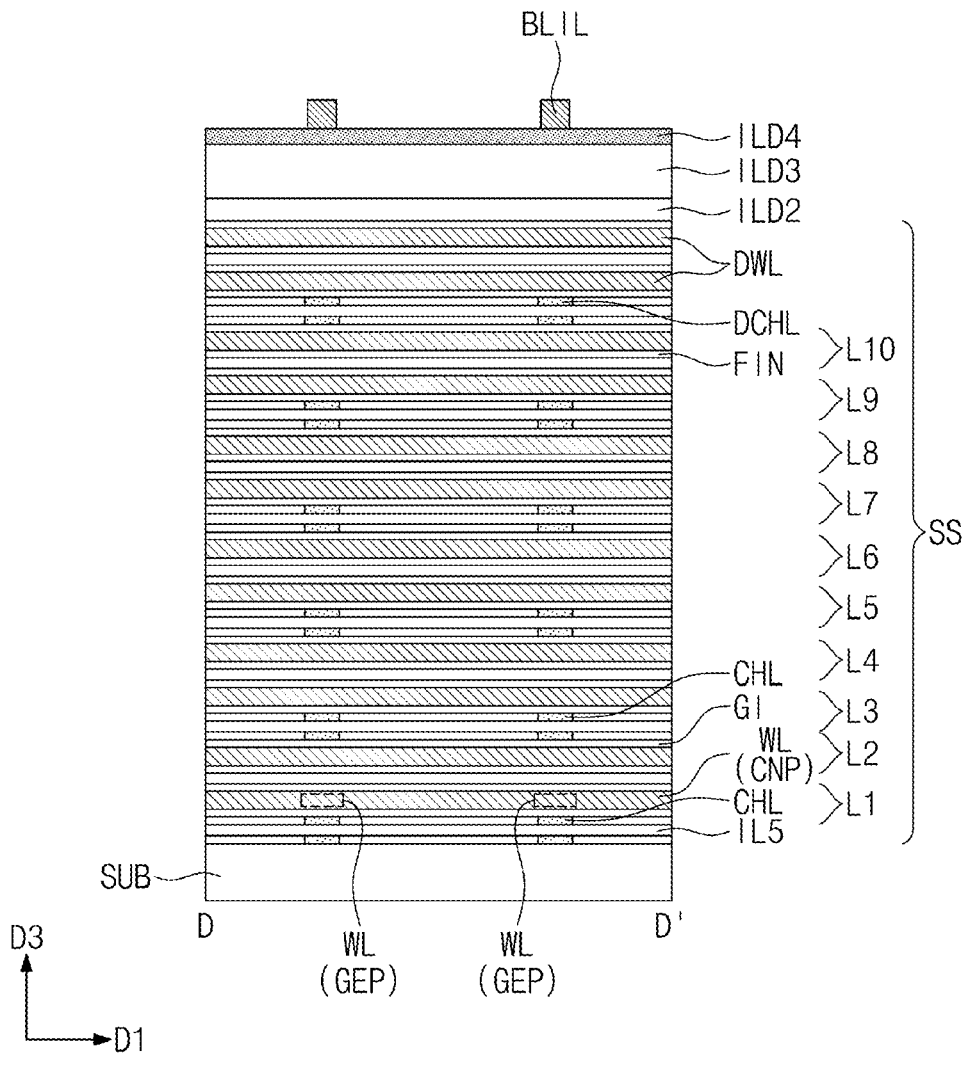

Referring to FIG. 9A, the first and second dielectric pillars INP1 and INP2 may be connected to each other via a filling insulating layer FIN. Referring to FIG. 9D, the channel layers CHL may be divided from each other by the filling insulating layer FIN and the fifth insulating layer IL5. The first and second dielectric pillars INP1 and INP2 may include a silicon oxide layer.

Figure 9E:
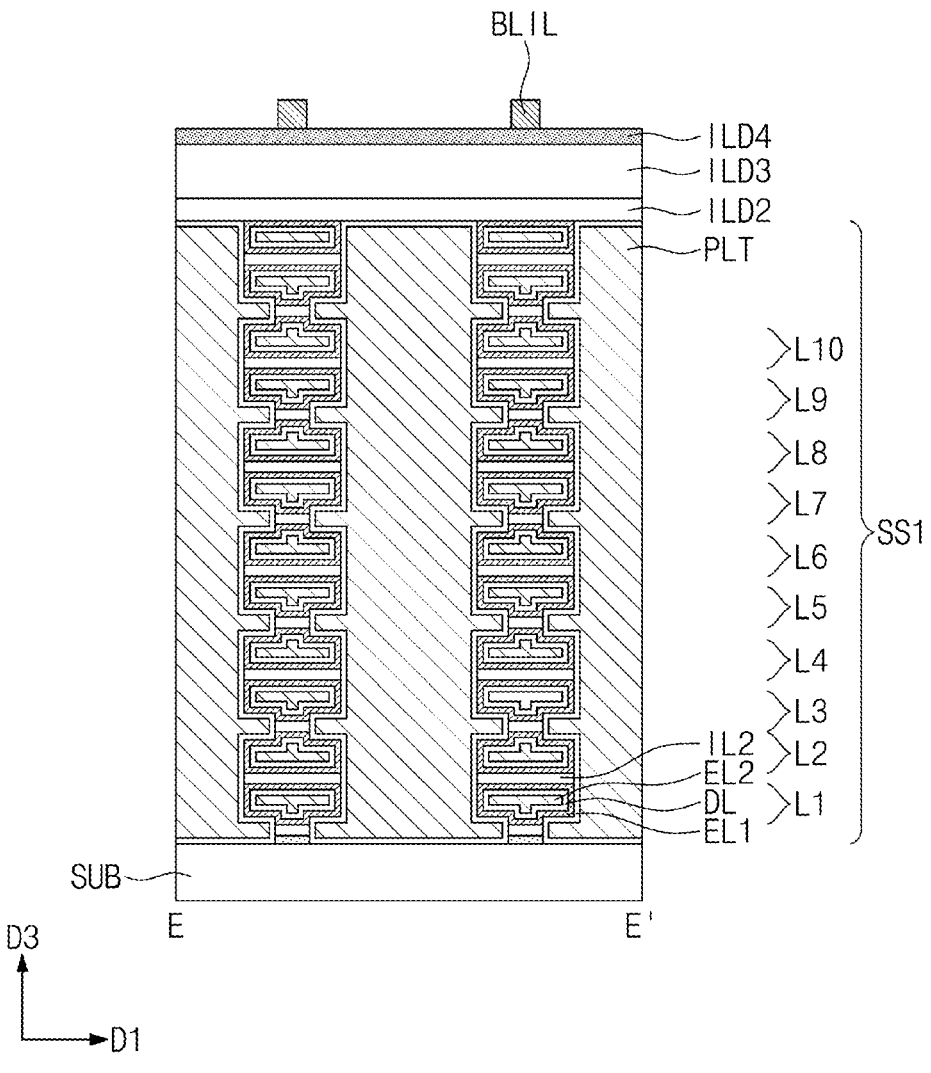
Figure 9F:
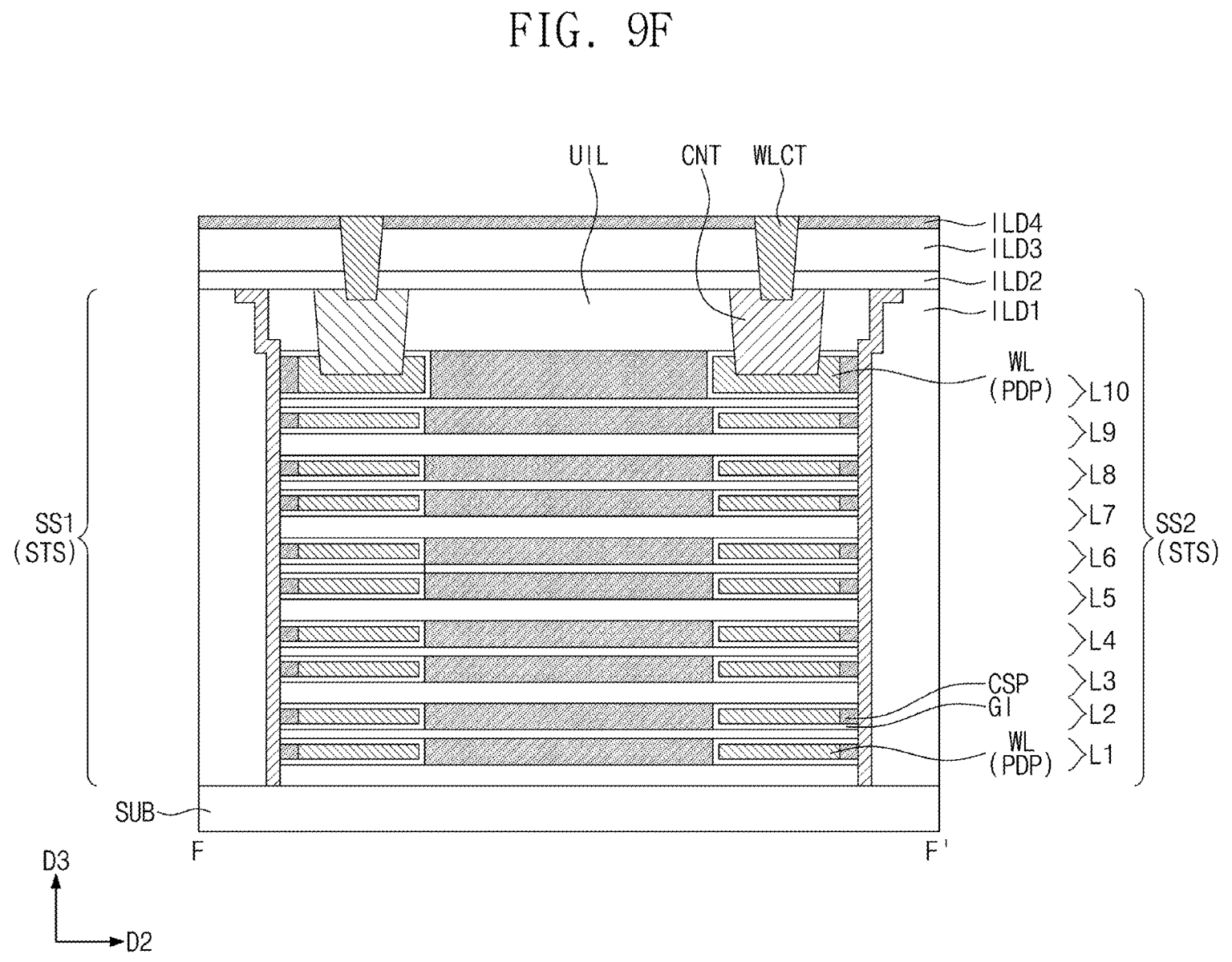

Referring to FIGS. 9B and 9E, each of the data storage elements DS may include a first electrode EL1, a dielectric layer DL, and a second electrode EL2. The data storage elements DS of each of the first and second stack structures SS1 and SS2 may share one dielectric layer DL and one second electrode EL2. In an implementation, in each of the first and second stack structures SS1 and SS2, the first electrode EL1 may be provided in plural, and one dielectric layer DL may cover surfaces of the plurality of first electrodes EL1. One second electrode EL2 may be on one dielectric layer DL.

The data storage element DS according to some embodiments may have the capacitor structure discussed above with reference to FIG. 4A. In an implementation, referring to FIG. 9E, the first electrode EL1 may have a hollow cylindrical shape. The second electrode EL2 may be inserted into an internal space of the hollow cylindrical first electrode EL1. In an implementation, the data storage element DS may have the same structure as that discussed above with reference to FIG. 4B or 4C.

The first electrodes EL1 on a single layer may be arranged in the first direction D1. The first electrode EL1 may be connected to an end of the channel layer CHL. In an implementation, the first electrode EL1 may be connected to the drain region (or the source region) of the channel layer CHL. The second electrodes EL2 may be connected in common to the plate PLT. The plate PLT may be between the first and second stack structures SS1 and SS2.

Each of the first and second stack structures SS1 and SS2 may include at least one dummy word line DWL and at least one dummy channel layer DCHL that are provided on the tenth layer L10. In an implementation, the dummy word line DWL and the dummy channel layer DCHL may serve as a process buffer structure for the data storage elements DS and memory cell transistors that constitute the first to tenth layers L1 to L10 below the dummy word line DWL and the dummy channel layer DCHL.

A first interlayer insulating layer ILD1 may be on the sidewall of each of the first and second stack structures SS1 and SS2. The first interlayer insulating layer ILD1 may cover the bit lines BL. The first interlayer insulating layer ILD1 may electrically insulate from each other the bit lines BL that are arranged along the first direction D1.

A second interlayer insulating layer ILD2 may be on the first and second stack structures SS1 and SS2. Referring to FIG. 9A, an upper portion of the plate PLT may penetrate the second interlayer insulating layer ILD2 to thereby protrude upwardly. Third and fourth interlayer insulating layers ILD3 and ILD4 may be on the second interlayer insulating layer ILD2. Each of the first to fourth interlayer insulating layers ILD1 to ILD4 may include, e.g., a silicon nitride layer, a silicon oxynitride layer, a carbon-containing silicon oxide layer, a carbon-containing silicon nitride layer, or a carbon-containing silicon oxynitride layer.

Each of the bit lines BL may include a pad CEP at top thereof. A bit-line contact BLCT may penetrate the second, third, and fourth interlayer insulating layers ILD2, ILD3, and ILD4. The bit-line contact BLCT may be coupled to the pad CEP of the bit line BL.

Bit-line straps BLIL may be on the fourth interlayer insulating layer ILD4. The bit-line straps BLIL may have parallel linear shapes that extend in the second direction D2. Each of the bit-line straps BLIL may be a metal line. The bit-line strap BLIL may be connected to the bit-line contact BLCT and may be electrically connected through the bit-line contact BLCT to the bit line BL.

A plate contact PLCT may penetrate the third and fourth interlayer insulating layers ILD3 and ILD4 and is coupled to a protruding part of the plate PLT. The plate contact PLCT may be electrically connected through a via to an upper metal line.

With reference to FIGS. 8 and 9A to 9H, the following will describe a pad structure on the connection region CNR of the substrate SUB. The word lines WL may extend in the first direction D1 from the cell array region CAR to the connection region CNR. Each of the word lines WL may include a pad portion PDP on the connection region CNR.

As discussed above with reference to FIG. 2, the word lines WL on the connection region CNR may constitute a stepwise structure STS that has a staircase shape. The stepwise structure STS may have a height (in the third direction D3) that decreases in the first direction D1 (e.g., at different points along the first direction D1). The word lines WL stacked in the stepwise structure STS may be exposed one by one in a downward direction.

Figure 9G:
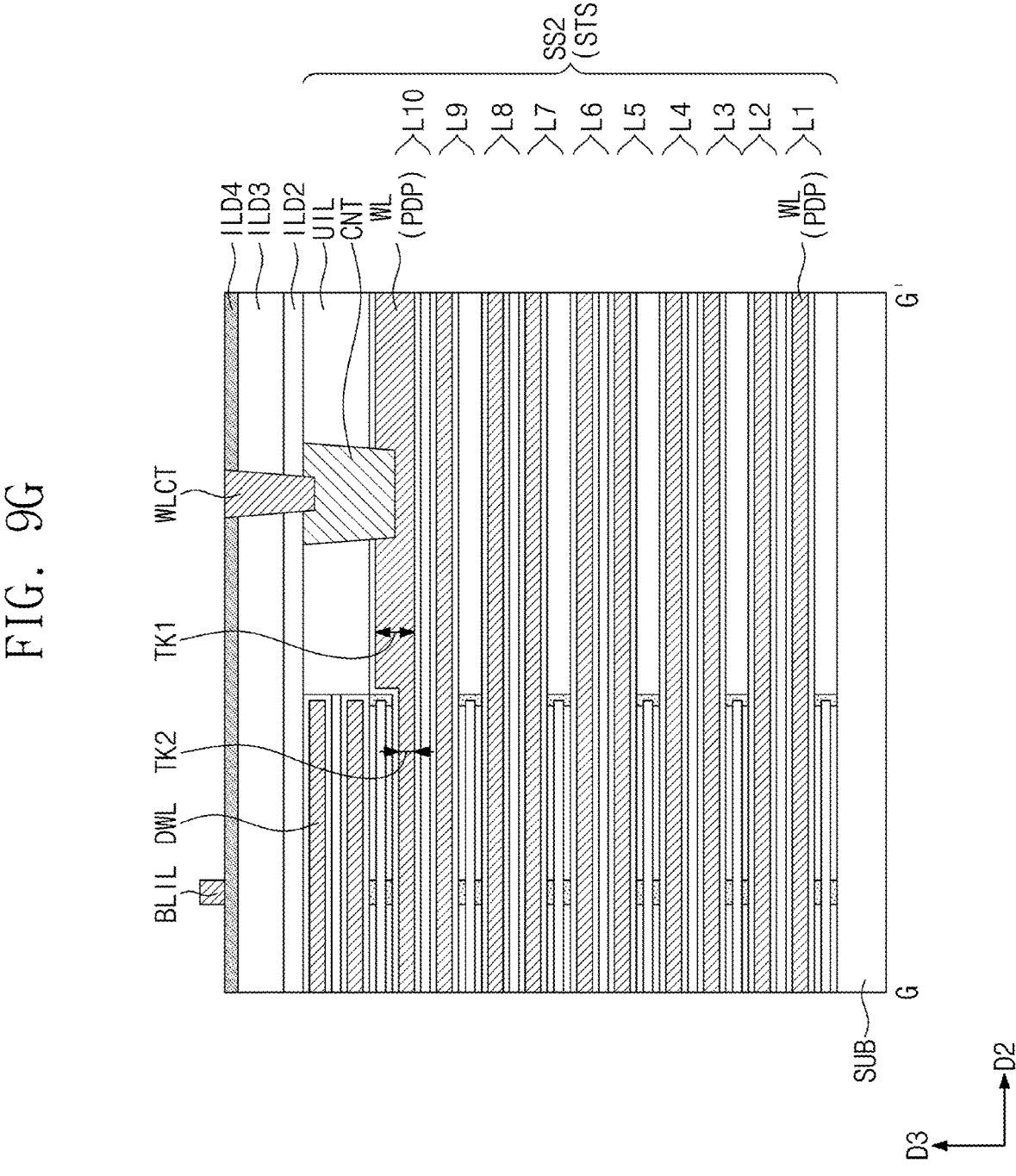
Figure 9H:
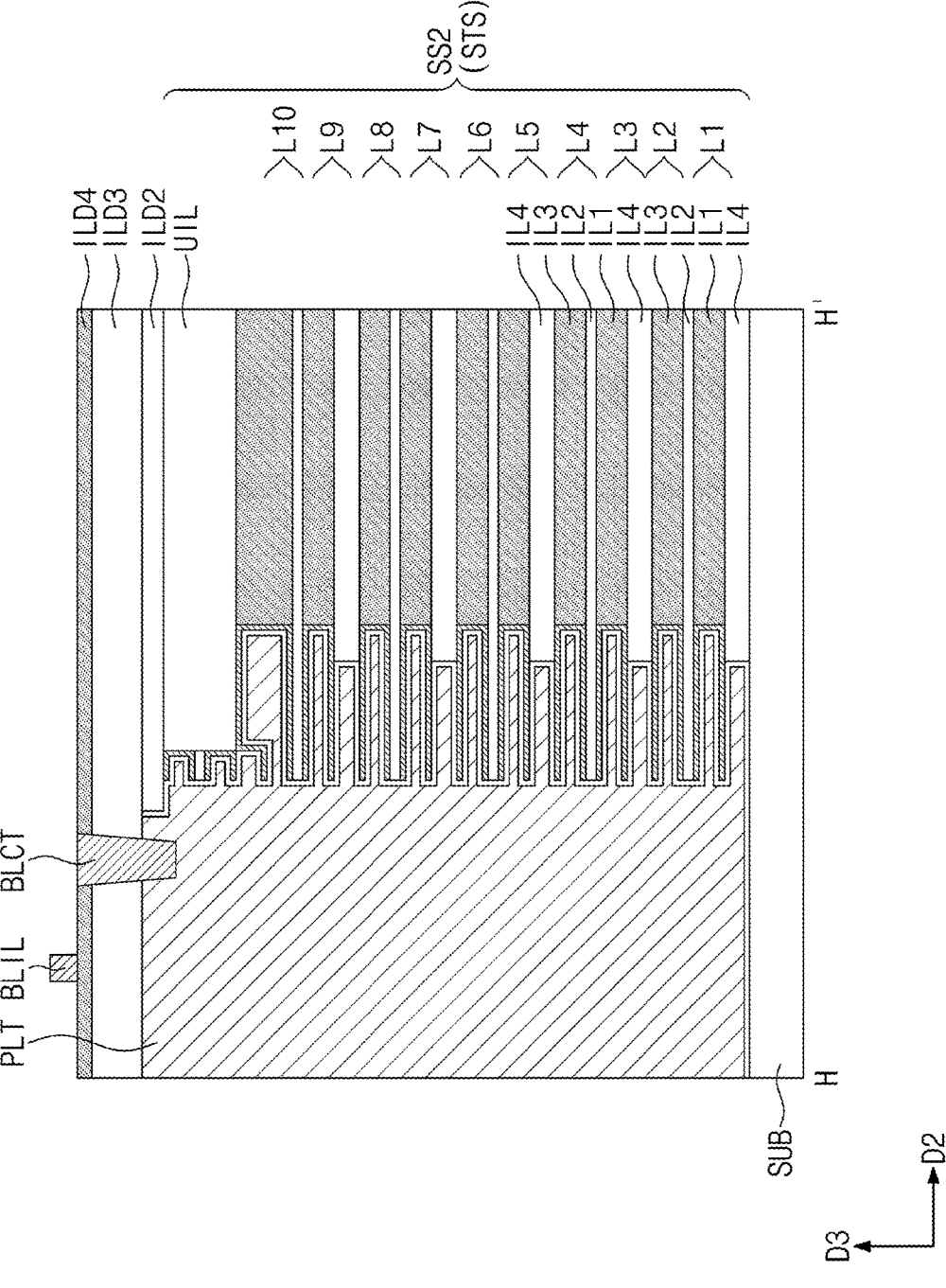
Figure 10:
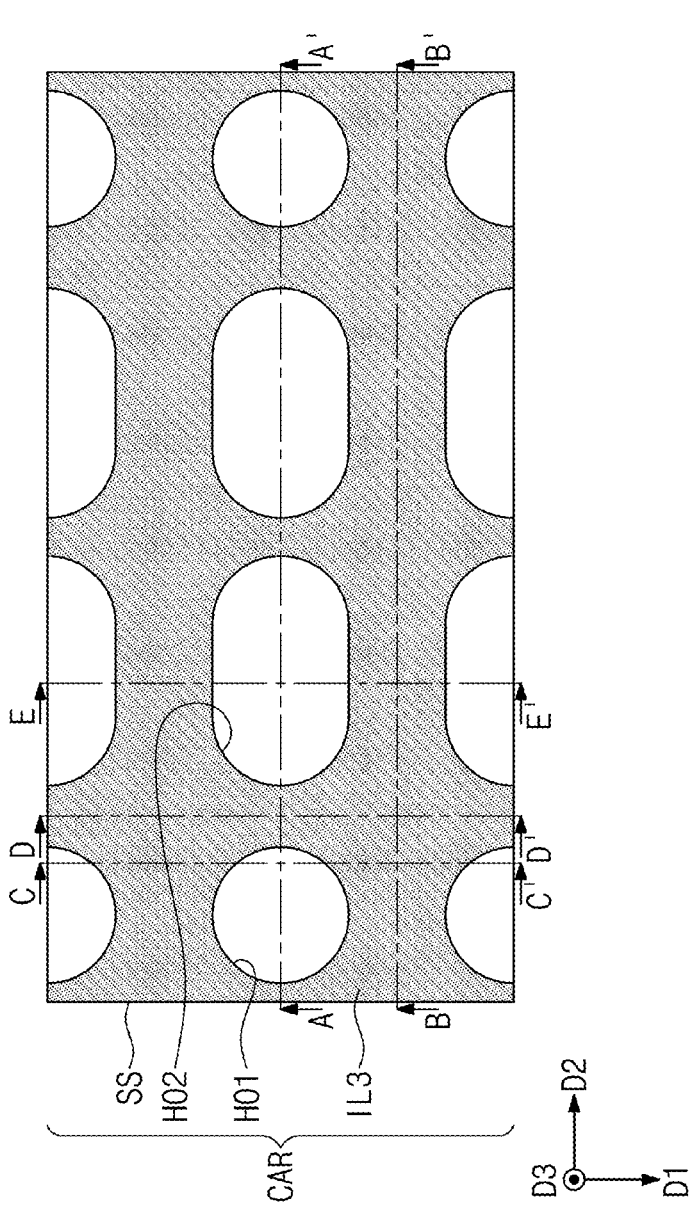
FIGS. 10, 12, 14, 16, 18, 20, 22, 24, 26, 28, 30, 32, 34, 36, 38, 40, 42, and 44 illustrate plan views of stages in a method of fabricating a three-dimensional semiconductor memory device according to some embodiments.
Figure 11A:
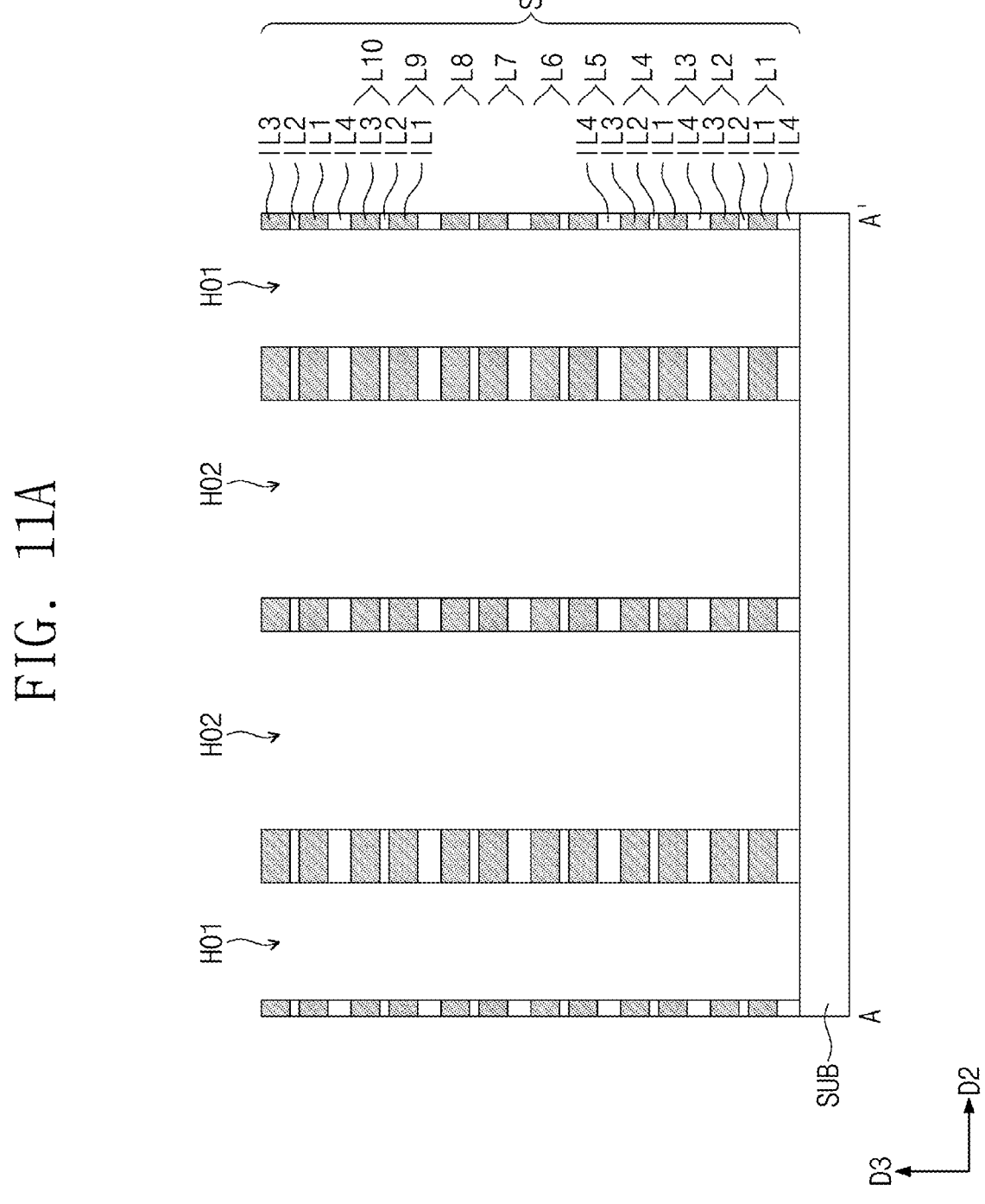
Figure 11B:
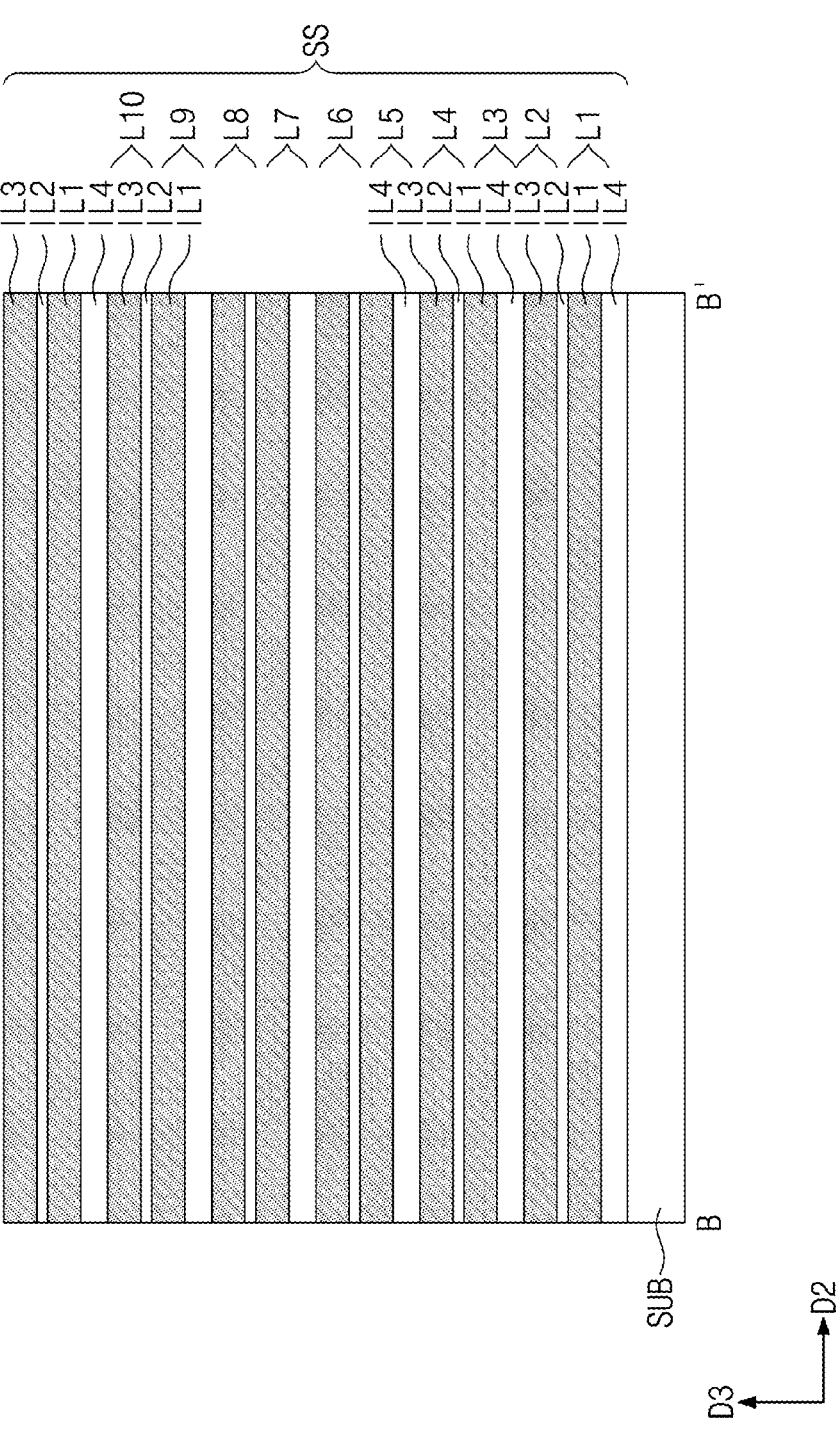
Figure 11C:
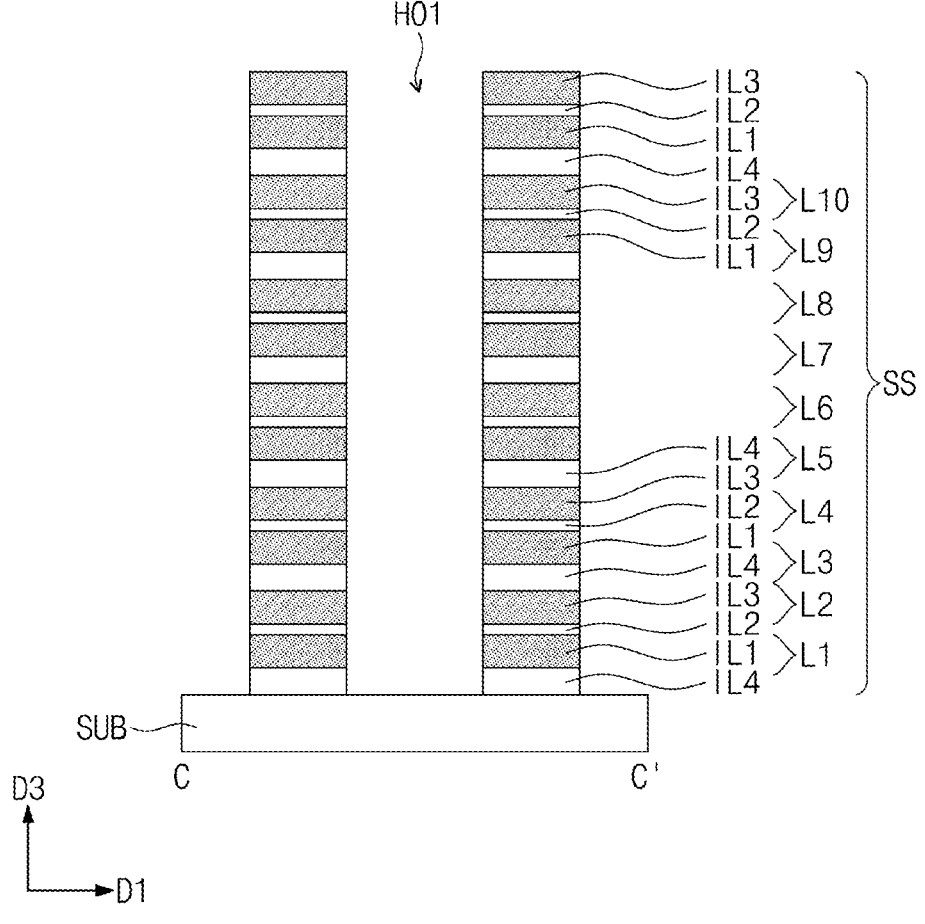
FIGS. 11C, 13C, 15C, 17C, 19C, 21C, 23C, 25C, 27C, 29C, 31C, 33C, 35C, 37C, 39C, 41C, 43C, and 45C illustrate cross-sectional views taken along line C-C' of FIGS. 10, 12, 14, 16, 18, 20, 22, 24, 26, 28, 30, 32, 34, 36, 38, 40, 42, and 44, respectively.
Figure 11D:
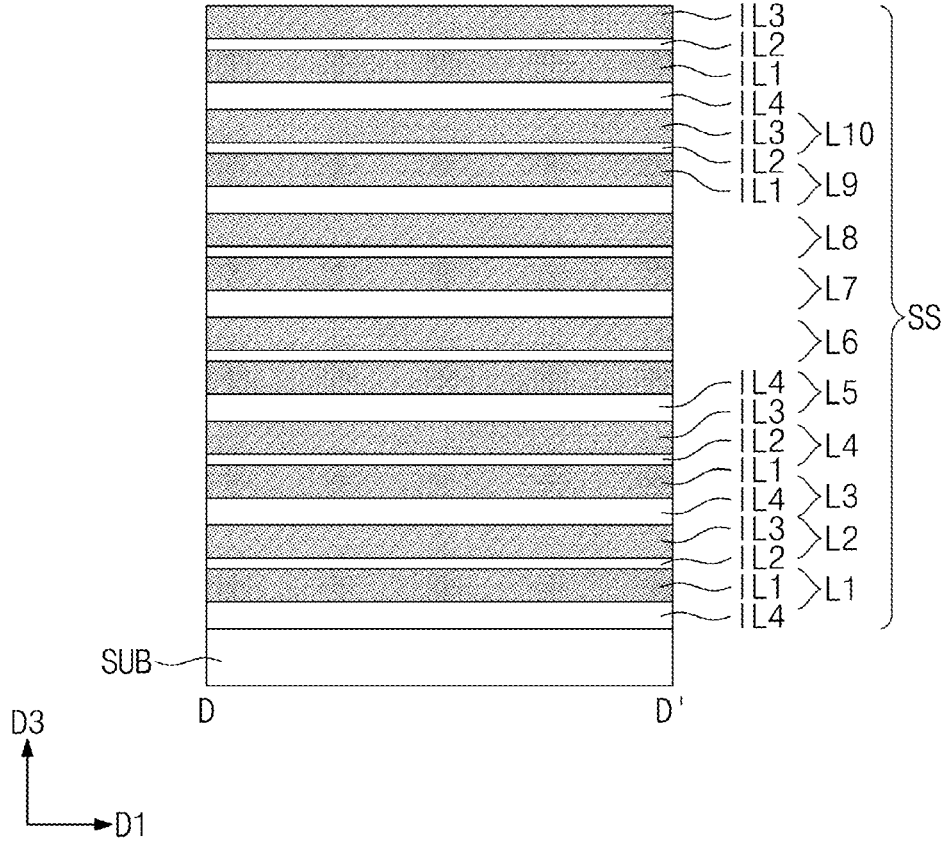
FIGS. 11D, 13D, 15D, 17D, 19D, 21D, 23D, 25D, 27D, 29D, 31D, 33D, 35D, 37D, 39D, 41D, 43D, and 45D illustrate cross-sectional views taken along line D-D' of FIGS. 10, 12, 14, 16, 18, 20, 22, 24, 26, 28, 30, 32, 34, 36, 38, 40, 42, and 44, respectively.
Figure 11E:
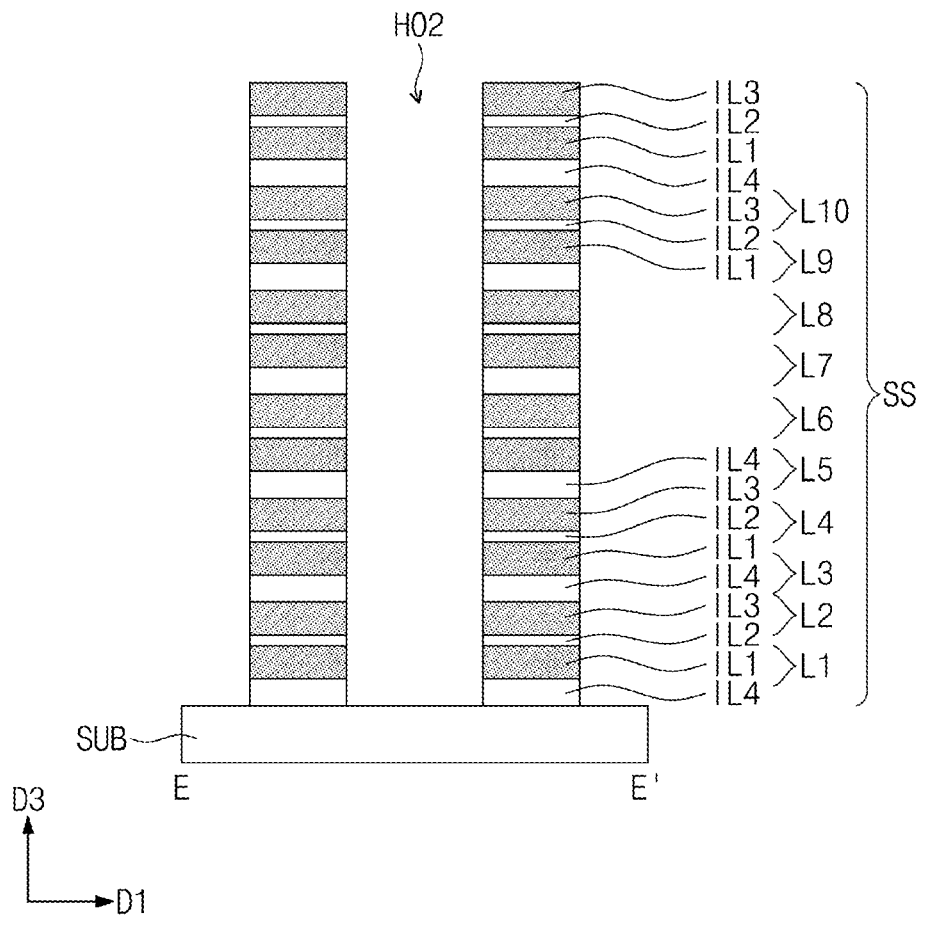
FIGS. 11E, 13E, 15E, 17E, 19E, 21E, 23E, 25E, 27E, 29E, 31E, 33E, 35E, 37E, 39E, 41E, 43E, and 45E illustrate cross-sectional views taken along line E-E' of FIGS. 10, 12, 14, 16, 18, 20, 22, 24, 26, 28, 30, 32, 34, 36, 38, 40, 42, and 44, respectively.
Figure 12:
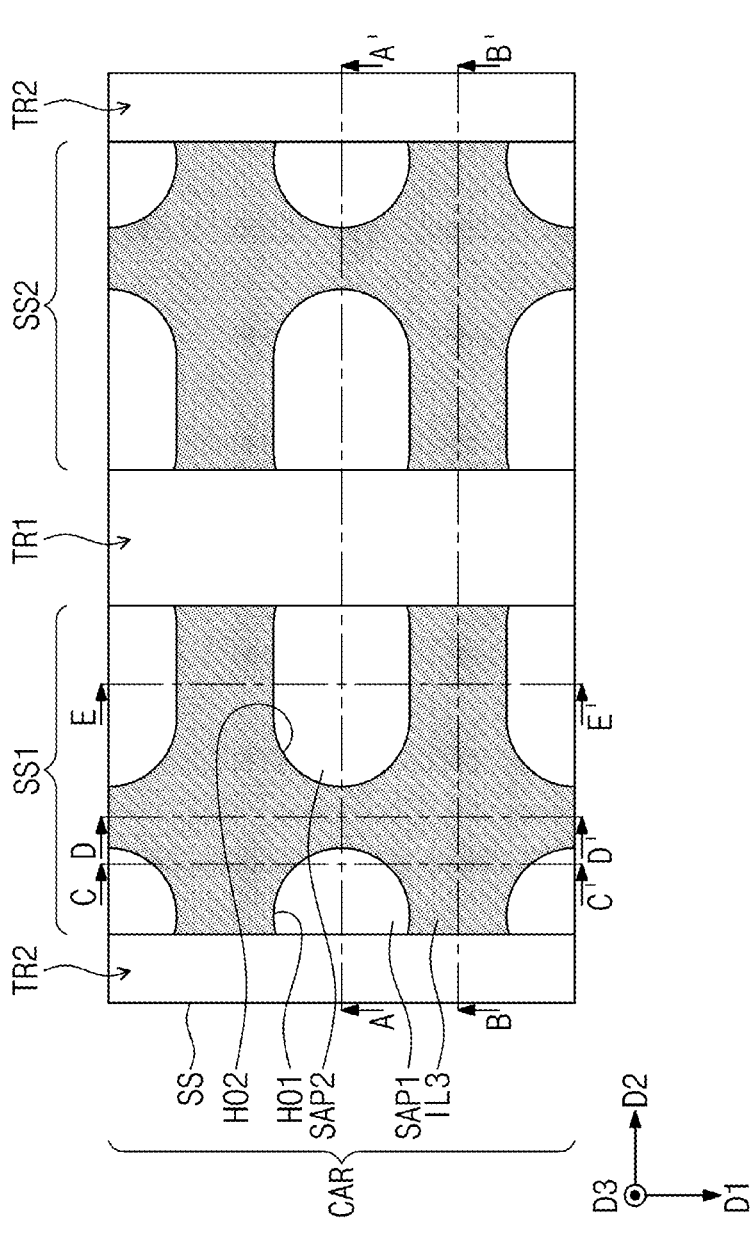
Figure 13C:
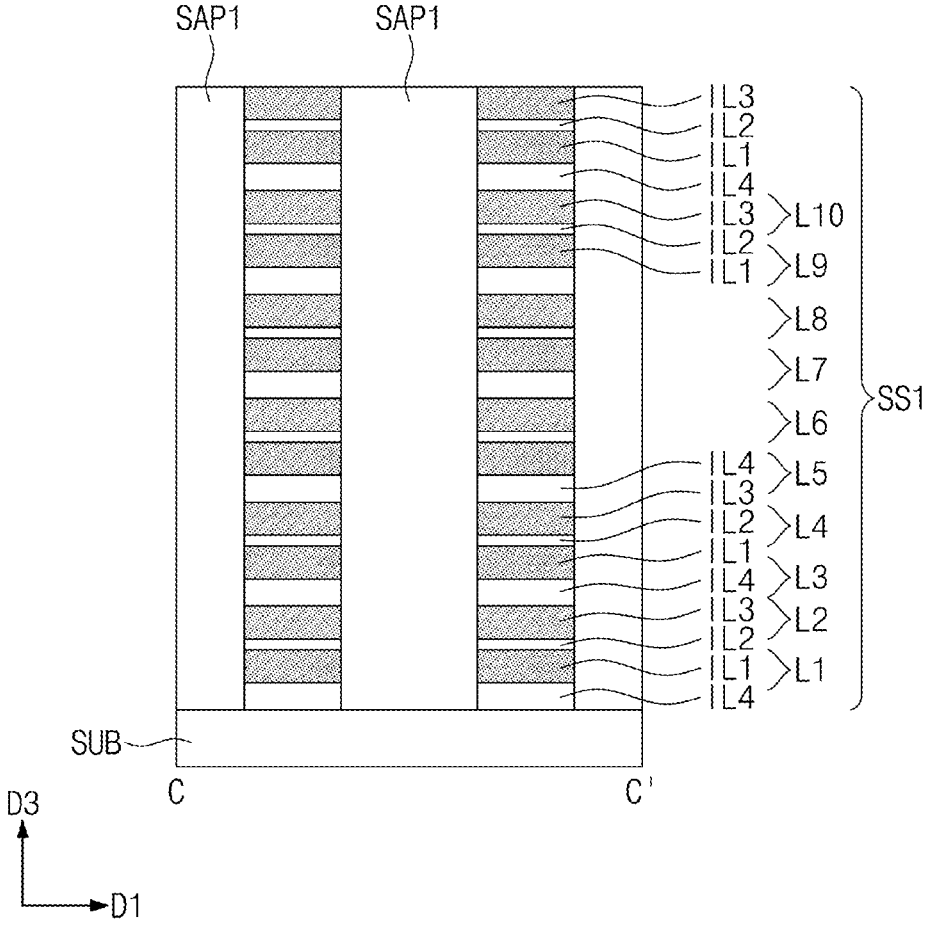
Figure 13D:
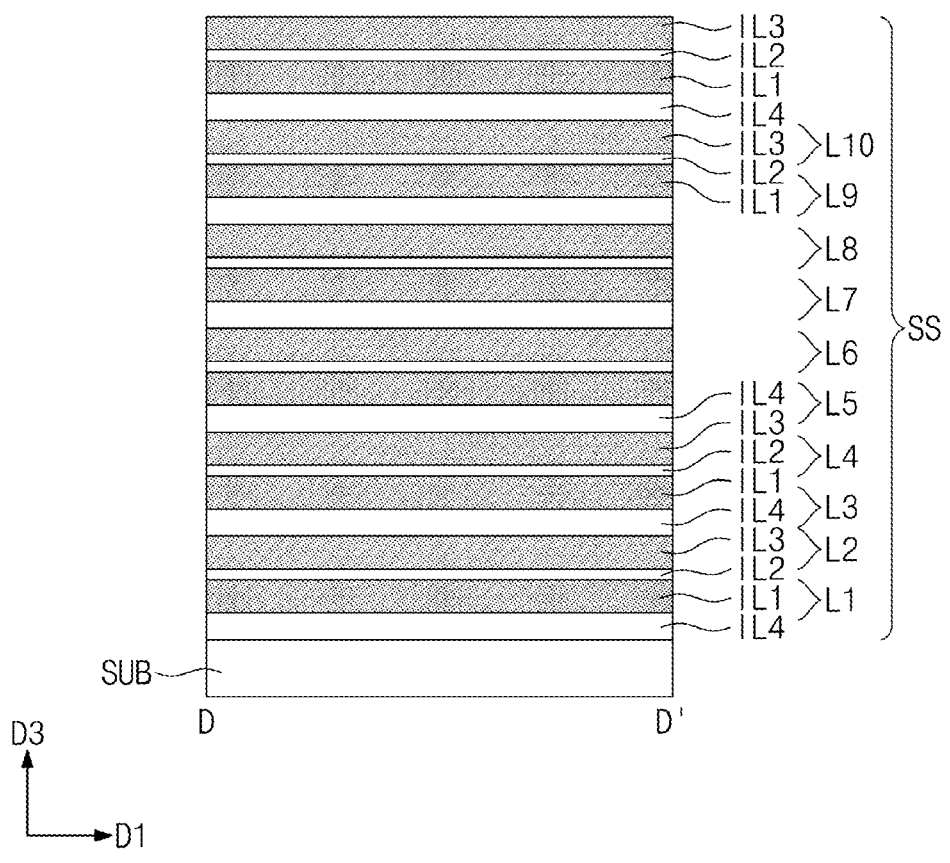
Figure 13E:
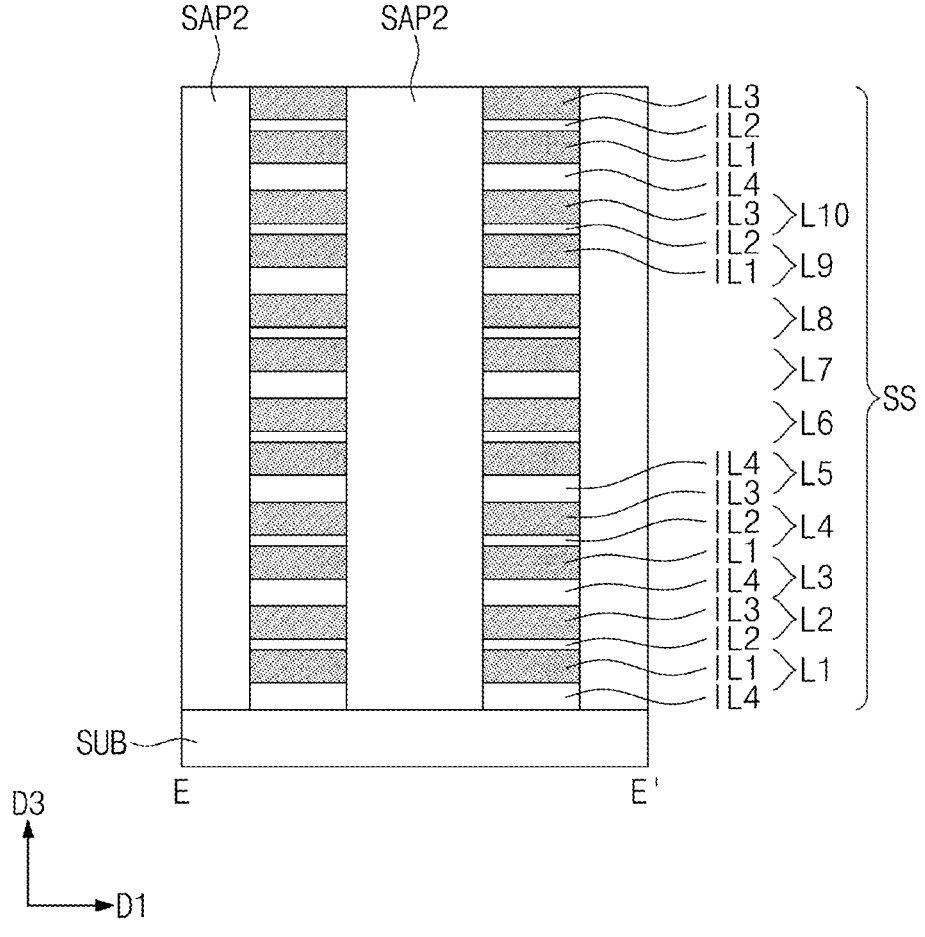
Figure 14:
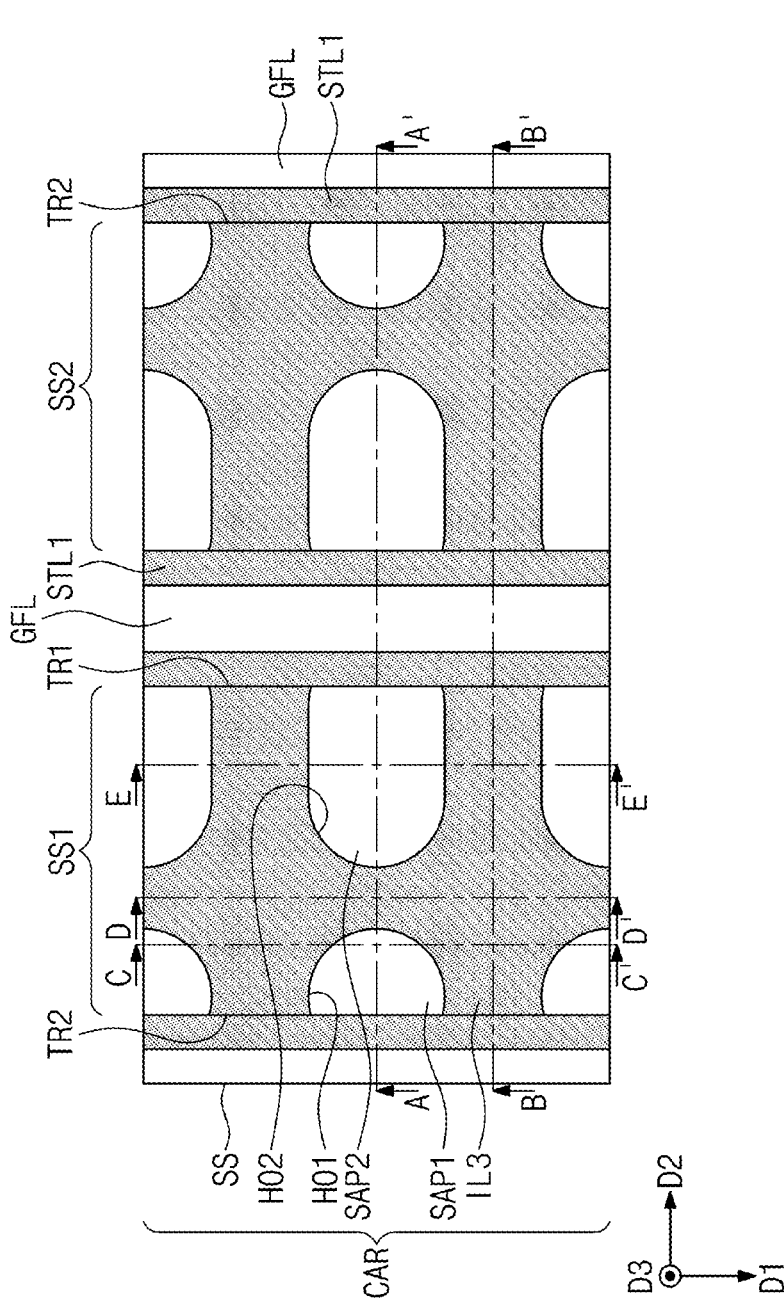
Figure 15C:
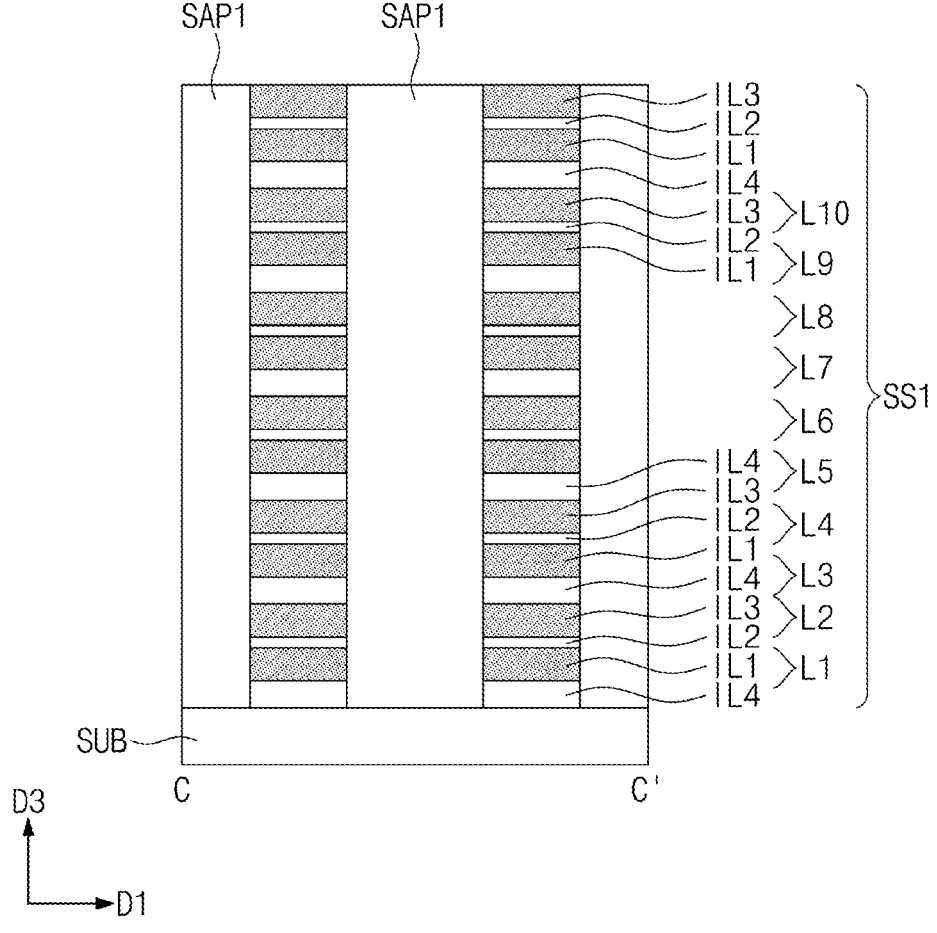
Figure 15D:
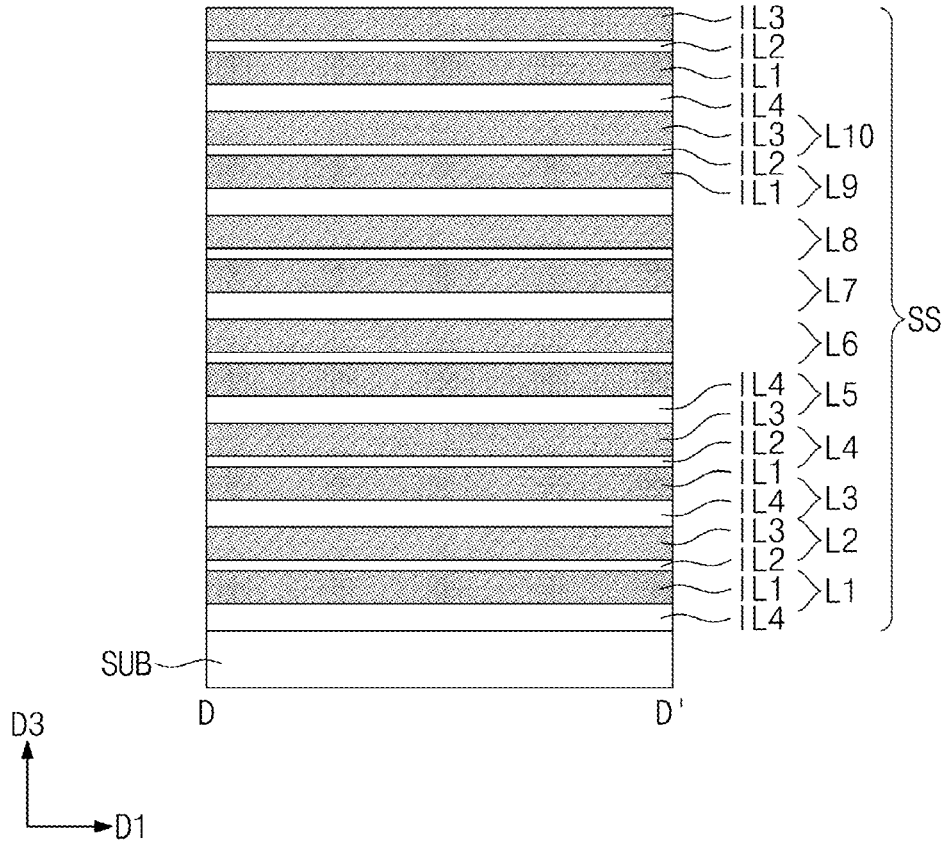
Figure 15E:
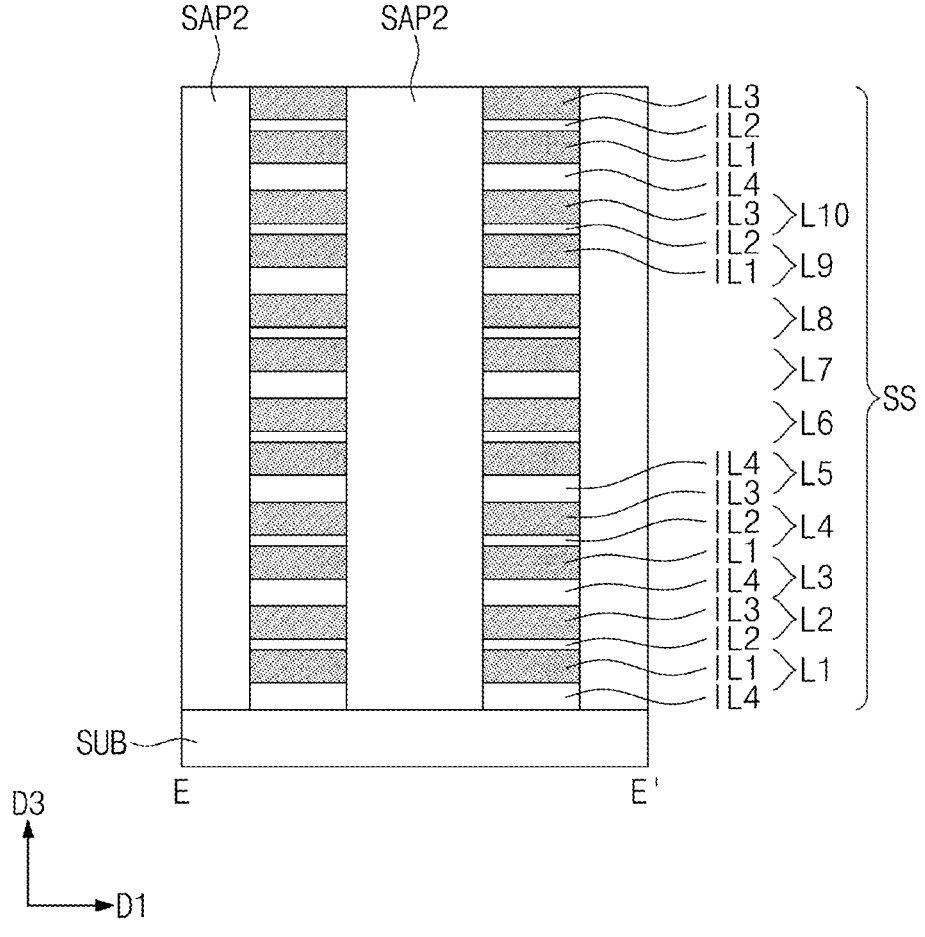
Figure 16:
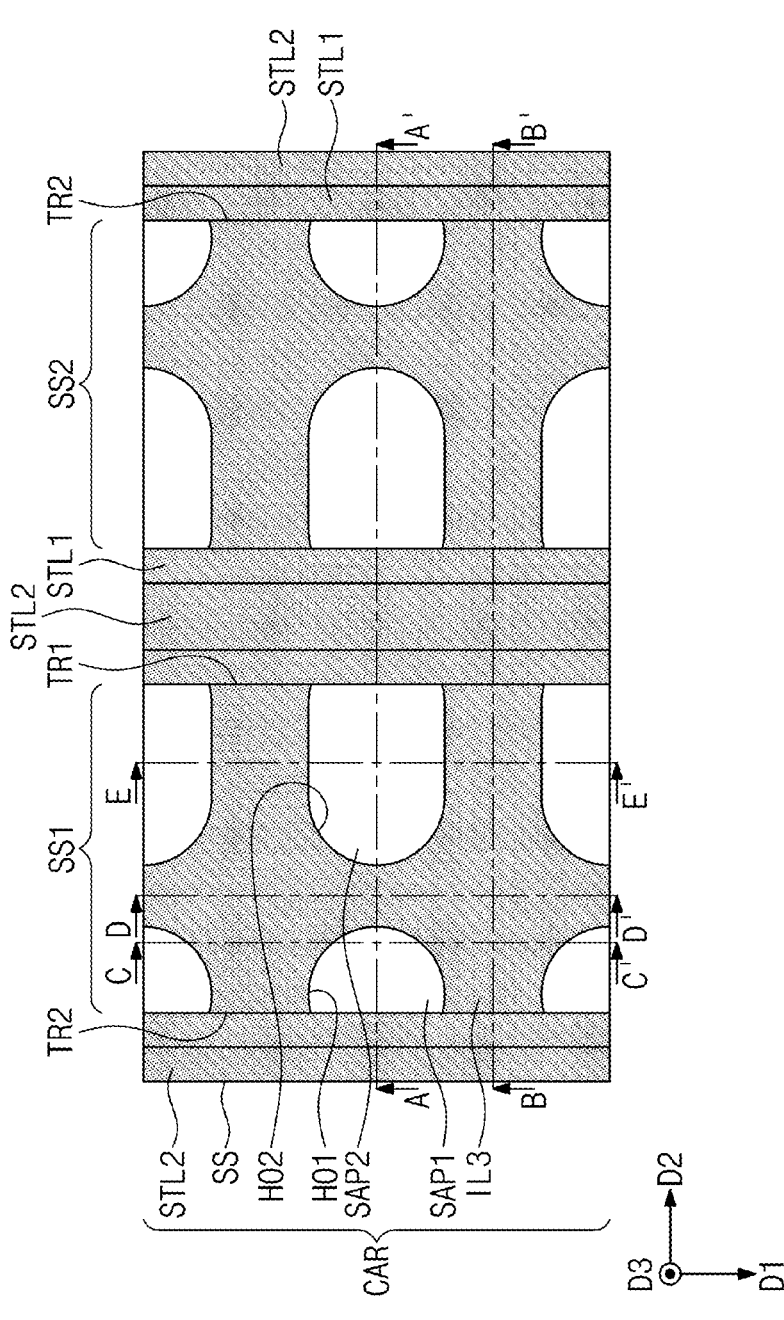
Figure 17A:
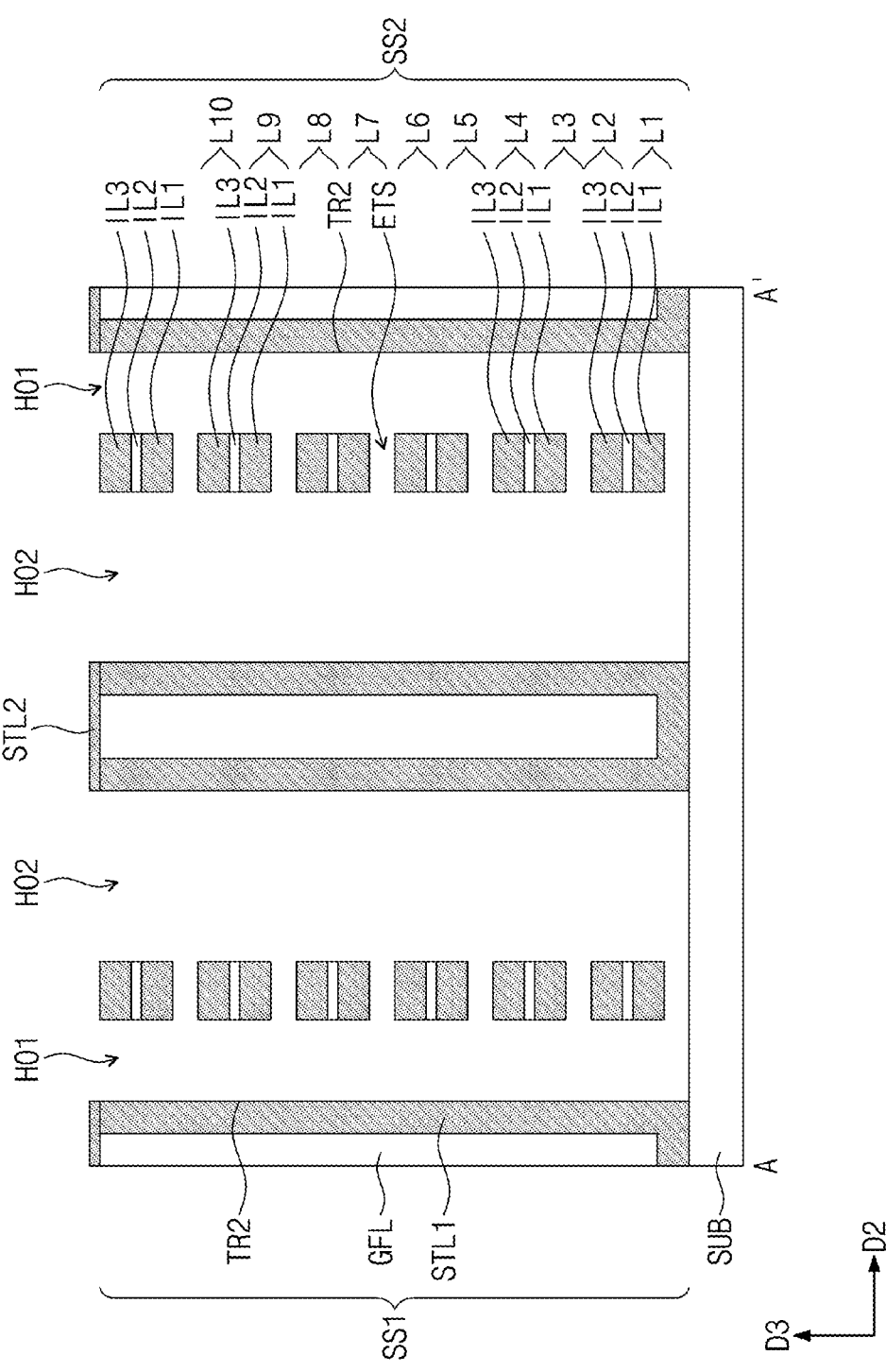
Figure 17B:
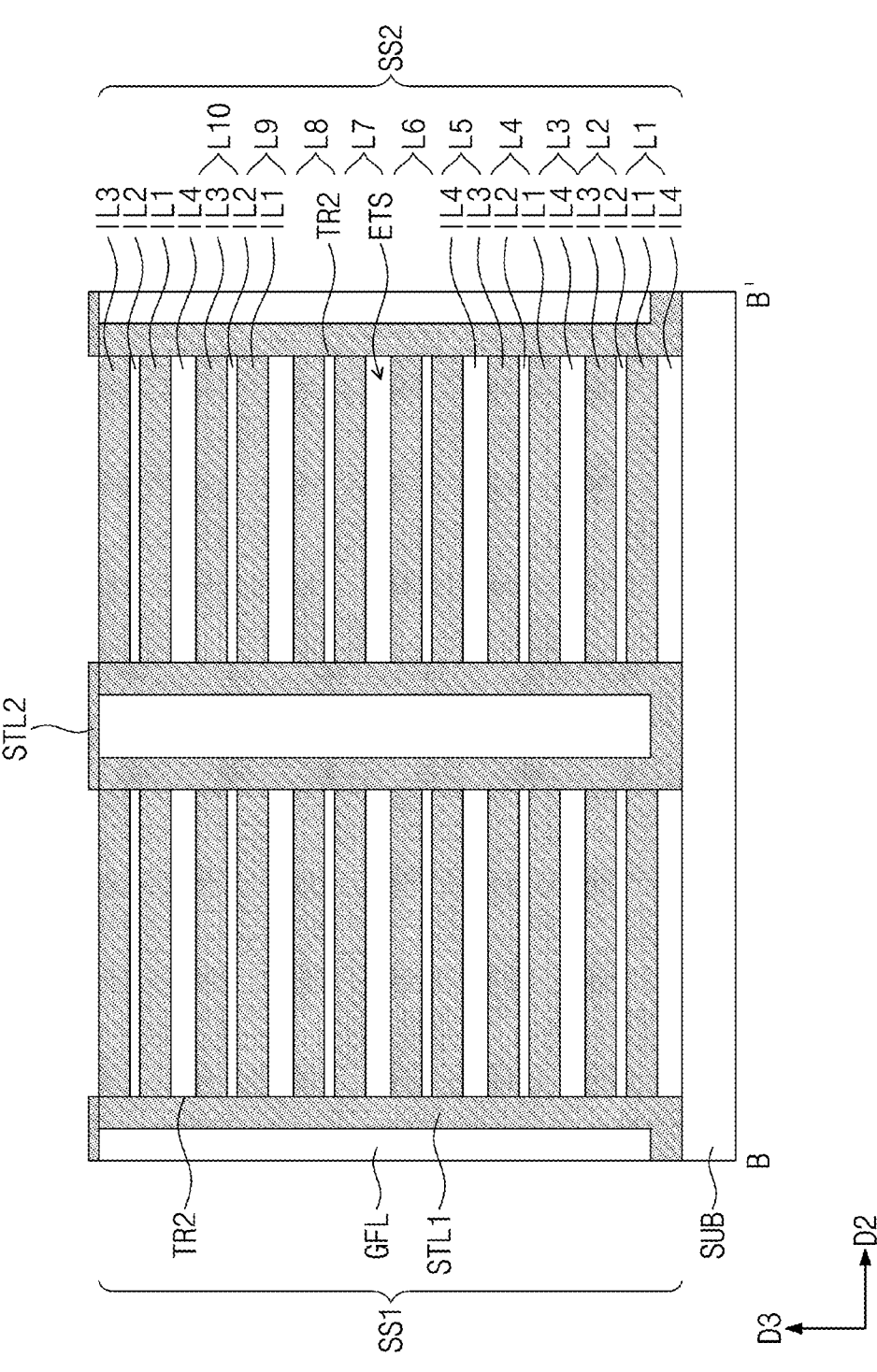
Figure 17C:
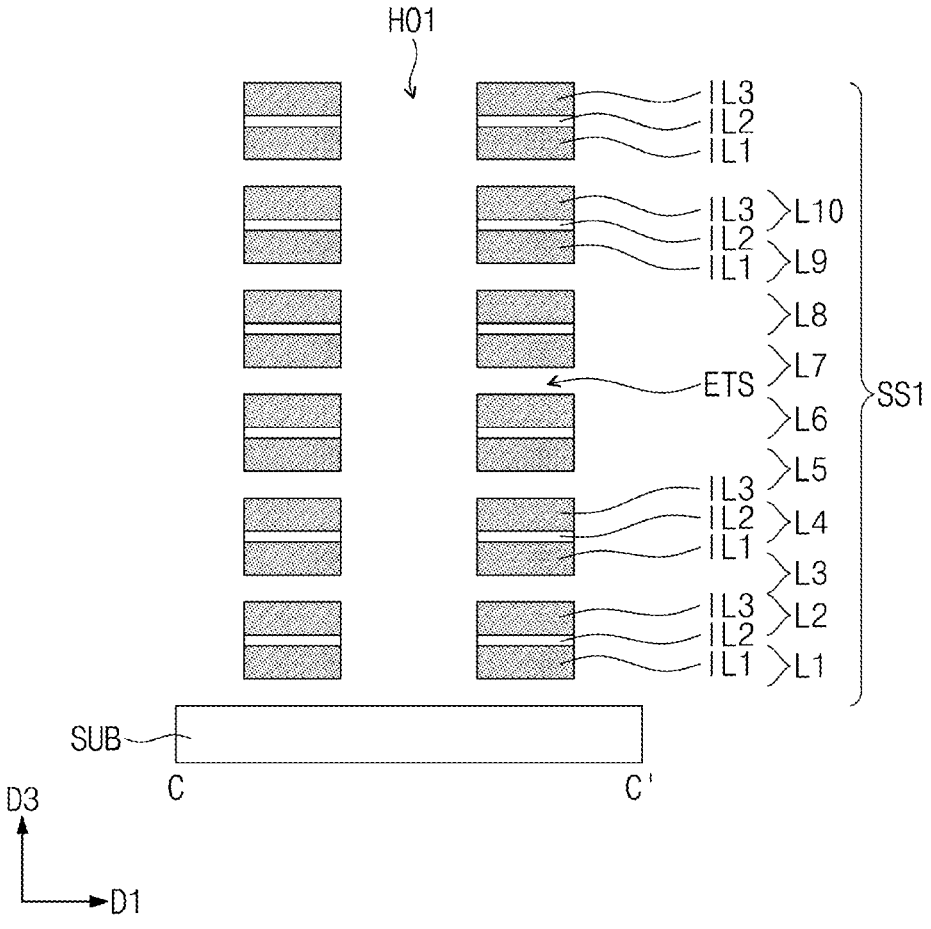
Figure 17D:
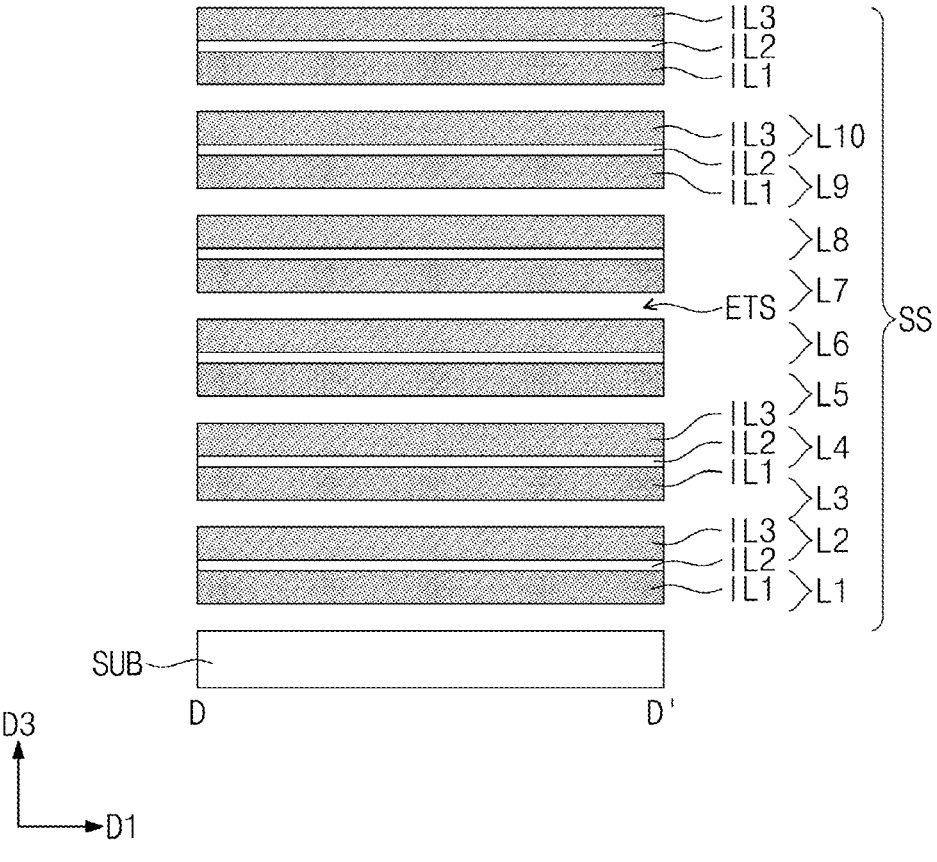
Figure 17E:
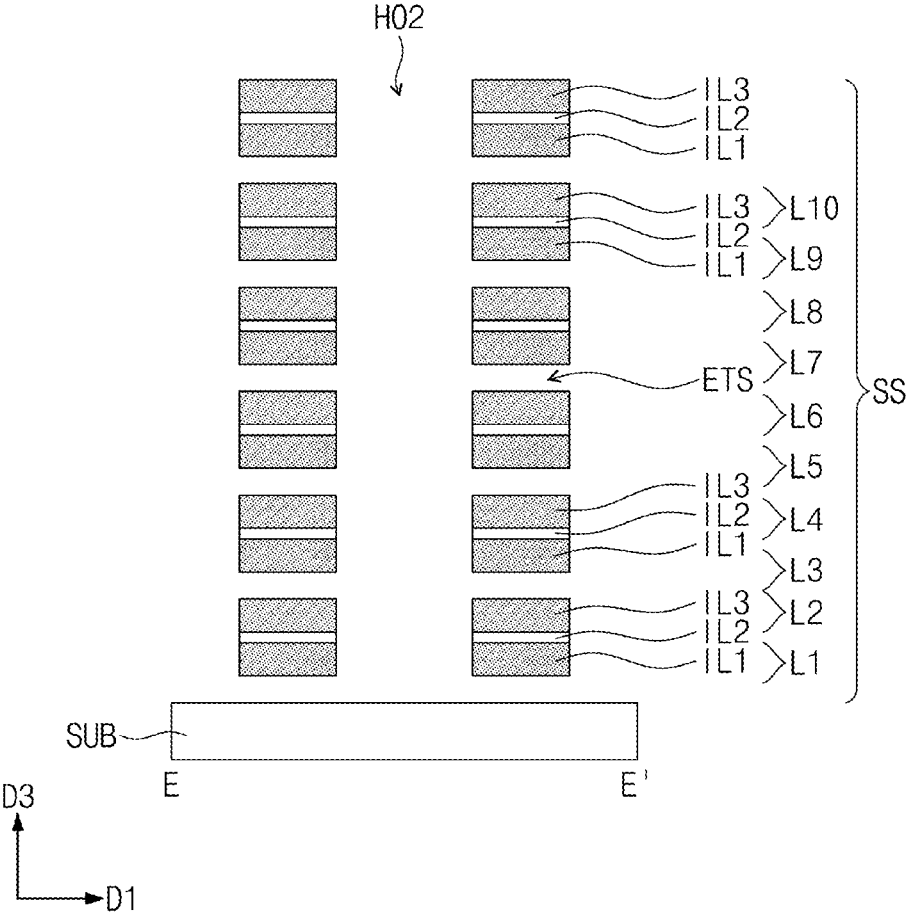
Figure 18:
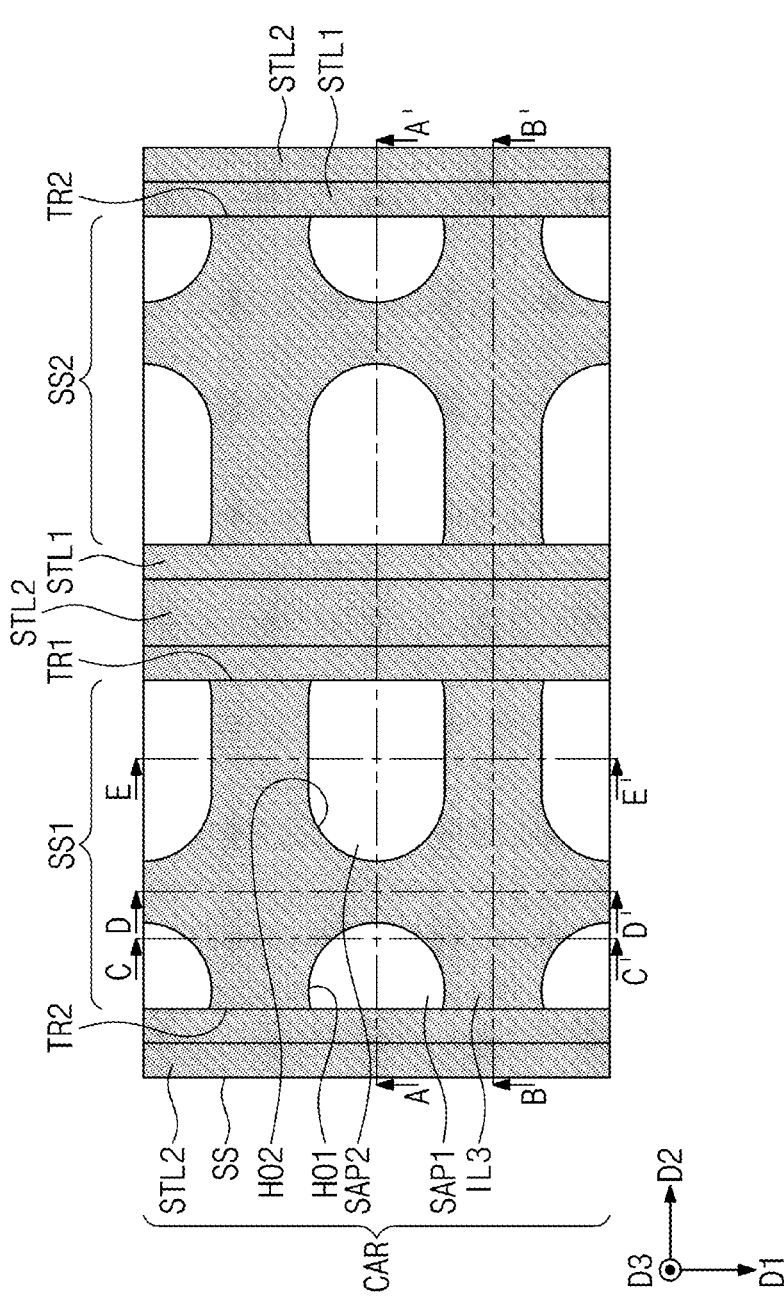
Figure 19A:
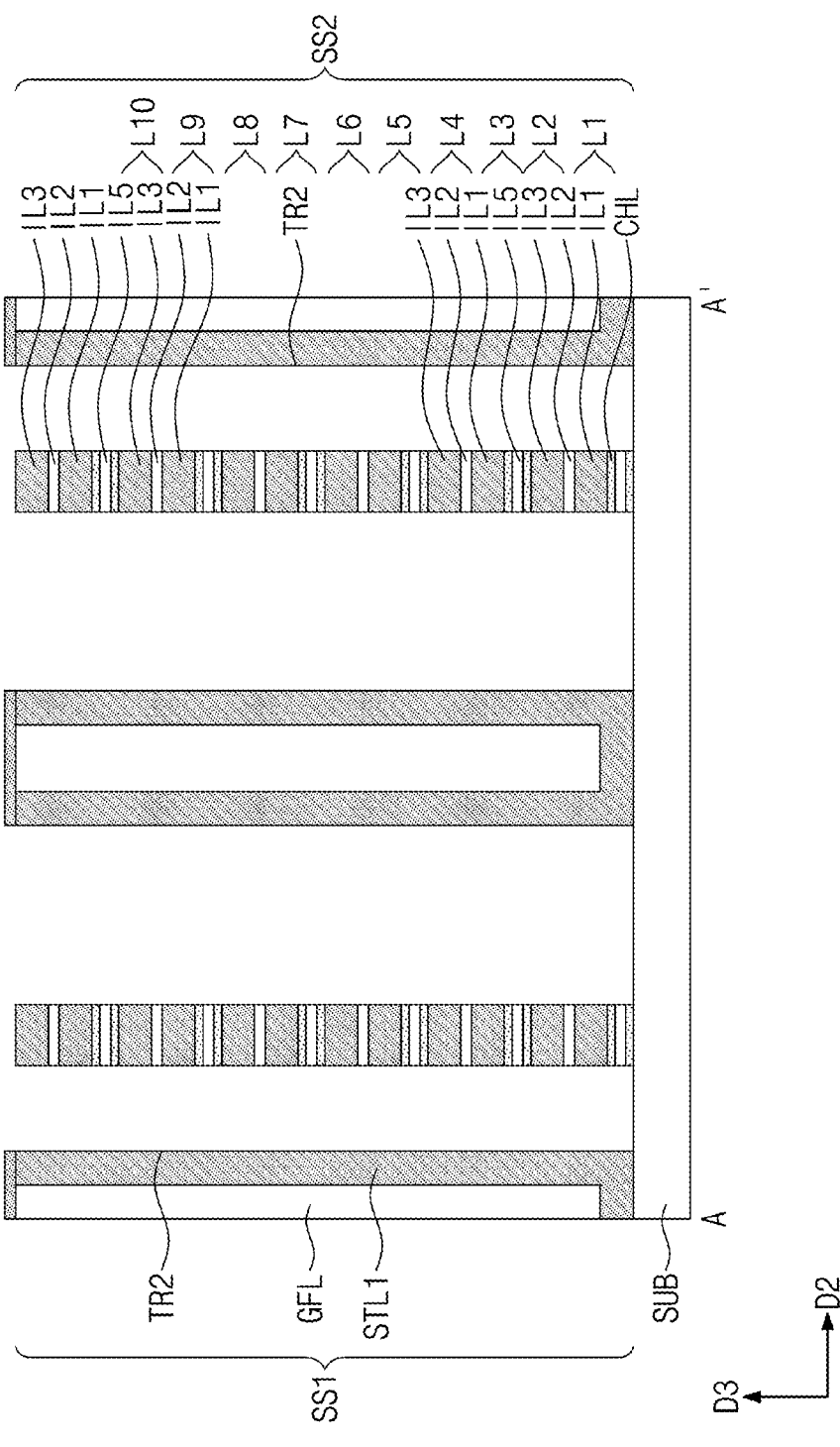
Figure 19B:
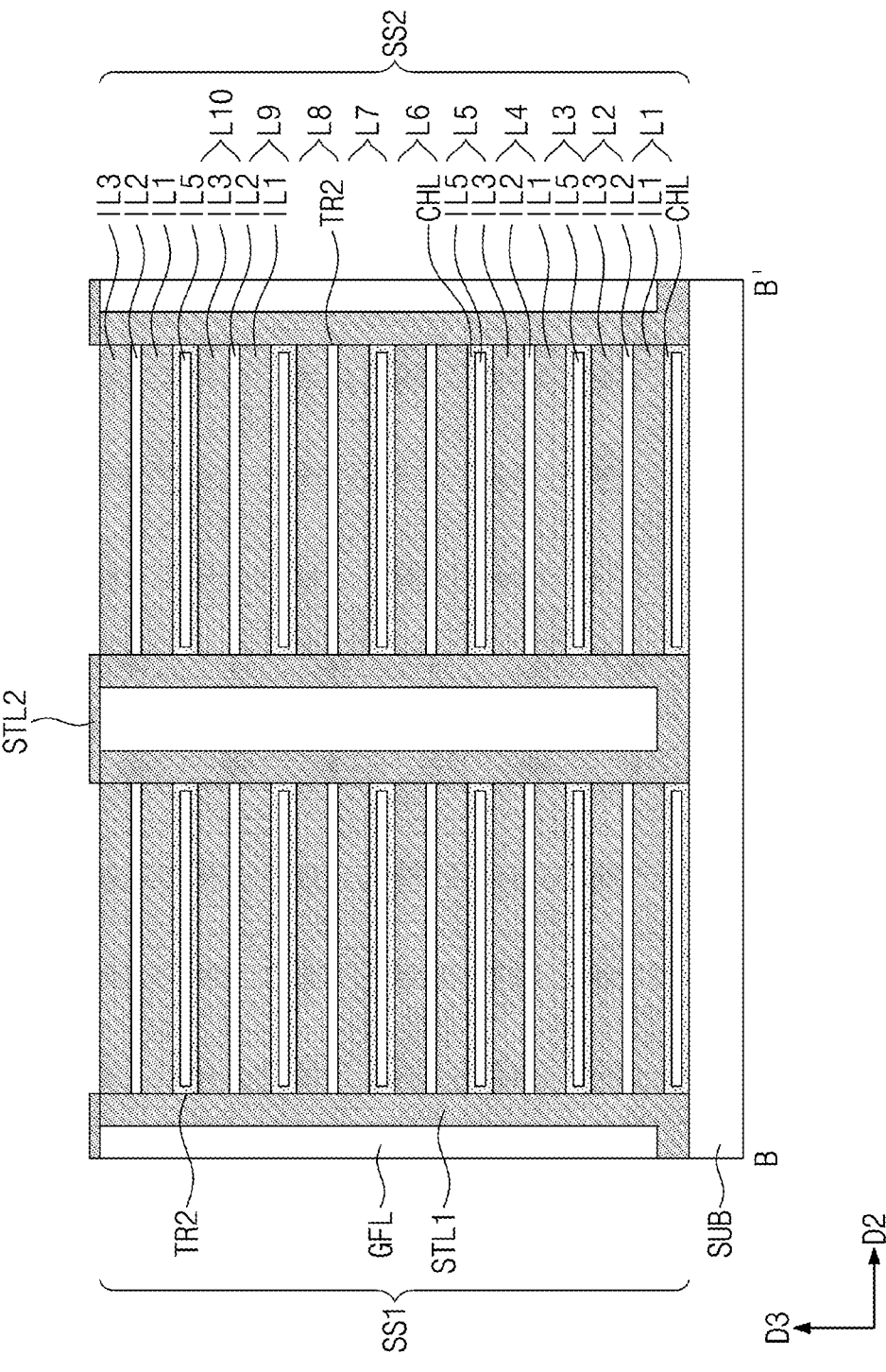
Figure 19C:
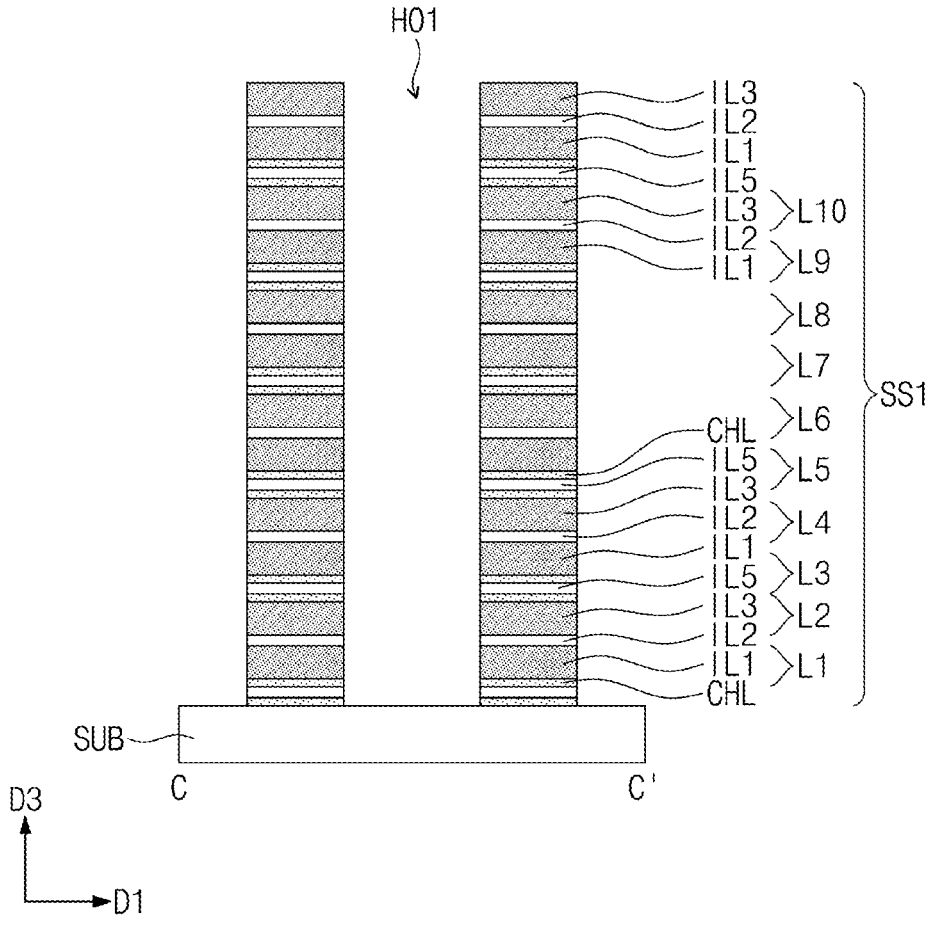
Figure 19D:
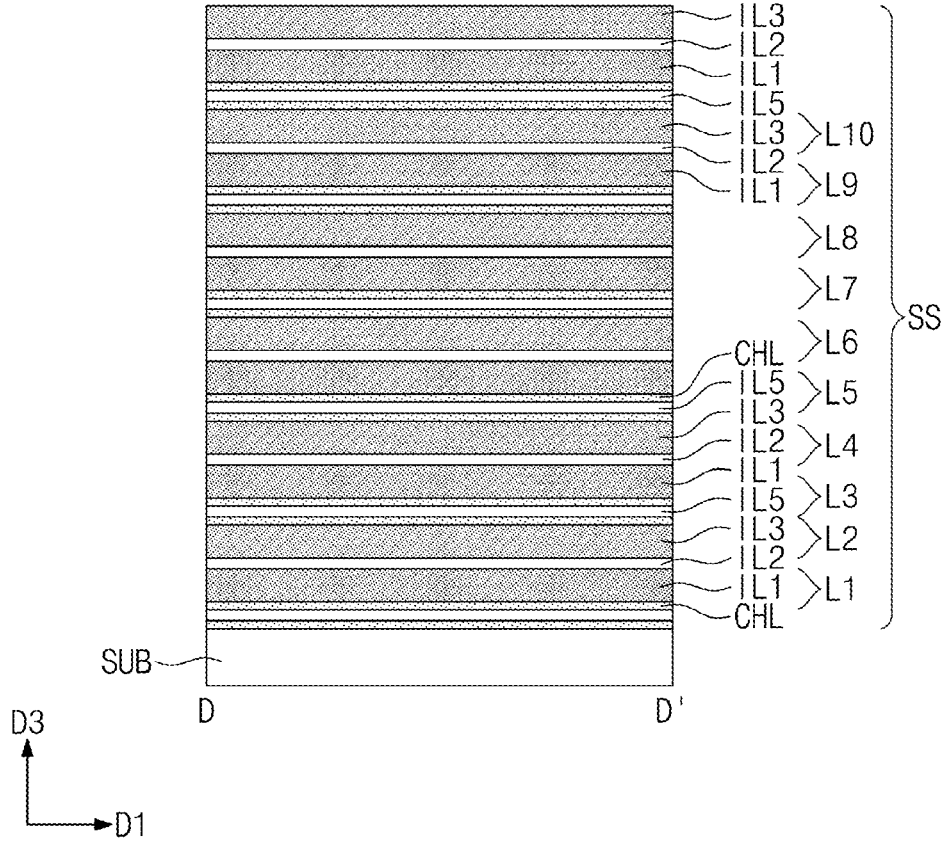
Figure 19E:
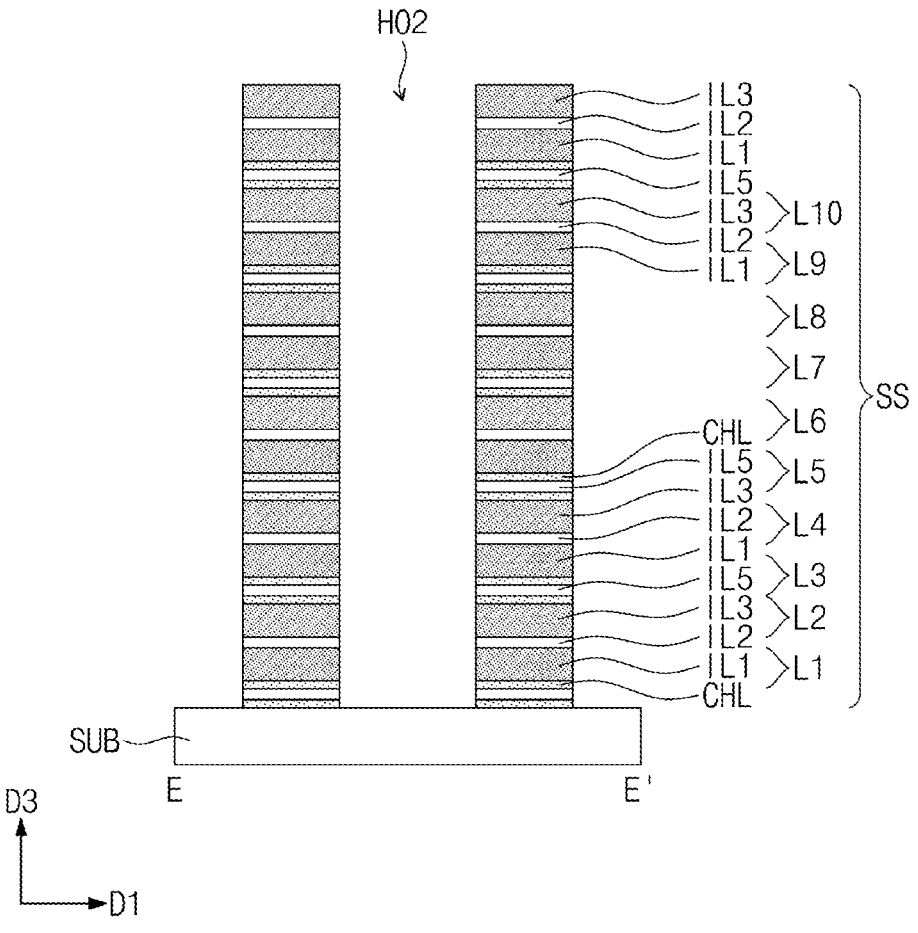

FIG. 9G depicts the pad portion of an uppermost word line WL, or the word line WL in the tenth layer L10. The word line WL may have a first thickness TK1 (in the vertical third direction D3). The pad portion PDP of the word line WL may have a second thickness TK2 (in the vertical third direction D3). The second thickness TK2 may be greater than the first thickness TK1. In an implementation, the word line WL may have a thickness that becomes abruptly increased on the pad portion PDP.

Referring to FIG. 9G, an upper insulating layer UIL may be on the stepwise structure STS. The upper insulating layer UIL may cover the step structure STS. A contact CNT may penetrate the upper insulating layer UIL and may be connected to the pad portion PDP. In an implementation, the contact CNT may be coupled to the pad portion PDP of the word line WL in the tenth layer L10. The contact CNT may have a bottom surface lower than a top surface of the pad portion PDP.

The stepwise structure STS may be configured such that the pad portions PDP in the first to ninth layers L1 to L9 are sequentially exposed in a downward direction while extending in the first direction D1. The contacts CNT may be correspondingly coupled to the exposed pad portions PDP, and a detailed description thereof may be the same as that discussed above with reference to FIG. 2.

Word-line contacts WLCT may penetrate the second to fourth interlayer insulating layers ILD2 to ILD4 and may be coupled to corresponding contacts CNT. The word-line contact WLCT may be electrically connected through a via to an upper metal line.

For a three-dimensional semiconductor memory device according to some embodiments, each of stacked word lines WL may include the pad portion PDP at an end thereof. A signal applied to the pad portion PDP may be directly transmitted to the cell array region CAR through the word line WL. Accordingly, the memory device may increase in operating speed and electrical properties.

FIGS. 10, 12, 14, 16, 18, 20, 22, 24, 26, 28, 30, 32, 34, 36, 38, 40, 42, and 44 illustrate plan views of stages in a method of fabricating a three-dimensional semiconductor memory device according to some embodiments. FIGS. 11A, 13A, 15A, 17A, 19A, 21A, 23A, 25A, 27A, 29A, 31A, 33A, 35A, 37A, 39A, 41A, 43A, and 45A illustrate cross-sectional views taken along line A-A' of FIGS. 10, 12, 14, 16, 18, 20, 22, 24, 26, 28, 30, 32, 34, 36, 38, 40, 42, and 44, respectively. FIGS. 11B, 13B, 15B, 17B, 19B, 21B, 23B, 25B, 27B, 29B, 31B, 33B, 35B, 37B, 39B, 41B, 43B, and 45B illustrate cross-sectional views taken along line B-B' of FIGS. 10, 12, 14, 16, 18, 20, 22, 24, 26, 28, 30, 32, 34, 36, 38, 40, 42, and 44, respectively.

FIGS. 11C, 13C, 15C, 17C, 19C, 21C, 23C, 25C, 27C, 29C, 31C, 33C, 35C, 37C, 39C, 41C, 43C, and 45C illustrate cross-sectional views taken along line C-C' of FIGS. 10, 12, 14, 16, 18, 20, 22, 24, 26, 28, 30, 32, 34, 36, 38, 40, 42, and 44, respectively. FIGS. 11D, 13D, 15D, 17D, 19D, 21D, 23D, 25D, 27D, 29D, 31D, 33D, 35D, 37D, 39D, 41D, 43D, and 45D illustrate cross-sectional views taken along line D-D' of FIGS. 10, 12, 14, 16, 18, 20, 22, 24, 26, 28, 30, 32, 34, 36, 38, 40, 42, and 44, respectively. FIGS. 11E, 13E, 15E, 17E, 19E, 21E, 23E, 25E, 27E, 29E, 31E, 33E, 35E, 37E, 39E, 41E, 43E, and 45E illustrate cross-sectional views taken along line E-E' of FIGS. 10, 12, 14, 16, 18, 20, 22, 24, 26, 28, 30, 32, 34, 36, 38, 40, 42, and 44, respectively.

The following will representatively describe a method of fabricating a three-dimensional memory cell array on a cell array region CAR of a substrate SUB. Referring to FIGS. 10 and 11A to 11E, a stack structure SS may be formed on a substrate SUB. The formation of the stack structure SS may include sequentially stacking first to tenth layers L1 to L10.

In an implementation, a fourth insulating layer IL4 may be formed on the substrate SUB. First to fourth insulating layers IL1 to IL4 may be sequentially stacked on the fourth insulating layer IL4. The first to fourth insulating layers IL1 to IL4 may be alternately and repeatedly stacked. A $(2N-1)^{th}$ layer may include the first insulating layer IL1, and a $2N^{th}$ layer may include the third insulating layer IL3. Herein, N is an integer equal to or greater than 1.

The first and third insulating layers IL1 and IL3 may include the same material. In an implementation, the first and third insulating layers IL1 and IL3 may each include a silicon nitride layer. The second insulating layers IL2 may include a different material from that of the first and third insulating layers IL1 and IL3. In an implementation, the second insulating layers IL2 may include, e.g., a carbon-containing silicon nitride layer, a carbon-containing silicon oxynitride layer, or a polysilicon layer. The fourth insulating layers IL4 may include a different material from those of the first to third insulating layers IL1 to IL3. In an implementation, the fourth insulating layers IL4 may include a silicon oxide layer.

The stack structure SS may be patterned to form first holes HO1 and second holes HO2 that penetrate the stack structure SS. The first holes HO1 may be arranged at a certain pitch along a first direction D1. The second holes HO2 may be adjacent in a second direction D2 to the first holes HO1. The second holes HO2 may be arranged at a certain pitch along the first direction D1. The first and second holes HO1 and HO2 may expose a top surface of the substrate SUB.

Referring to FIGS. 12 and 13A to 13E, the first and second holes HO1 and HO2 may be filled with a dielectric material to form first sacrificial pillars SAP1 and second sacrificial pillars SAP2, respectively. The first sacrificial pillars SAP1 may completely fill corresponding first holes HO1, and the second sacrificial pillars SAP2 may completely fill corresponding second holes HO2. In an implementation, the first and second sacrificial pillars SAP1 and SAP2 may each include silicon oxide.

The stack structure SS may be patterned to form first and second trenches TR1 and TR2 that penetrate the stack structure SS. The first and second trenches TR1 and TR2 may divide the stack structure SS into a first stack structure SS1 and a second stack structure SS2.

The first trench TR1 may be between the first and second stack structures SS1 and SS2. The second trench TR2 may be on one side of each of the first and second stack structures SS1 and SS2. The first trench TR1 may expose a sidewall of each of the second sacrificial pillars SAP2. The second trench TR2 may expose a sidewall of each of the first sacrificial pillars SAP1.

Referring to FIGS. 14 and 15A to 15E, a first stopper layer STL1 may be conformally formed in each of the first and second trenches TR1 and TR2. In an implementation, the first stopper layer STL1 may have a thickness that does not completely fill the first trench TR1 or the second trench TR2. The first stopper layer STL1 may have a U shape at a cross section thereof (see FIGS. 15A and 15B).

A gap-fill layer GFL may be formed to fill each of the first and second trenches TR1 and TR2. The gap-fill layer GFL may be on the first stopper layer STL1. The gap-fill layer GFL may completely fill the first trench TR1 or the second trench TR2. In an implementation, the first stopper layer STL1 may include silicon nitride, and the gap-fill layer GFL may include silicon oxide.

Referring to FIGS. 16 and 17A to 17E, a second stopper layer STL2 may be formed to cover a top surface of the first stopper layer STL1 and a top surface of the gap-fill layer GFL. The second stopper layer STL2 may cover only the top surface of each of the first stopper layer STL1 and the gap-fill layer GFL, and the second stopper layer STL2 may expose top surfaces of the first and second stack structures SS1 and SS2. The second stopper layer STL2 may expose top surfaces of the first and second sacrificial pillars SAP1 and SAP2.

The second stopper layer STL2 may be used as an etching mask to perform a wet etching process that selectively removes the first and second sacrificial pillars SAP1 and SAP2. The first and second sacrificial pillars SAP1 and SAP2 may be removed to re-expose the first and second holes HO1 and HO2.

The wet etching process may selectively etch silicon oxide, e.g., the first and second sacrificial pillars SAP1 and SAP2. Therefore, the fourth insulating layers IL4 in the first and second stack structures SS1 and SS2 may also be removed while the first and second sacrificial pillars SAP1 and SAP2 are removed. This may be because the fourth insulating layers IL4 include silicon oxide.

Empty spaces ETS may be defined to indicate spaces where the fourth insulating layers IL4 are removed. In an implementation, the wet etching process may form the empty spaces ETS in the first and second stack structures SS1 and SS2. The empty spaces ETS may spatially connect to each other the first and second holes HO1 and HO2 that are adjacent to each other (see FIG. 17A).

In an implementation, the gap-fill layer GFL may include silicon oxide, and the gap-fill layer GFL may be surrounded by the first and second stopper layers STL1 and STL2 and may thus remain without being removed during the etching process.

Referring to FIGS. 18 and 19A to 19E, a channel layer CHL may be conformally deposited on the substrate SUB. The channel layer CHL may be formed in each of the empty spaces ETS. The channel layer CHL may be formed on a bottom surface of each of the first insulating layers IL1. The channel layer CHL may be formed on a top surface of each of the third insulating layers IL3.

The channel layer CHL may be formed by using chemical vapor deposition (CVD) or atomic layer deposition (ALD). The channel layer CHL may be formed to have a relatively small thickness that does not completely fills the empty space ETS.

The channel layer CHL may include a suitable semiconductor material that not only may be formed by deposition but also may serve as a channel of a memory cell transistor.

In an implementation, the channel layer CHL may include an amorphous oxide semiconductor, e.g., indium-gallium-zinc oxide (IGZO) or indium-tin-zinc oxide (ITZO). In an implementation, the channel layer CHL may include a two-dimensional semiconductor, e.g., metal, chalcogenide, graphene, or phosphorene.

A fifth insulating layer IL5 may be deposited on the substrate SUB. The fifth insulating layer IL5 may completely fill each of the empty spaces ETS. A wet trimming process may be performed to allow the fifth insulating layer IL5 to remain only in the empty space ETS. In an implementation, the fifth insulating layer IL5 may include silicon oxide.

The fifth insulating layers IL5 may be used as an etching mask to etch the channel layer CHL to leave the channel layers CHL in the empty spaces ETS. In an implementation, the channel layer CHL may be formed into a plurality of channel layers CHL that are vertically separated from each other.

Referring to FIGS. 20 and 21A to 21E, a wet etching process may be performed on sidewalls of the channel layers CHL exposed to the first and second holes HO1 and HO2. The wet etching process may horizontally and partially etch each of the channel layers CHL. The wet etching process may selectively etch the channel layers CHL. Each of the channel layers CHL may be partially etched to form a recess region RSR.

Figure 20:
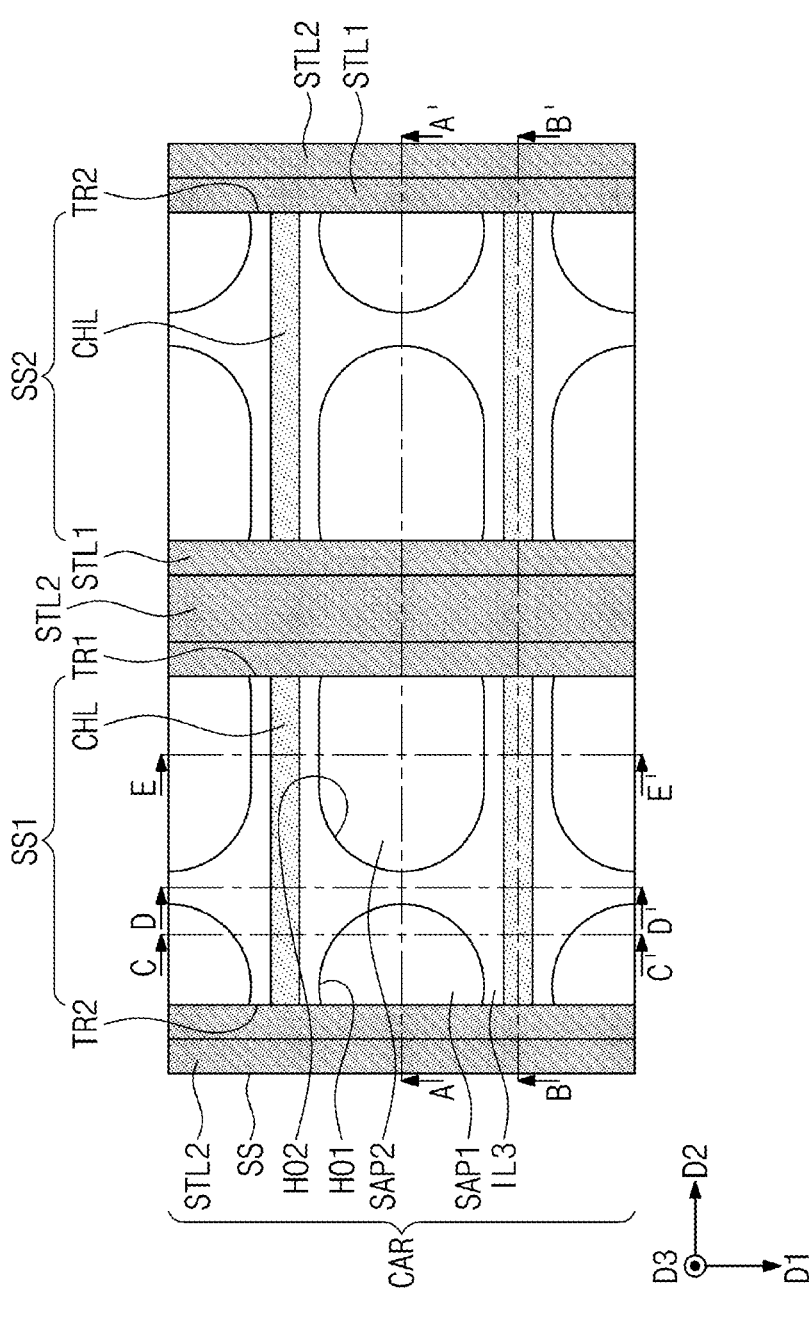

Referring to FIG. 20, each of the channel layers CHL may be horizontally and partially wet-etched to form a bar shape that extends in the second direction D2. Representatively, referring to FIG. 21C, the wet etching process may cause the channel layer CHL to have a reduced width in the first direction D1.

Figure 21A:
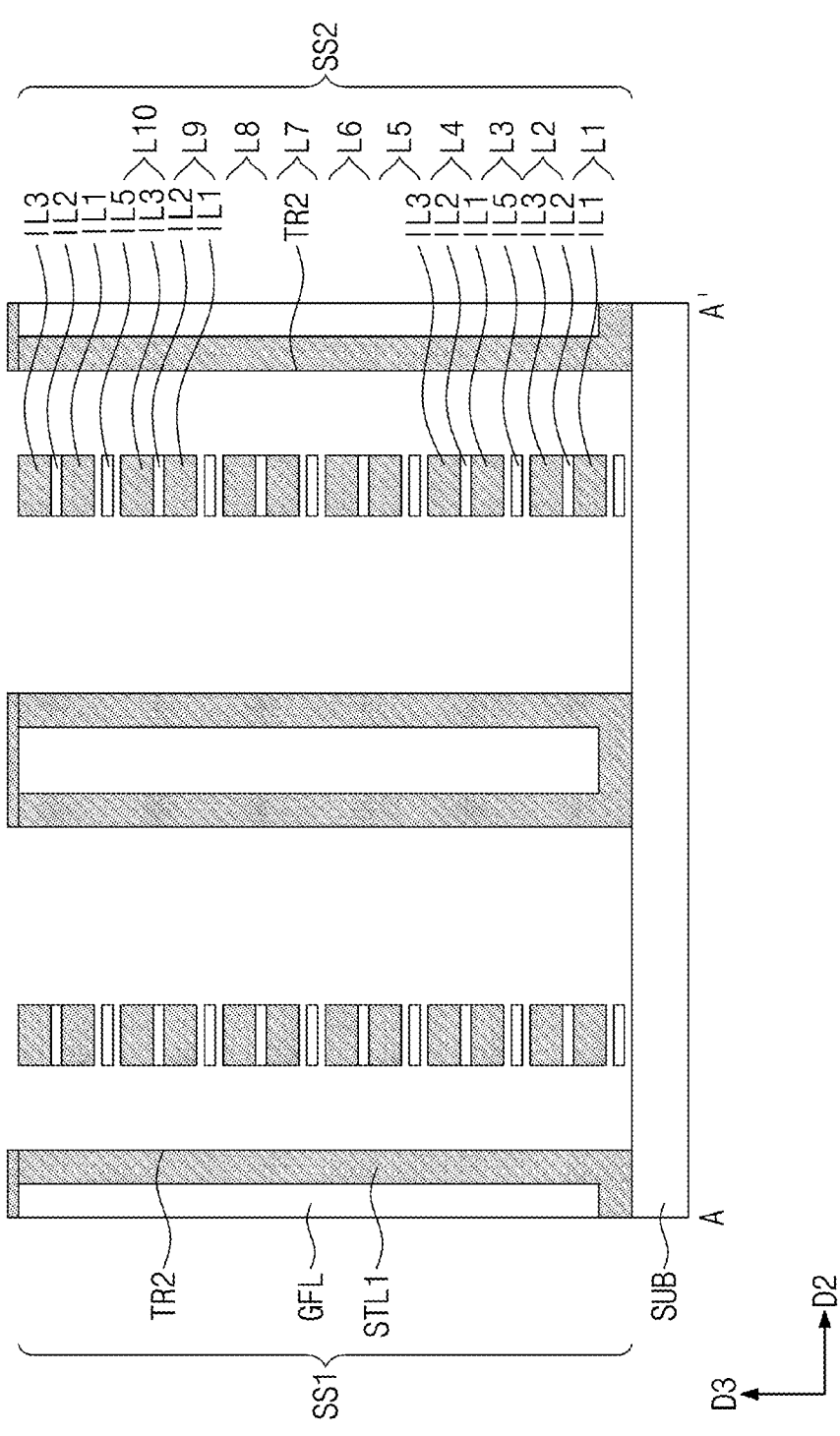
Figure 21B:
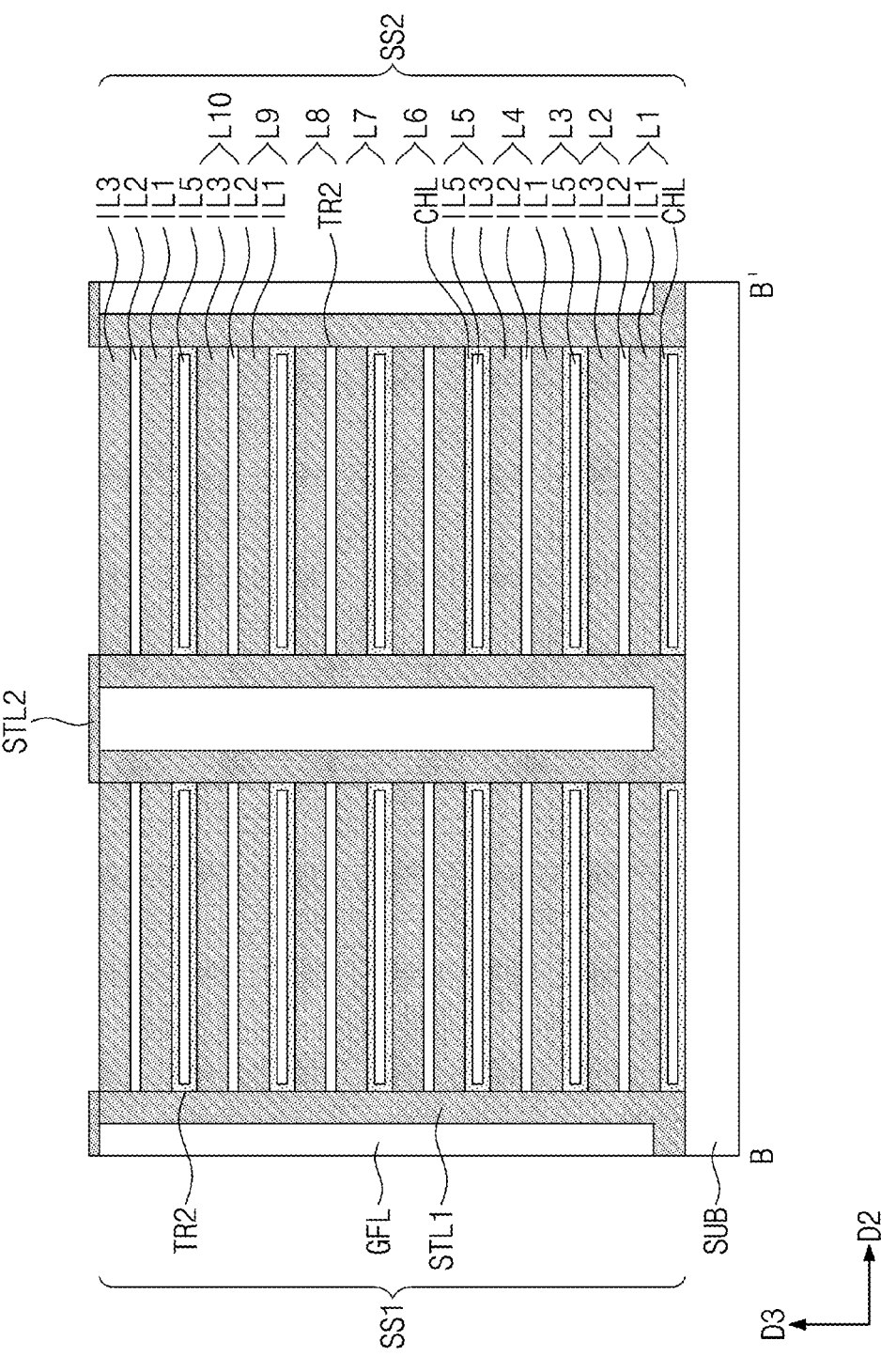
Figure 21C:
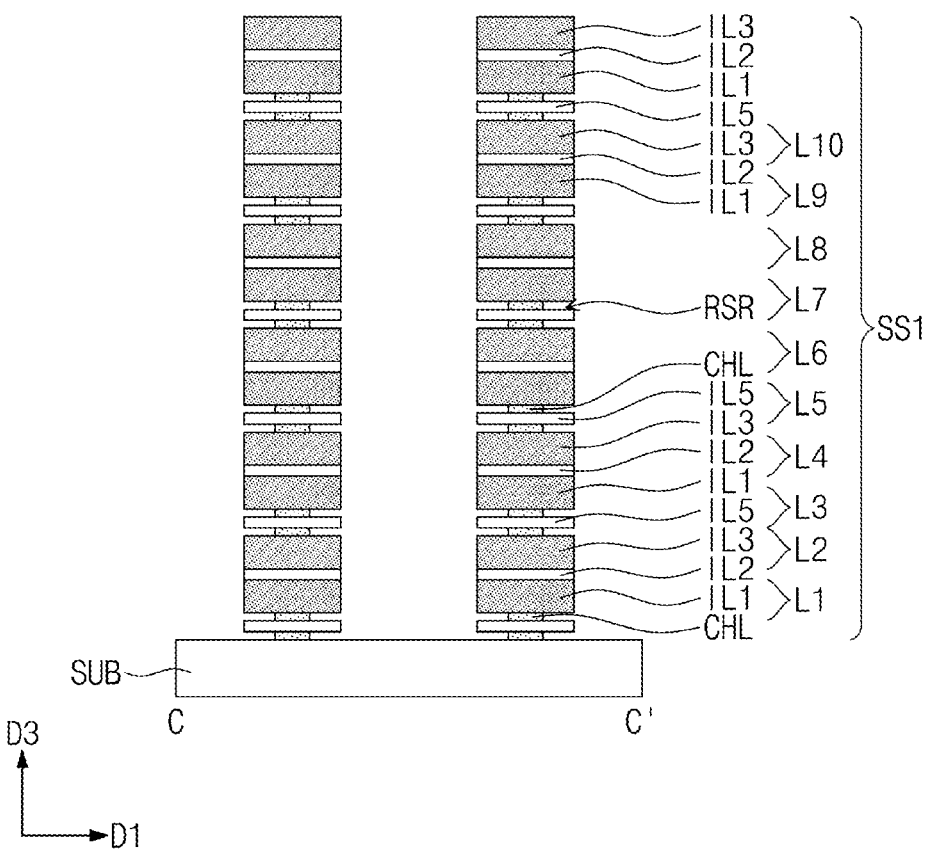
Figure 21D:
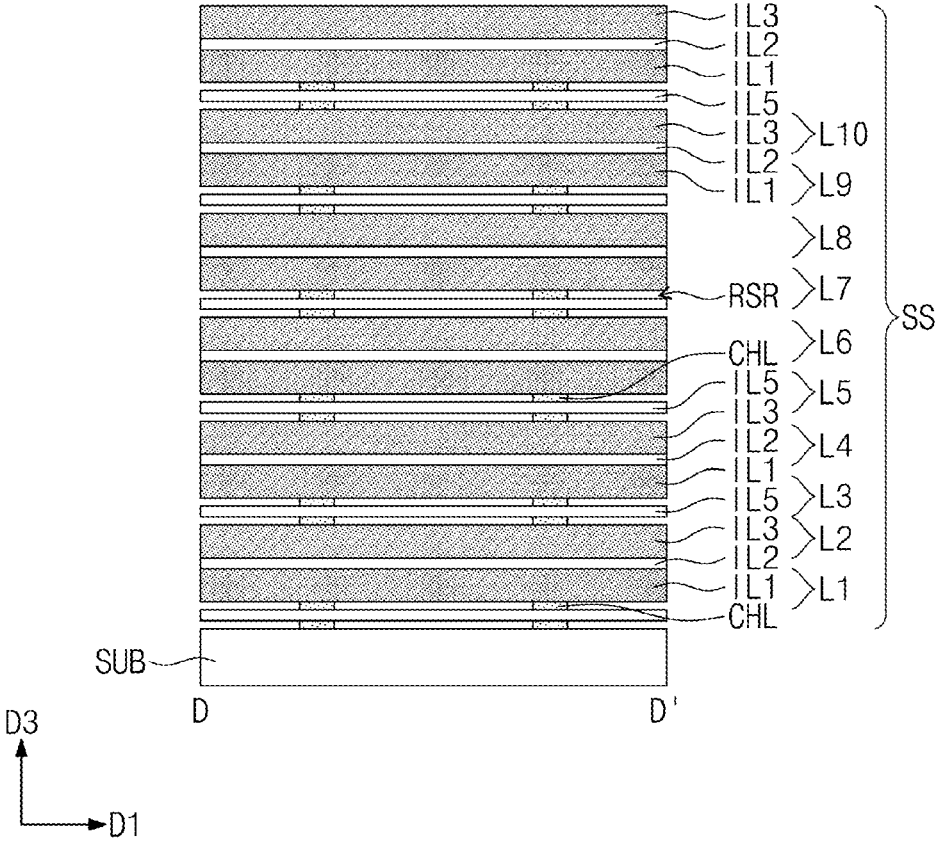
Figure 21E:
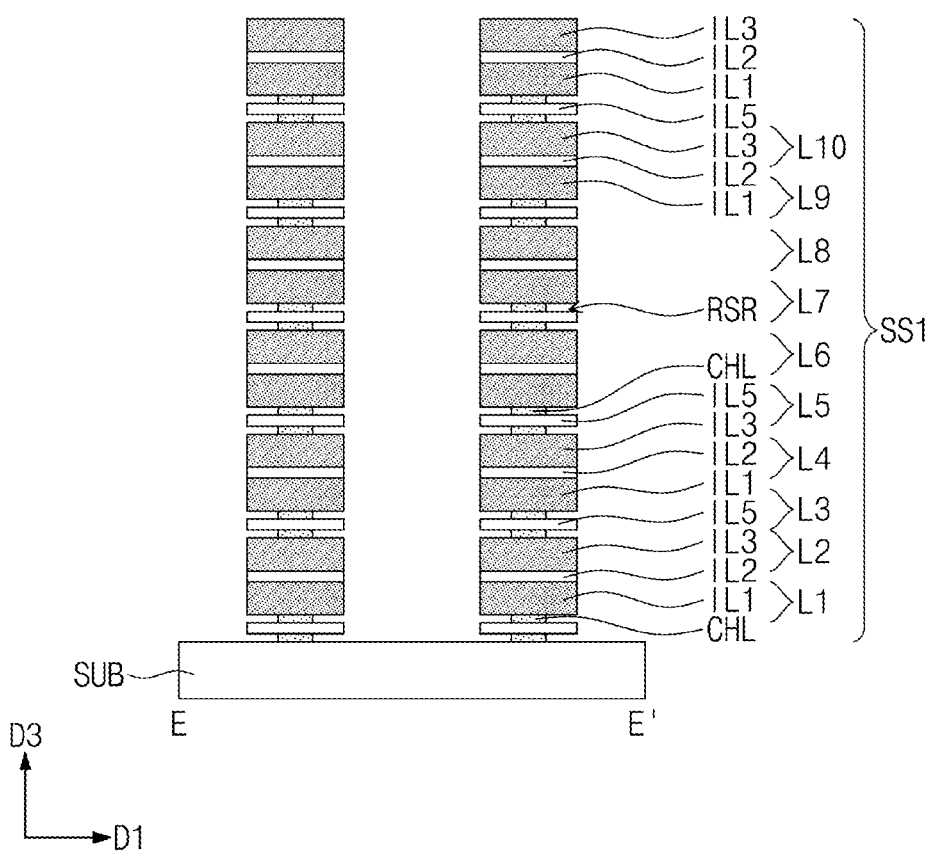
Figure 22:
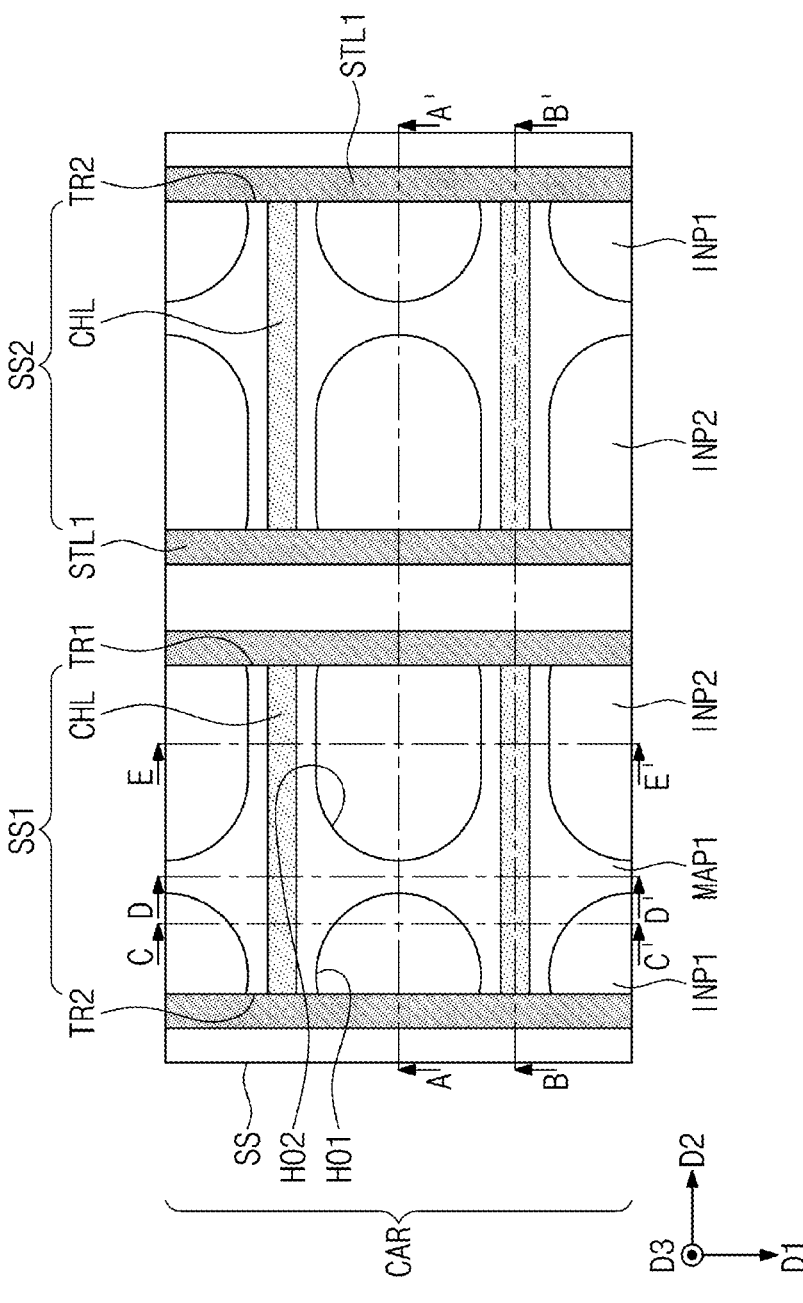
Figure 23C:
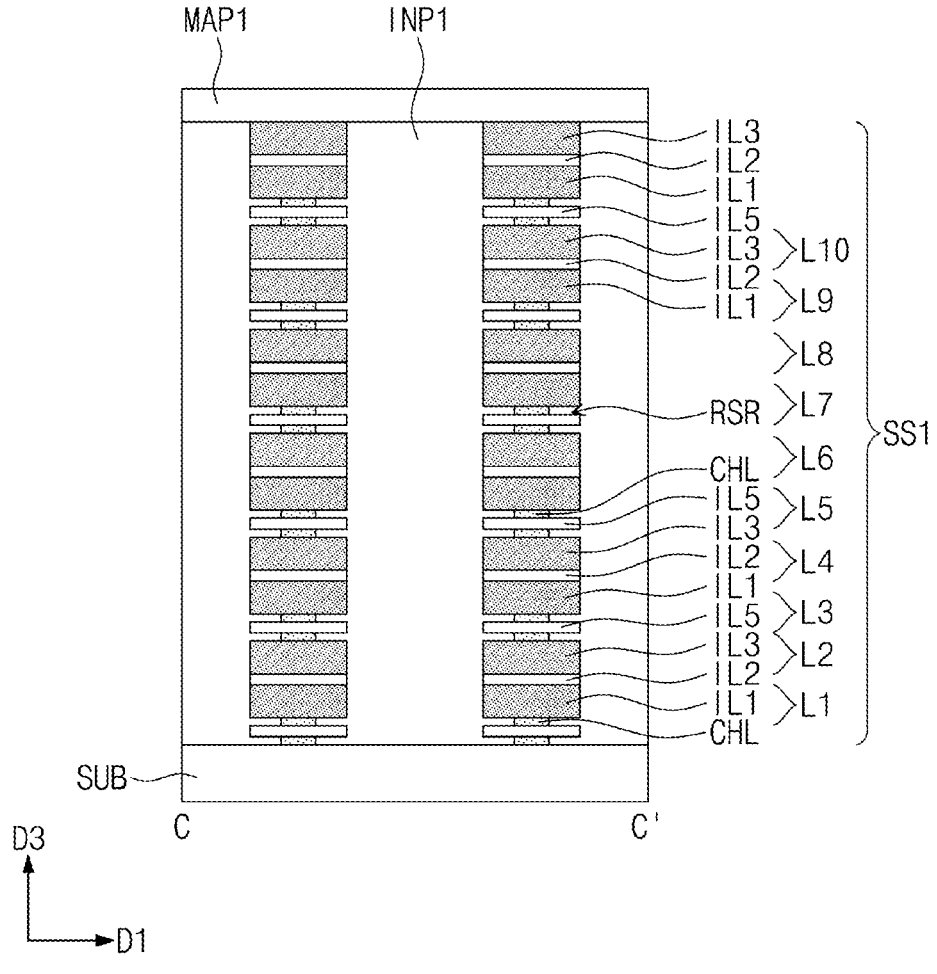
Figure 23D:
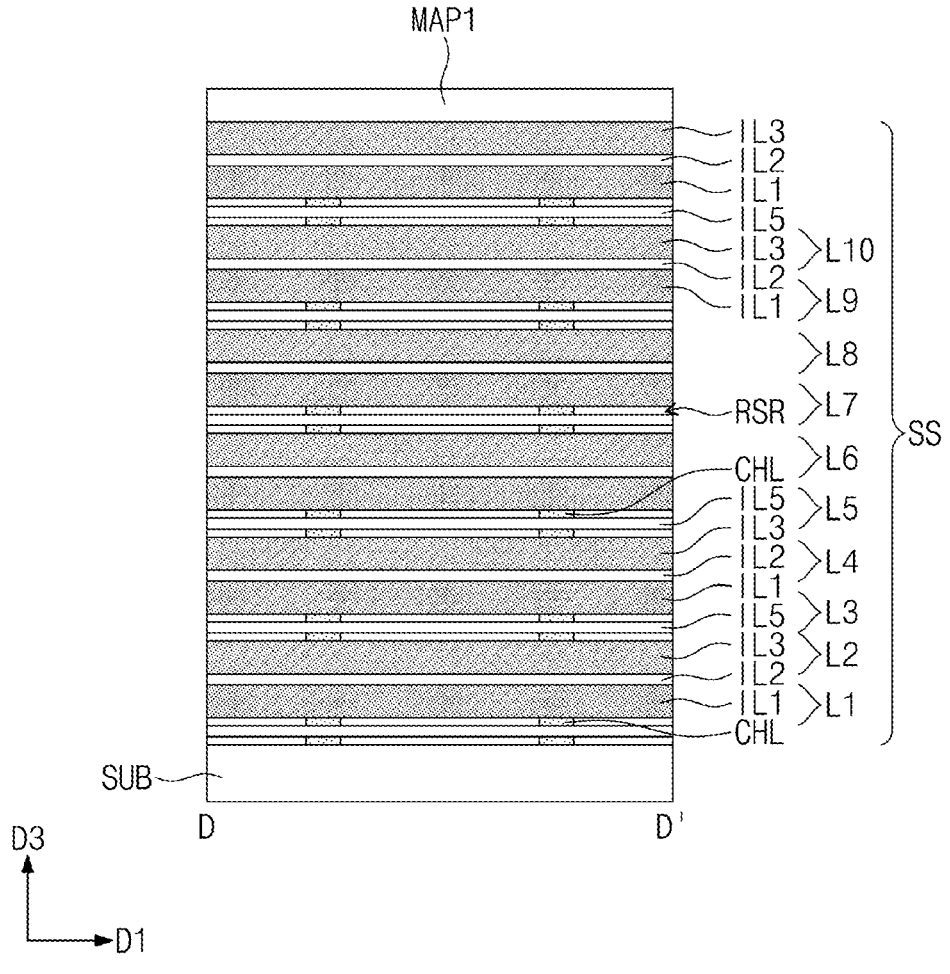
Figure 23E:
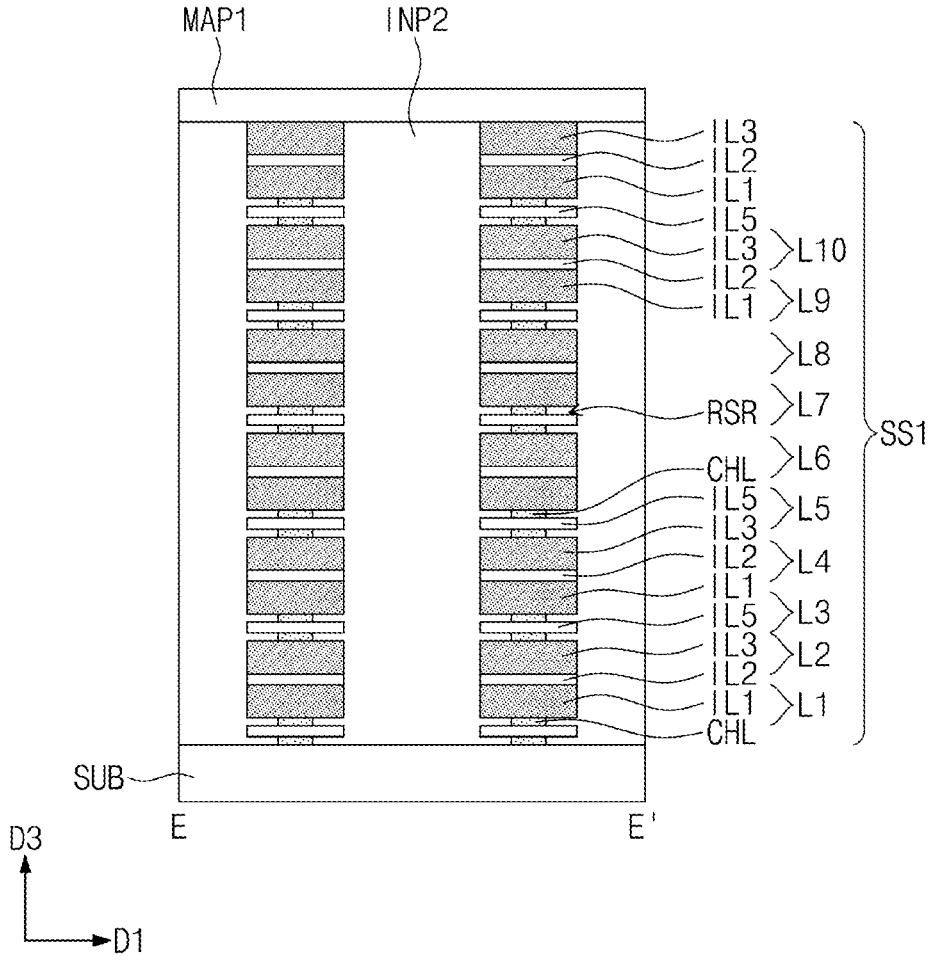
Figure 24:
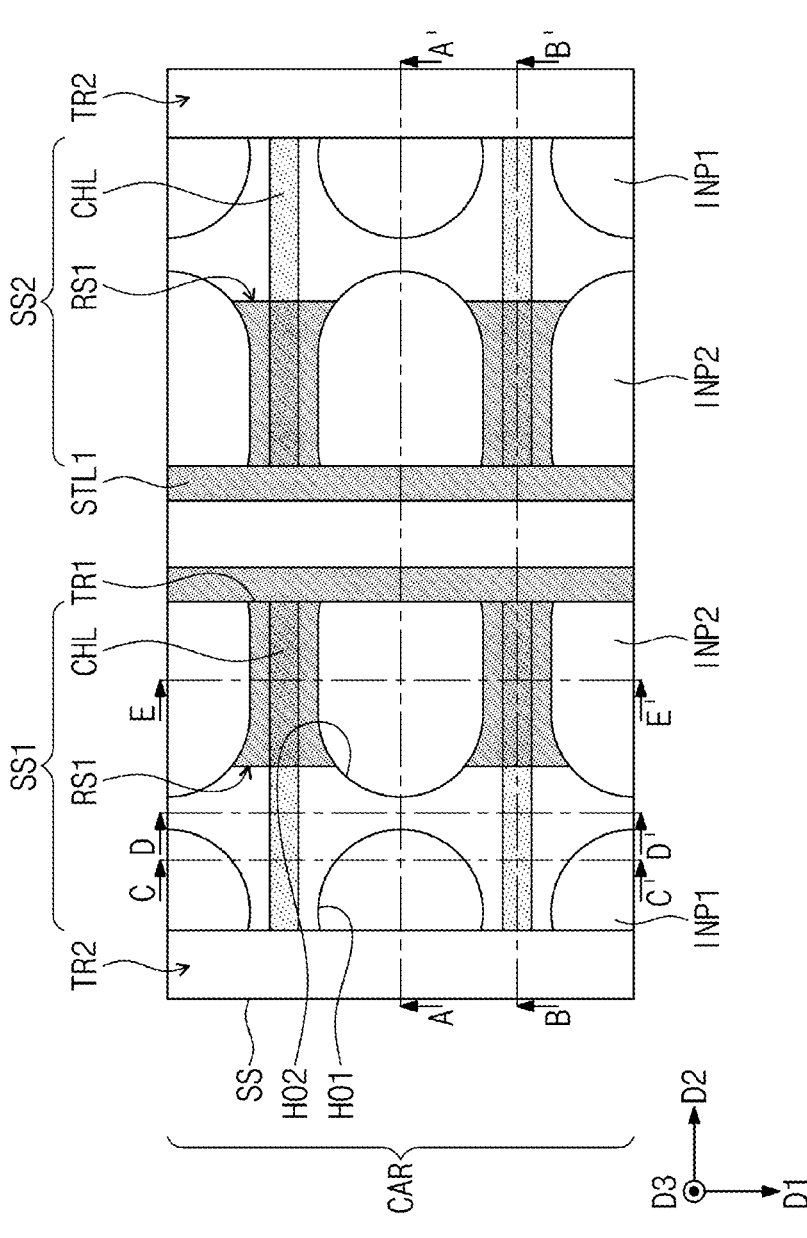

Referring to FIG. 21D, the wet etching process may divide the channel layer CHL in each of the first to tenth layers L1 to L10 into a plurality of channel layers CHL. In an implementation, a single channel layer CHL may be horizontally divided into a plurality of channel layers CHL. The recess region RSR may be between the channel layers CHL that are horizontally divided from each other.

Referring to FIGS. 22 and 23A to 23E, the first and second holes HO1 and HO2 may be filled with a dielectric material to form first sacrificial pillars SAP1 and second sacrificial pillars SAP2, respectively. The first sacrificial pillars SAP1 may completely fill corresponding first holes HO1, and the second sacrificial pillars SAP2 may completely fill corresponding second holes HO2. In an implementation, the first and second dielectric pillars INP1 and INP2 may each include silicon oxide.

Filling insulating layers FIN may be formed while the first and second dielectric pillars INP1 and INP2 are formed (see FIG. 23A). The filling insulating layers FIN may connect the first and second dielectric pillars INP1 and INP2 that are adjacent to each other. In an implementation, the filling insulating layer FIN may be formed in the recess region RSR.

A first mask pattern MAP1 may be formed on the top surfaces of the first and second stack structures SS1 and SS2 and on the top surface of the gap-fill layer GFL in the first trench TR1. The first mask pattern MAP1 may expose the gap-fill layer GFL in the second trench TR2.

The first mask pattern MAP1 may be used as an etching mask to selectively remove the exposed gap-fill layer GFL. Therefore, the first stopper layer STL1 may be exposed on a sidewall of each of the first and second stack structures SS1 and SS2. In an implementation, the first stopper layer STL1 may be exposed in the second trench TR2.

Referring to FIGS. 24 and 25A to 25E, the first stopper layer STL1 in the second trench TR2 may be selectively removed through the second trench TR2. The first and third insulating layers IL1 and IL3 may be partially removed which are exposed to the second trench TR2. In an implementation, the removal of the first stopper layer STL1 and the first and third insulating layers IL1 and IL3 may include performing a wet etching process that selectively etches silicon nitride. The wet etching process may horizontally and partially etch each of the first and third insulating layers IL1 and IL3.

Figure 25A:
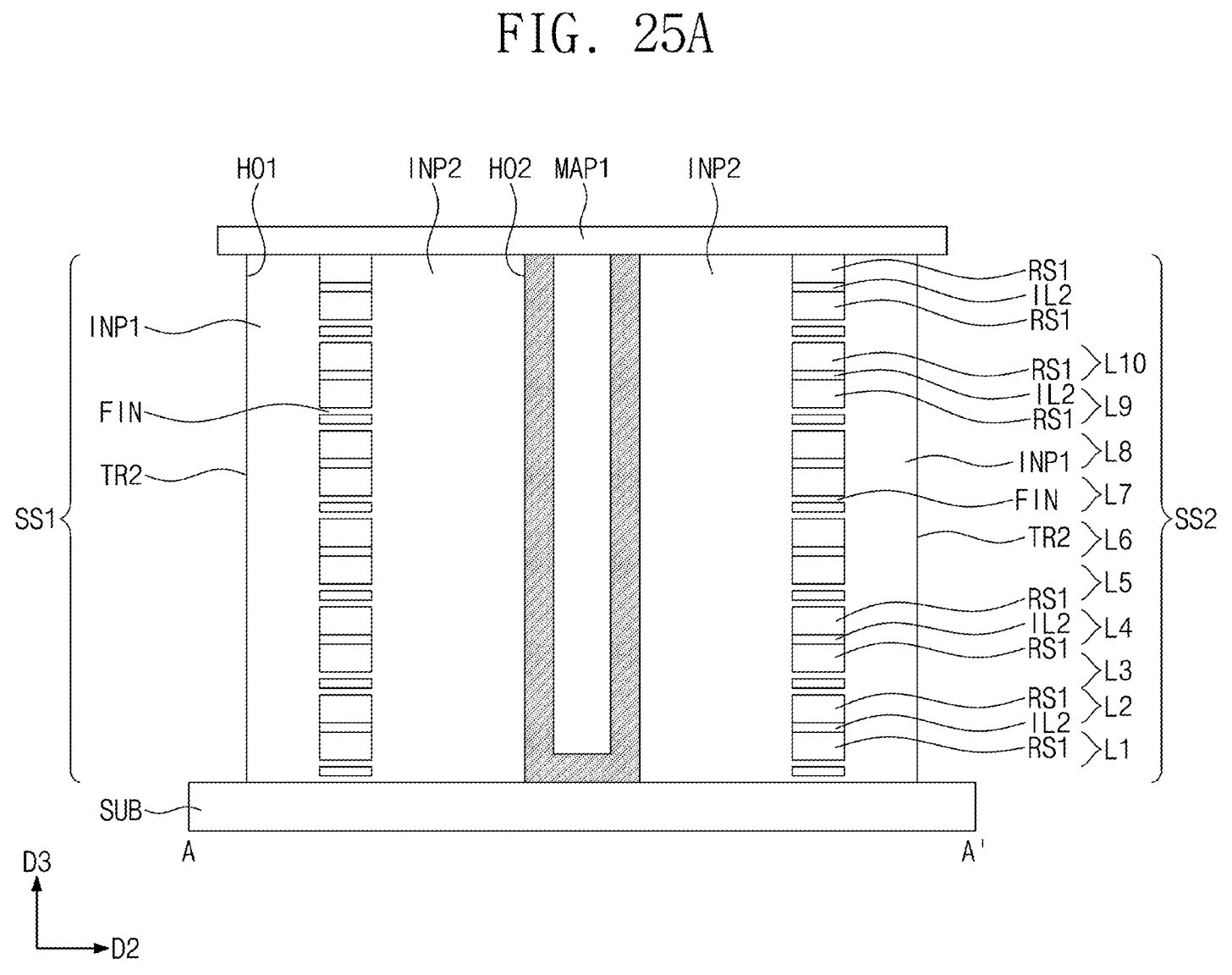
Figure 25B:
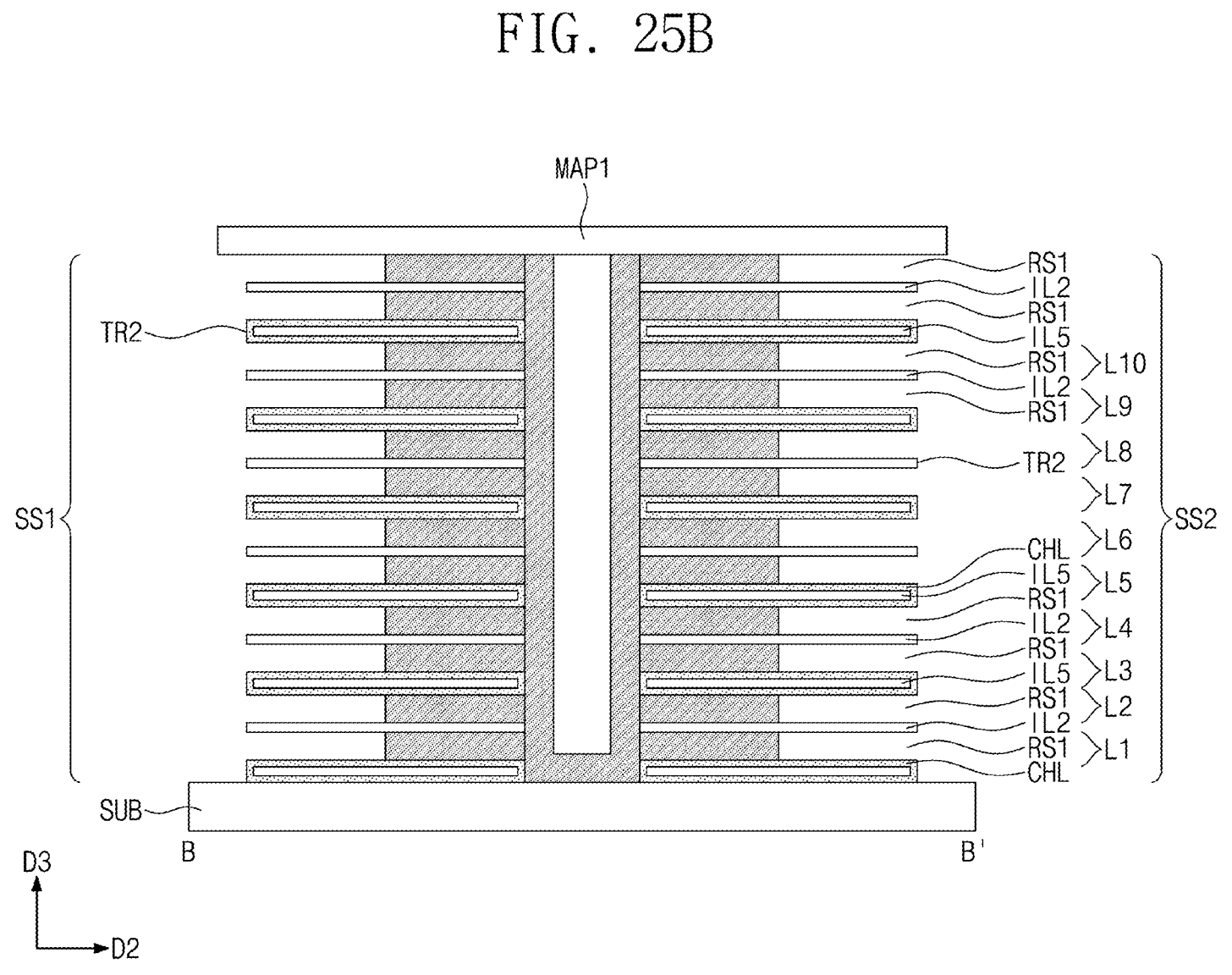
Figure 25C:
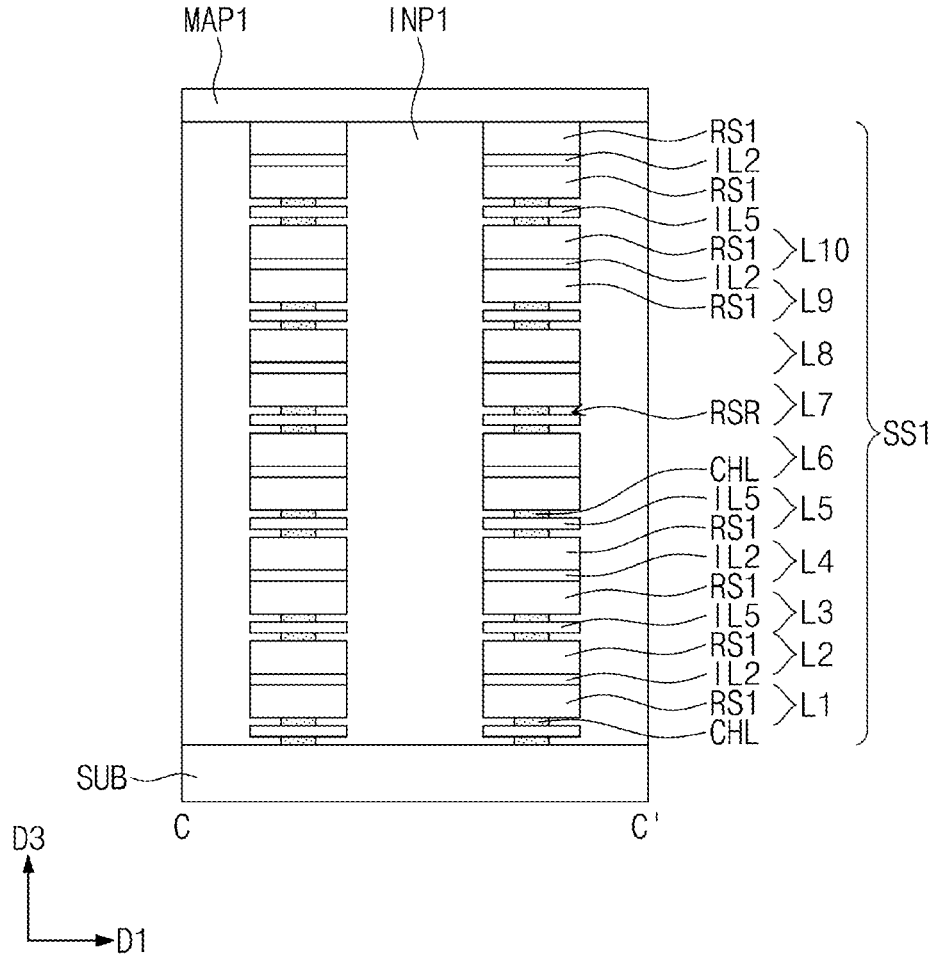
Figure 25D:
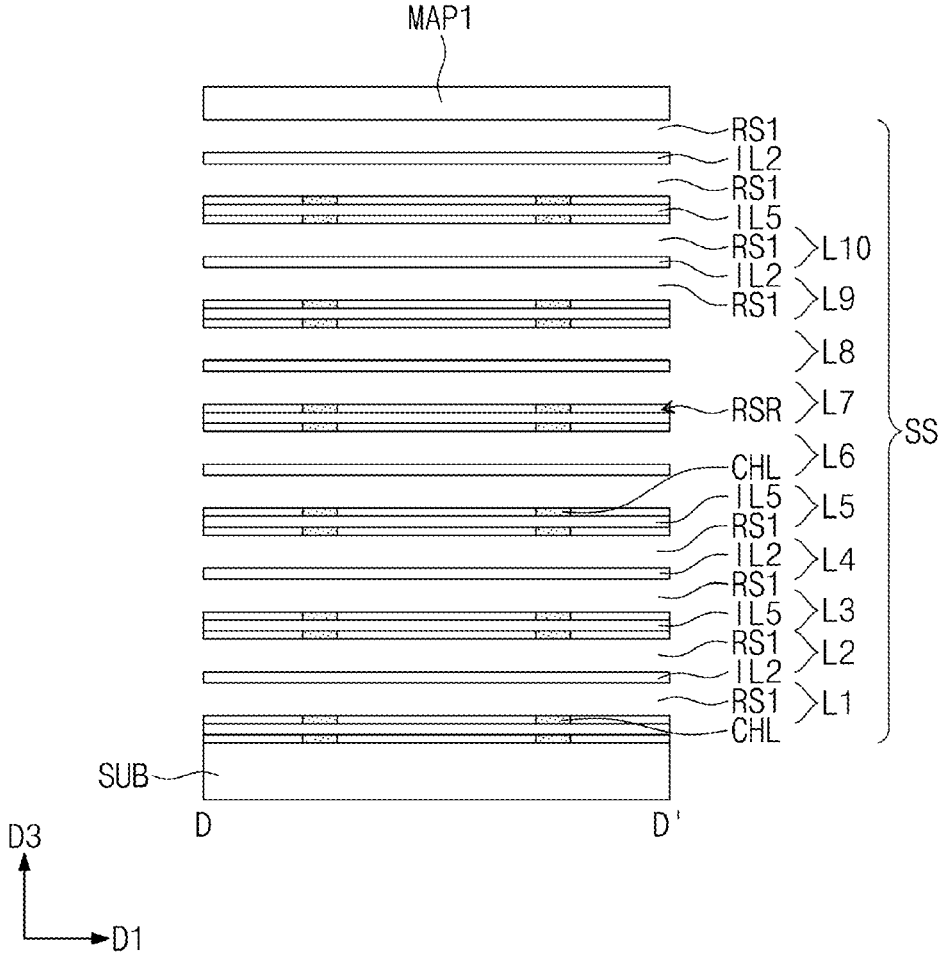
Figure 25E:
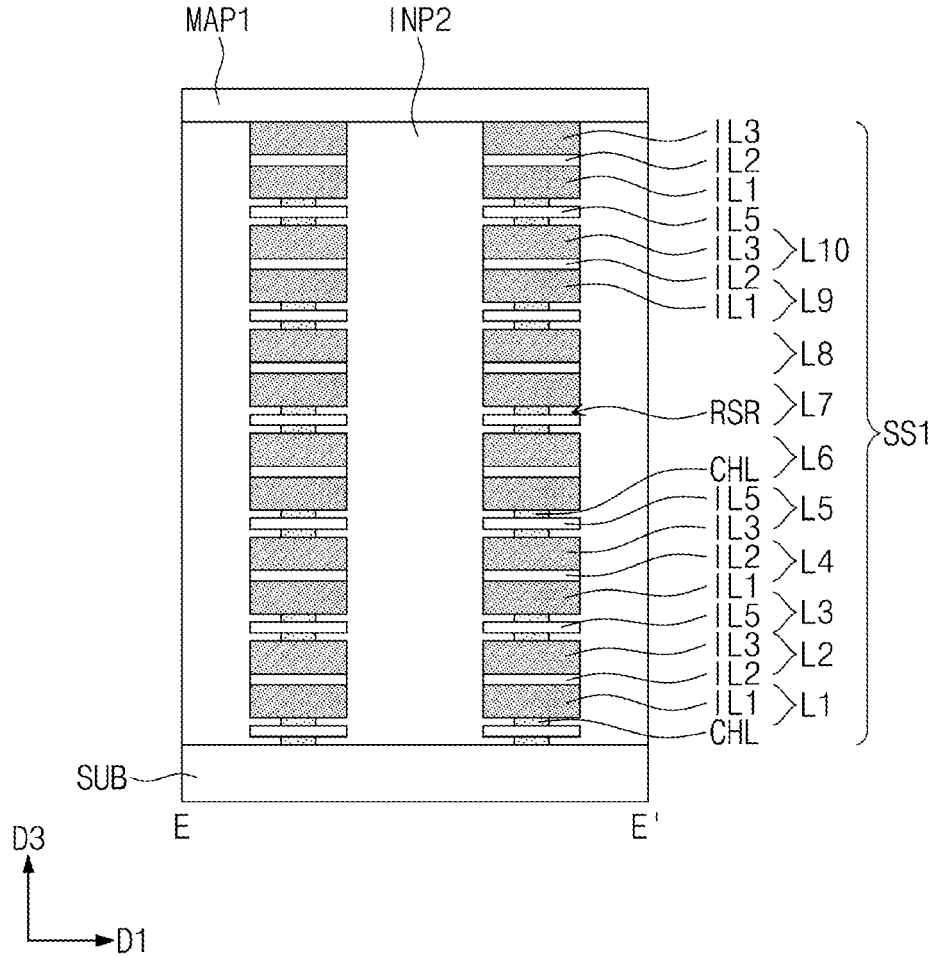
Figure 26:
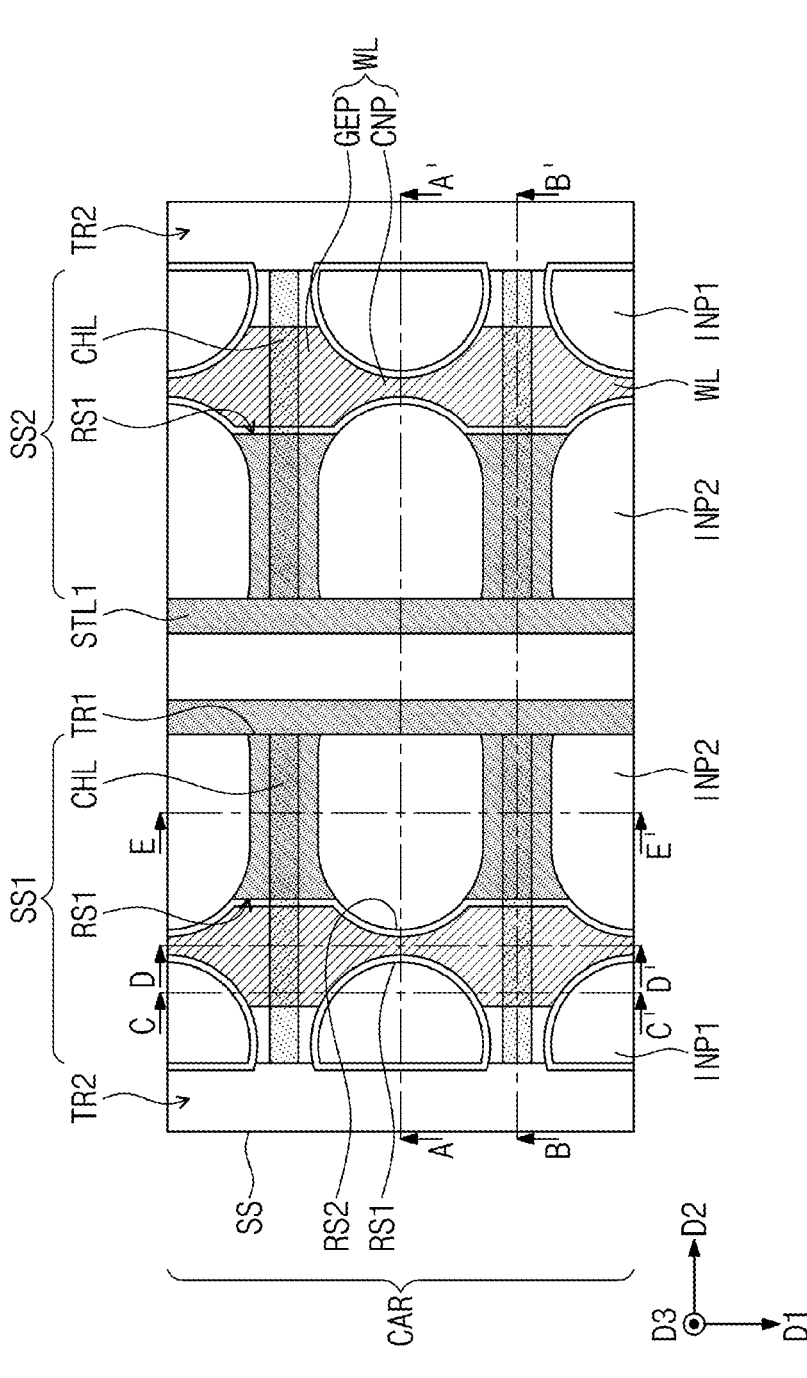
Figure 27C:
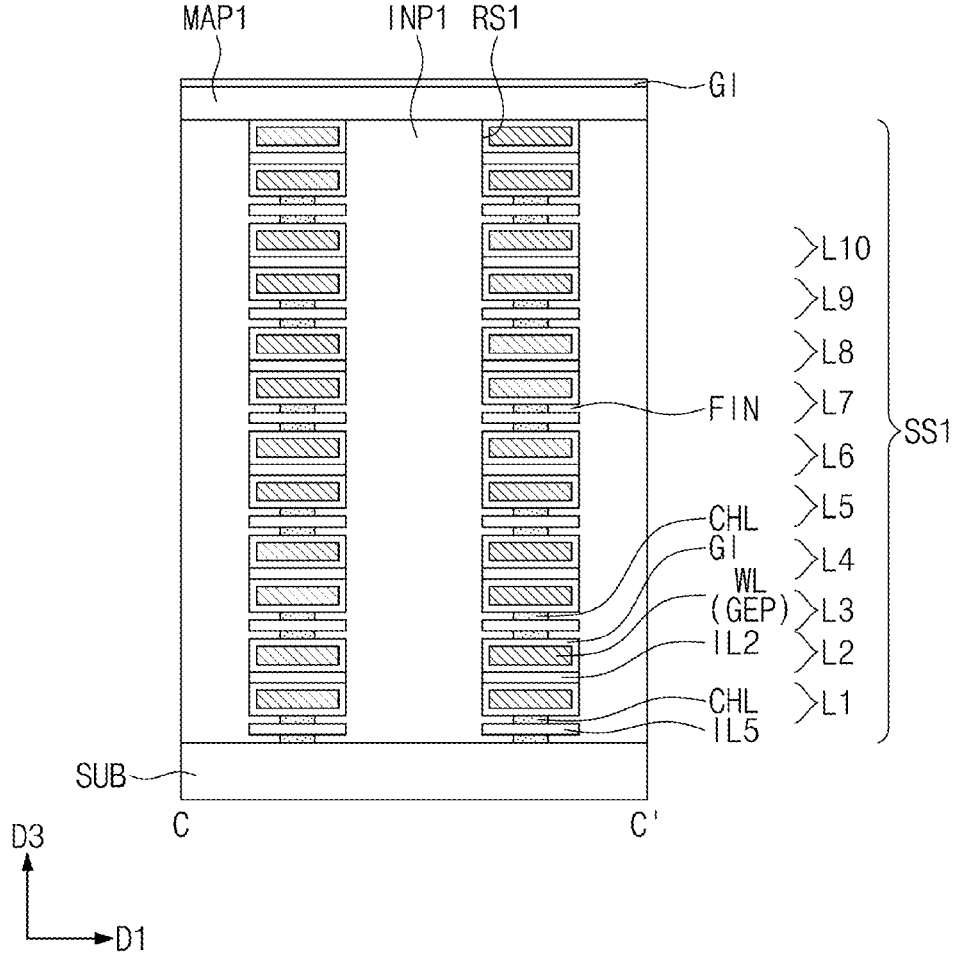
Figure 27D:
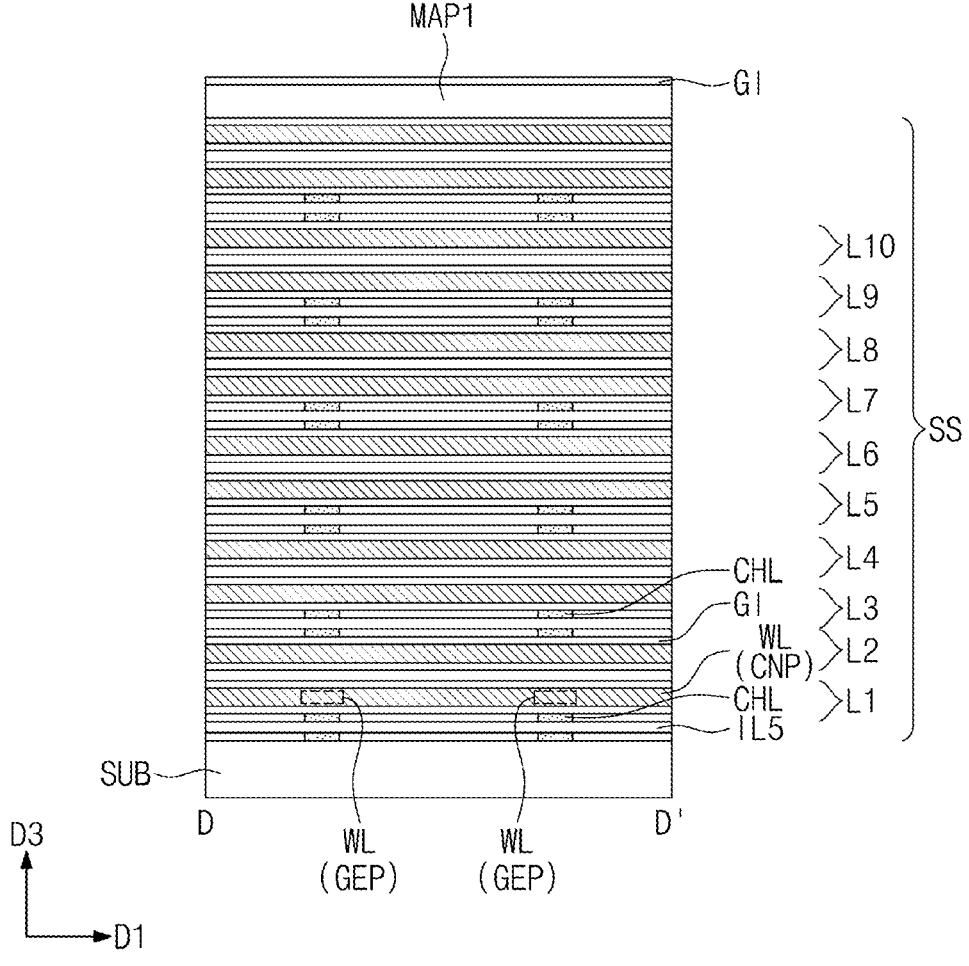
Figure 27E:
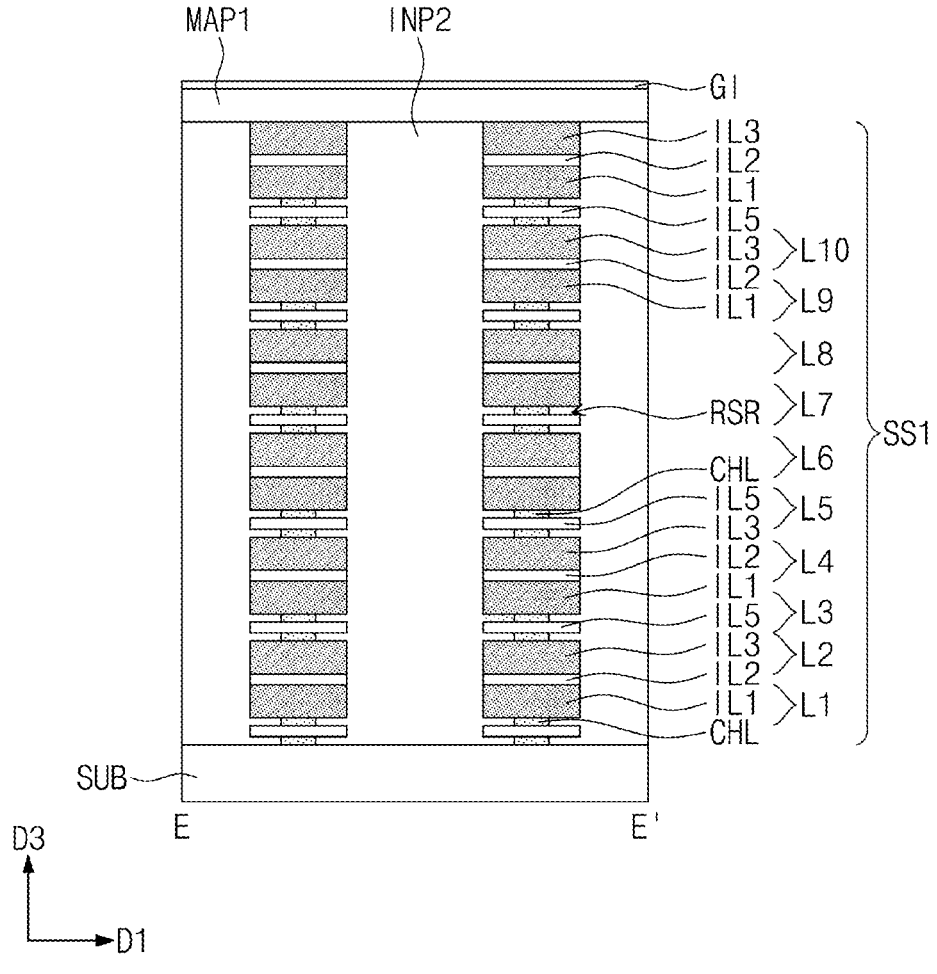
Figure 28:
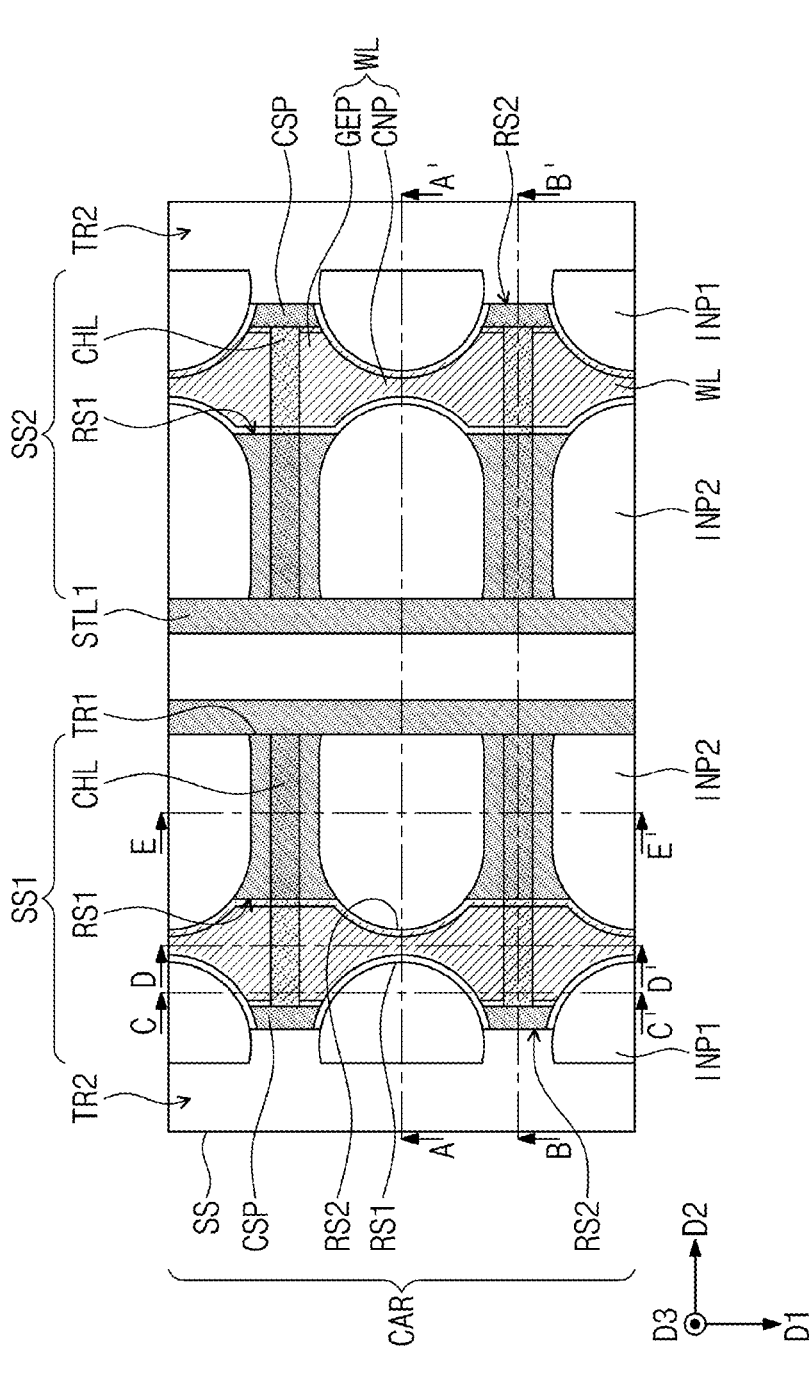
Figure 29C:
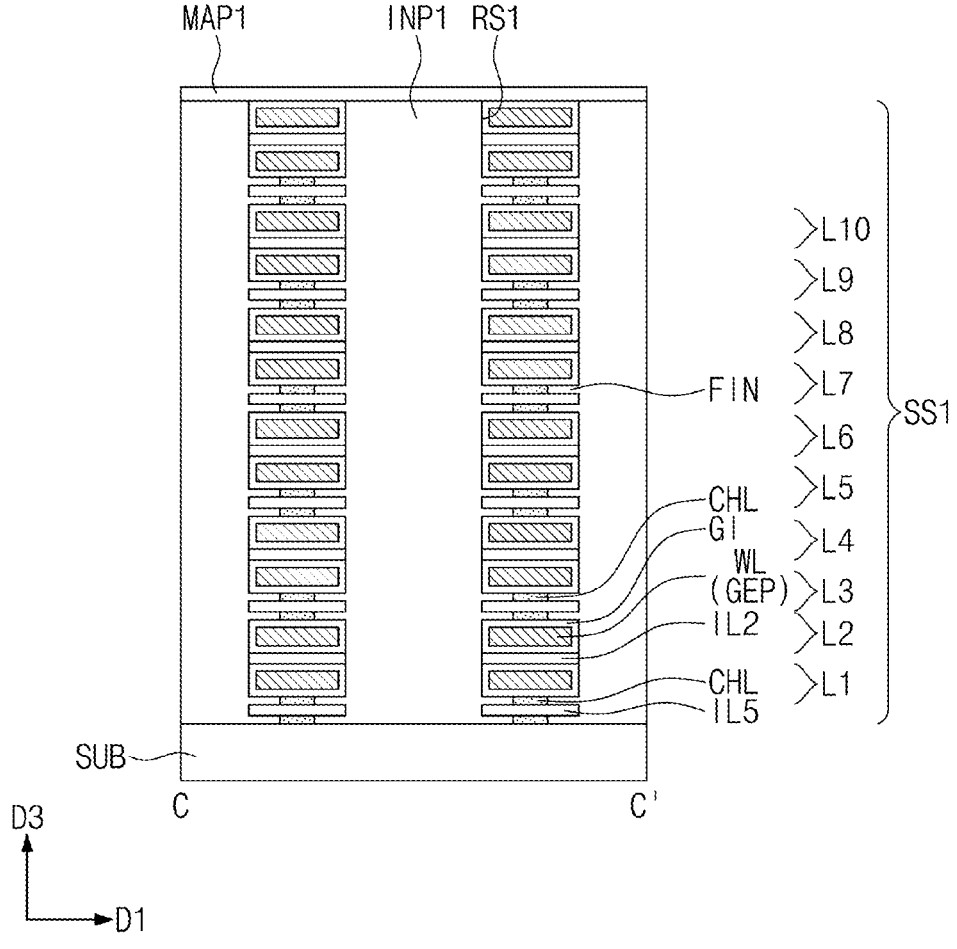
Figure 29D:
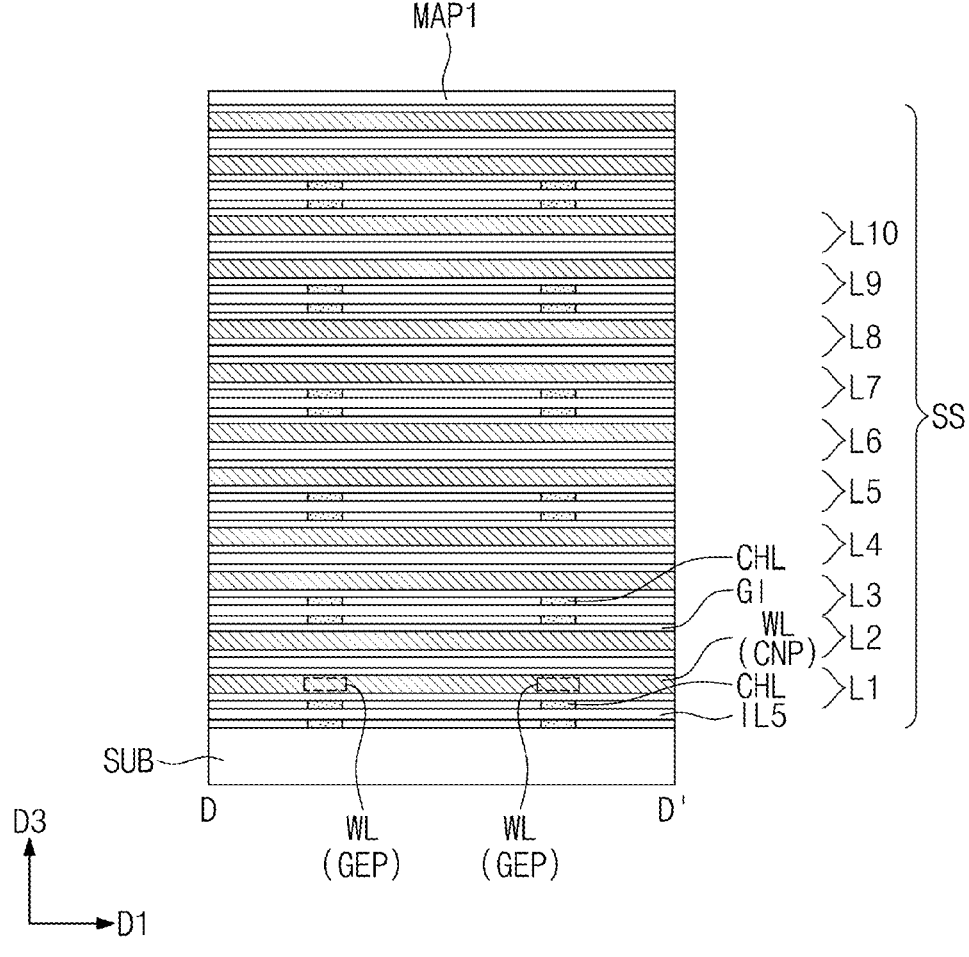
Figure 29E:
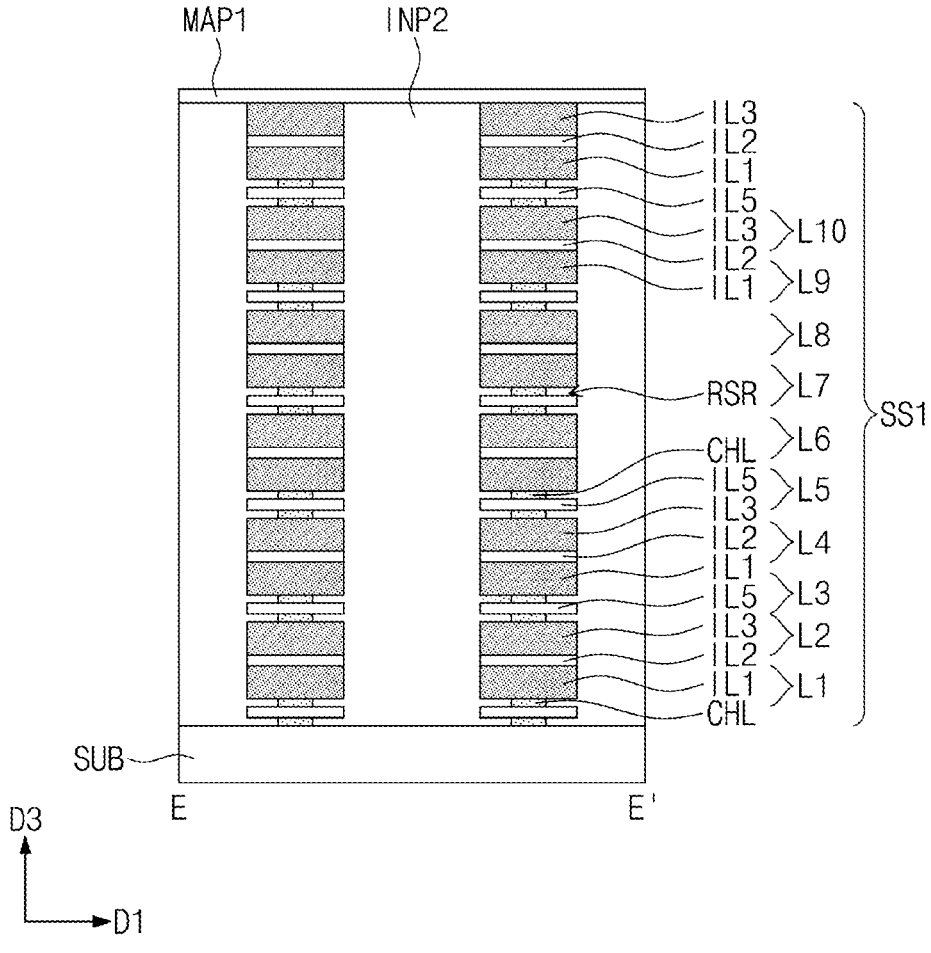
Figure 30:
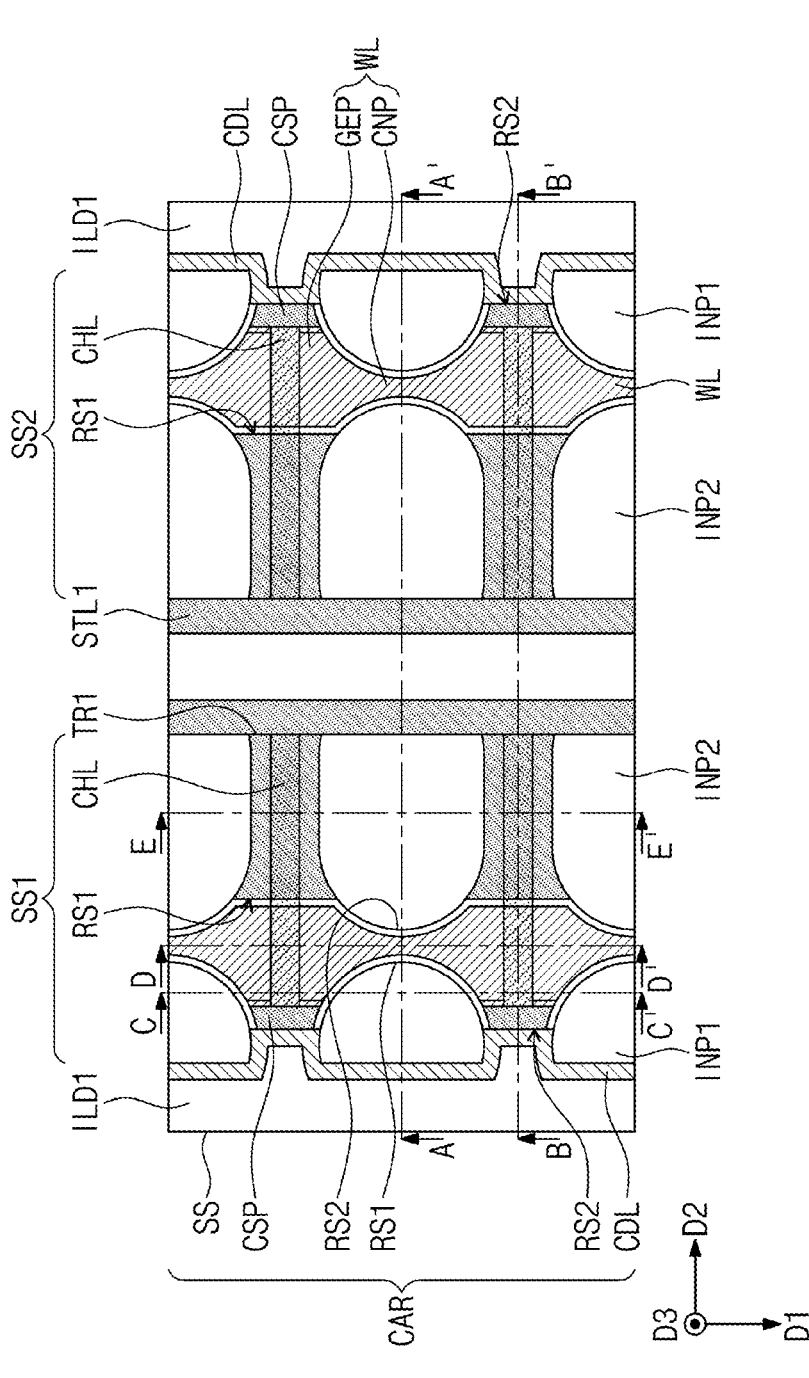
Figure 31C:
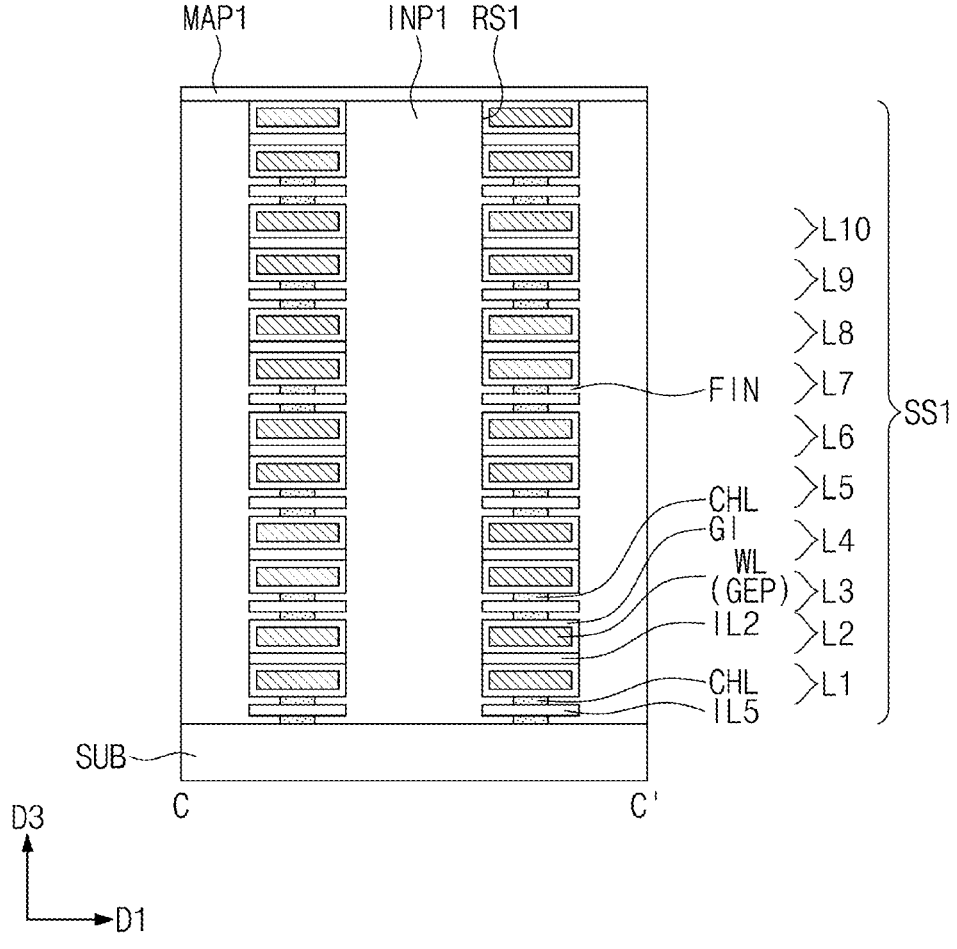
Figure 31D:
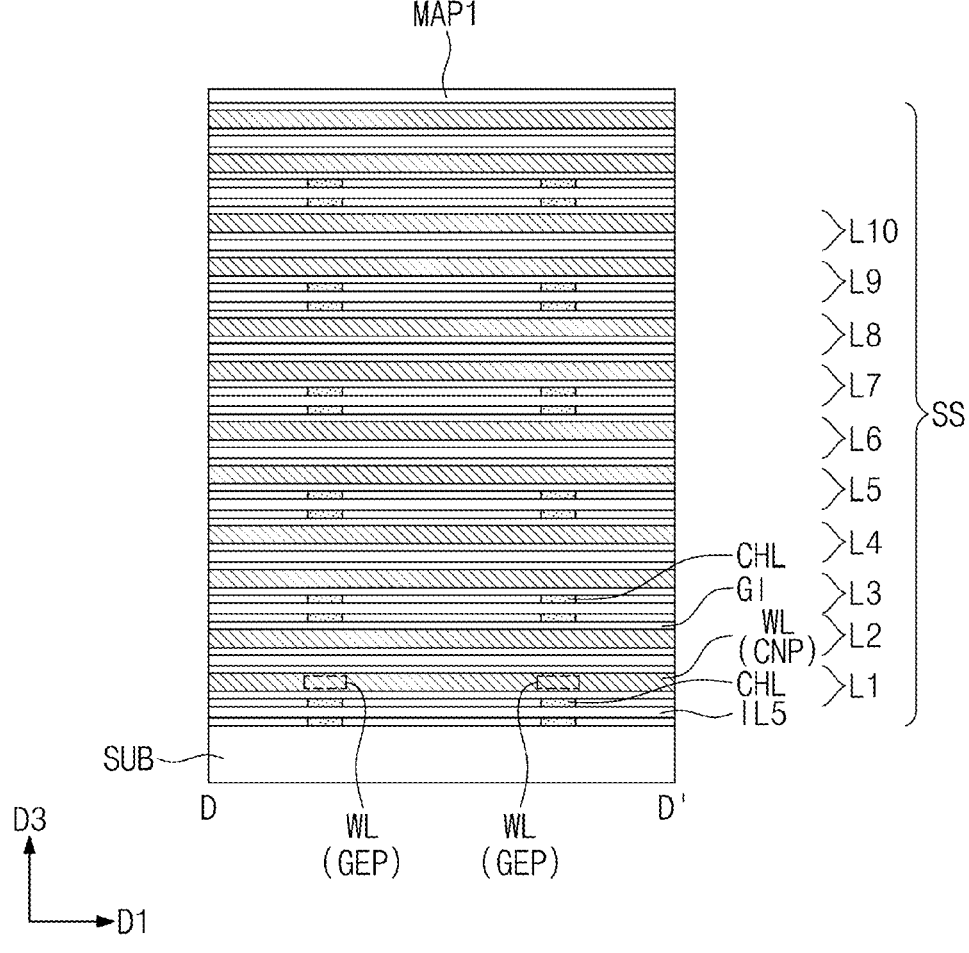
Figure 31E:
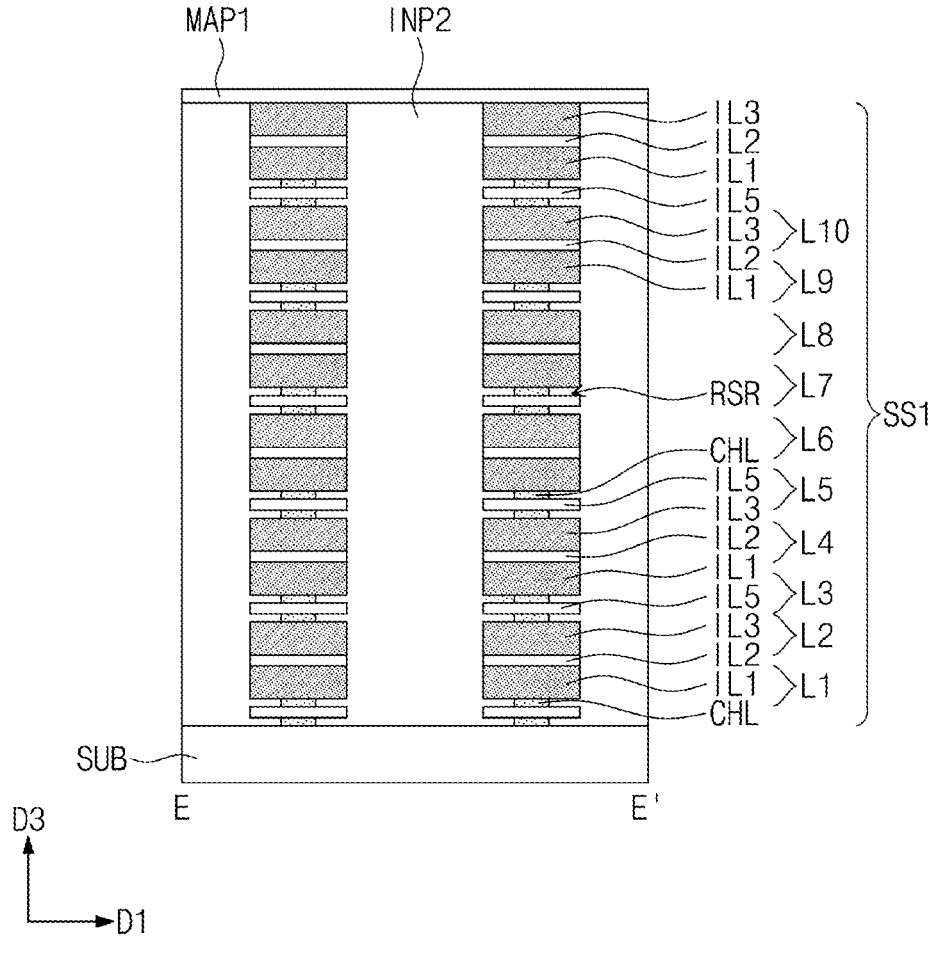
Figure 32:
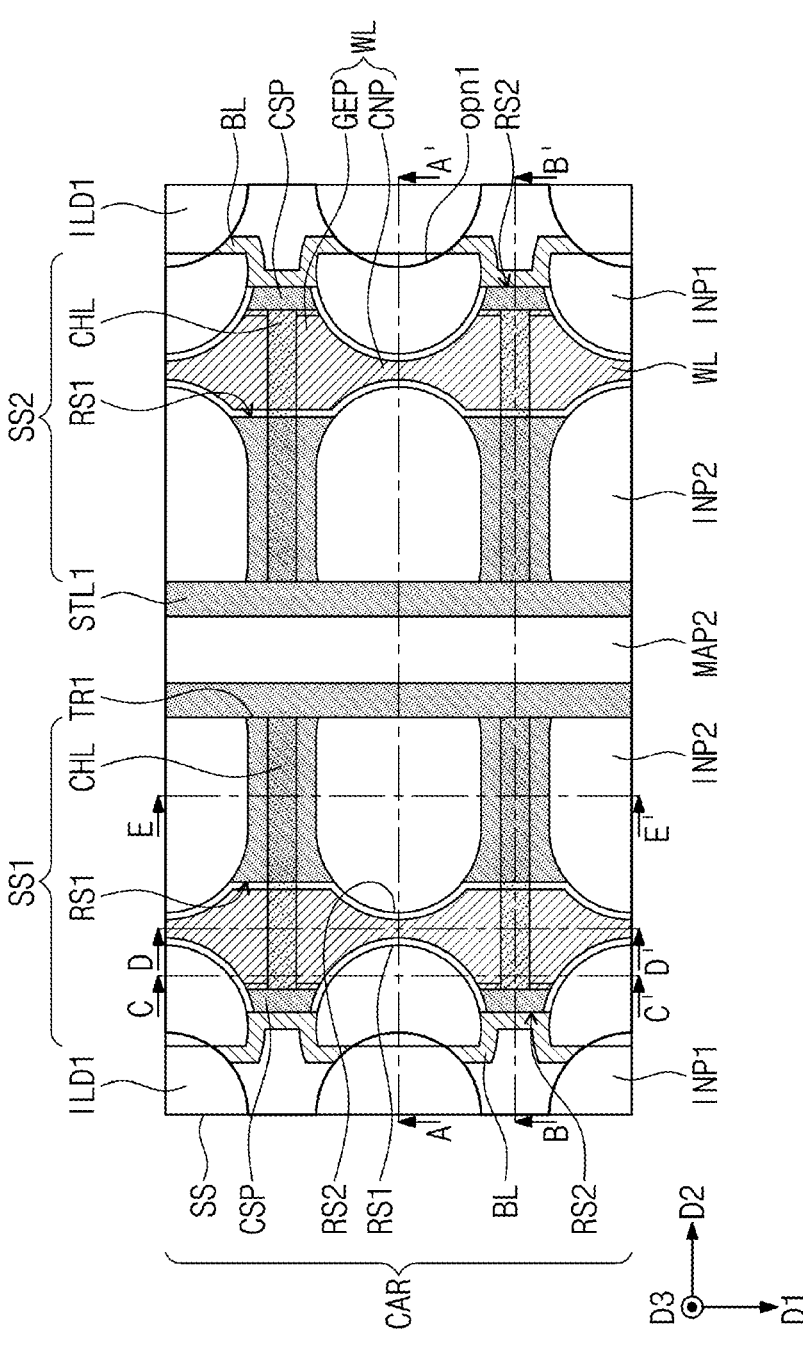
Figure 33C:
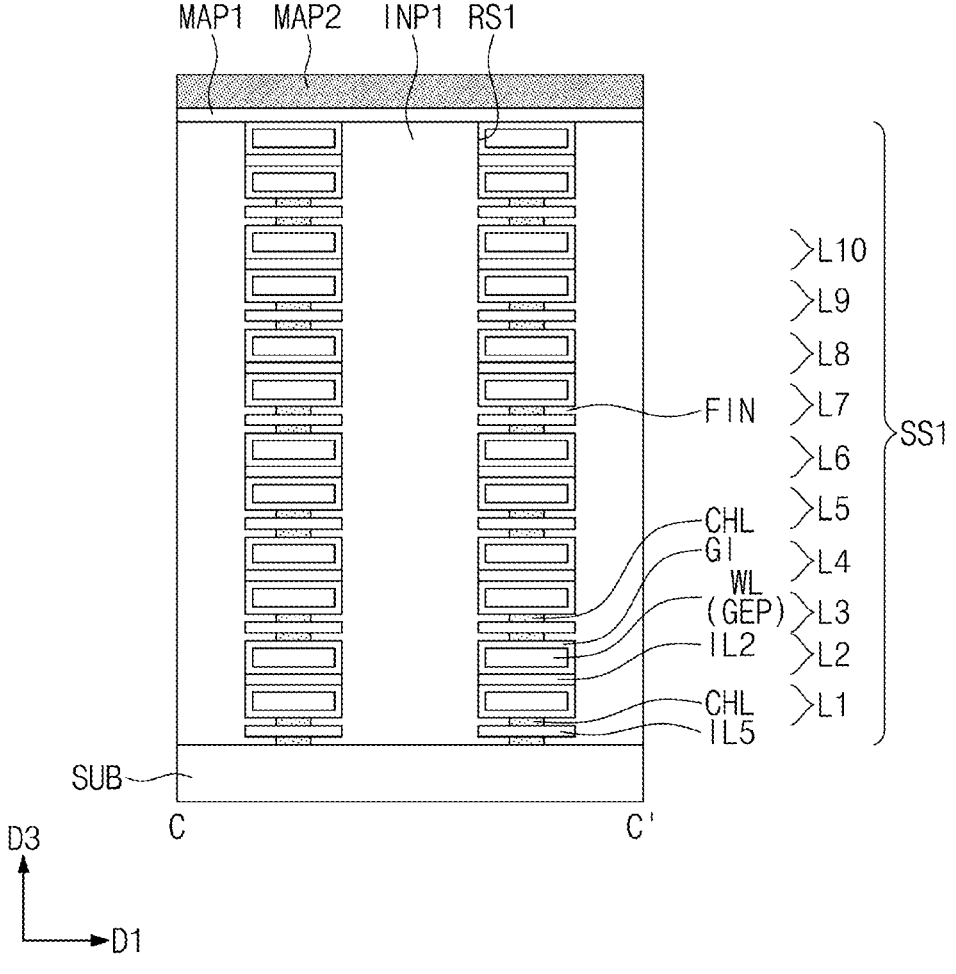
Figure 33D:
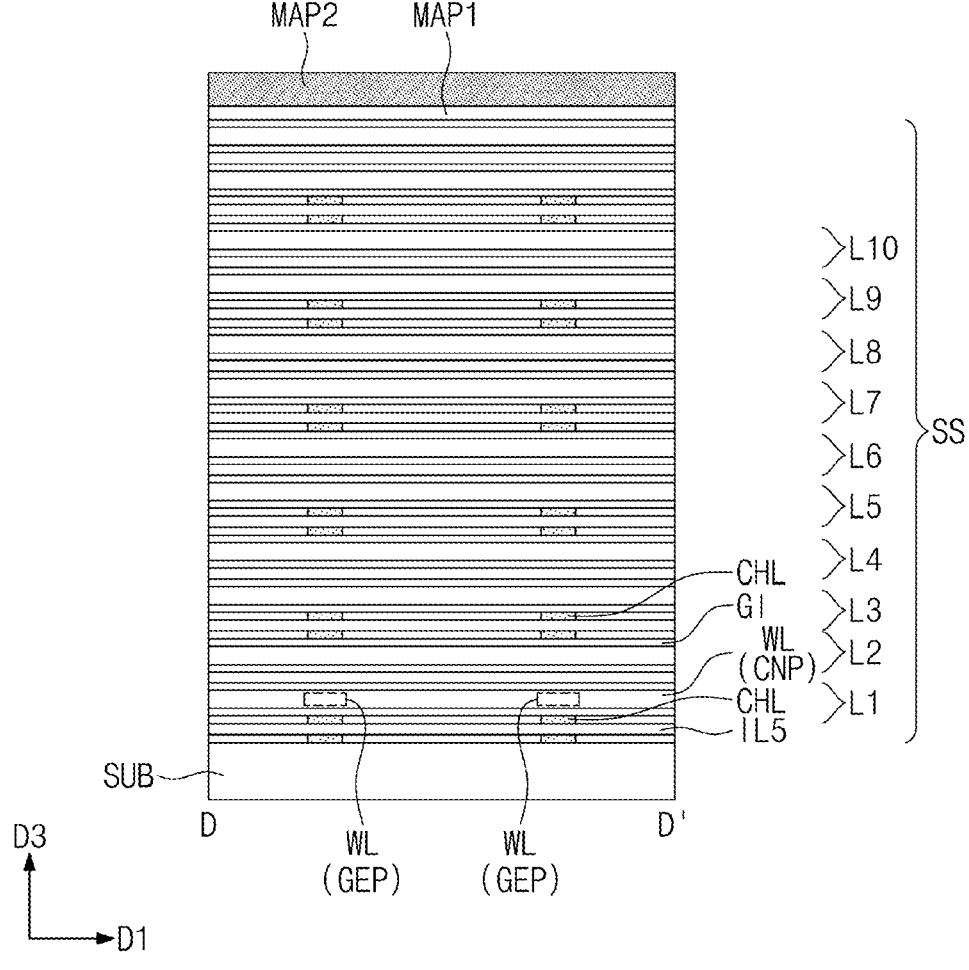
Figure 33E:
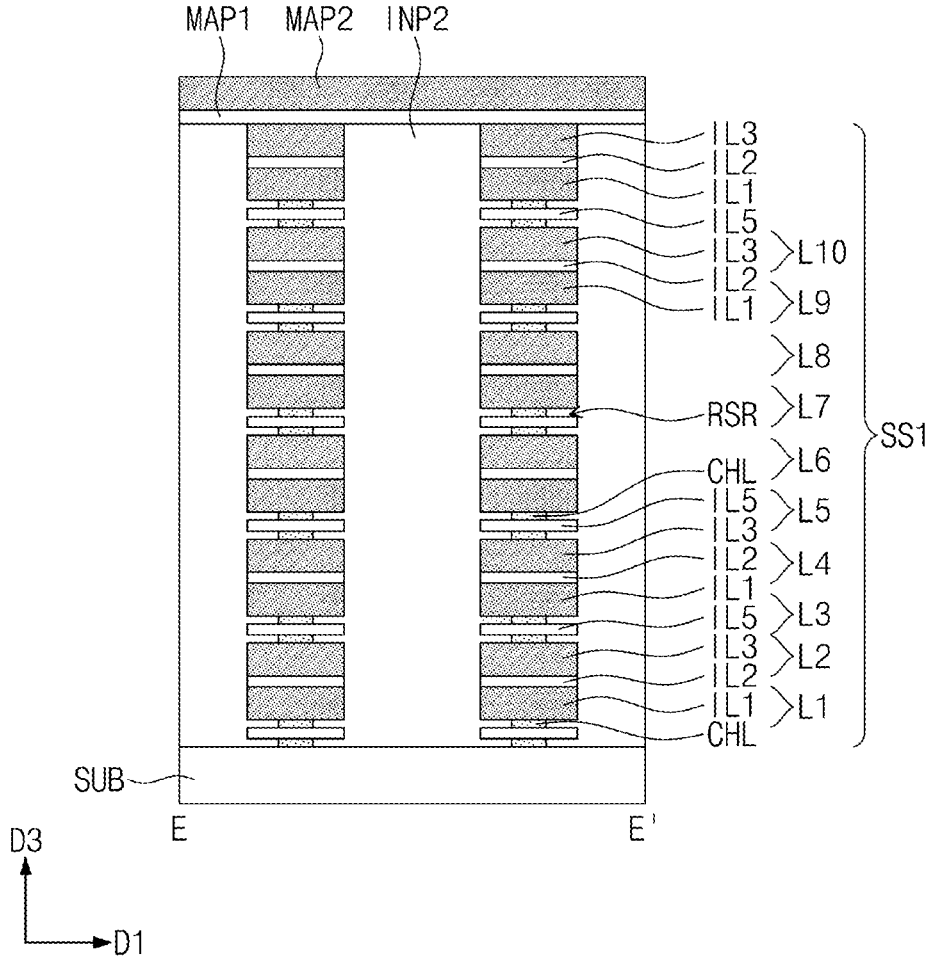
Figure 34:
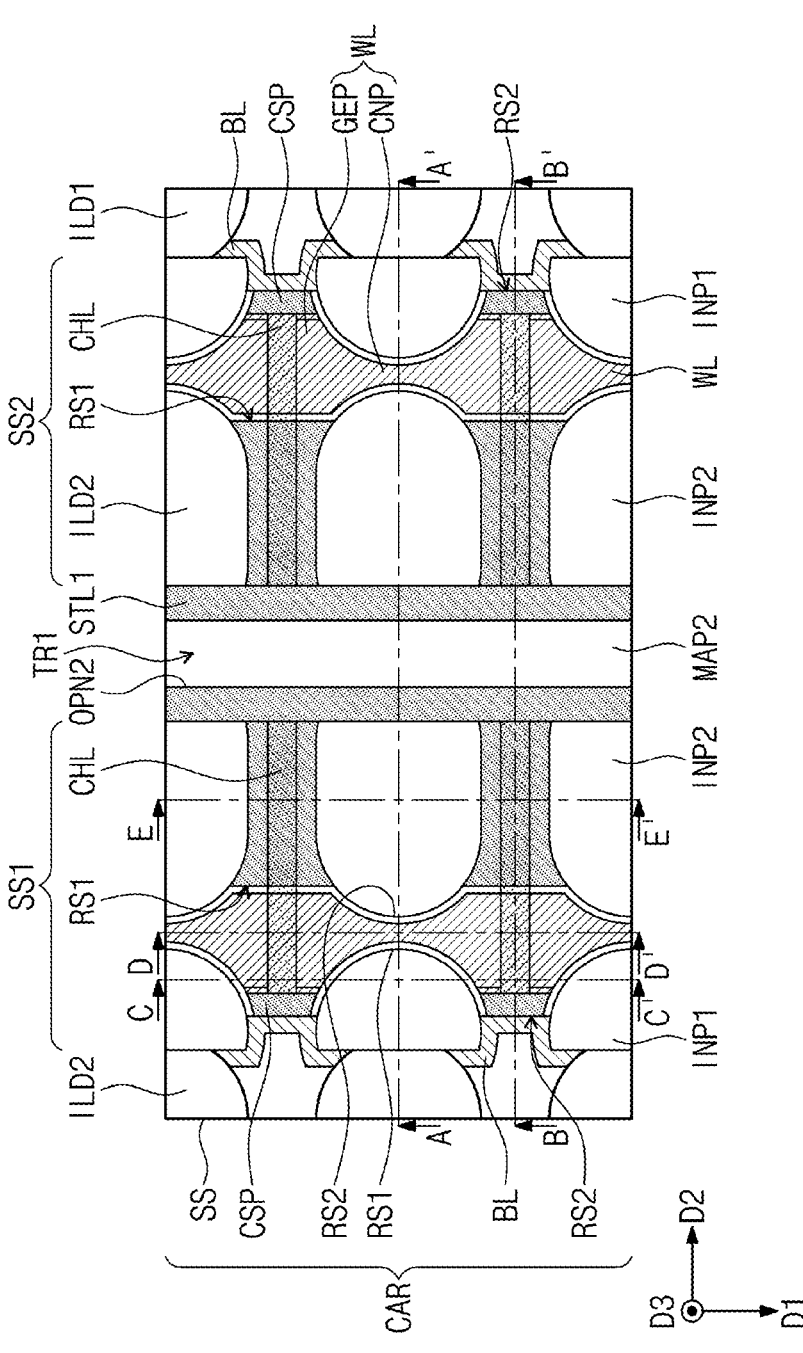
Figure 35C:
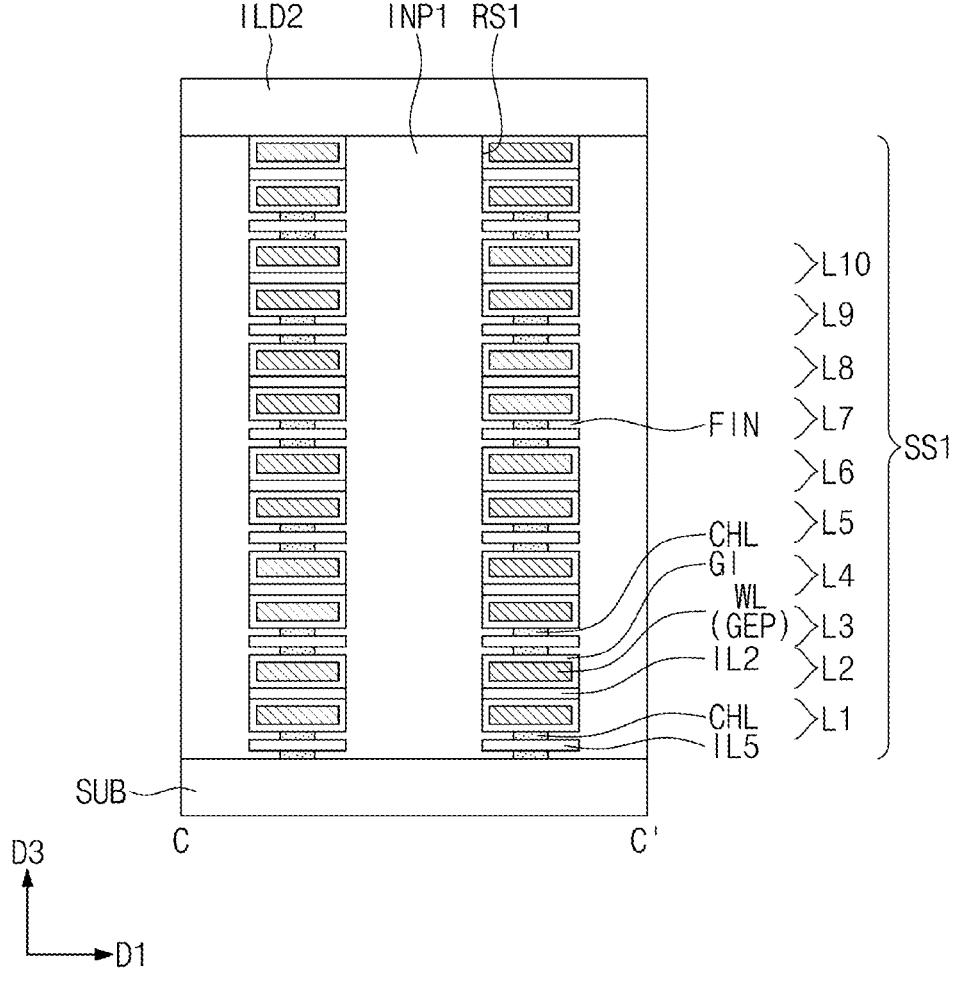
Figure 35D:
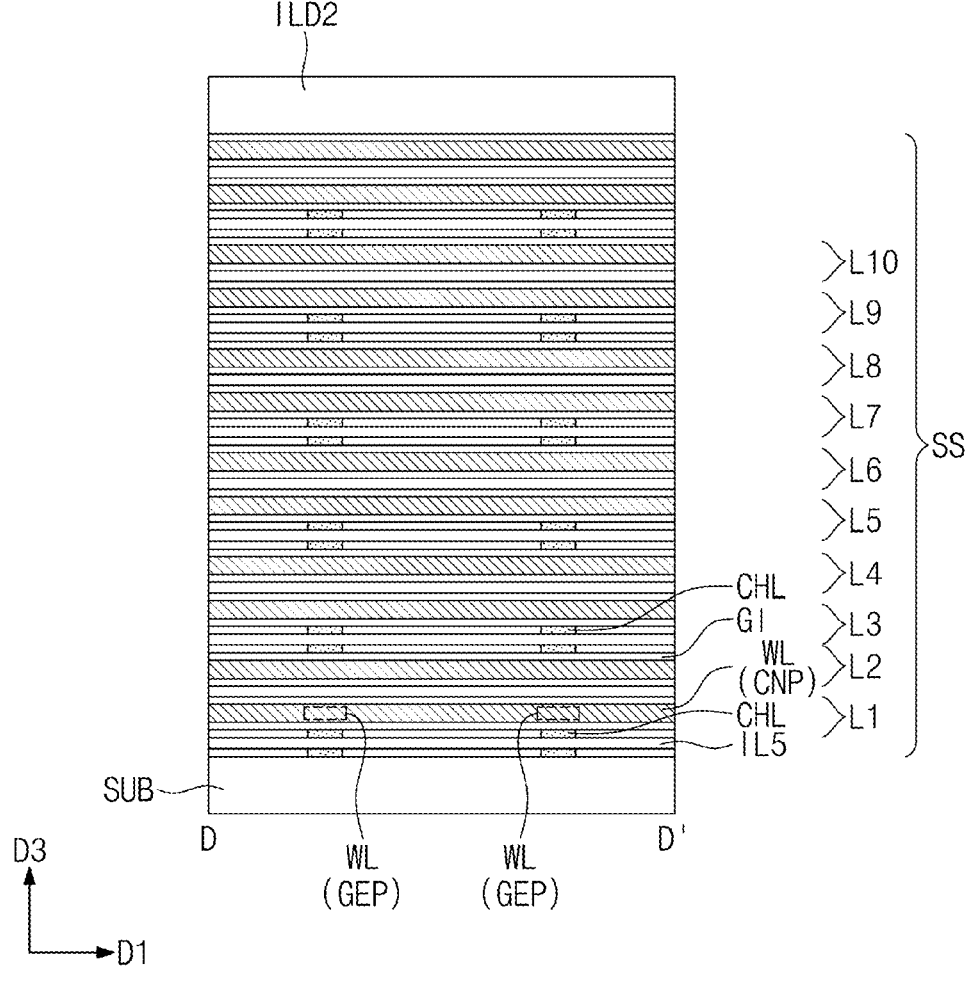
Figure 35E:
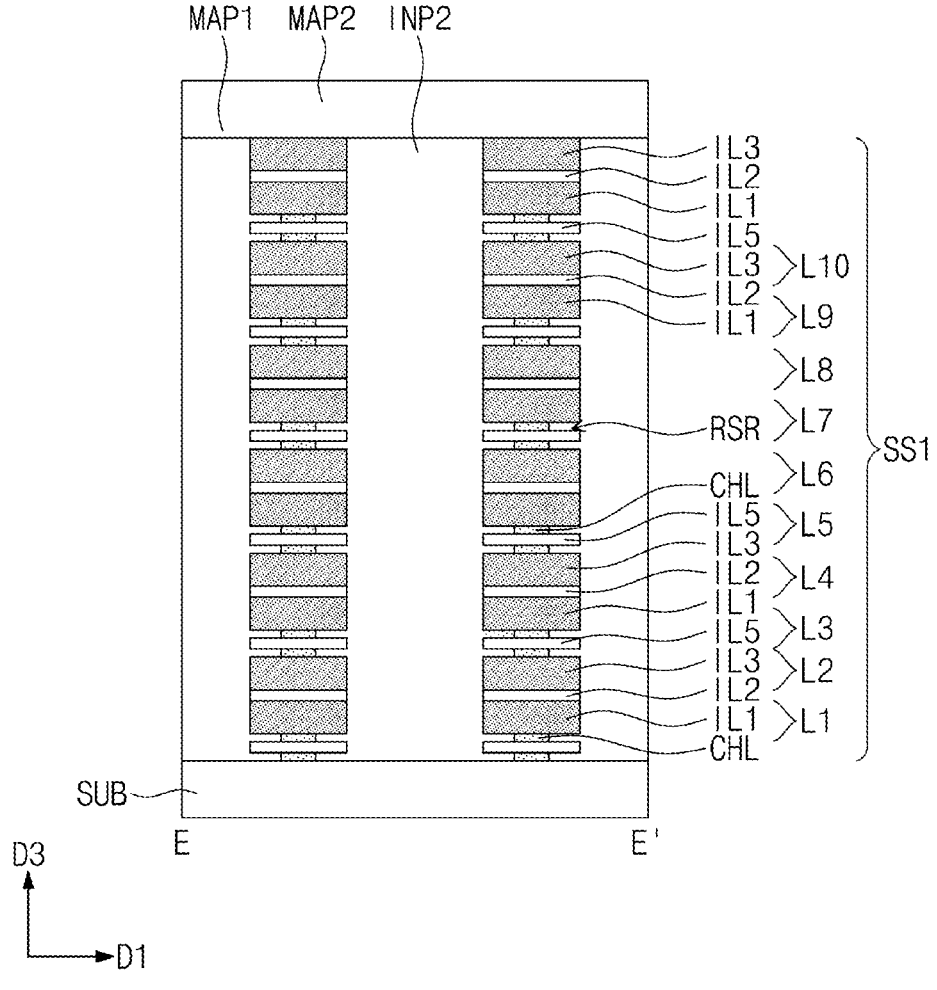
Figure 36:
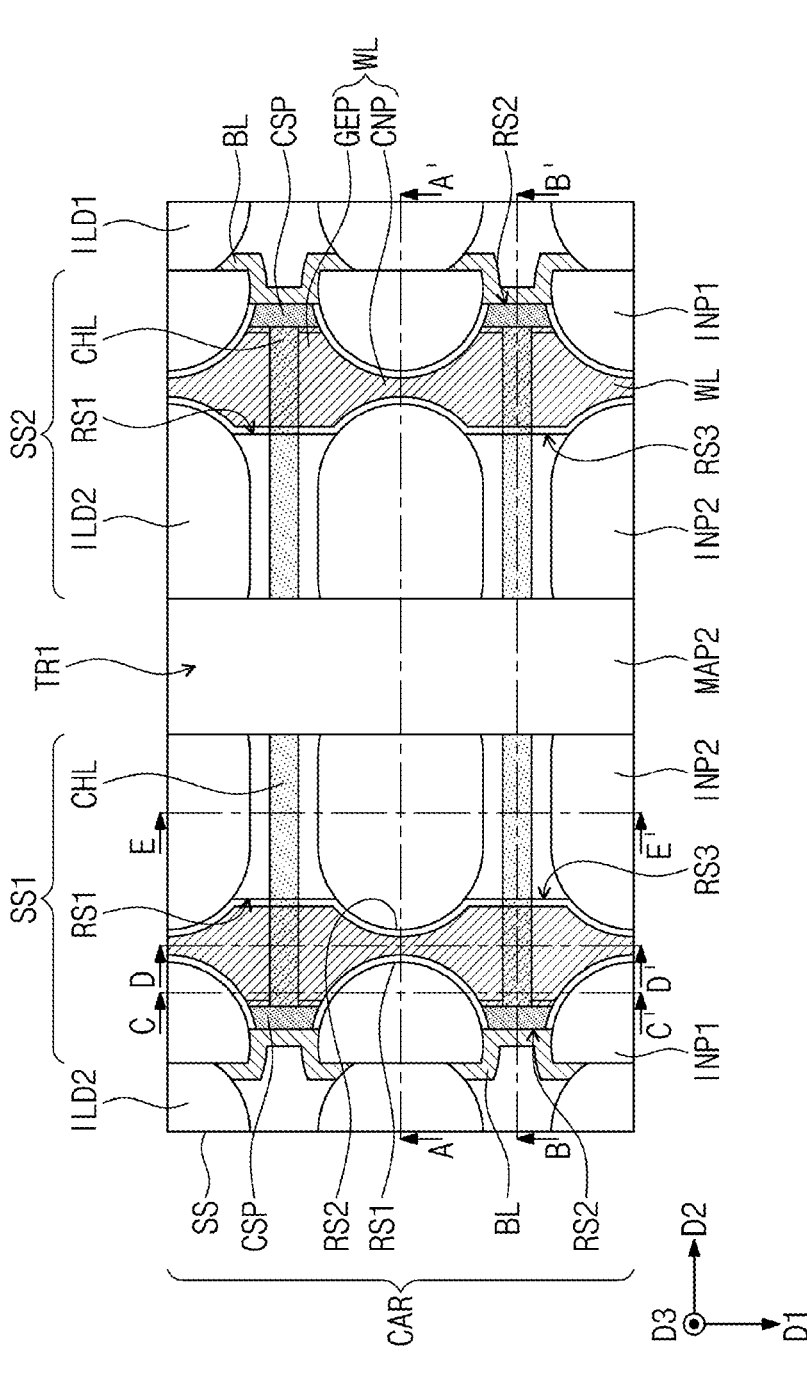

As each of the first and third insulating layers IL1 and IL3 is horizontally etched, the first stack structure SS1 may have a first recess RS1 that is formed to extend in the second direction D2 from the second trench TR2. The first recess RS1, which extends from the second trench TR2, may also be formed in the second stack structure SS2. Referring to FIGS. 25B and 25C, the first recess RS1 may be formed between the channel layer CHL and the second insulating layer IL2.

Referring to FIGS. 26 and 27A to 27E, a gate insulating layer GI may be conformally deposited on the substrate SUB. The gate insulating layer GI may be formed through the second trench TR2 in the first recess RS1.

A word line WL may be formed in the first recess RS1. The word line WL may be formed on the gate insulating layer GI. In an implementation, the formation of the word line WL may include using the second trench TR2 to deposit a metal layer in the first recess RS1, and allowing the metal layer to undergo a wet etching process performed through the second trench TR2 to thereby form the word line WL that remains in the first recess RS1.

The word lines WL may be correspondingly formed in the first recesses RS1 and may be stacked in the third direction D3. Each of the word lines WL may have a linear shape that extends along the first direction D1. The word line WL may have first and second recessed sidewalls RSP1 and RSP2 that are respectively formed by the first and second dielectric pillars INP1 and INP2 that are adjacent to each other.

The word line WL may include a gate portion GEP adjacent to the channel layer CHL and a connection portion CNP that is between the first and second dielectric pillars INP1 and INP2. The connection portion CNP may connect the gate portions GEP that are adjacent to each other in the first direction D1. The gate portion GEP may be formed to have a width in the second direction D2 greater than a width in the second direction D2 of the connection portion CNP.

Referring to FIGS. 28 and 29A to 29E, a capping pattern CSP may be formed on an exposed sidewall of the gate portion GEP of the word line WL. The capping pattern CSP may be formed between the first dielectric pillars INP1 that are adjacent to each other in the first direction D1. The capping pattern CSP may be used as an etching mask to partially remove the gate insulating layer GI that is exposed externally.

Referring to FIG. 29B, the channel layer CHL, the second insulating layer IL2, and the fifth insulating layer IL5 may be horizontally etched through the second trench TR2, thereby being recessed in a direction parallel to the second direction D2. The channel layer CHL may be horizontally recessed to divide one channel layer CHL into a lower channel layer CHL and an upper channel layer CHL. The fifth insulating layer IL5 may be between the lower channel layer CHL and the upper channel layer CHL. The lower channel layer CHL and the upper channel layer CHL may be recessed to form a second recess RS2 that expose the lower and upper channel layers CHL.

In an implementation, a doping process may be performed on an end of the channel layer CHL, which end is exposed to the second recess RS2. The doping process may allow the end of the channel layer CHL to have electrical properties for serving as a source (or drain) of a memory cell transistor. In an implementation, when the channel layer CHL includes an amorphous oxide semiconductor, the doping process may be performed in such a way that, e.g., hydrogen (H), oxygen (O), or silicon (Si), are implanted as impurities.

Referring to FIGS. 30 and 31A to 31E, a conductive layer CDL may be conformally deposited in the second trench TR2 and the second recess RS2. The conductive layer CDL may be formed on the sidewall of each of the first and second stack structures SS1 and SS2.

The conductive layer CDL may be formed to connect to the end of each of the channel layers CHL, which end is exposed to the second recess RS2. In an implementation, the conductive layer CDL may include a protrusion portion PRP that fills the second recess RS2. The protrusion portion PRP may be connected to the exposed end of the channel layer CHL.

A first interlayer insulating layer ILD1 may be formed on the conductive layer CDL, filling the second trench TR2. In an implementation, the first interlayer insulating layer ILD1 may include a silicon oxide layer. The first interlayer insulating layer ILD1 may have a top surface coplanar with that of the first mask pattern MAP1.

Referring to FIGS. 32 and 33A to 33E, a second mask pattern MAP2 may be formed on the first mask pattern MAP1 and the first interlayer insulating layer ILD1. The second mask pattern MAP2 may include a plurality of first openings OPN1. Each of the first openings OPN1 may be formed to partially expose the conductive layer CDL.

The second mask pattern MAP2 may be used as an etching mask to remove the first interlayer insulating layer ILD1 and the conductive layer CDL that are exposed. As the conductive layer CDL is partially removed through the first openings OPN1, a single conductive layer CDL may be formed into a plurality of bit lines BL that are divided from each other in the first direction D1. Each of the bit lines BL may extend in the third direction D3 along the sidewall of the first stack structure SS1 or the second stack structure SS2. Each of the bit lines BL may be connected through the protrusion portion PRP to the channel layer CHL. Each of the bit lines BL may include a pad CEP at top thereof.

Referring to FIGS. 34 and 35A to 35E, an insulating layer may be formed in spaces that are etched through the first openings OPN1. The insulating layer and a remaining first interlayer insulating layer ILD1 may form a single first interlayer insulating layer ILD1.

A planarization process may be performed until exposure of the top surface of each of the first interlayer insulating layer ILD1, the first dielectric pillar INP1, and the second dielectric pillar INP2. The planarization process may remove the first and second mask patterns MAP1 and MAP2.

A second interlayer insulating layer ILD2 may be formed on the first interlayer insulating layer ILD1 and the first and second stack structures SS1 and SS2. The second interlayer insulating layer ILD2 may be patterned to form a second opening OPN2 that overlaps the first trench TR1. The gap-fill layer GFL may be selectively remove which is exposed to the second opening OPN2.

Referring to FIGS. 36 and 37A to 37E, the first stopper layer STL1 may be removed which is exposed to the second opening OPN2. Therefore, the first trench TR1 may be completely exposed. The remaining first and third insulating layers IL1 and IL3 may be completely removed which are exposed to the first trench TR1. In an implementation, the removal of the first stopper layer STL1 and the first and third insulating layers IL1 and IL3 may include performing a wet etching process that selectively etches silicon nitride.

Figure 37A:
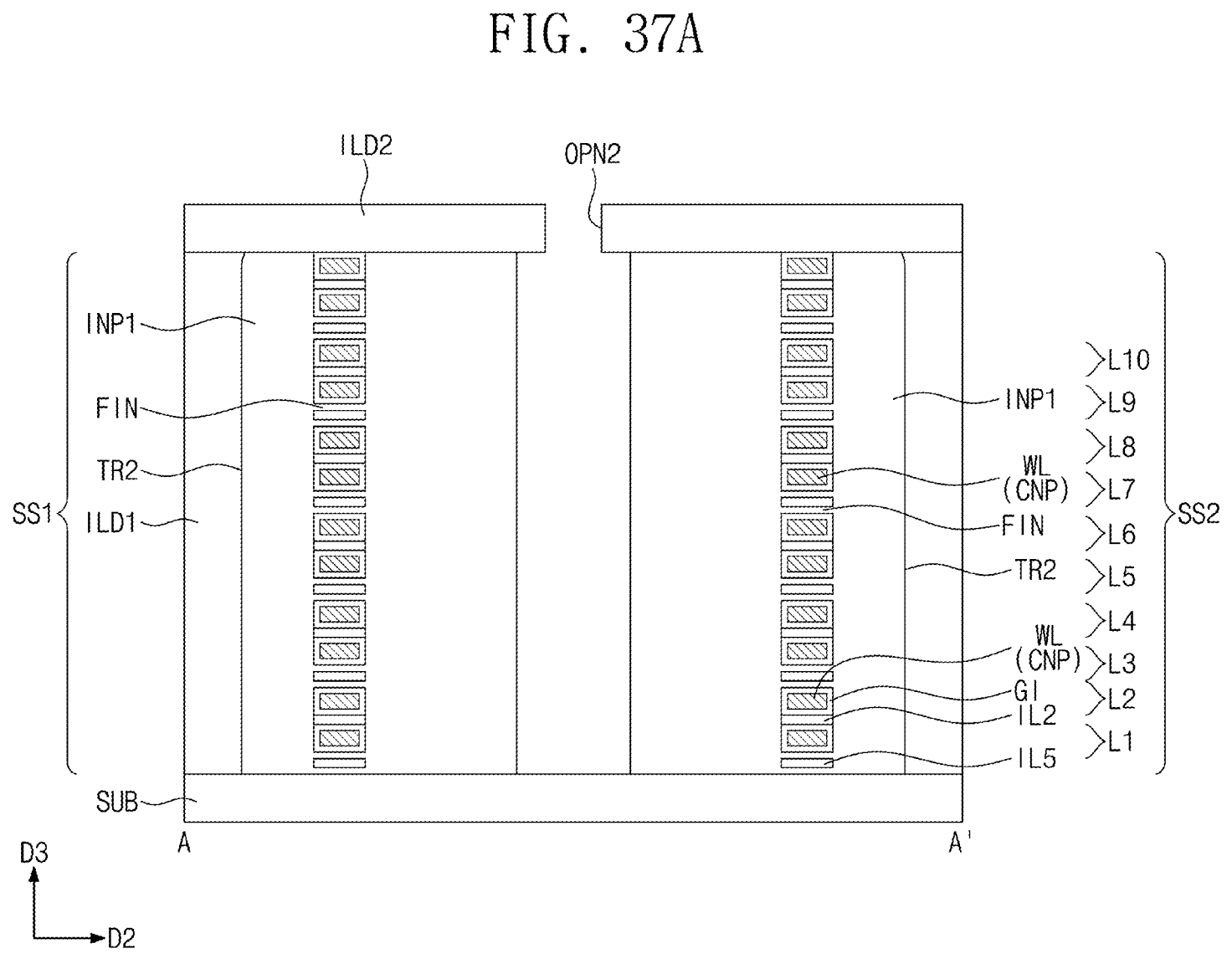
Figure 37B:
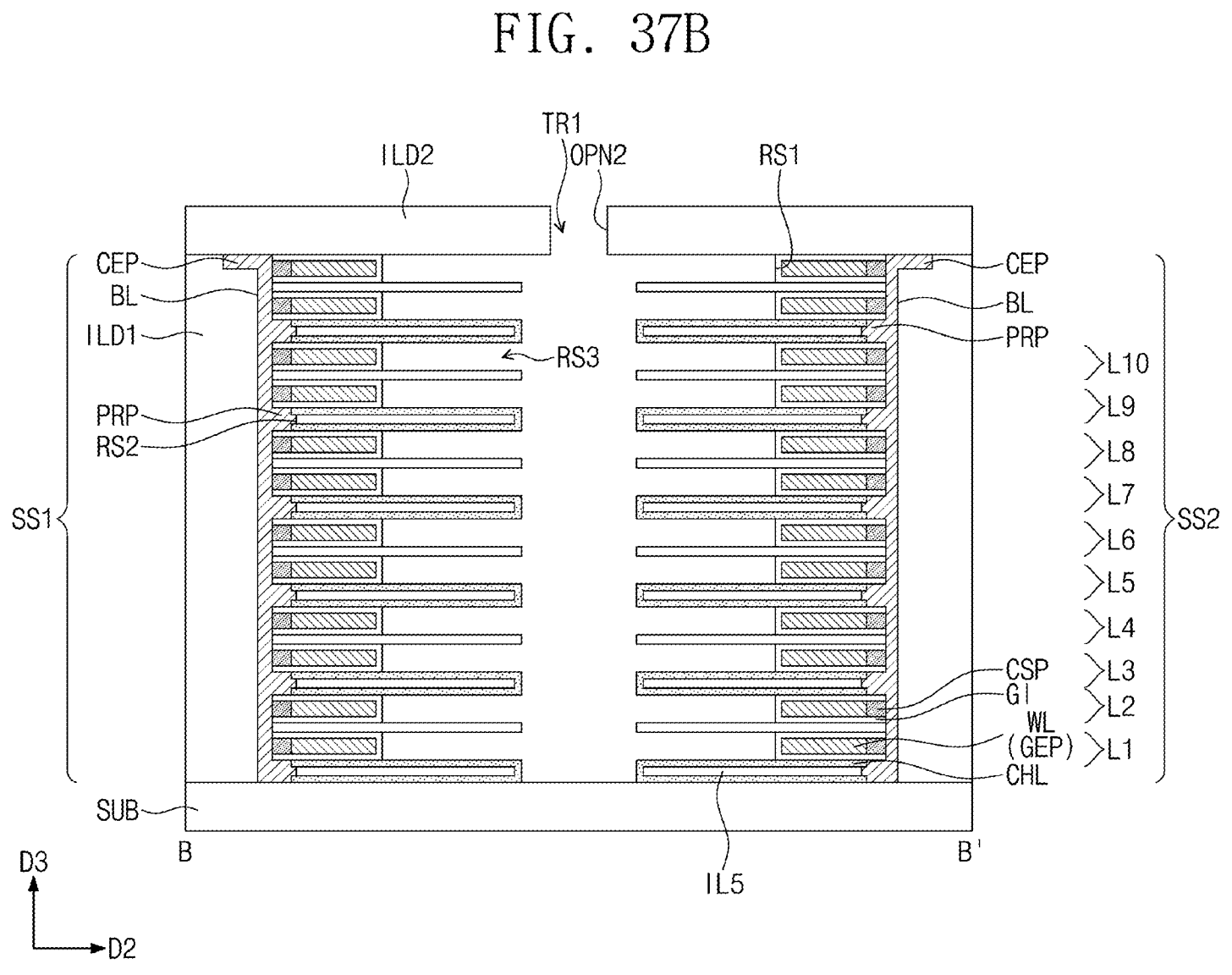
Figure 37C:
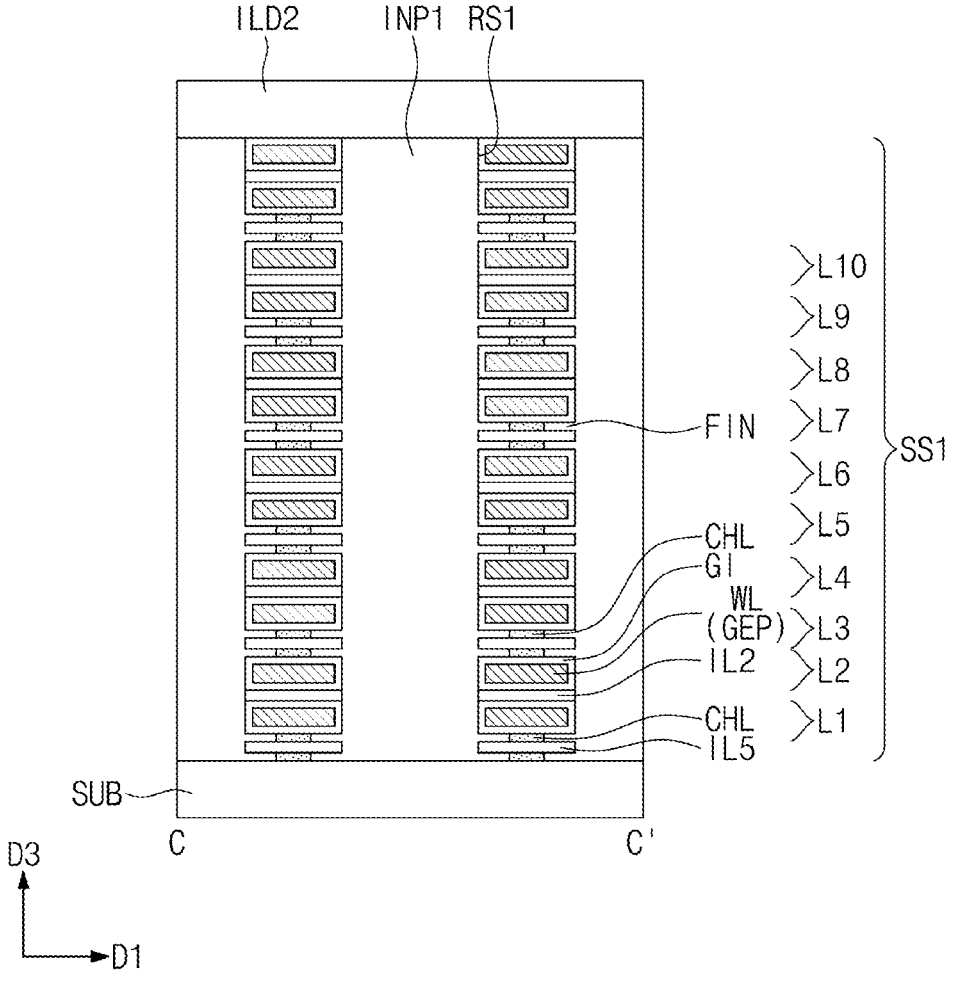
Figure 37D:
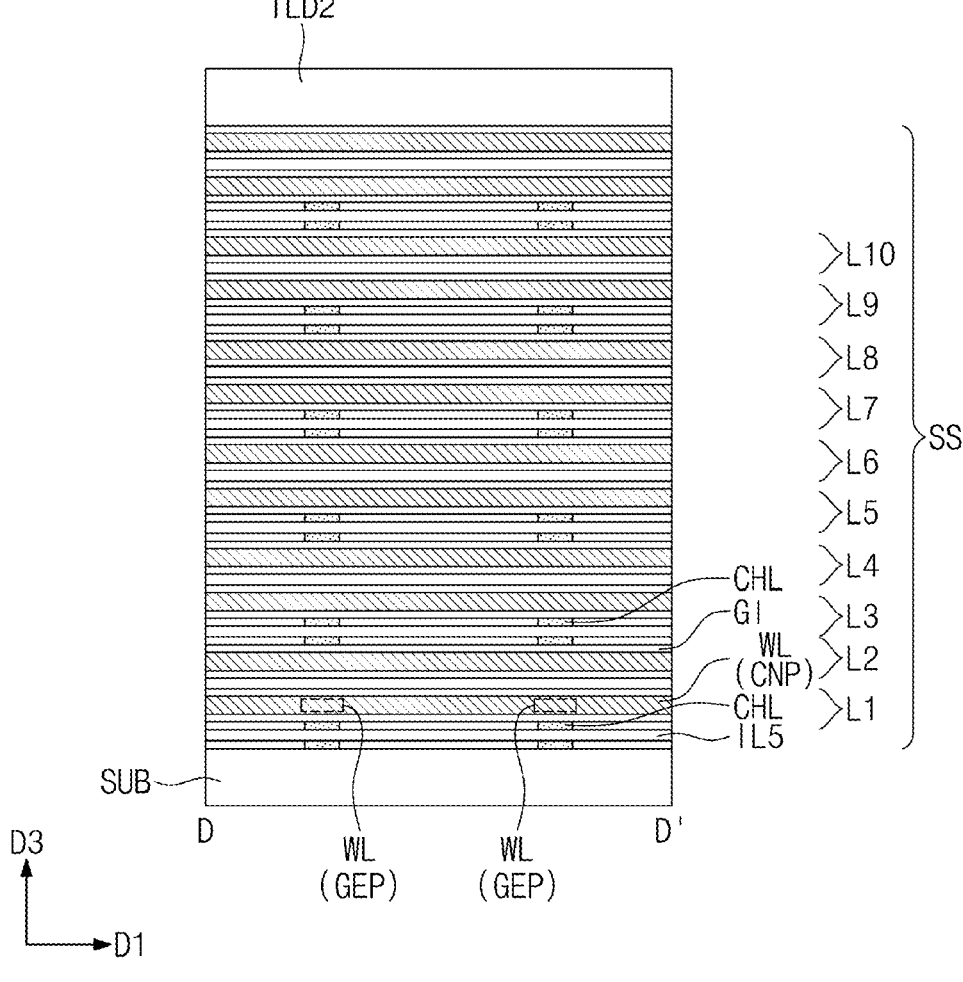
Figure 37E:
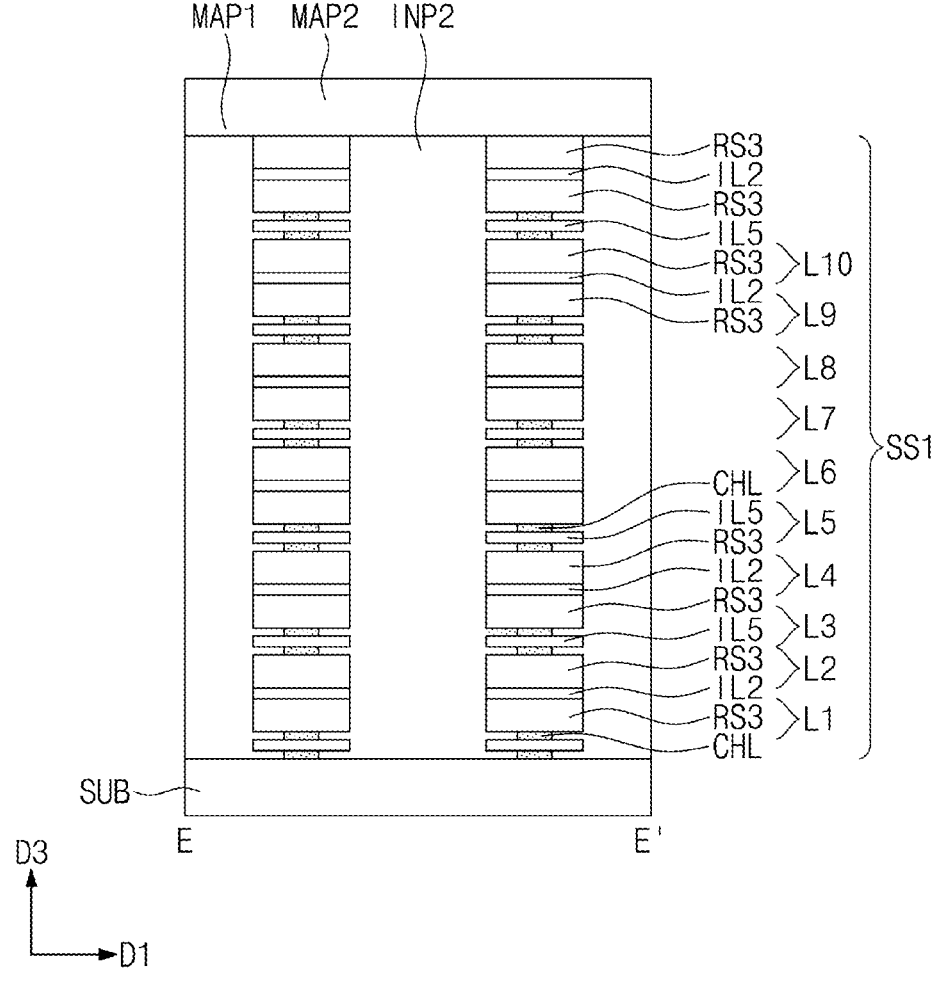
Figure 38:
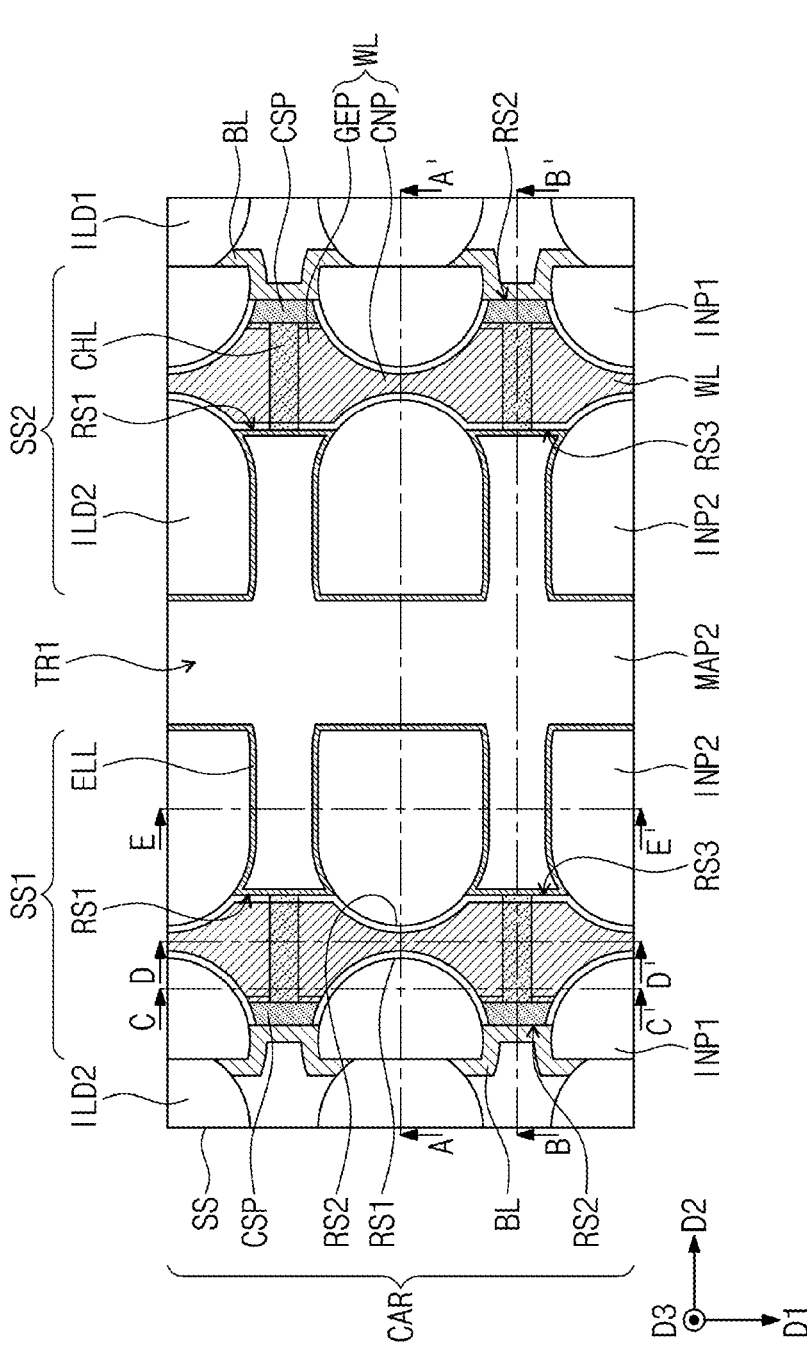
Figure 39C:
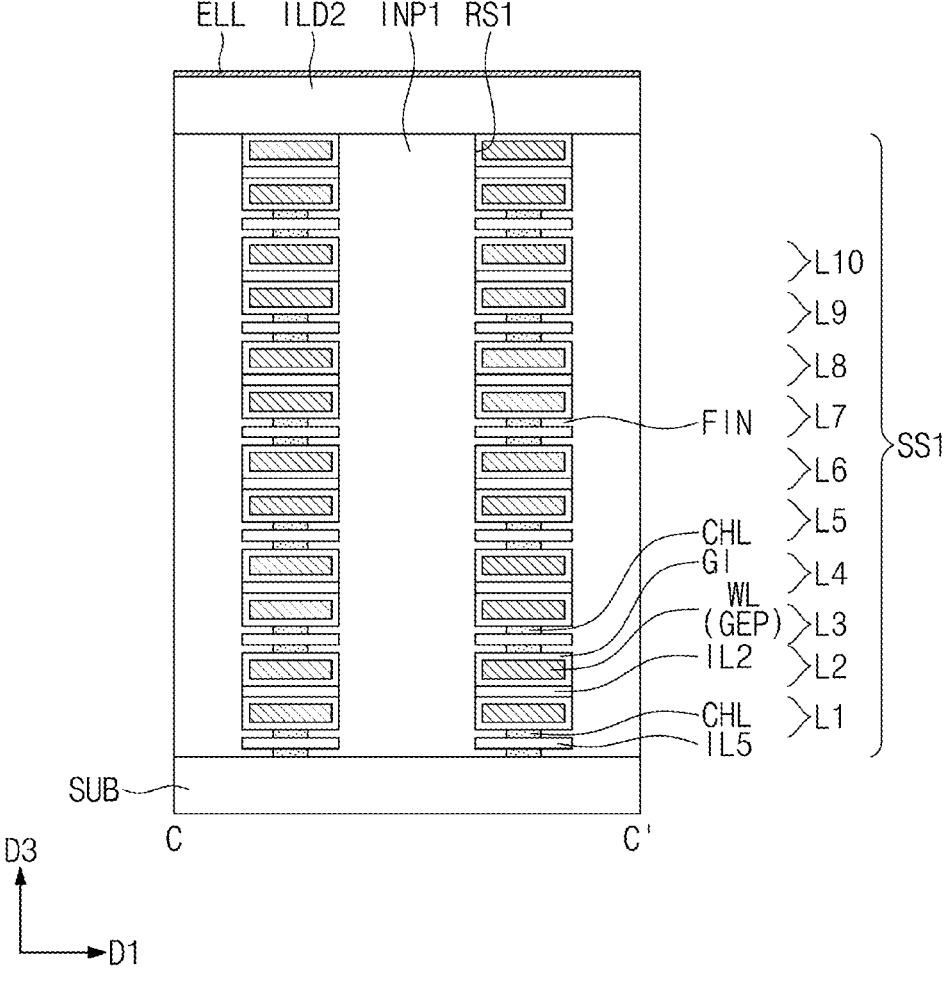
Figure 39D:
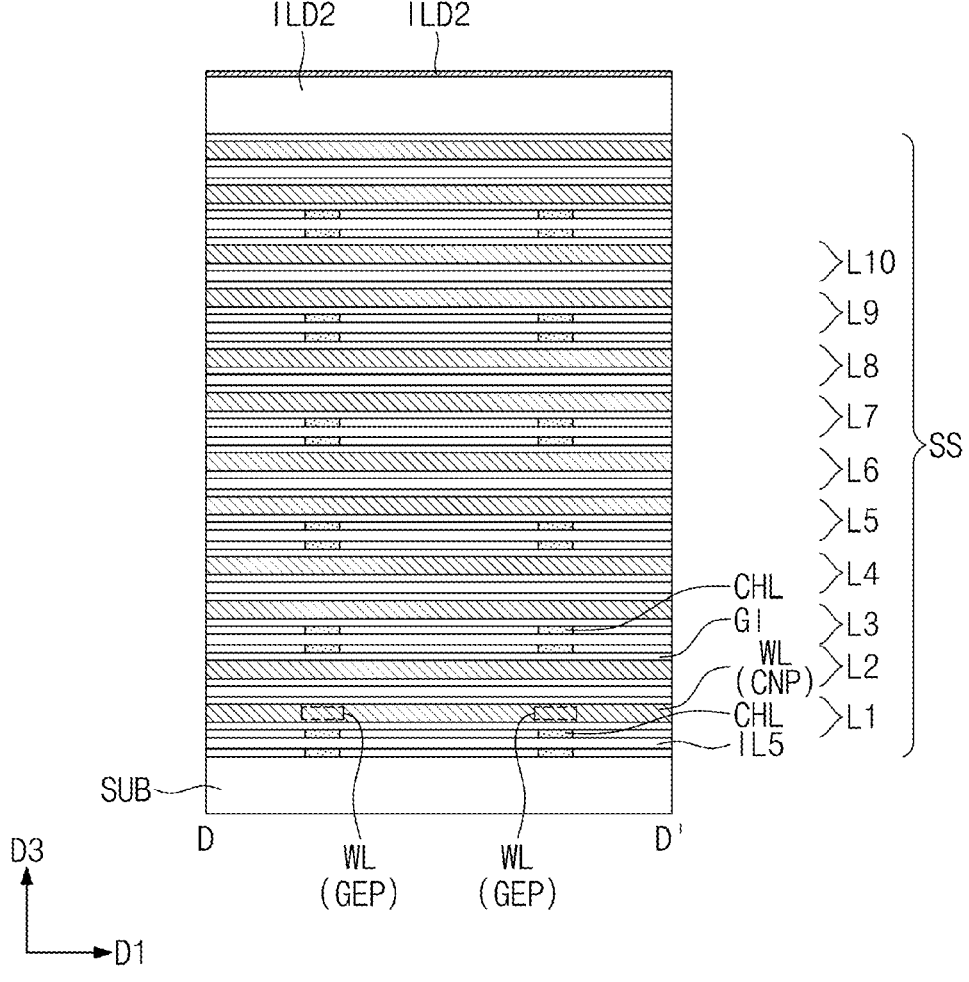
Figure 39E:
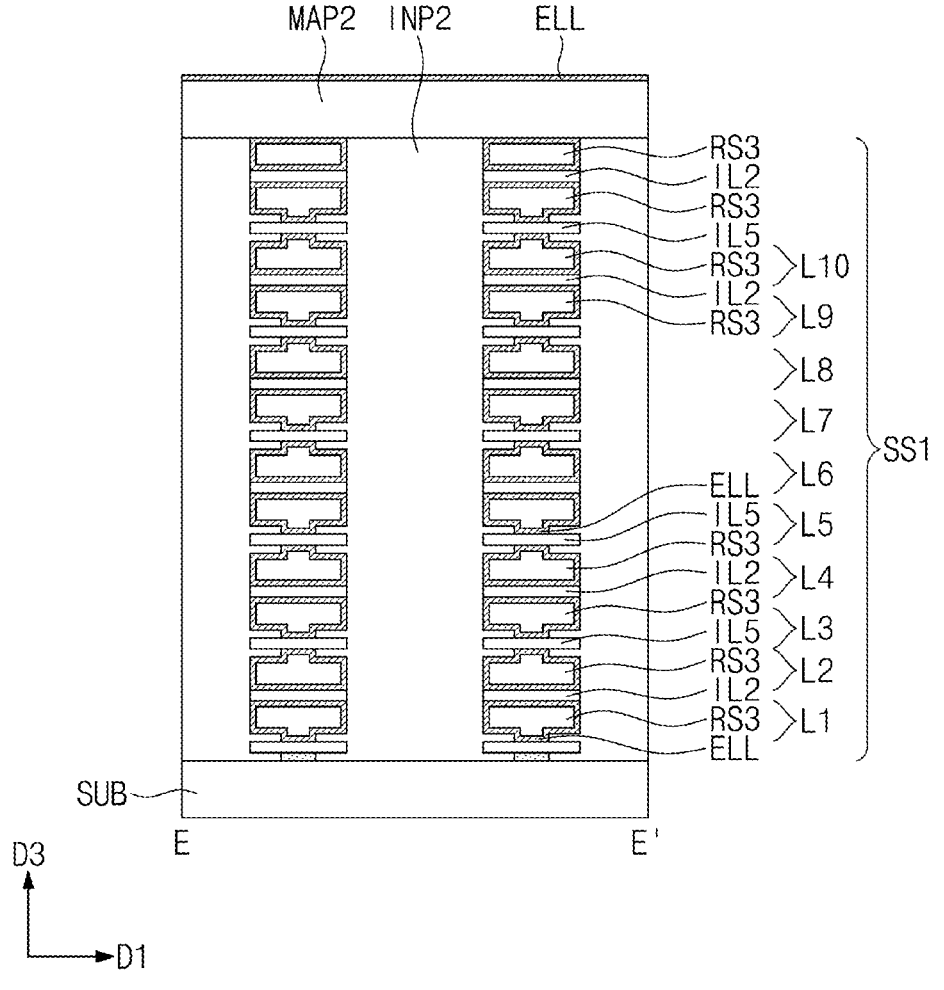
Figure 40:
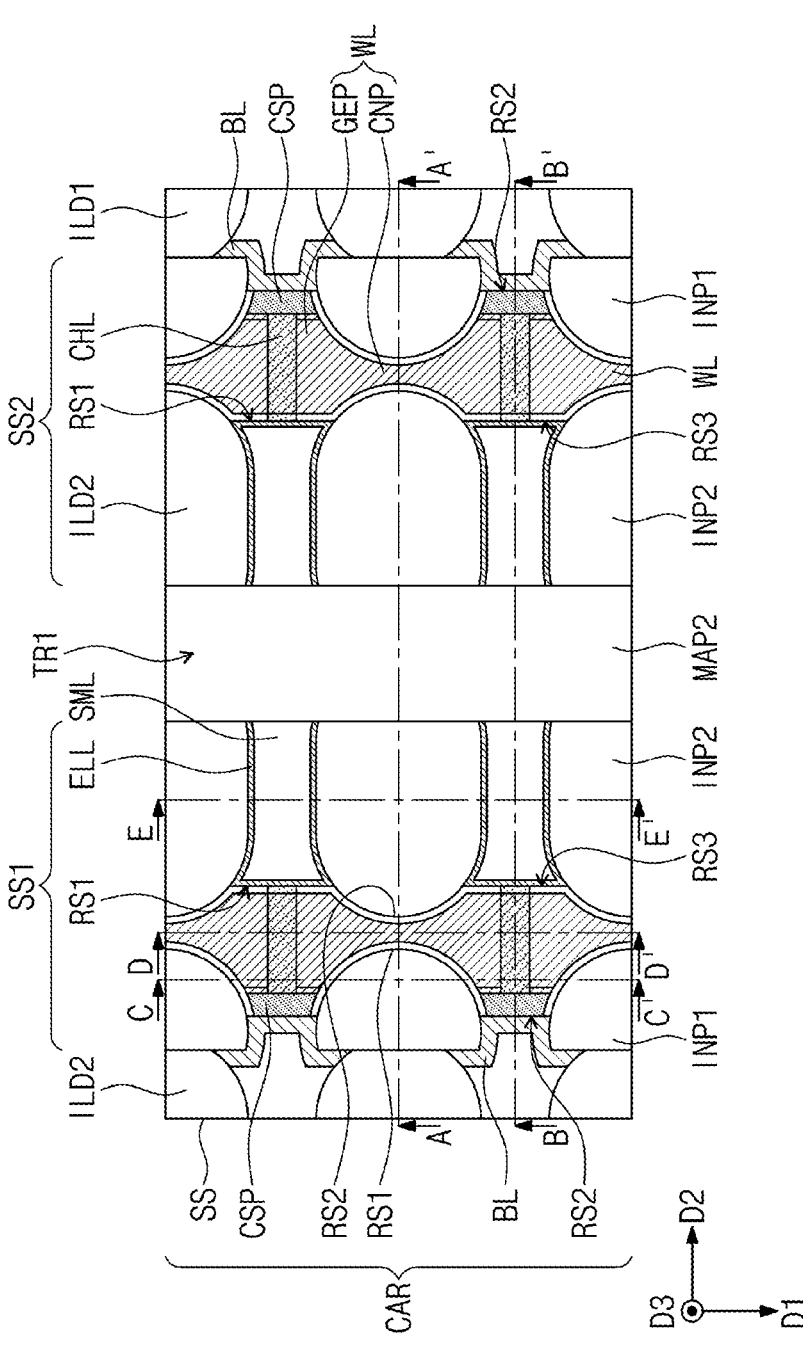
Figure 41C:
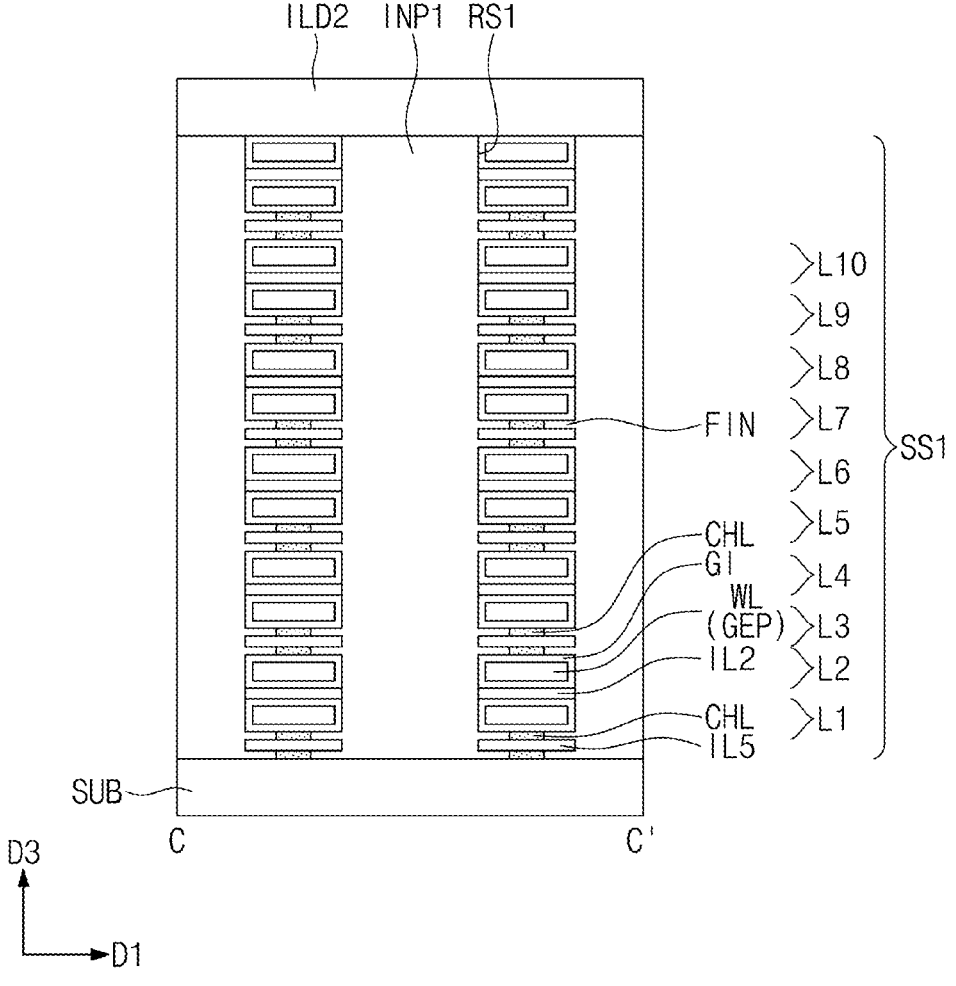
Figure 41D:
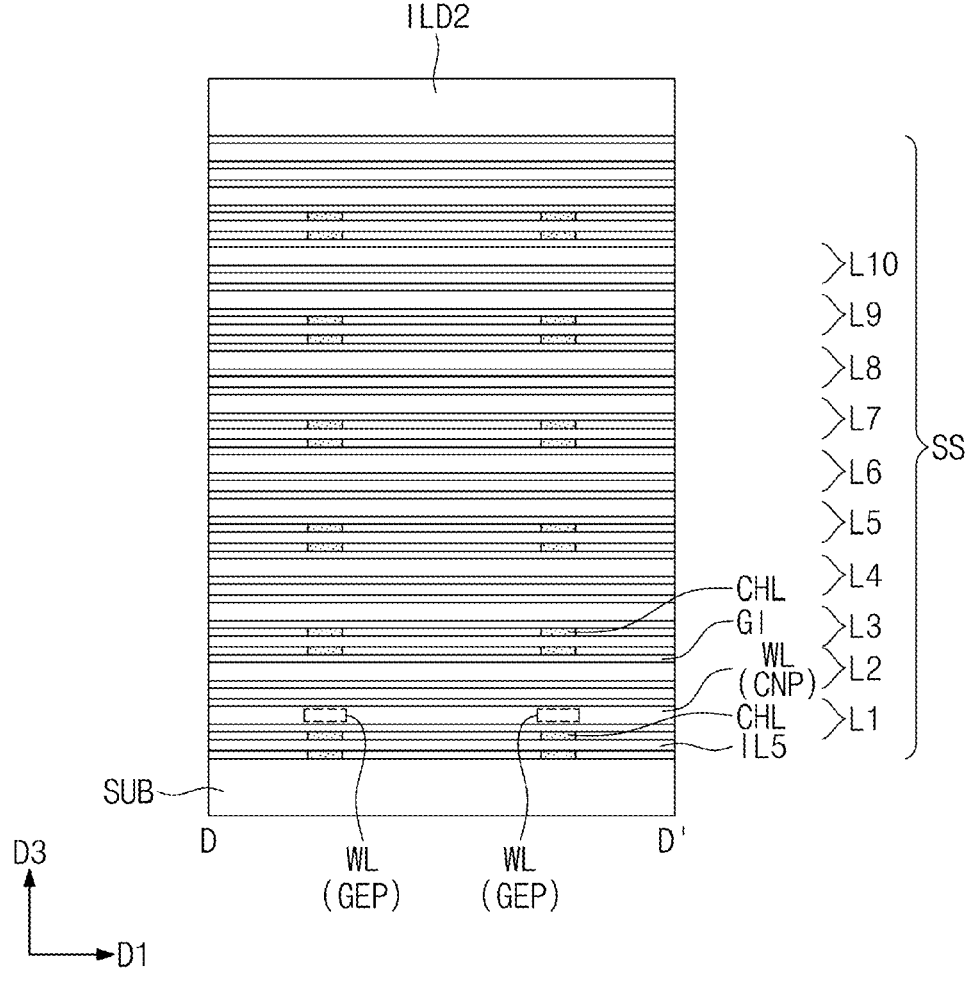
Figure 41E:
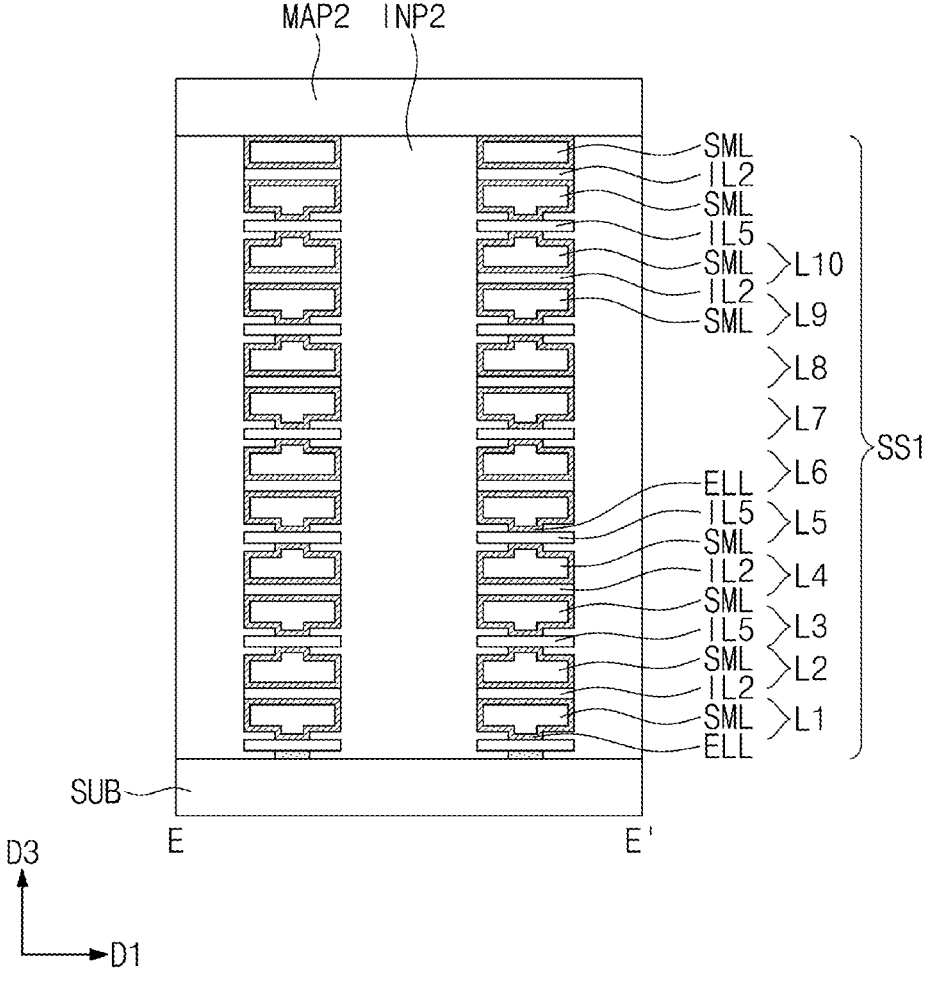
Figure 42:
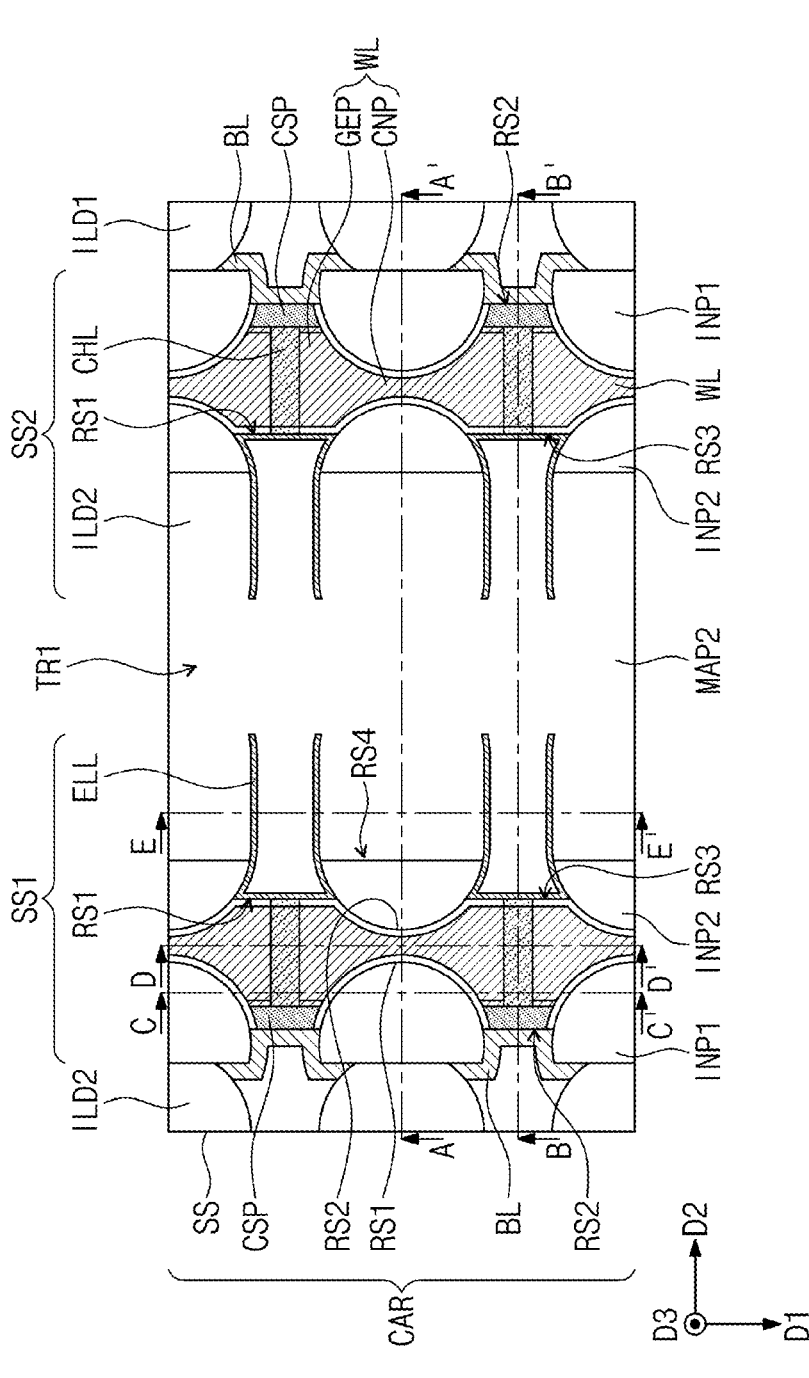
Figure 43C:
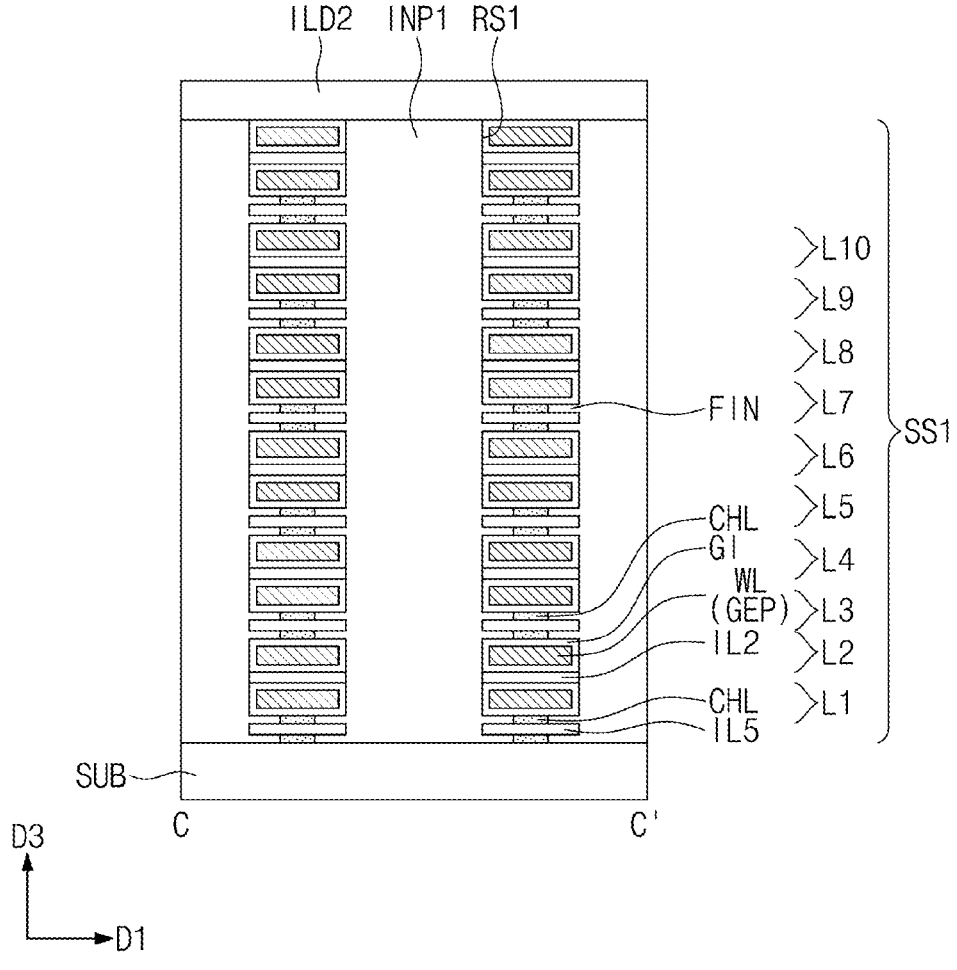
Figure 43D:
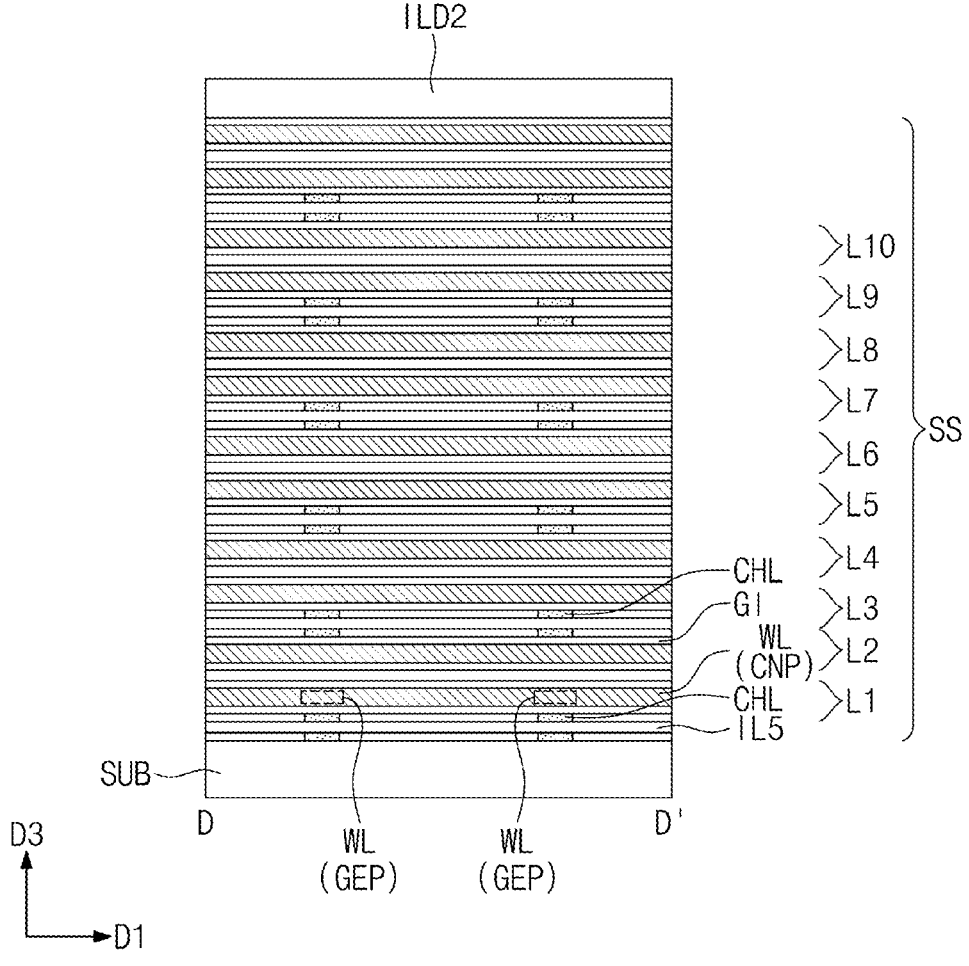
Figure 43E:
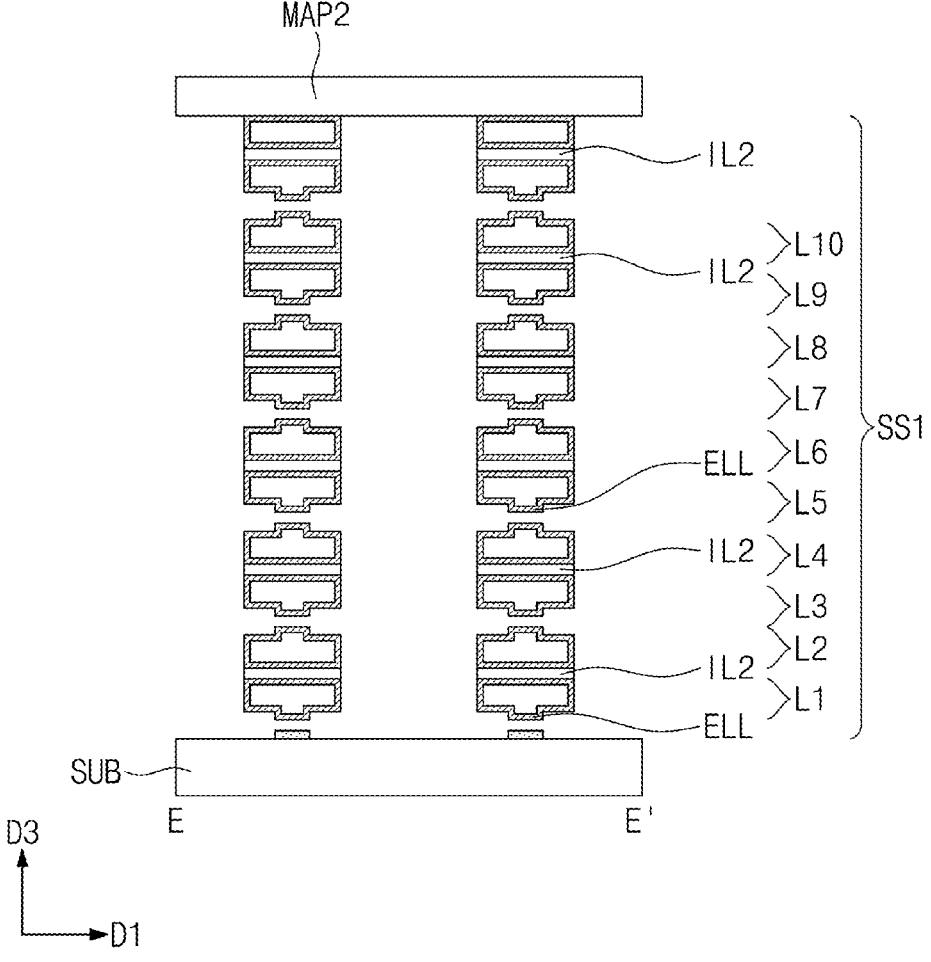
Figure 44:
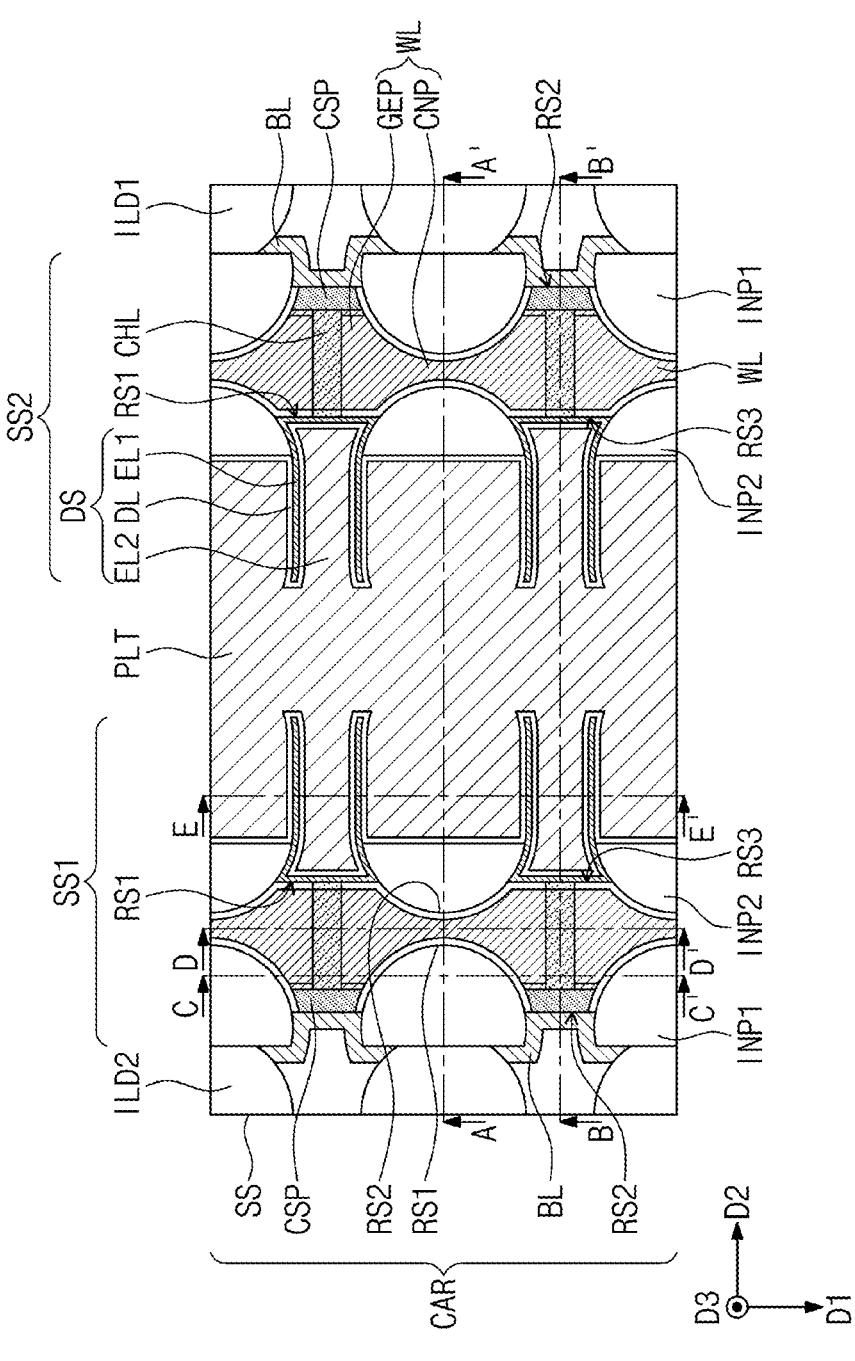
Figure 45C:
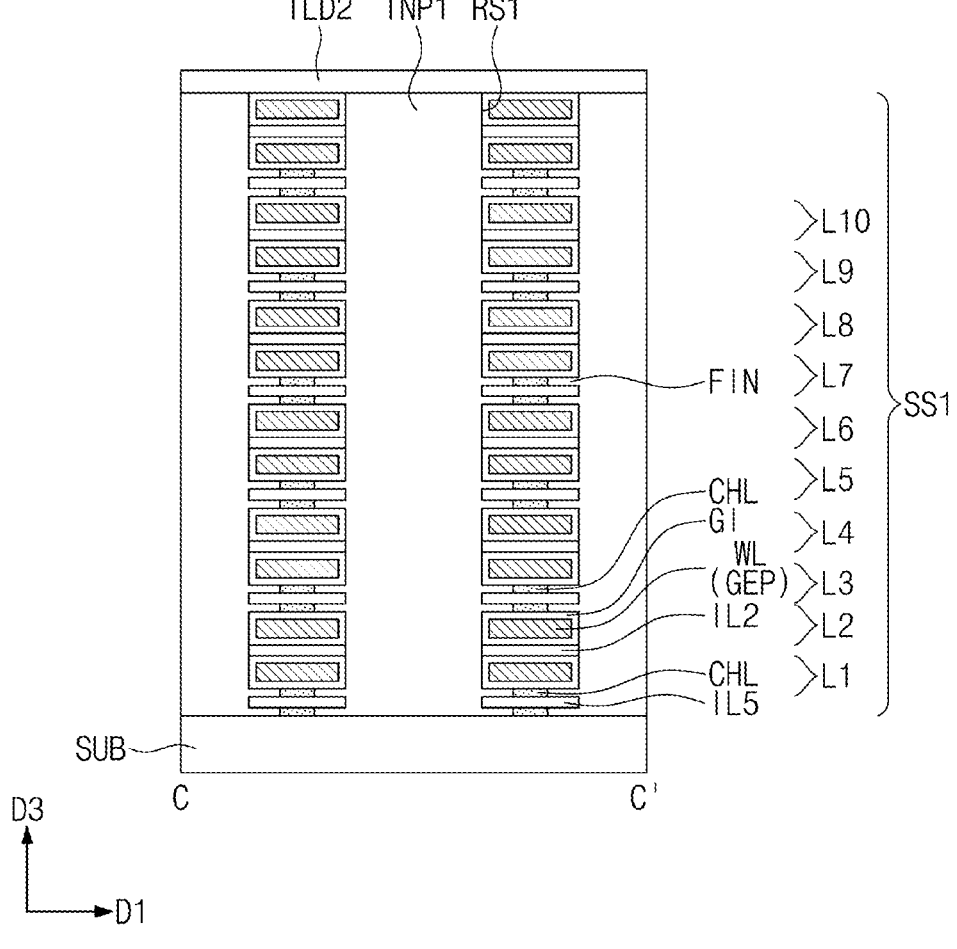
Figure 45D:
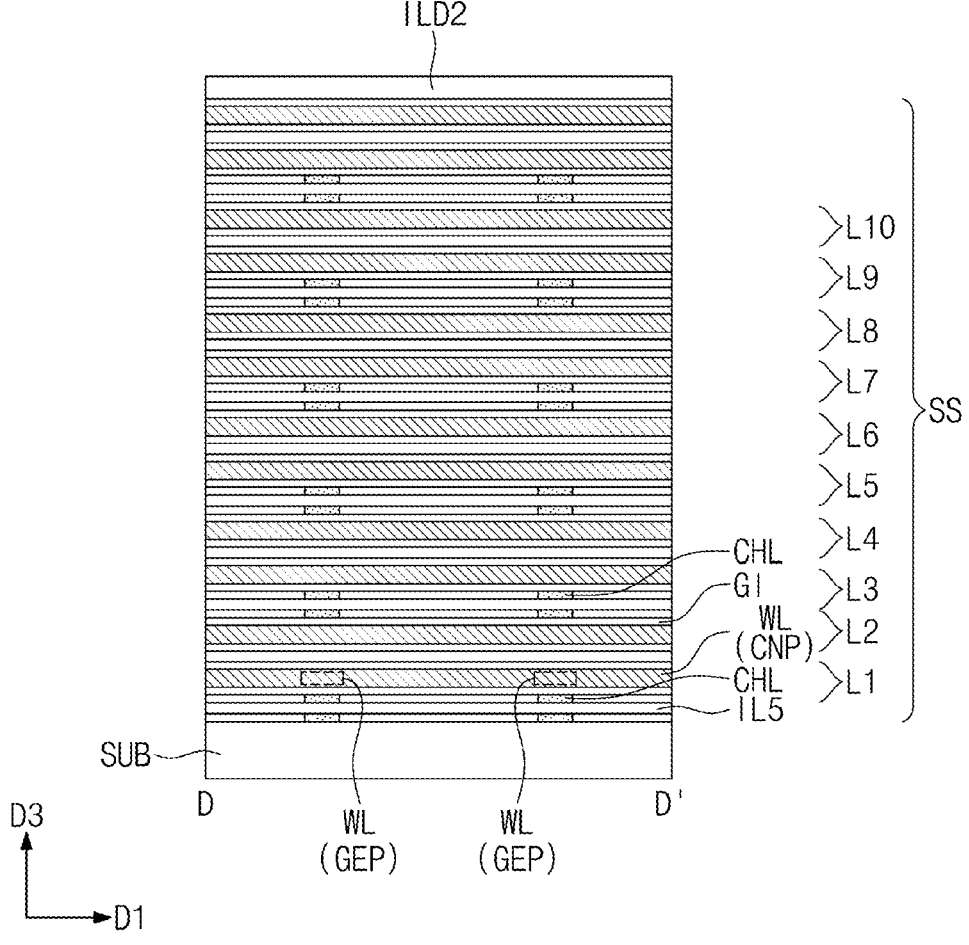
Figure 45E:
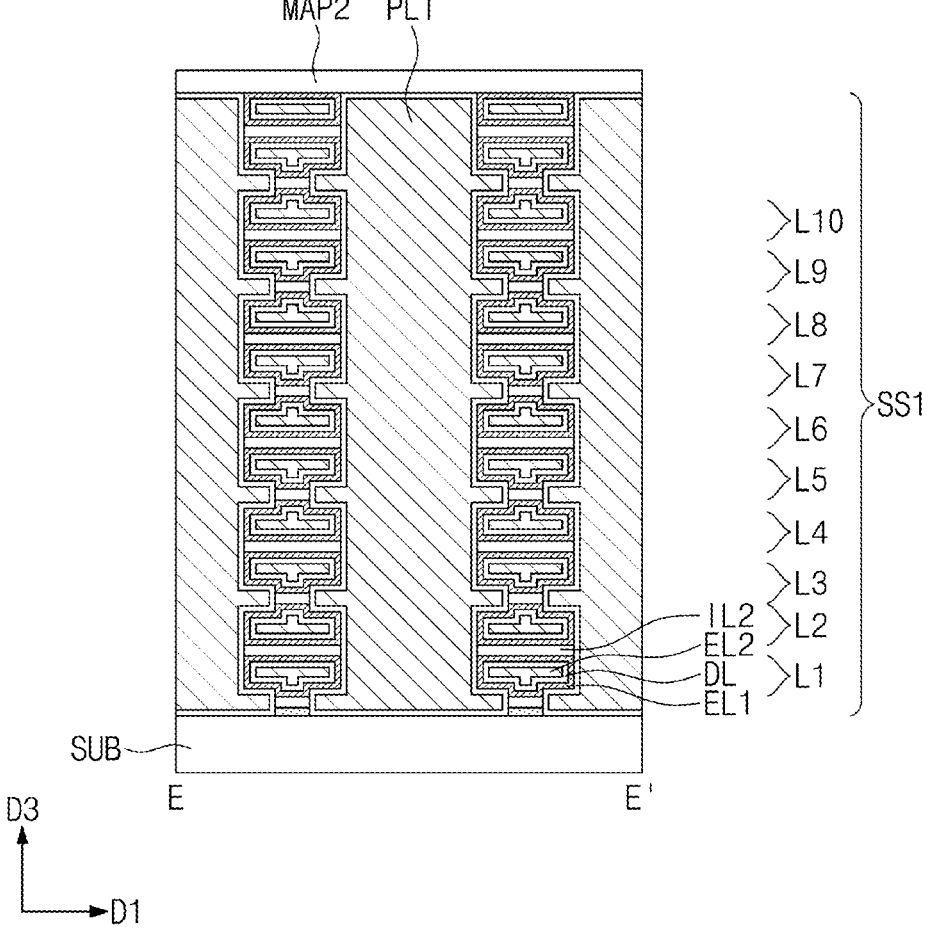

Referring to FIGS. 37B and 37E, the removal of the first and third insulating layers IL1 and IL3 may form third recesses RS3 that horizontally extend from the first trench TR1. Each of the third recesses RS3 may be formed between the second insulating layer IL2 and the channel layer CHL. The third recess RS3 may expose the gate insulating layer GI.

Referring to FIGS. 38 and 39A to 39E, a wet etching process may be performed on the channel layers CHL that are exposed to the third recesses RS3 and the first trench TR1. The wet etching process may horizontally and partially etch each of the channel layers CHL. The wet etching process may selectively etch the channel layers CHL.

Referring to FIG. 39B, the etching process may completely separate the lower channel layer CHL and the upper channel layer CHL with the fifth insulating layer IL5 therebetween. The etching process may allow an end of the channel layer CHL to vertically align with a sidewall of the word line WL.

In an implementation, a doping process may be performed on an end of the channel layer CHL, which end is exposed to the third recess RS3. The doping process may allow the end of the channel layer CHL to have electrical properties for serving as a drain (or a source) of a memory cell transistor. In an implementation, when the channel layer CHL includes an amorphous oxide semiconductor, the doping process may be performed in such a way that, e.g., hydrogen (H), oxygen (O), or silicon (Si), are implanted as impurities.

An electrode layer ELL may be conformally deposited through the first trench TR1 in the third recess RS3. The electrode layer ELL may be connected to the end of the channel layer CHL, which end is exposed to the third recess RS3.

Referring to FIGS. 40 and 41A to 41E, a sacrificial mask layer SML may be formed on the electrode layer ELL, filing the third recess RS3. The sacrificial mask layer SML may have an etch selectivity with respect to the electrode layer ELL.

The sacrificial mask layer SML may be used as an etching mask such that the electrode layer ELL may be partially removed to form a first electrode EL1. The first electrode EL1 may have a hollow cylindrical shape that remains in the third recess RS3 (see FIG. 41E).

Referring to FIGS. 42 and 43A to 43E, the sacrificial mask layers SML may be selectively removed. The second dielectric pillars INP2 may be horizontally etched which are exposed to the first trench TR1 while the sacrificial mask layers SML are removed. Therefore, a fourth recess RS4 may be formed between the first electrodes EL1 that are adjacent to each other in the first direction D1 (see FIG. 42).

Referring to FIGS. 44 and 45A to 45E, a dielectric layer DL and a second electrode EL2 may be sequentially formed through the first trench TR1 on the first electrode EL1. The second electrode EL2 between the first and second stack structures SS1 and SS2 may serve as a plate PLT. An upper portion of the plate PLT may protrude through the first trench TR1.

Referring back to FIGS. 8 and 9A to 9E, a third interlayer insulating layer ILD3 and a fourth interlayer insulating layer ILD4 may be sequentially formed on the second interlayer insulating layer ILD2. A plate contact PLCT may penetrate the third and fourth interlayer insulating layers ILD3 and ILD4 and may be coupled to the plate PLT. A bit-line contact BLCT may penetrate the second, third, and fourth interlayer insulating layers ILD2, ILD3, and ILD4 and may be coupled to the pad CEP of the bit line BL. A bit-line strap BLIL may be formed on the bit-line contact BLCT.

In an implementation, each of a silicon oxide layer and a silicon nitride layer used in fabricating a three-dimensional semiconductor memory device may further include, e.g., carbon (C), nitrogen (N), oxygen (O), or boron (B).

By way of summation and review, extremely expensive processing equipment to increase pattern fineness may set a practical limitation on increasing the integration of the two-dimensional or planar semiconductor devices. Three-dimensional semiconductor memory devices may have three-dimensionally arranged memory cells.

A three-dimensional semiconductor memory device according to some embodiments may include a channel layer formed of an amorphous oxide semiconductor or a two-dimensional semiconductor, and thus it is possible to eliminate floating body effects of memory cell transistors. In addition, the channel layer may be formed by a deposition process, and it is possible to easily achieve a three-dimensional memory cell array.

A three-dimensional semiconductor memory device according to some embodiments may be configured such that each of stacked word lines may include a pad portion at an end thereof. A signal applied to the pad portion may be directly transmitted to a cell array region through the word line. Accordingly, the memory device may exhibit improved operating speed and electrical properties.

A three-dimensional semiconductor memory device according to some embodiments may be configured such that a bit line is formed vertically and a word line is formed horizontally. Accordingly, process defects may decrease, and device reliability may increase in achieving a three-dimensional memory cell array.

One or more embodiments may provide a three-dimensional semiconductor memory device with improved electrical properties.

One or more embodiments may provide a three-dimensional semiconductor memory device with improved electrical properties and increased integration.

One or more embodiments may provide a method of fabricating a three-dimensional semiconductor memory device with improved electrical properties and increased integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor memory device, comprising:
a stack structure including layer groups that are stacked on a substrate in a vertical direction perpendicular to a top surface of the substrate, the layer groups each including a word line, a channel layer, and a data storage element that is electrically connected to the channel layer; and a bit line on one side of the stack structure, the bit line extending lengthwise in the vertical direction, wherein the word line of each of the layer groups extends in a first direction parallel to the top surface of the substrate, wherein the layer groups include a first layer group and a second layer group stacked on the first layer group in the vertical direction, wherein the channel layer of the first layer group is below the word line of the first layer group in the vertical direction, wherein the channel layer of the second layer group is above the word line of the second layer group in the vertical direction, and wherein the bit line includes:

a first protrusion portion connected to the channel layer of the first layer group; and a second protrusion portion connected to the channel layer of the second layer group.

2. The device as claimed in claim 1, wherein:

the layer groups further include a third layer group stacked on the second layer group, the channel layer of the third layer group is below the word line of the third layer group, and the channel layer of the third layer group is connected to the second protrusion portion.

3. The device as claimed in claim 2, wherein a first vertical interval between the word line of the first layer group and the word line of the second layer group is different from a second vertical interval between the word line of the second layer group and the word line of the third layer group.

4. The device as claimed in claim 1, wherein a structure of the word line and the channel layer of the first layer group and a structure of the word line and the channel layer of the second layer group are mirror-symmetrical to each other about a central line between the first layer group and the second layer group.

5. The device as claimed in claim 1, wherein the word line of each layer group of the layer groups includes:

a gate portion that overlaps the channel layer; and a connection portion that connects the gate portions that are adjacent to each other in the first direction, and wherein a width of the gate portion is greater than a width of the connection portion, as measured in a second direction that crosses the first direction.

6. The device as claimed in claim 1, wherein the channel layer of each layer group of the layer groups includes an amorphous oxide semiconductor or a two-dimensional semiconductor.

7. The device as claimed in claim 1, wherein:

the bit line further includes a pad at a top of the bit line, and a bit-line contact is connected to the pad.

8. The device as claimed in claim 1, wherein the data storage element in each of the layer groups includes:

a first electrode electrically connected to the channel layer;

a second electrode on the first electrode; and a dielectric layer between the first electrode and the second electrode.

9. The device as claimed in claim 1, wherein:

the word lines of the layer groups extend to a connection region of the substrate, the word lines include corresponding pad portions on the connection region, the pad portions constitute a stepwise structure on the connection region, the pad portions are sequentially exposed in a downward direction by the stepwise structure, and a thickness of each of the pad portions is greater than a thickness of the corresponding word line.

10. The device as claimed in claim 1, further comprising:

a peripheral circuit layer between the substrate and the stack structure; and a through contact that electrically connects at least one selected from the word line and the bit line to the peripheral circuit layer.

11. A semiconductor memory device, comprising:

a stack structure including layer groups that are stacked on a substrate in a vertical direction perpendicular to a top surface of the substrate, the layer groups each including a word line, a channel layer, and a data storage element that is electrically connected to the channel layer; and a bit line on one side of the stack structure, the bit line extending lengthwise in the vertical direction, wherein the word line of each of the layer groups extends lengthwise in a horizontal direction that is parallel to the top surface of the substrate, wherein the layer groups include a first layer group, a second layer group, and a third layer group that are sequentially stacked in the vertical direction, wherein a first vertical interval between the channel layer of the first layer group and the channel layer of the second layer group is different from a second vertical interval between the channel layer of the second layer group and the channel layer of the third layer group, and wherein the channel layer of the first layer group, the channel layer of the second layer group, and the channel layer of the third layer group are spaced apart from each other in the vertical direction.

12. The device as claimed in claim 11, wherein the bit line includes:

a first protrusion portion connected to the channel layer of the first layer group; and a second protrusion portion connected in common to the channel layer of the second layer group and the channel layer of the third layer group.

13. The device as claimed in claim 11, wherein the first vertical interval is greater than the second vertical interval.

14. The device as claimed in claim 11, wherein:

the word line of the first layer group and the word line of the second layer group are between the channel layer of the first layer group and the channel layer of the second layer group, and an insulating layer is between the channel layer of the second layer group and the channel layer of the third layer group.

15. The device as claimed in claim 11, wherein a third vertical interval between the word line of the first layer group and the word line of the second layer group is different from a fourth vertical interval between the word line of the second layer group and the word line of the third layer group.

16. A semiconductor memory device, comprising:

a stack structure including layer groups that are stacked on a substrate in a vertical direction that is perpendicular to a top surface of the substrate, the layer groups each including a word line, a channel layer adjacent to the word line, and a data storage element electrically connected to the channel layer; and a bit line on one side of the stack structure, the bit line extending lengthwise in the vertical direction, wherein the bit line electrically connects the layer groups, wherein the channel layer is between the bit line and the data storage element in the vertical direction, wherein the layer groups include a first layer group, a second layer group, and a third layer group that are sequentially stacked in the vertical direction, wherein the first layer group is configured such that the word line of the first layer group is above a top surface of the channel layer of the first layer group in the vertical direction, wherein the second layer group is configured such that the word line of the second layer group is below a bottom surface of the channel layer of the second layer group in the vertical direction, wherein a structure of the first layer group and a structure of the second layer group are mirror-symmetrical to each other about a central line between the first layer group and the second layer group, and wherein a structure of the third layer group is the same as the structure of the first layer group.

17. The device as claimed in claim 16, wherein the channel layer of each of the layer groups includes an amorphous oxide semiconductor or a two-dimensional semiconductor.

18. The device as claimed in claim 16, wherein the bit line includes a plurality of protrusion portions connected with the layer groups.

19. The device as claimed in claim 16, wherein the third layer group is configured such that the word line of the third layer group is above a top surface of the channel layer of the third layer group in the vertical direction.

20. The device as claimed in claim 16, wherein the data storage element of each of the layer groups includes:

a first electrode electrically connected to the channel layer;

a second electrode on the first electrode; and a dielectric layer between the first electrode and the second electrode.

* * * * *